(12) United States Patent
Murakoshi et al.

(10) Patent No.: US 10,276,586 B2
(45) Date of Patent: Apr. 30, 2019

(54) SEMICONDUCTOR DEVICE AND METHOD FOR MANUFACTURING SAME

(71) Applicant: TOSHIBA MEMORY CORPORATION, Tokyo (JP)

(72) Inventors: Atsushi Murakoshi, Yokkaichi Mie (JP); Yasuhito Yoshimizu, Yokkaichi Mie (JP); Tomofumi Inoue, Yokkaichi Mie (JP); Tatsuya Kato, Yokkaichi Mie (JP); Yuta Watanabe, Yokkaichi Mie (JP); Fumitaka Arai, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 16 days.

(21) Appl. No.: 15/254,014

(22) Filed: Sep. 1, 2016

(65) Prior Publication Data

US 2017/0263613 A1 Sep. 14, 2017

(30) Foreign Application Priority Data

Mar. 10, 2016 (JP) .................................. 2016-047426

(51) Int. Cl.
*H01L 27/115* (2017.01)
*H01L 29/792* (2006.01)
(Continued)

(52) U.S. Cl.
CPC .... *H01L 27/1157* (2013.01); *H01L 27/11519* (2013.01); *H01L 27/11521* (2013.01); *H01L 27/11548* (2013.01); *H01L 27/11556* (2013.01); *H01L 27/11565* (2013.01); *H01L 27/11575* (2013.01); *H01L 27/11578* (2013.01); *H01L 27/11582* (2013.01); *H01L 29/4234* (2013.01);
(Continued)

(58) Field of Classification Search
CPC ......... H01L 21/28282; H01L 29/66833; H01L 29/792; H01L 27/11582; H01L 29/42344; H01L 27/11578; H01L 29/7926; H01L 29/42352; H01L 29/4234; H01L 29/42348; H01L 29/42324; H01L 29/66825; H01L 29/42328; H01L 29/42332; H01L 29/518
See application file for complete search history.

(56) References Cited

U.S. PATENT DOCUMENTS 7,759,719 B2 * 7/2010 Wang ................ H01L 29/42324
257/314
8,759,895 B2 6/2014 Tang et al.
(Continued)

FOREIGN PATENT DOCUMENTS

JP 2013-243177 12/2013
JP 2014-003235 1/2014
(Continued)

*Primary Examiner* — Yu Chen
*Assistant Examiner* — Pauline Vu
(74) *Attorney, Agent, or Firm* — Kim & Stewart LLP

(57) ABSTRACT

According to one embodiment, a semiconductor device includes a substrate and a semiconductor layer. The device further includes a first electrode layer that is provided on a side surface of the semiconductor layer with a first insulating film interposed therebetween. The device further includes a charge storage layer provided on a side surface of the first electrode layer with the second insulating film interposed therebetween.

13 Claims, 135 Drawing Sheets

(51) Int. Cl.
  *H01L 29/423* (2006.01)
  *H01L 29/66* (2006.01)
  *H01L 27/1157* (2017.01)
  *H01L 27/11582* (2017.01)
  *H01L 27/11578* (2017.01)
  *H01L 27/11519* (2017.01)
  *H01L 27/11521* (2017.01)
  *H01L 27/11548* (2017.01)
  *H01L 27/11556* (2017.01)
  *H01L 27/11565* (2017.01)
  *H01L 27/11575* (2017.01)
  *H01L 21/28* (2006.01)

(52) U.S. Cl.
  CPC .. *H01L 29/42324* (2013.01); *H01L 29/42328* (2013.01); *H01L 29/42332* (2013.01); *H01L 29/42348* (2013.01); *H01L 29/42352* (2013.01); *H01L 29/66825* (2013.01); *H01L 29/7926* (2013.01)

(56) References Cited

U.S. PATENT DOCUMENTS

| | | | |
|---|---|---|---|
| 8,796,755 B2 | 8/2014 | Sato | |
| 8,803,219 B2 | 8/2014 | Sato | |
| 9,449,985 B1* | 9/2016 | Rabkin | H01L 21/28282 |
| 2008/0067577 A1* | 3/2008 | Wang | G11C 11/5671 257/321 |
| 2009/0302365 A1* | 12/2009 | Bhattacharyya | B82Y 10/00 257/298 |
| 2011/0298037 A1* | 12/2011 | Choe | G11C 16/0483 257/324 |
| 2012/0003828 A1* | 1/2012 | Chang | H01L 27/1157 438/591 |
| 2012/0092926 A1* | 4/2012 | Whang | H01L 27/11556 365/185.01 |
| 2012/0217564 A1* | 8/2012 | Tang | H01L 27/11524 257/315 |
| 2012/0231593 A1* | 9/2012 | Joo | H01L 27/11556 438/264 |
| 2013/0049097 A1* | 2/2013 | Ahn | H01L 29/66833 257/324 |
| 2013/0087843 A1* | 4/2013 | Han | B82Y 10/00 257/315 |
| 2013/0163340 A1* | 6/2013 | Dutta | G11C 16/10 365/185.18 |
| 2014/0061770 A1* | 3/2014 | Lee | H01L 29/66825 257/324 |
| 2014/0084357 A1* | 3/2014 | Choi | H01L 27/1157 257/324 |
| 2014/0131784 A1* | 5/2014 | Davis | H01L 27/11556 257/316 |
| 2014/0203344 A1* | 7/2014 | Hopkins | H01L 29/42324 257/316 |
| 2014/0264532 A1* | 9/2014 | Dennison | H01L 29/66833 257/316 |
| 2014/0339624 A1* | 11/2014 | Ramaswamy | H01L 29/792 257/326 |
| 2015/0041879 A1* | 2/2015 | Jayanti | H01L 21/28282 257/324 |
| 2015/0200199 A1* | 7/2015 | Sakamoto | G11C 16/0408 257/329 |
| 2015/0294980 A1* | 10/2015 | Lee | H01L 27/11582 257/324 |
| 2015/0303215 A1* | 10/2015 | Chang | H01L 21/28273 257/314 |
| 2016/0086972 A1* | 3/2016 | Zhang | H01L 27/11582 257/66 |
| 2018/0166463 A1* | 6/2018 | Cho | H01L 21/28273 |

FOREIGN PATENT DOCUMENTS

| | | |
|---|---|---|
| JP | 2014-003236 | 1/2014 |
| JP | 2014-003793 | 1/2014 |

* cited by examiner

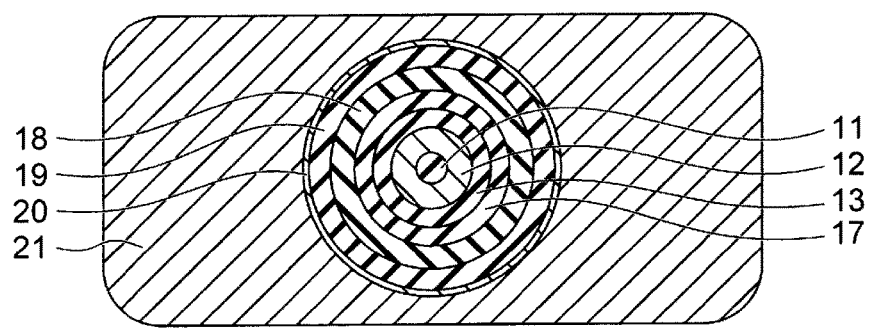
FIG. 18A
PRIOR ART
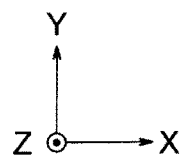
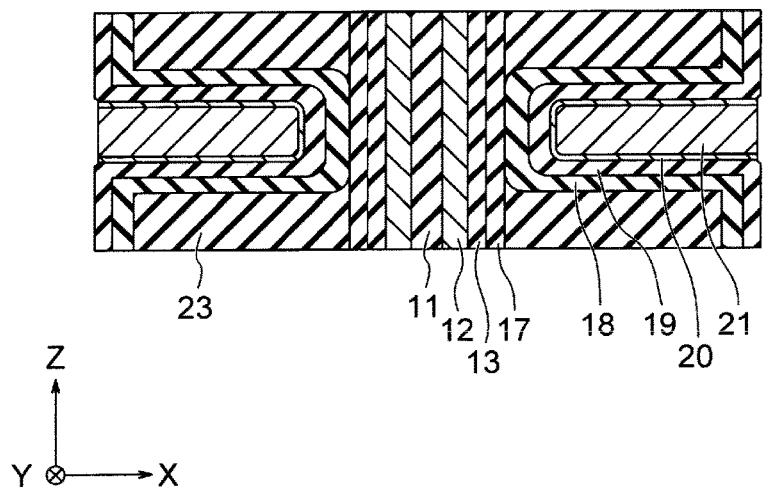
FIG. 18B
PRIOR ART
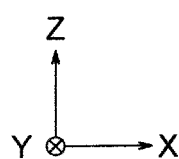

ΔVth ≦ 0.2V

ΔVth ≧ 1.1V

ΔVth ≦ 0.3V

FIG. 26
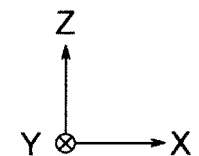
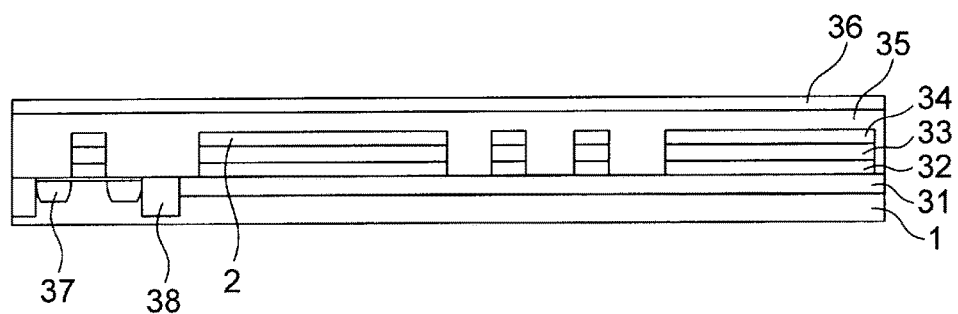

FIG. 27
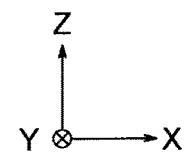
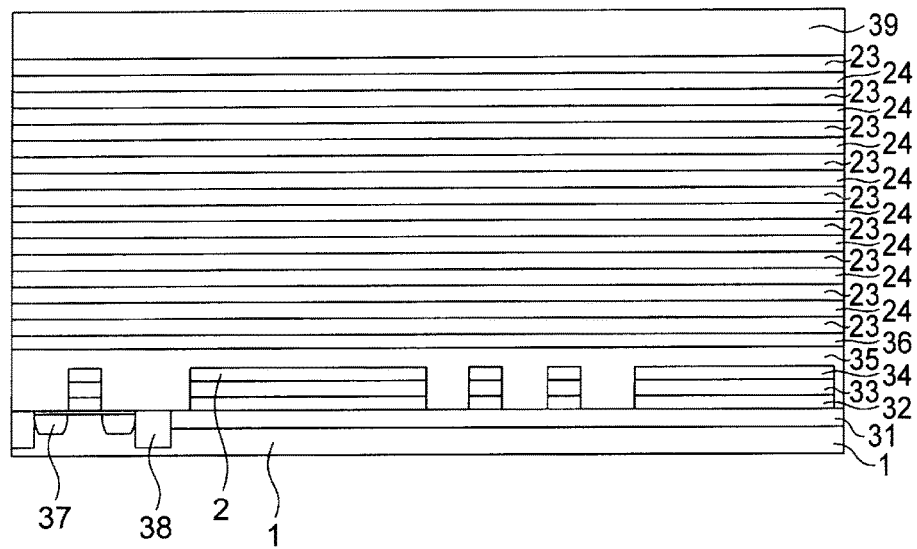

FIG. 31
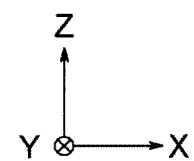
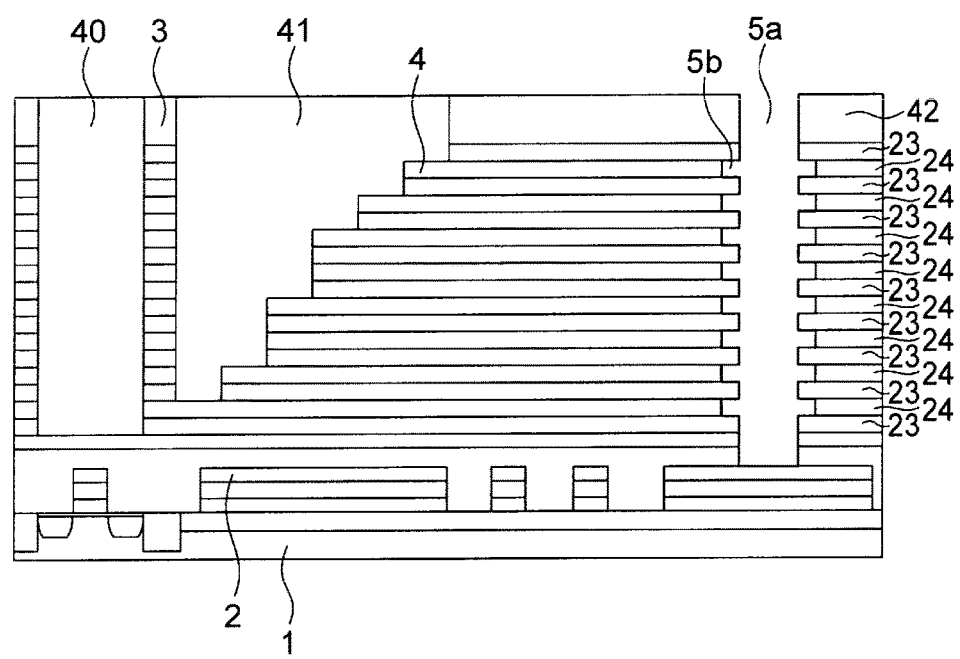

FIG. 32
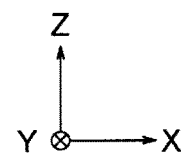
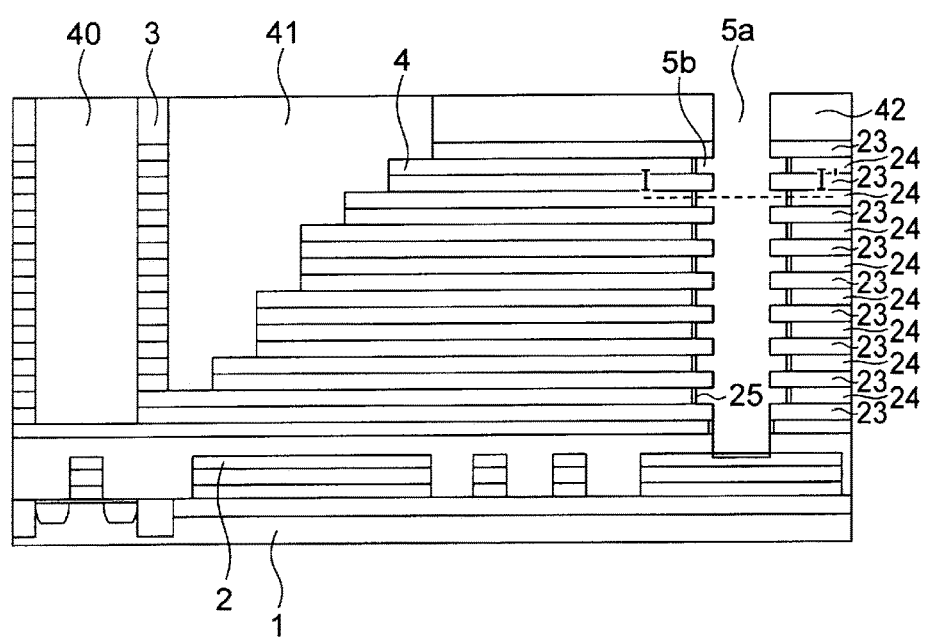

FIG. 38A
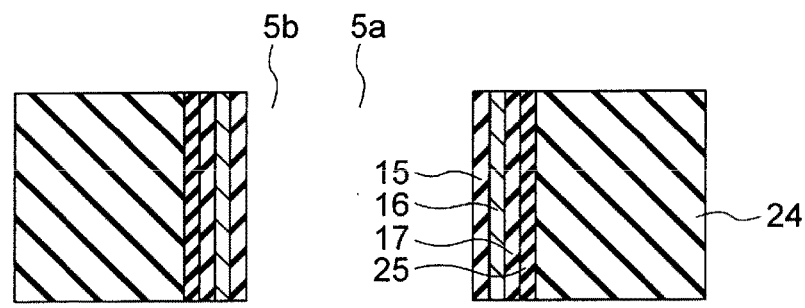
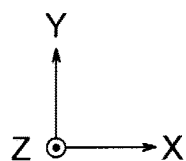
FIG. 38B
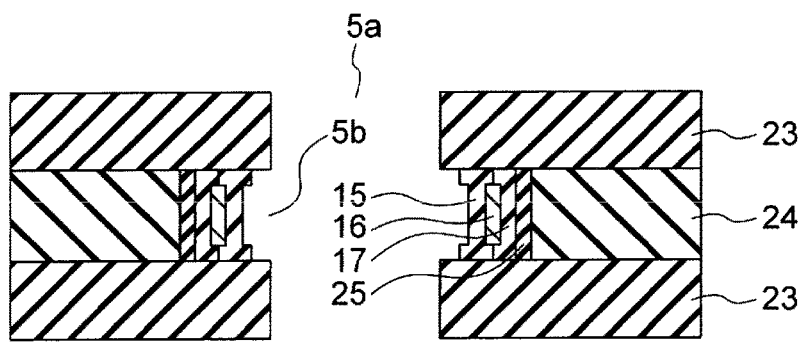
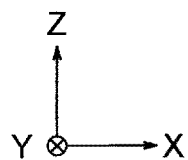

FIG. 42
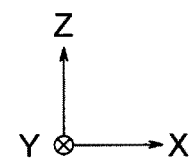
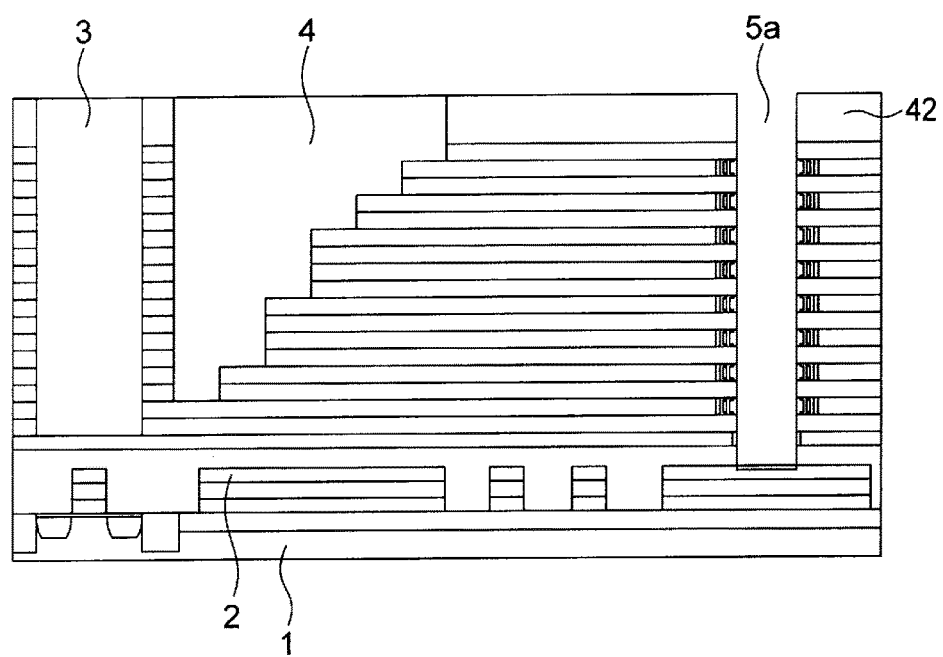

FIG. 43
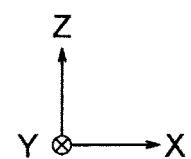
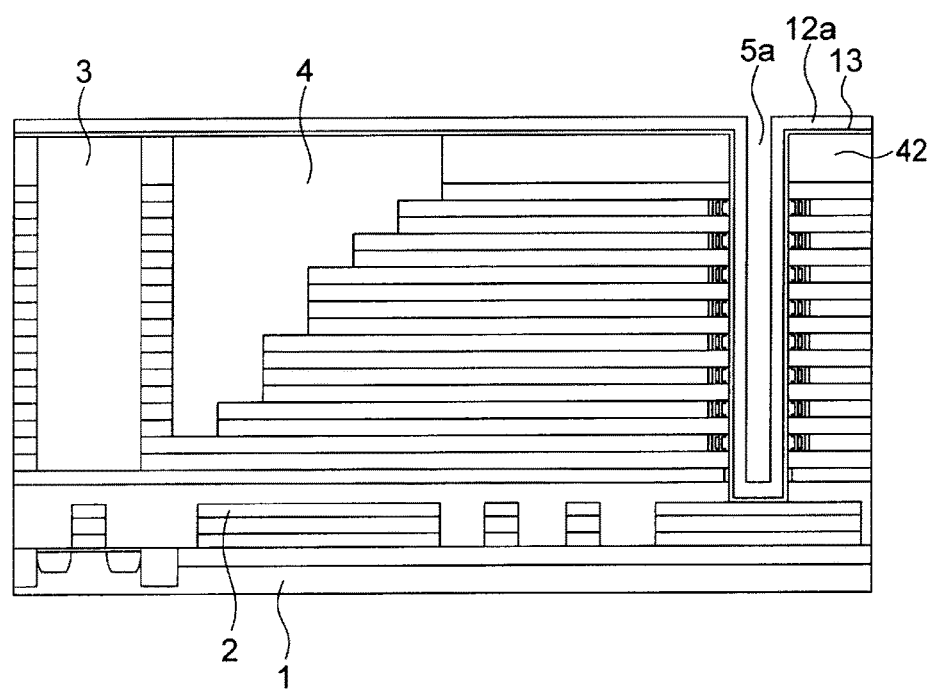

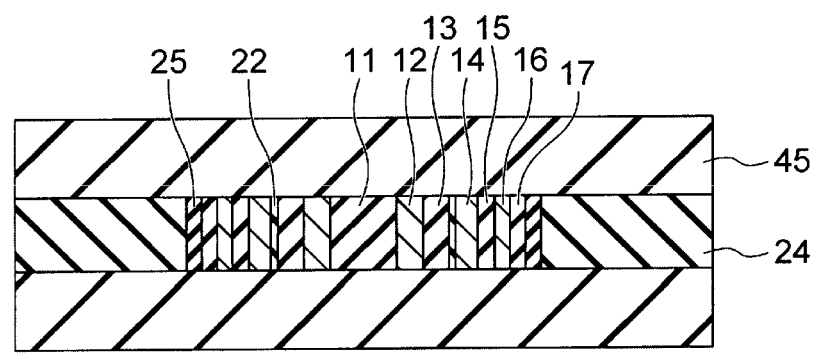
FIG. 50A
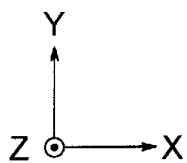
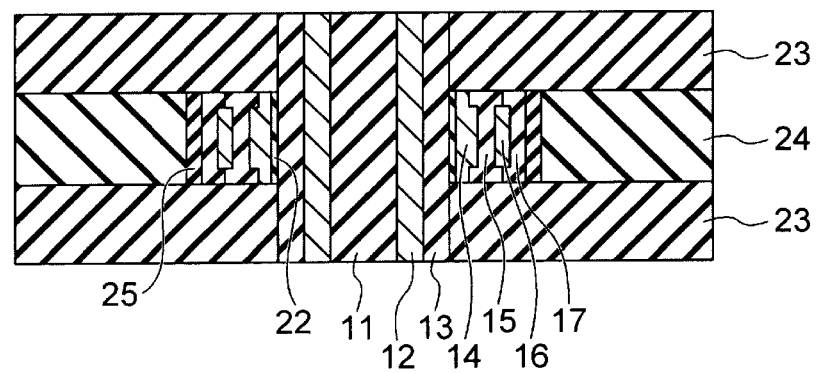
FIG. 50B
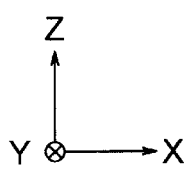

FIG. 51A
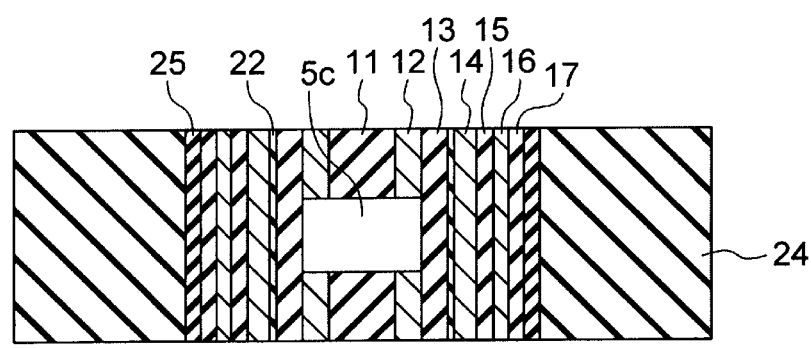
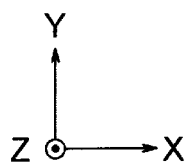
FIG. 51B
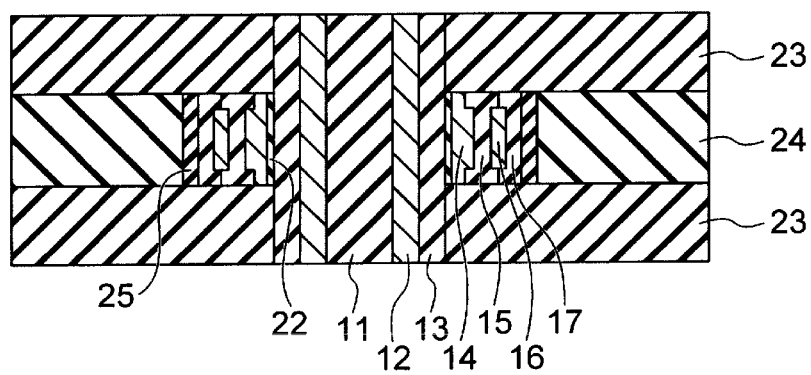
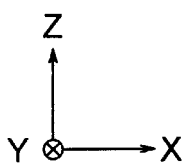

FIG. 54A
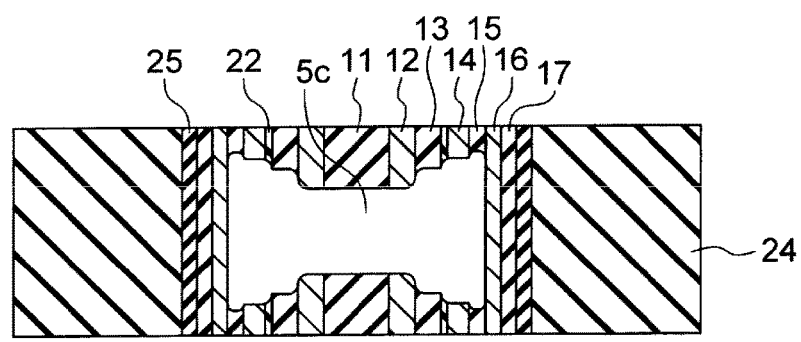
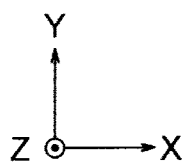
FIG. 54B
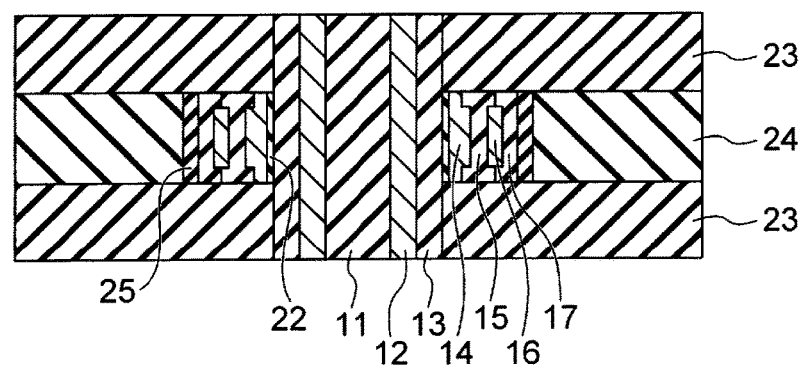
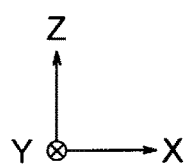

FIG. 55A
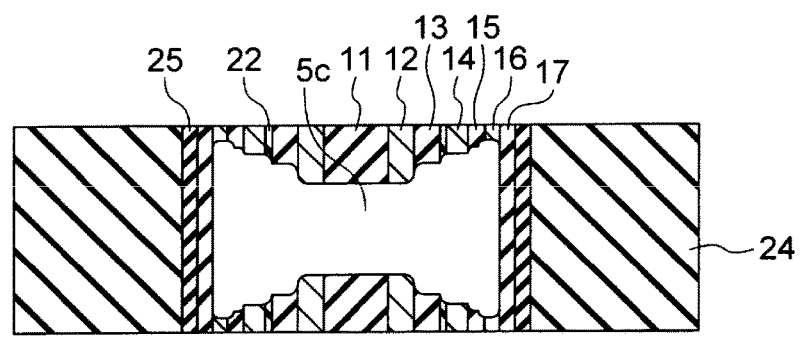
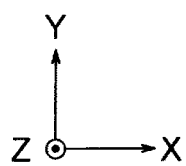
FIG. 55B
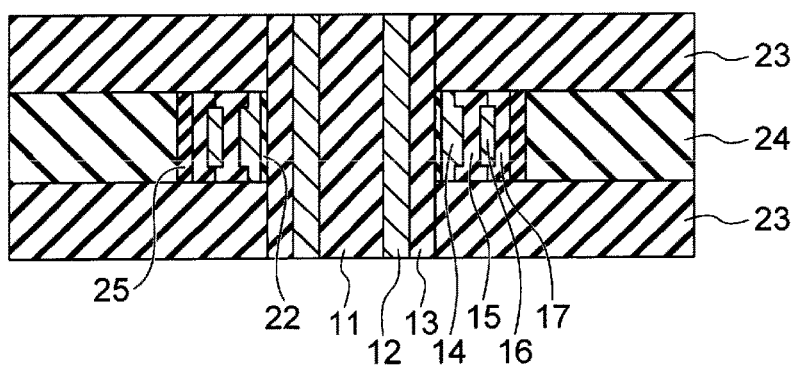
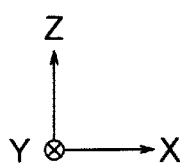

FIG. 56A
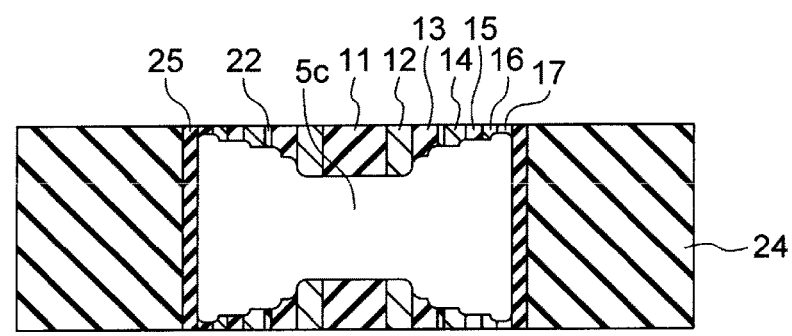
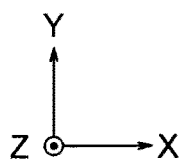
FIG. 56B
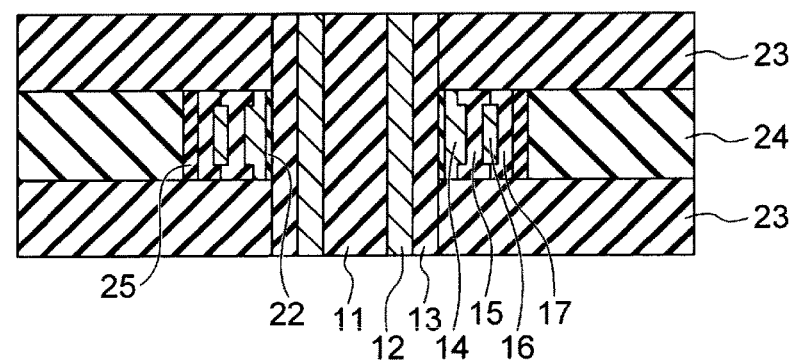
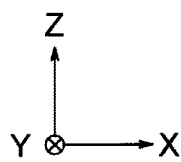

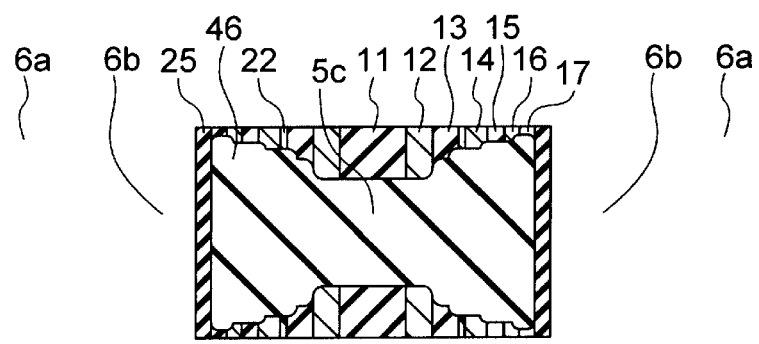
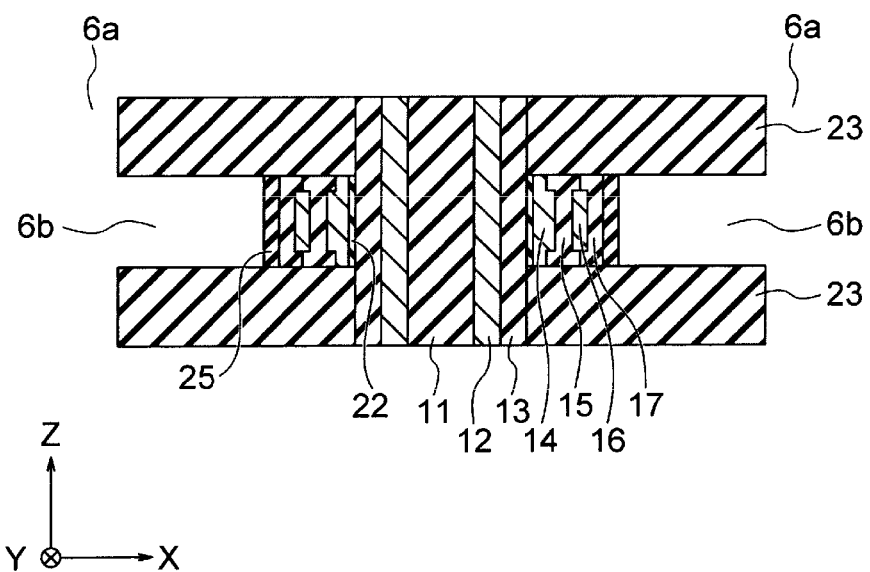

FIG. 63A
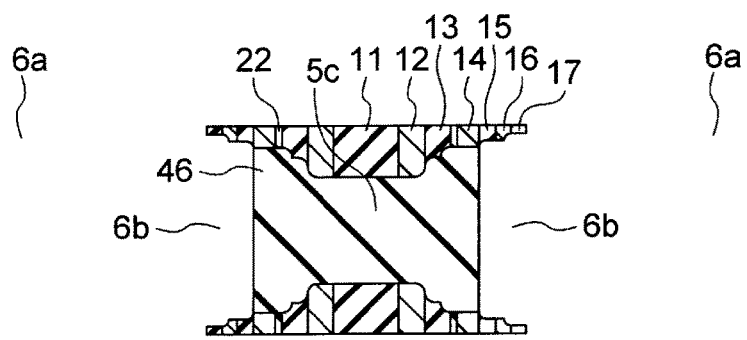
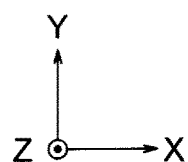
FIG. 63B
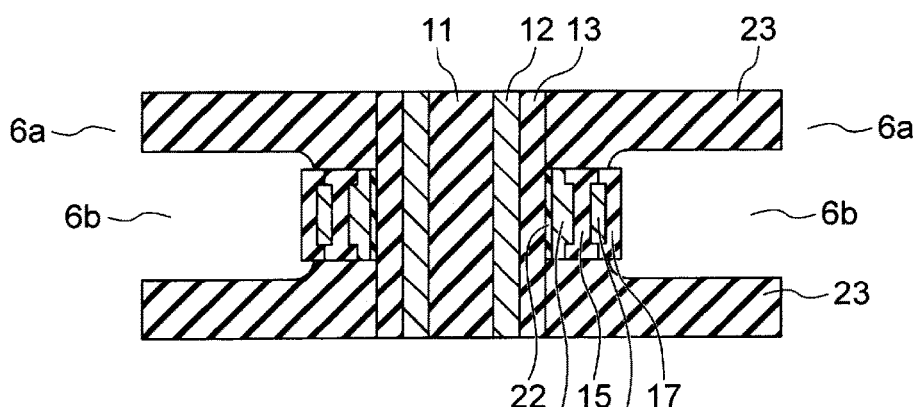
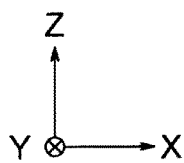

FIG. 65A
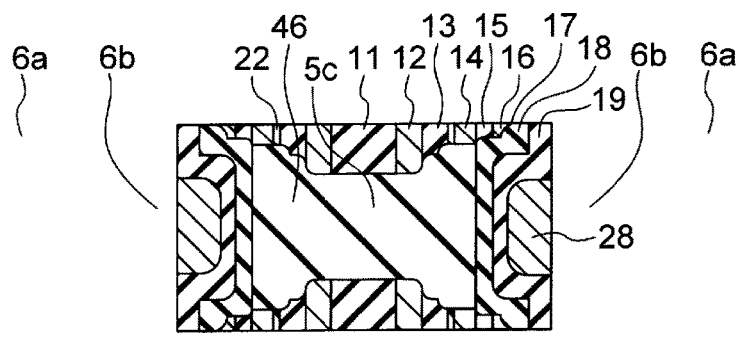
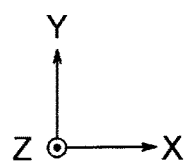
FIG. 65B
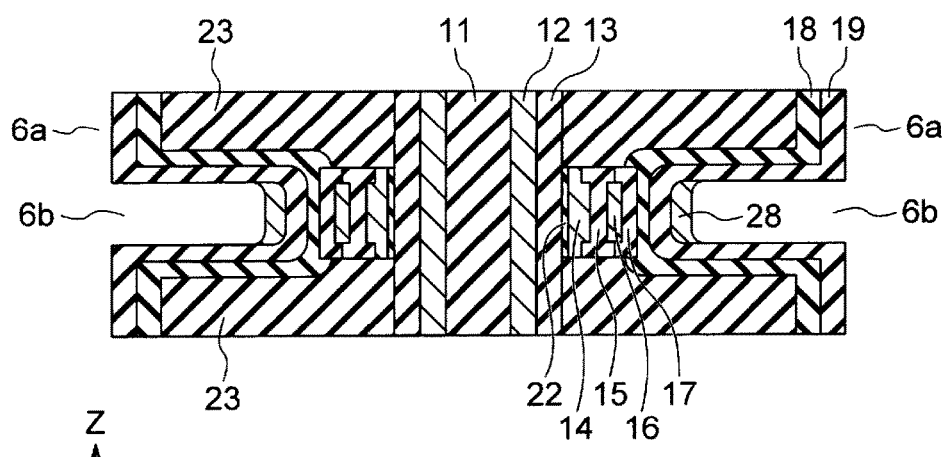
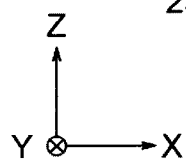

FIG. 66A
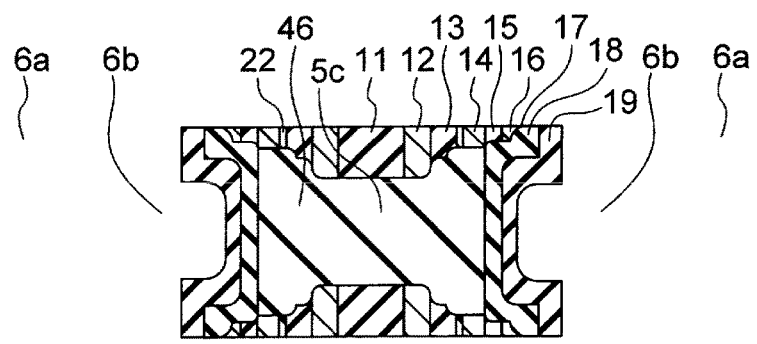
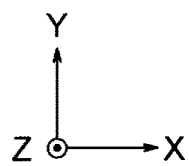
FIG. 66B
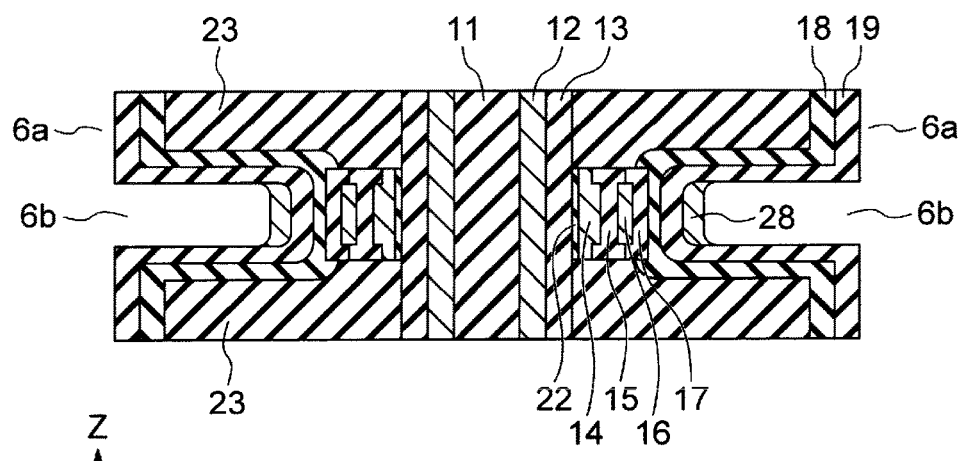
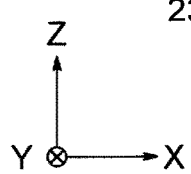

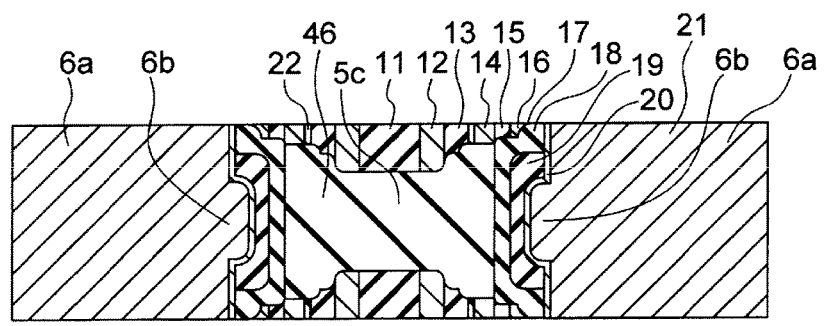
FIG. 67A
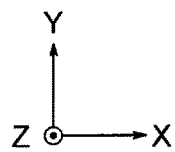
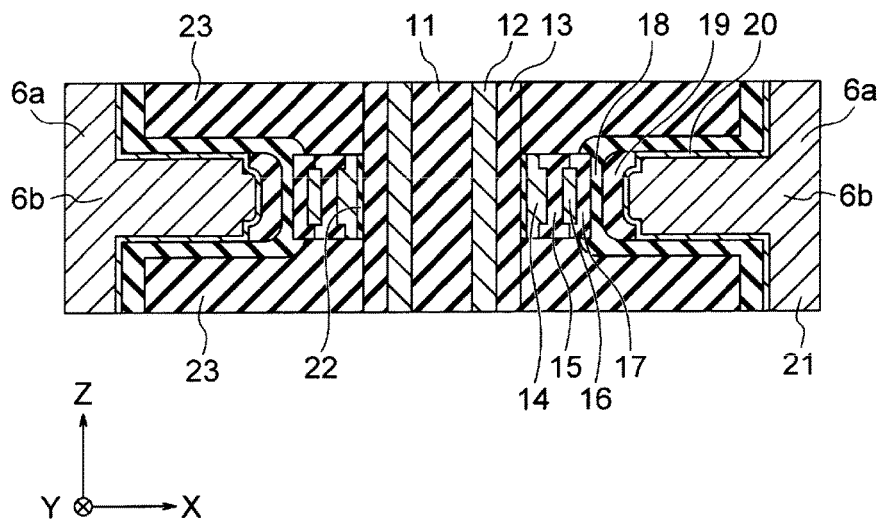
FIG. 67B
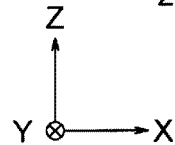

FIG. 68A
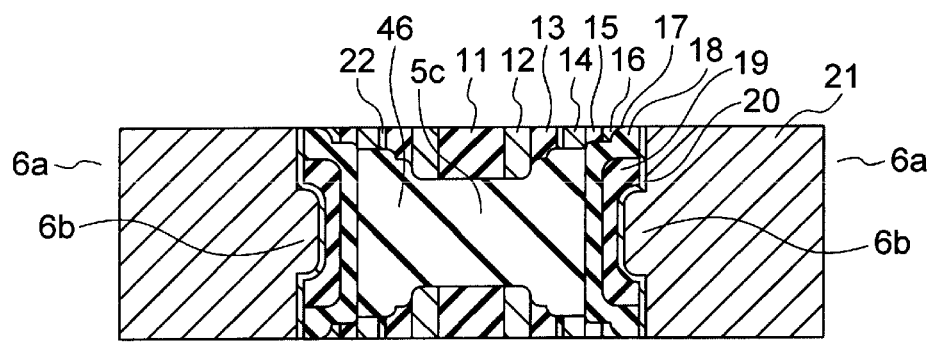
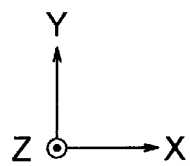
FIG. 68B
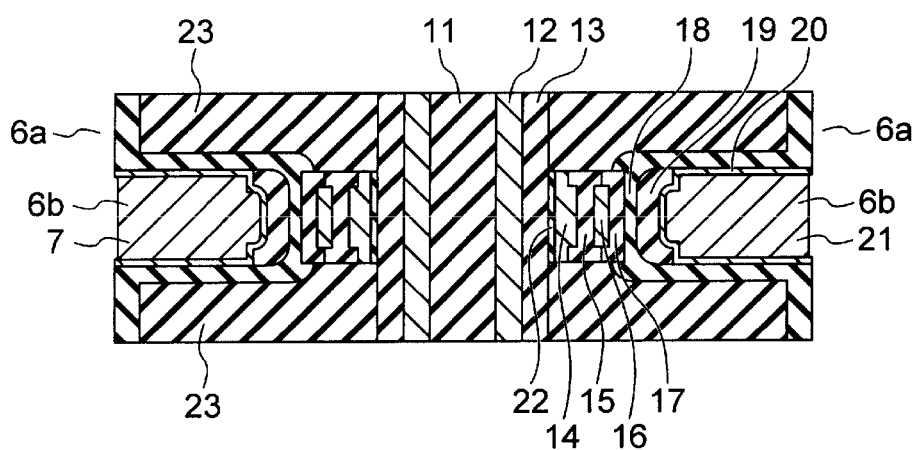
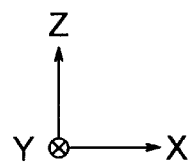

FIG. 76A
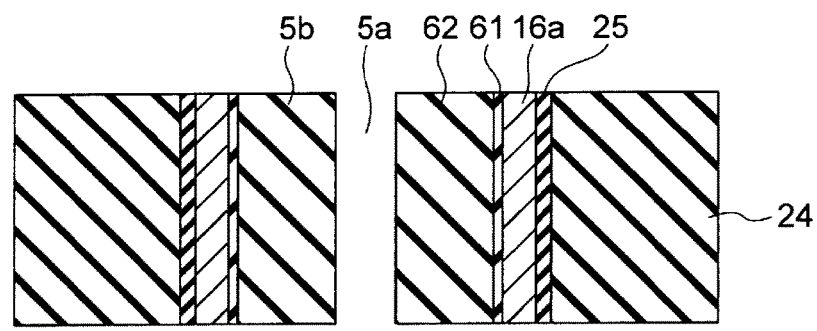
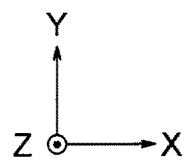
FIG. 76B
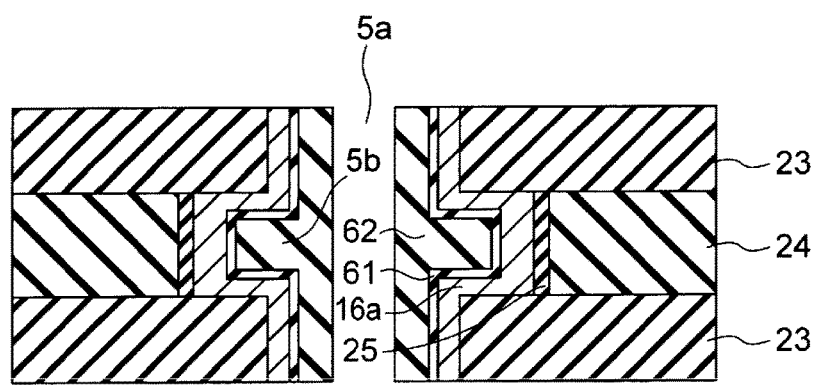
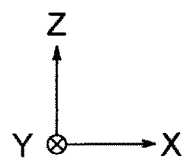

FIG. 81A
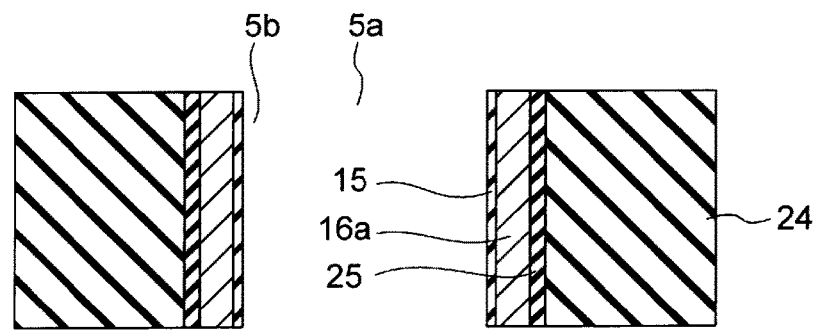
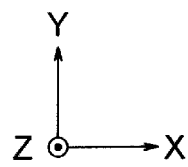
FIG. 81B
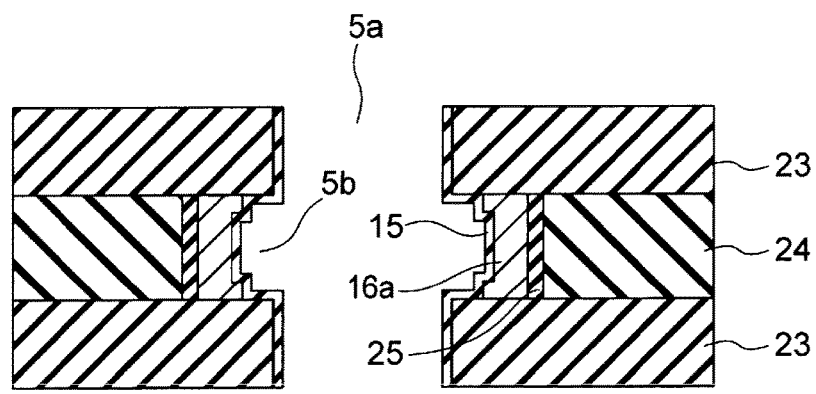
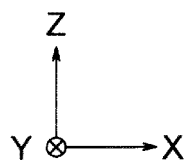

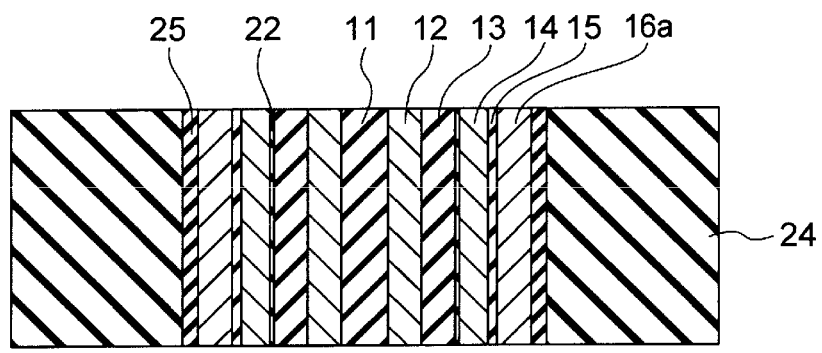
FIG. 86A
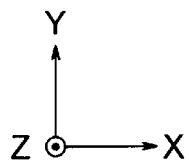
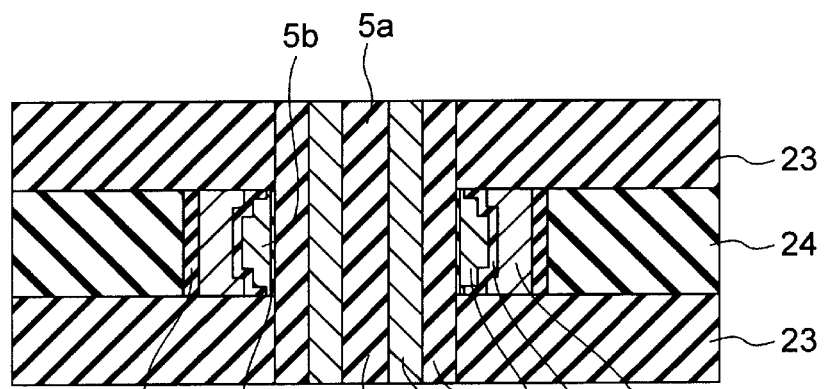
FIG. 86B
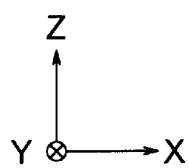

FIG. 92
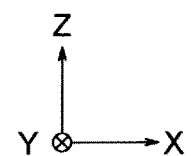
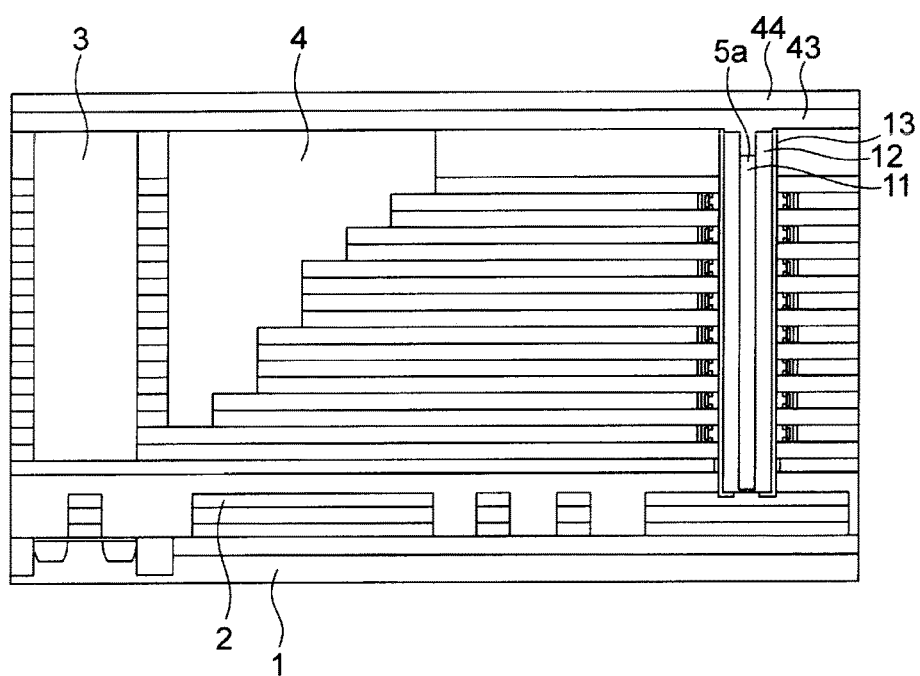

FIG. 112A
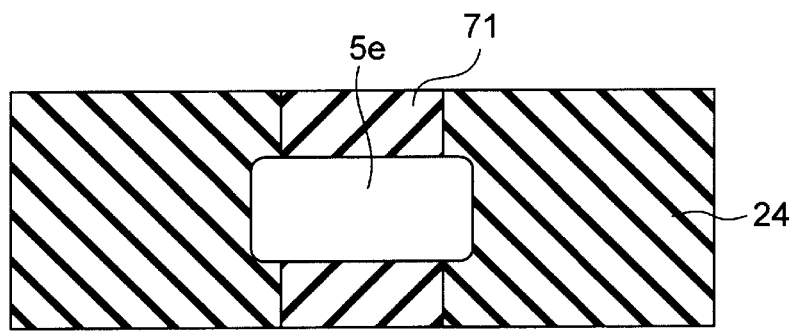
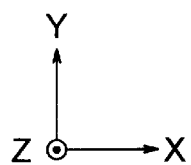
FIG. 112B
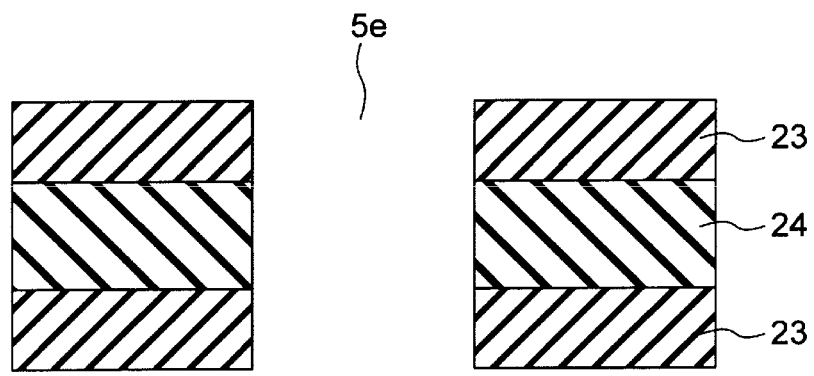
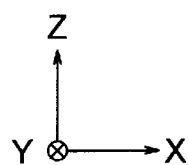

US 10,276,586 B2

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2016-047426, filed Mar. 10, 2016, the entire contents of which are incorporated herein by reference.

FIELD

Embodiments described herein relate generally to a semiconductor device and a method for manufacturing the same.

BACKGROUND

A memory cell of a three-dimensional memory is commonly of a metal/oxide/nitride/oxide/silicon (MONOS) type. A MONOS type memory cell includes a channel semiconductor layer that is a silicon layer, a tunnel insulating film that is an oxide film, a charge trapping film that is a nitride film, a block insulating film that is an oxide film, and a control gate that is a metal layer.

A MONOS type memory cell includes, as a charge storage layer, a charge trapping film instead of a floating gate. A floating gate generally includes a semiconductor layer such as a polysilicon layer and a conductive layer, such as a metal layer, while a charge trapping film generally includes an insulating film, such as a silicon nitride film. A MONOS type three-dimensional memory cell is advantageous in that the thickness of the charge trapping film can be smaller than the thickness of the floating gate, but suffers from a low erase speed and an increase in interference between memory cells when the memory cell is miniaturized.

Therefore, suggested is forming a floating gate and an inter-gate insulating film between the tunnel insulating film and the charge trapping film in the MONOS type three-dimensional memory cell. In this case, storing charges in the charging trapping film and not in the floating gate allows the floating gate to have a small thickness. Furthermore, using a high-k film as the charge trapping film allows a large amount of charge to be stored in the charge trapping film. However, a problem arises in that charges in the charge trapping film are likely to leak to the floating gate. That is, a three-dimensional memory cell, including a floating gate and a charge trapping film, suffers from a low charge retaining ability, through having a high charge storing ability.

DESCRIPTION OF THE DRAWINGS

FIGS. 18A and 18B are enlarged sectional views illustrating the structure of the semiconductor device according to the first comparative example of the first embodiment.

FIG. 26 is a sectional view illustrating a method for manufacturing the semiconductor device according to the second embodiment.

FIG. 27 is a sectional view illustrating a method for manufacturing the semiconductor device according to the second embodiment.

FIG. 31 is a sectional view illustrating a method for manufacturing the semiconductor device according to the second embodiment.

FIG. 32 is a sectional view illustrating a method for manufacturing the semiconductor device according to the second embodiment.

FIGS. 38A and 38B are enlarged sectional views illustrating a method for manufacturing the semiconductor device according to the second embodiment.

FIG. 42 is a sectional view illustrating a method for manufacturing the semiconductor device according to the second embodiment.

FIG. 43 is a sectional view illustrating a method for manufacturing the semiconductor device according to the second embodiment.

FIGS. 50A and 50B are enlarged sectional views illustrating a method for manufacturing the semiconductor device according to the second embodiment.

FIGS. 51A and 51B are enlarged sectional views illustrating a method for manufacturing the semiconductor device according to the second embodiment.

FIGS. 54A and 54B are enlarged sectional views illustrating a method for manufacturing the semiconductor device according to the second embodiment.

FIGS. 55A and 55B are enlarged sectional views illustrating a method for manufacturing the semiconductor device according to the second embodiment.

FIGS. 56A and 56B are enlarged sectional views illustrating a method for manufacturing the semiconductor device according to the second embodiment.

FIGS. 62A and 62B are enlarged sectional views illustrating a method for manufacturing the semiconductor device according to the second embodiment.

FIGS. 63A and 63B are enlarged sectional views illustrating a method for manufacturing the semiconductor device according to the second embodiment.

FIGS. 65A and 65B are enlarged sectional views illustrating a method for manufacturing the semiconductor device according to the second embodiment.

FIGS. 66A and 66B are enlarged sectional views illustrating a method for manufacturing the semiconductor device according to the second embodiment.

FIGS. 67A and 67B are enlarged sectional views illustrating a method for manufacturing the semiconductor device according to the second embodiment.

FIGS. 68A and 68B are enlarged sectional views illustrating a method for manufacturing the semiconductor device according to the second embodiment.

FIGS. 76A and 76B are enlarged sectional views illustrating a method for manufacturing the semiconductor device according to the third embodiment.

FIGS. 81A and 81B are enlarged sectional views illustrating a method for manufacturing the semiconductor device according to the third embodiment.

FIGS. 86A and 86B are enlarged sectional views illustrating a method for manufacturing the semiconductor device according to the third embodiment.

FIG. 92 is a sectional view illustrating a method for manufacturing the semiconductor device according to the third embodiment.

FIGS. 112A and 112B are enlarged sectional views illustrating a method for manufacturing the semiconductor device according to the fourth embodiment.

FIGS. 120A and 120B are enlarged sectional views illustrating a method for manufacturing the semiconductor device according to the fourth embodiment.

FIGS. 121A and 121B are enlarged sectional views illustrating a method for manufacturing the semiconductor device according to the fourth embodiment.

FIGS. 122A and 122B are enlarged sectional views illustrating a method for manufacturing the semiconductor device according to the fourth embodiment.

FIGS. 123A and 123B are enlarged sectional views illustrating a method for manufacturing the semiconductor device according to the fourth embodiment.

FIGS. 124A and 124B are enlarged sectional views illustrating a method for manufacturing the semiconductor device according to the fourth embodiment.

FIG. 125 is a sectional view illustrating a method for manufacturing the semiconductor device according to the fourth embodiment.

FIG. 126 is a sectional view illustrating a method for manufacturing the semiconductor device according to the fourth embodiment.

FIGS. 127A and 127B are enlarged sectional views illustrating a method for manufacturing the semiconductor device according to the fourth embodiment.

FIGS. 128A and 128B are enlarged sectional views illustrating a method for manufacturing the semiconductor device according to the fourth embodiment.

FIGS. 129A and 129B are enlarged sectional views illustrating a method for manufacturing the semiconductor device according to the fourth embodiment.

FIGS. 130A and 130B are enlarged sectional views illustrating a method for manufacturing the semiconductor device according to the fourth embodiment.

FIGS. 131A and 131B are enlarged sectional views illustrating a method for manufacturing the semiconductor device according to the fourth embodiment.

Figure 132A:
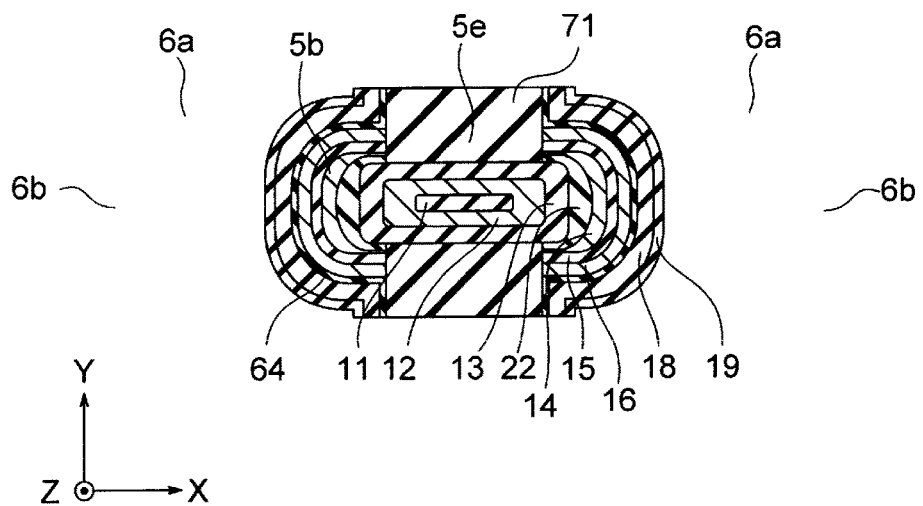
Figure 132B:
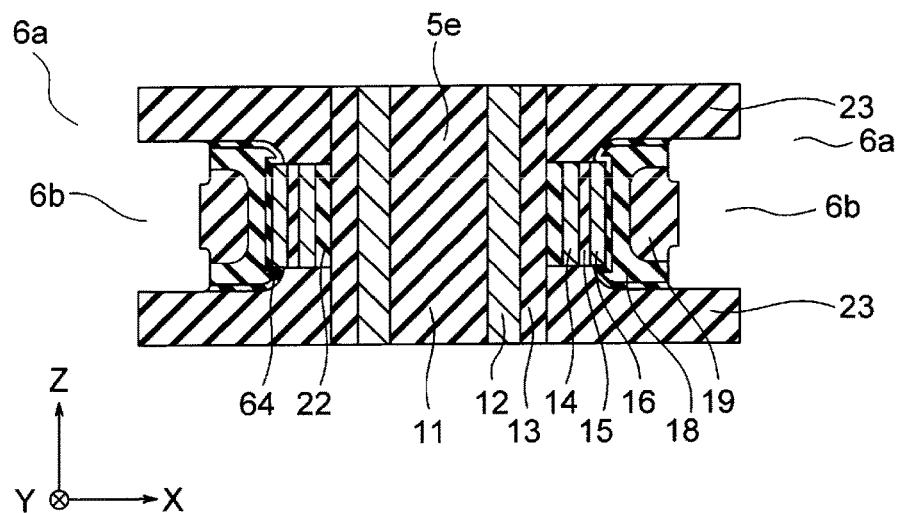

FIGS. 132A and 132B are enlarged sectional views illustrating a method for manufacturing the semiconductor device according to the fourth embodiment.

Figure 133A:
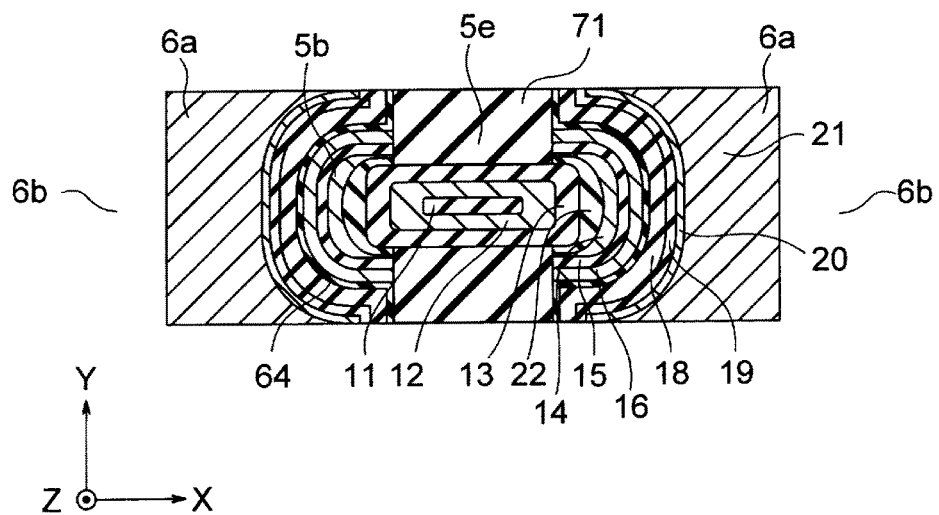
Figure 133B:
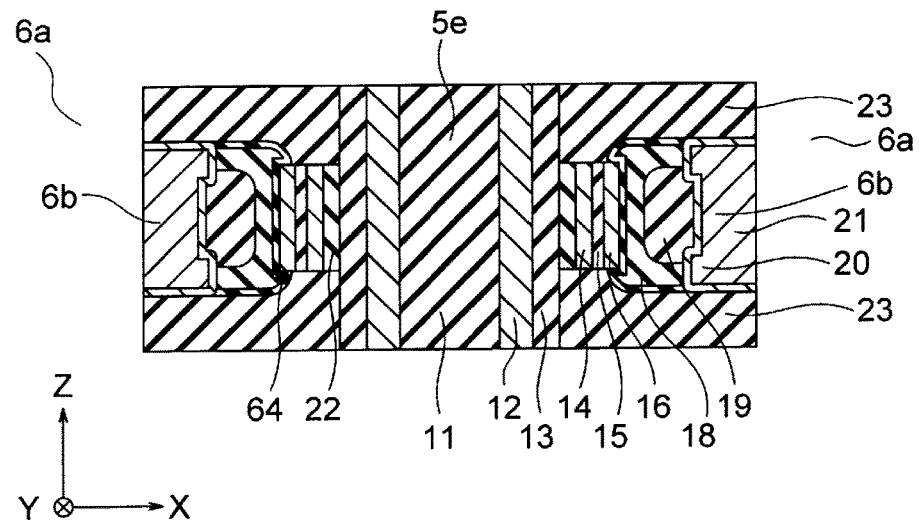

FIGS. 133A and 133B are enlarged sectional views illustrating a method for manufacturing the semiconductor device according to the fourth embodiment.

Figure 134:
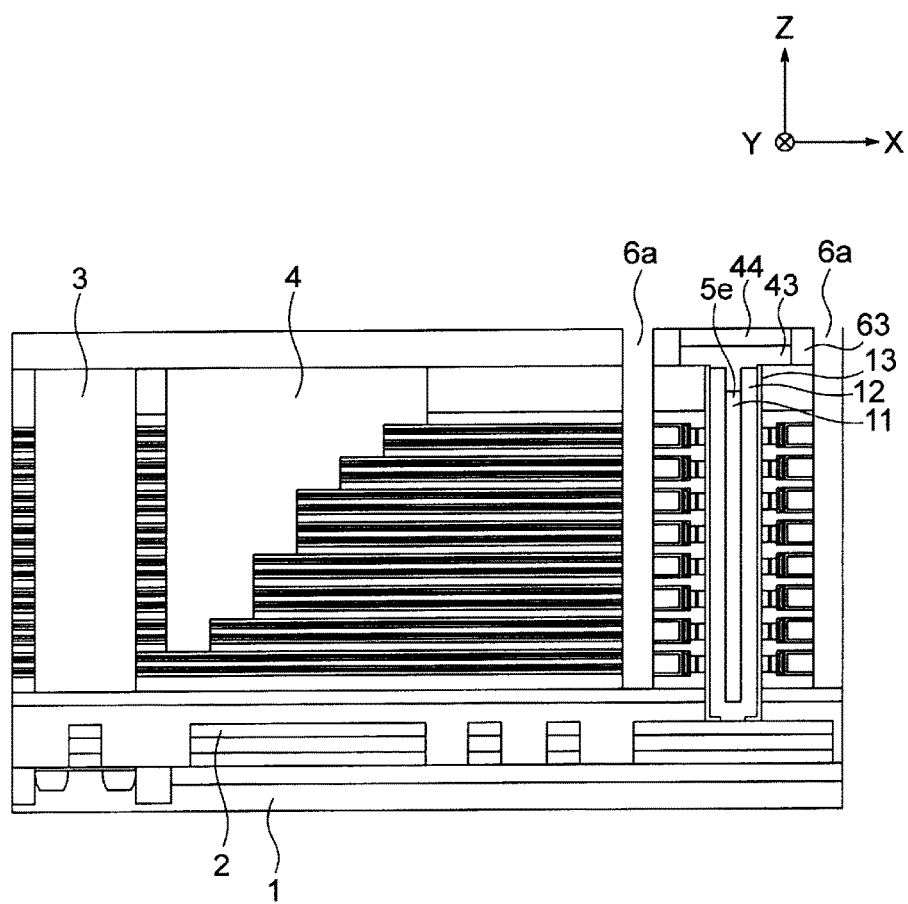

FIG. 134 is a sectional view illustrating a method for manufacturing the semiconductor device according to the fourth embodiment.

Figure 135:
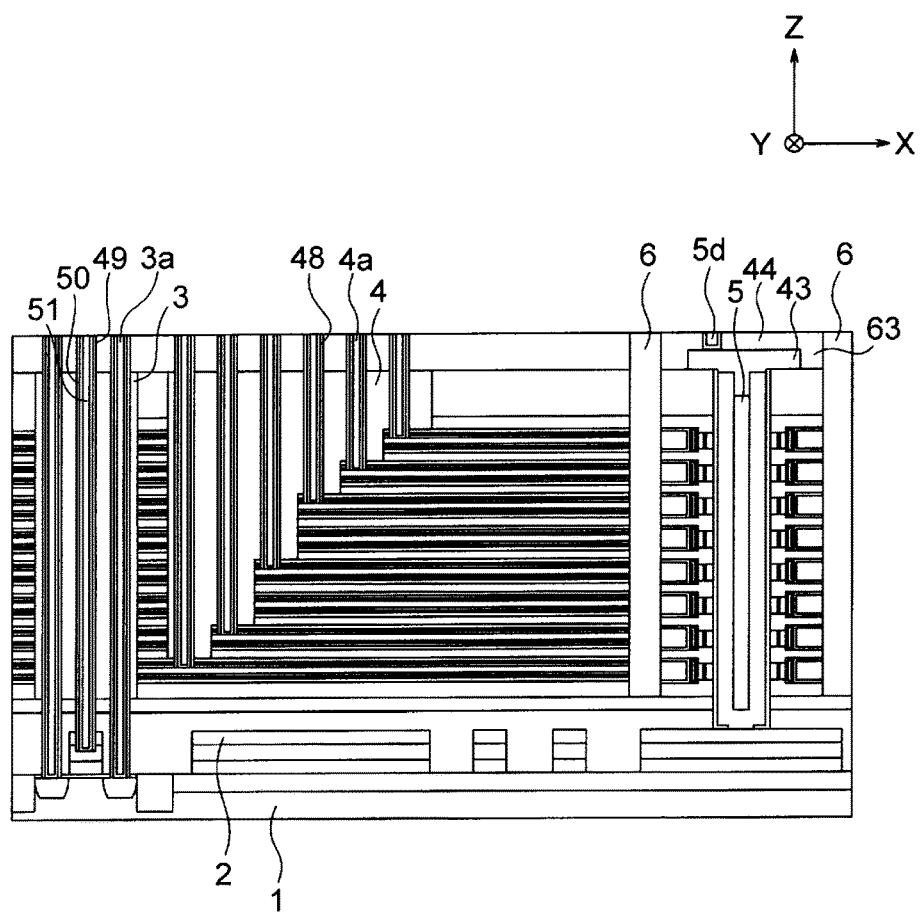

FIG. 135 is a sectional view illustrating a method for manufacturing the semiconductor device according to the fourth embodiment.

DETAILED DESCRIPTION

According to an embodiment, there are provided a semiconductor device and a method for manufacturing the same that provides an improvement in charge storing ability and charge retaining ability of a three-dimensional memory cell.

In general, according to one embodiment, a semiconductor device includes a substrate and a semiconductor layer that extends in a direction perpendicular to a surface of the substrate. The device further includes a first electrode layer that is provided on a side surface of the semiconductor layer with a first insulating film interposed therebetween. The device further includes a charge storage layer provided on a side surface of the first electrode layer with a second insulating film interposed therebetween. The device further includes a second electrode layer that is provided on a side surface of the charge storage layer with a third insulating film interposed therebetween.

Hereinafter, embodiments will be described with reference to the drawings.

Figure 1:
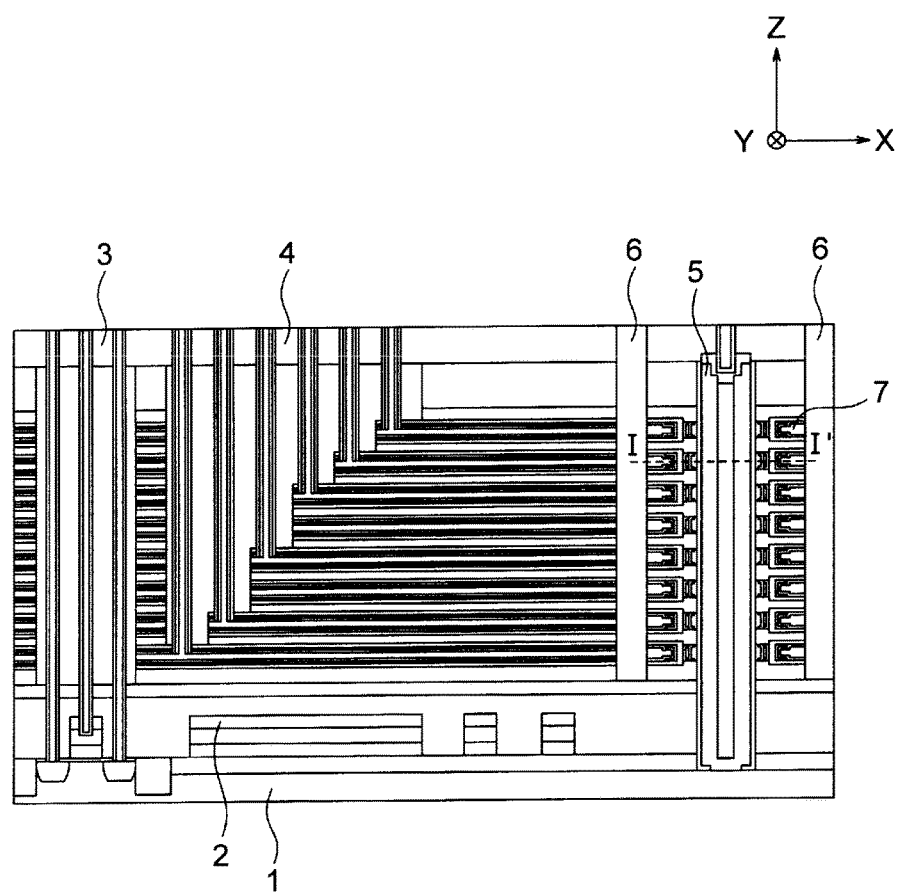
FIG. 1 is a sectional view illustrating the structure of a semiconductor device according to a first embodiment.

First Embodiment (1) Structure of Semiconductor Device According to First Embodiment FIG. 1 is a sectional view illustrating the structure of a semiconductor device according to a first embodiment.

FIG. 1 illustrates a base MOSFET unit 2, a peripheral transistor unit 3, a stepped contact portion 4, a memory element unit 5, a slit trench portion 6, and a plurality of memory cell units 7 formed on a substrate 1. The semiconductor device according to the present embodiment includes a three-dimensional memory.

Examples of the substrate 1 include a semiconductor substrate such as a silicon substrate. FIG. 1 illustrates an X direction and a Y direction that are parallel to the surface of the substrate 1 and are perpendicular to each other, and a Z direction that is perpendicular to the surface of the substrate 1. The +Z direction will be regarded as an upward direction and the −Z direction as a downward direction in the present disclosure. The −Z direction of the present embodiment may or may not be the direction of gravity.

The base MOSFET unit 2 includes a plurality of transistors corresponding to a MOSFET. A stacked memory area of the three-dimensional memory is provided on the base MOSFET unit 2. The stacked memory area includes the peripheral transistor unit 3, the stepped contact portion 4, the memory element unit 5, the slit trench portion 6, and the memory cell units 7.

The peripheral transistor unit 3 is electrically connected to the MOSFET of the base MOSFET unit 2. The stepped contact portion 4 is used in order to form a contact plug on each word line of the stacked memory area. The memory element unit 5 includes a channel semiconductor layer and an electrode layer of the three-dimensional memory. Each memory element unit 5 includes the plurality of memory cell units 7, and each memory cell unit 7 includes a floating gate, a charge trapping film, a control gate, and the like. The slit trench portion 6 is used in order to divide memory cells and form the electrode layer of the memory element unit 5.

Figure 2A:
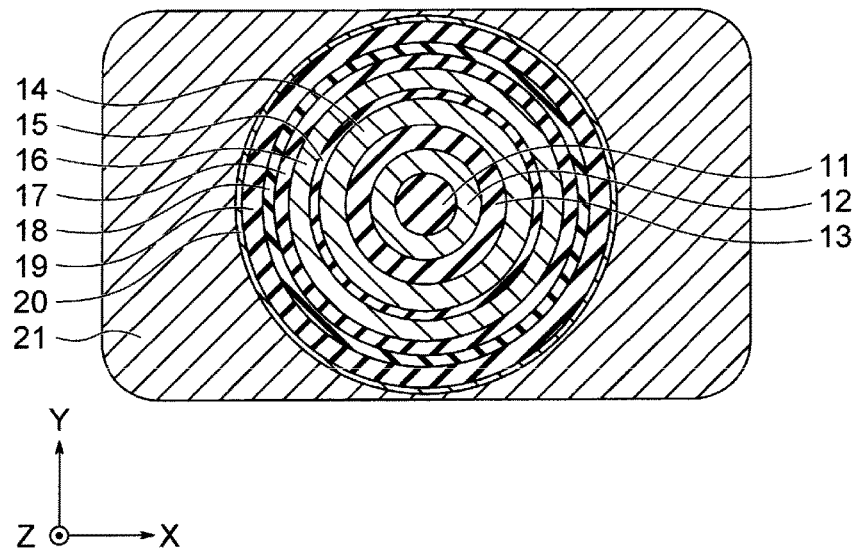
FIGS. 2A and 2B are enlarged sectional views illustrating the structure of the semiconductor device according to the first embodiment.
Figure 2B:
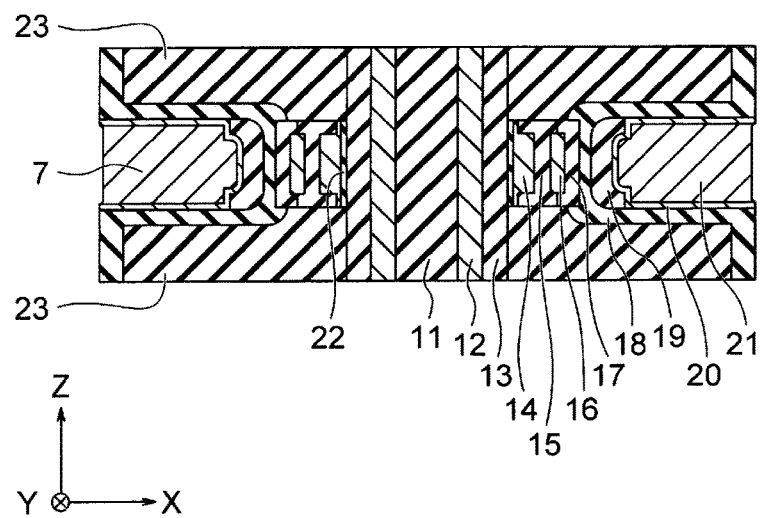

FIGS. 2A and 2B are enlarged sectional views illustrating the structure of the semiconductor device according to the first embodiment. FIG. 2A illustrates a horizontal section (top view) taken along a line I-I' in FIG. 1. FIG. 2B illustrates a vertical section (side view) near the line I-I' in FIG. 1. FIG. 2A and FIG. 2B illustrate sections of one memory cell.

FIG. 2A and FIG. 2B illustrate a core layer 11, a channel semiconductor layer 12, a tunnel insulating film 13, a floating gate (FG) layer 14, an inter-gate insulating film 15, a first charge trapping (CT) film 16, a second charge trapping (CT) film 17, a first block insulating film 18, a second block insulating film 19, a barrier metal layer 20, a control gate (CG) layer 21, an oxide film 22, and a plurality of insulating layers 23 formed on the substrate 1. The channel semiconductor layer 12 is an example of a semiconductor layer. The tunnel insulating film 13 is an example of a first insulating film. The FG layer 14 is an example of a first electrode layer. The inter-gate insulating film 15 is an example of a second insulating film. The first and second CT films 16 and 17 are examples of a charge storage layer. The first and second block insulating films 18 and 19 are examples of a third insulating film. The barrier metal layer 20 and the CG layer 21 are examples of a second electrode layer.

The core layer 11, the channel semiconductor layer 12, and the tunnel insulating film 13 extend in the Z direction. Examples of the core layer 11 include an insulating film such as a silicon oxide film ($SiO_2$) and a semiconductor layer such as a $p^+$ type silicon layer. Examples of the channel semiconductor layer 12 include a polysilicon layer. Examples of the tunnel insulating film 13 include a silicon oxynitride film (SiON). The horizontal sectional shape of the core layer 11 of the present embodiment is a circular shape. The horizontal sectional shapes of the channel semiconductor layer 12 and the tunnel insulating film 13 of the present embodiment are annular shapes. The channel semiconductor layer 12 is formed on the side surface of the core layer 11. The tunnel insulating film 13 is formed on the side surface of the channel semiconductor layer 12.

The FG layer 14 is formed on the side surface of the channel semiconductor layer 12 with the tunnel insulating film 13 interposed therebetween. Examples of the FG layer 14 include a polysilicon layer. The oxide film 22 that is formed by oxidation of the FG layer 14 is provided between the tunnel insulating film 13 and the FG layer 14. The FG layer 14 of the present embodiment annularly encloses the tunnel insulating film 13.

The first CT film 16 is formed on the side surface of the FG layer 14 with the inter-gate insulating film 15 interposed therebetween, and the second CT film 17 is formed on the side surface of the first CT film 16. Examples of the inter-gate insulating film 15 include a silicon nitride film (SiN). Examples of the first CT film 16 include a semiconductor layer such as a polysilicon layer. Examples of the second CT film 17 include an insulating film such as a high-k film (high dielectric film). Examples of the high-k film include an HfSiON film. Hf, Si, O, and N respectively represent hafnium, silicon, oxygen, and nitrogen. The nitrogen composition ratio of the HfSiON film is greater than or equal to 10%. Accordingly, the HfSiON film is soluble in acid such as phosphoric acid, and the HfSiON film can be selectively etched. The nitrogen composition ratio of the HfSiON film may be greater than or equal to 10% and less than or equal to 40%. The reason is that when the nitrogen composition ratio of the HfSiON film exceeds 40%, the HfSiON crystallization speed is decreased, and amorphous HfSiON is likely to remain. The first and second CT films 16 and 17 of the present embodiment annularly enclose the inter-gate insulating film 15.

The first and second CT films 16 and 17 in the present embodiment are used as a charge storage layer to store charges. In this case, when the charge storage layer is formed with only an insulating film, charges gather on the surface of the insulating film, and charges are likely to leak to the FG layer 14. The charge storage layer of the present embodiment includes the first and second CT films 16 and 17. Thus, configuring the first CT film 16 as a semiconductor layer and the second CT film 17 as an insulating film prevents charges on the surface of the second CT film 17 from leaking to the FG layer 14 in the present embodiment. The reason is that charges separated from the second CT film 17 stay in the first CT film 16 between the second CT film 17 and the FG layer 14. Thus, according to the present embodiment, the charge retaining ability of the charge storage layer can be improved. Furthermore, according to the present embodiment, the charge storing ability of the charge storage layer can be improved by configuring the second CT film 17 with a high-k film.

The inter-gate insulating film 15 is separated from the tunnel insulating film 13 by the FG layer 14 and the oxide film 22 and is not in contact with the tunnel insulating film 13 in the present embodiment. Furthermore, the first and second CT films 16 and 17 are separated from the tunnel insulating film 13 by the inter-gate insulating film 15, the FG layer 14, and the oxide film 22 and are not in contact with the tunnel insulating film 13. Accordingly, charges in the first and second CT films 16 and 17 are unlikely to leak to the channel semiconductor layer 12, and the charge retaining ability of the first and second CT films 16 and 17 can be further improved. Both of the first CT film 16 and the second CT film 17 are in contact with the inter-gate insulating film 15 in the present embodiment.

The barrier metal layer 20 is formed on the side surface of the second CT film 17 with the first and second block insulating films 18 and 19 interposed therebetween. The CG layer 21 is formed on the side surface of the second CT film 17 with the first and second block insulating films 18 and 19 and the barrier metal layer 20 interposed therebetween. Examples of the first block insulating film 18 include a silicon oxide film. Examples of the second block insulating film 19 include an HfSiON film. Examples of the barrier metal layer 20 include a titanium nitride (TiN) layer. Examples of the CG layer 21 include a tungsten (W) layer.

The memory cell units 7 and the insulating layers 23 are alternately stacked on the substrate 1. Each memory cell unit 7 includes the FG layer 14, the inter-gate insulating film 15, the first CT film 16, the second CT film 17, the first block insulating film 18, the second block insulating film 19, the barrier metal layer 20, the CG layer 21, and the oxide film 22. Each memory cell unit 7 is formed between the adjacent insulating layers 23 as illustrated in FIG. 2B. The channel semiconductor layer 12 and the tunnel insulating film 13 are formed on side surfaces of the insulating layers 23 as illustrated in FIG. 2B.

The first block insulating film 18 in the present embodiment is formed on the side surface of the second CT film 17, the lower surface of the insulating layer 23 above, and the upper surface of the insulating layer 23 below. The second block insulating film 19 is formed on only the side surface of the first block insulating film 18 and is not formed on the lower surface of the first block insulating film 18 above and the upper surface of the first block insulating film 18 below. Consequently, the barrier metal layer 20 is in contact with the lower surface of the first block insulating film 18 above, the upper surface of the first block insulating film 18 below, and the side surface of the second block insulating film 19. The CG layer 21 is formed on the lower surface of the first block insulating film 18 above, the upper surface of the first block insulating film 18 below, and the side surface of the second block insulating film 19 with the barrier metal layer 20 interposed therebetween. Such a structure is advantageous in that the electrical resistance of the CG layer 21 can be decreased by increasing the volume of the CG layer 21.

(2) Method for Manufacturing Semiconductor Device According to First Embodiment

FIG. 3A to FIG. 16B are enlarged sectional views illustrating a method for manufacturing the semiconductor device according to the first embodiment.

Figure 3A:
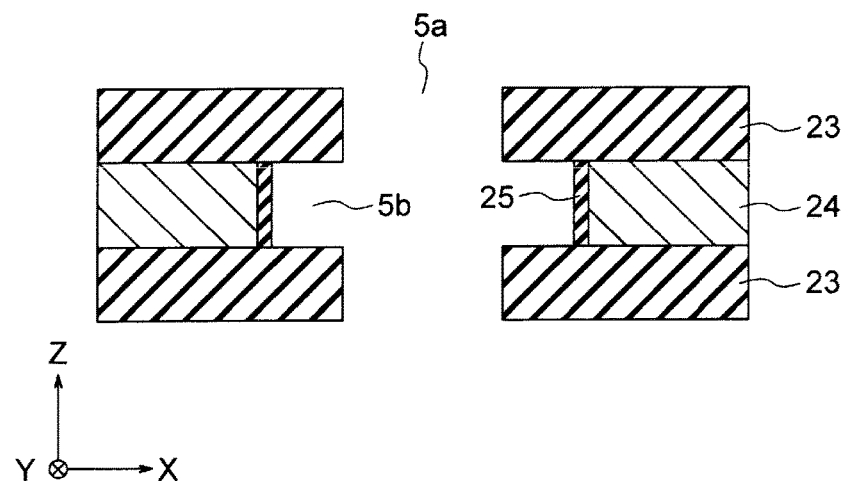
FIGS. 3A and 3B are enlarged sectional views illustrating a method for manufacturing the semiconductor device according to the first embodiment.

First, the plurality of insulating layers 23 and a plurality of sacrificial layers 24 are alternately formed on the substrate 1, and a memory hole 5a that extends in the Z direction is formed in the insulating layers 23 and the sacrificial layers 24 (FIG. 3A). The sacrificial layers 24 are, for example, polysilicon layers. The memory hole 5a is used to form the memory element unit 5. The sacrificial layers 24 are an example of a first film. The memory hole 5a is an example of a first recess portion.

Next, the sacrificial layers 24 that are exposed to the memory hole 5a are recessed, and a recess portion 5b is formed adjacent to the sacrificial layers 24 (FIG. 3A). The sacrificial layers 24 are recessed by, for example, a tetramethylammonium hydroxide (TMAH) treatment at room temperature. The recess portion 5b is an example of a second recess portion. Next, a modified oxide film 25 is formed by dry $O_2$ oxidation on the surfaces of the sacrificial layers 24 (FIG. 3A).

Figure 3B:
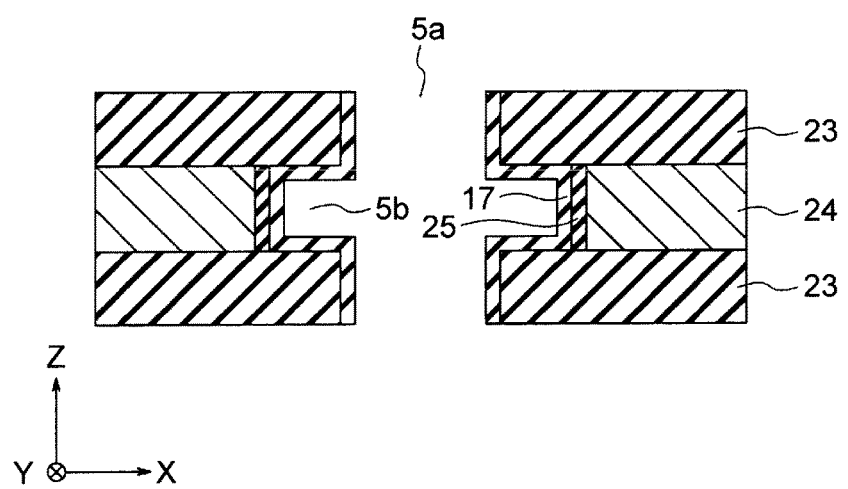

Next, the second CT film 17 is formed on the entire surface of the substrate 1 by chemical vapor deposition (CVD) (FIG. 3B). Consequently, the second CT film 17 is formed on the side surface of the modified oxide film 25 and the upper surface and the lower surface of the recess portion 5b. Examples of the second CT film 17 include an HfSiON film. Next, the second CT film 17 is crystallized by rapid thermal annealing (RTA) (FIG. 3B).

Figure 4A:
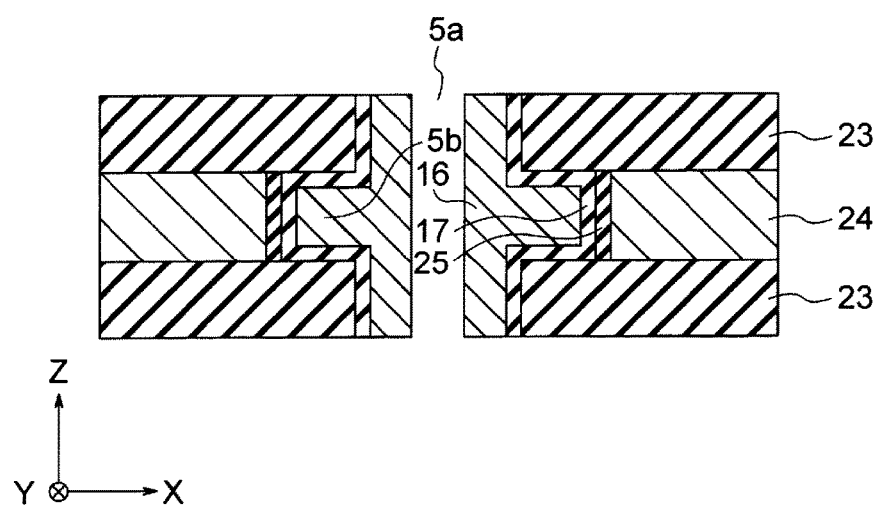
FIGS. 4A and 4B are enlarged sectional views illustrating a method for manufacturing the semiconductor device according to the first embodiment.

Next, the first CT film 16 is formed on the entire surface of the substrate 1 by CVD (FIG. 4A). Consequently, the first CT film 16 is formed in the recess portion 5b, and the recess portion 5b is completely occluded by the first CT film 16. Examples of the first CT film 16 include an amorphous silicon layer. The amorphous silicon layer is changed to a polysilicon layer by crystallization in a subsequent process.

Figure 4B:
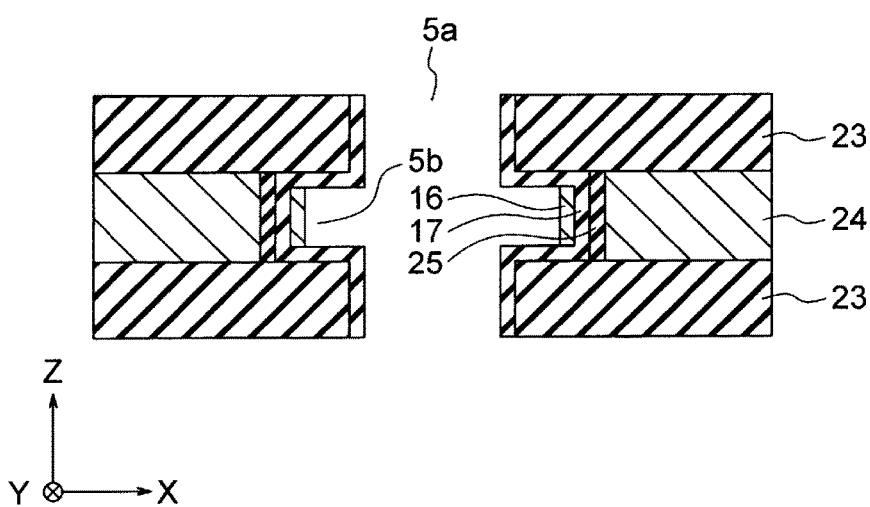

Next, the first CT film 16 is selectively etched (FIG. 4B). Consequently, the first CT film 16 remains on the side surface of the second CT film 17. The first CT film 16 is etched by, for example, the TMAH treatment.

Figure 5A:
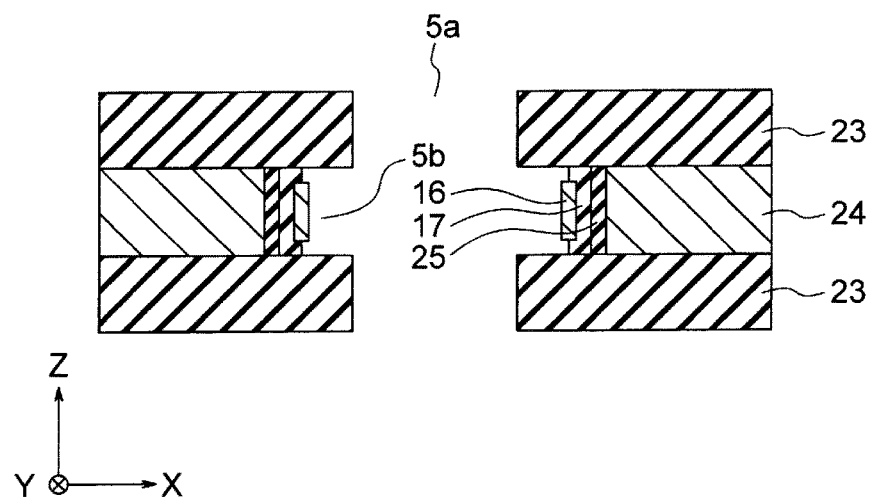
FIGS. 5A and 5B are enlarged sectional views illustrating a method for manufacturing the semiconductor device according to the first embodiment.

Next, the second CT film 17 is selectively removed by using the first CT film 16 as a mask (FIG. 5A). Consequently, the second CT film 17 remains on the side surface of the modified oxide film 25 and a portion of the upper surface and the lower surface of the recess portion 5b. The second CT film 17 is removed by, for example, a hot phosphoric acid treatment.

Figure 5B:
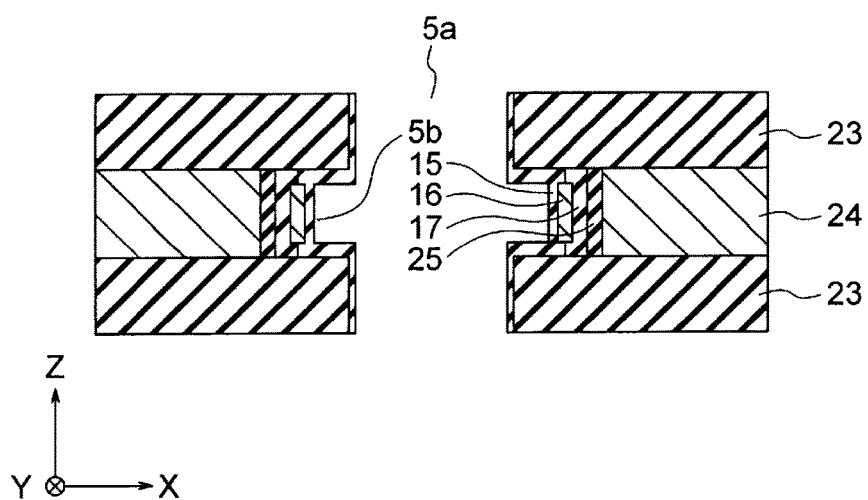

Next, the inter-gate insulating film 15 is formed on the entire surface of the substrate 1 by CVD (FIG. 5B). Consequently, the inter-gate insulating film 15 is formed on the side surfaces of the first and second CT films 16 and 17 and the upper surface and the lower surface of the recess portion 5b.

Figure 6A:
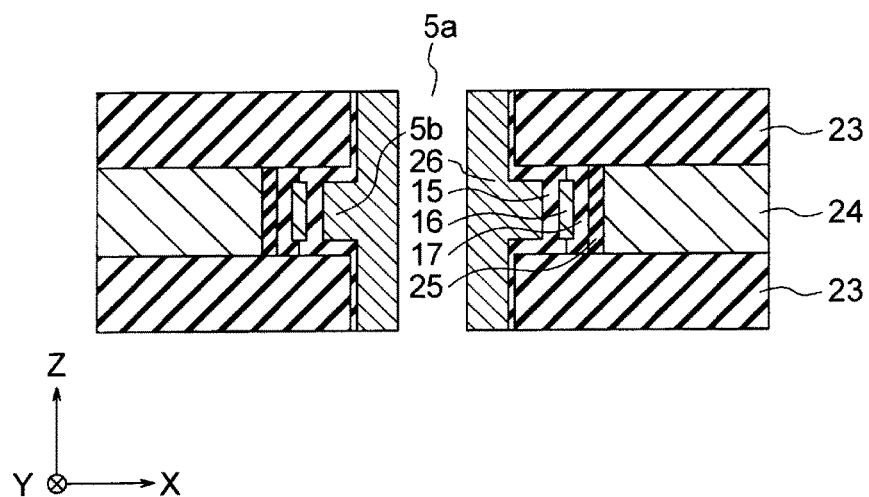
FIGS. 6A and 6B are enlarged sectional views illustrating a method for manufacturing the semiconductor device according to the first embodiment.

Next, a dummy layer 26 is formed on the entire surface of the substrate 1 by CVD (FIG. 6A). Consequently, the dummy layer 26 is formed in the recess portion 5b, and the recess portion 5b is completely occluded by the dummy layer 26. Examples of the dummy layer 26 include an amorphous silicon layer.

Figure 6B:
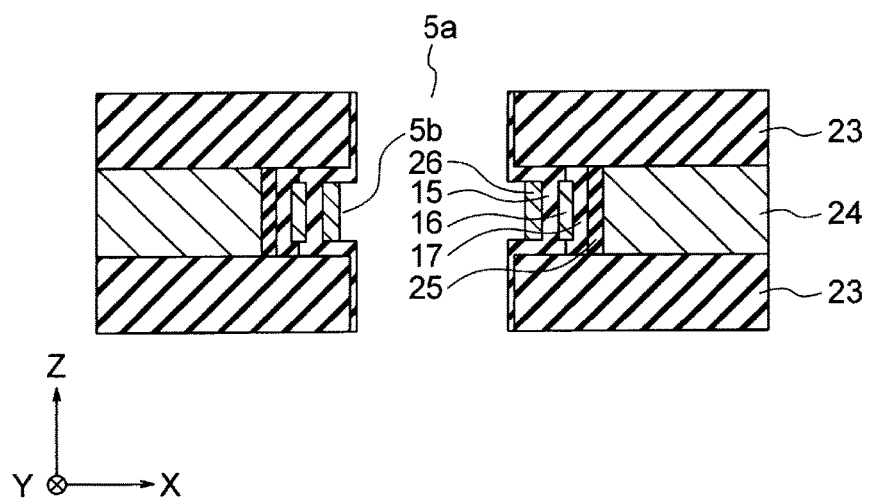

Next, the dummy layer 26 is selectively etched (FIG. 6B). Consequently, the dummy layer 26 remains on the side surface of the inter-gate insulating film 15. The dummy layer 26 is etched by, for example, the TMAH treatment.

Figure 7A:
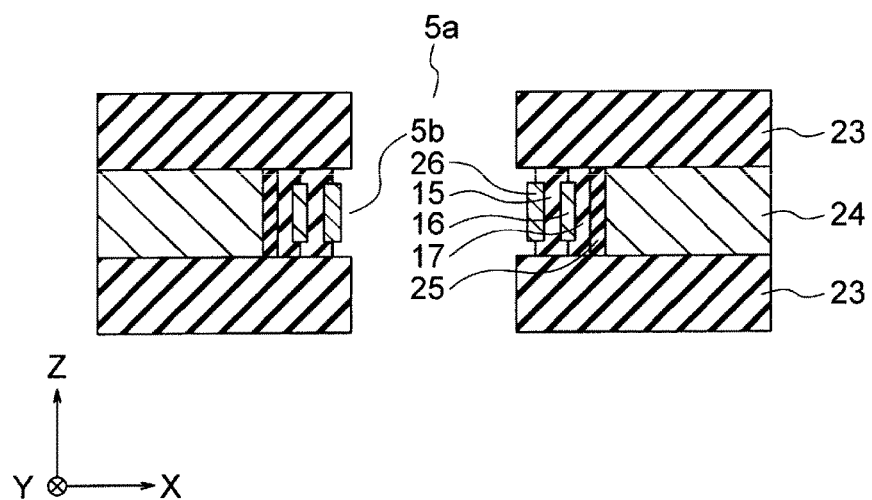
FIGS. 7A and 7B are enlarged sectional views illustrating a method for manufacturing the semiconductor device according to the first embodiment.

Next, the inter-gate insulating film 15 is selectively removed by using the dummy layer 26 as a mask (FIG. 7A). Consequently, the inter-gate insulating film 15 remains on the side surfaces of the first and second CT films 16 and 17 and the upper surface and the lower surface of the recess portion 5b. The inter-gate insulating film 15 is removed by, for example, the hot phosphoric acid treatment.

Figure 7B:
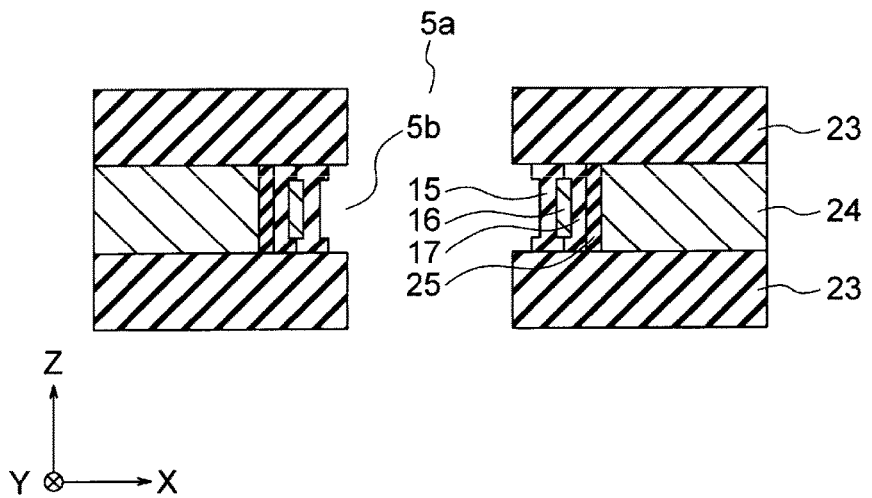

Next, the dummy layer 26 is selectively removed (FIG. 7B). The dummy layer 26 is removed by, for example, the TMAH treatment.

Figure 8A:
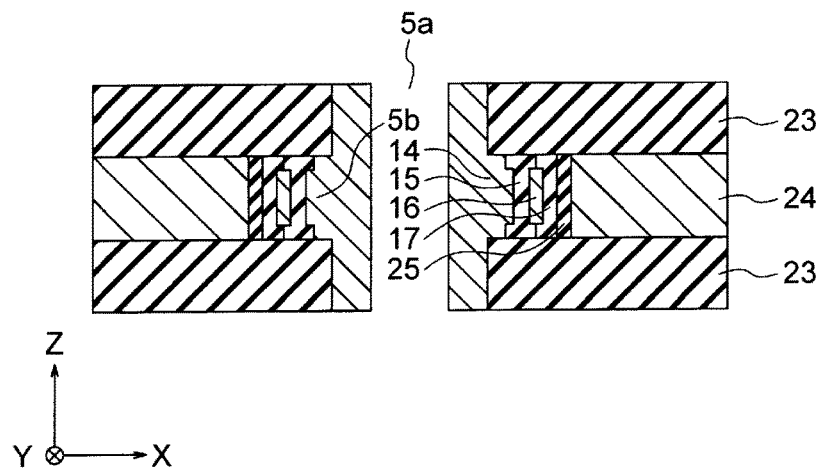
FIGS. 8A and 8B are enlarged sectional views illustrating a method for manufacturing the semiconductor device according to the first embodiment.

Next, the FG layer 14 is formed on the entire surface of the substrate 1 by CVD (FIG. 8A). Consequently, the FG layer 14 is formed in the recess portion 5b, and the recess portion 5b is completely occluded by the FG layer 14. Examples of the FG layer 14 include an amorphous silicon layer. The amorphous silicon layer is changed to a polysilicon layer by crystallization in a subsequent process.

Figure 8B:
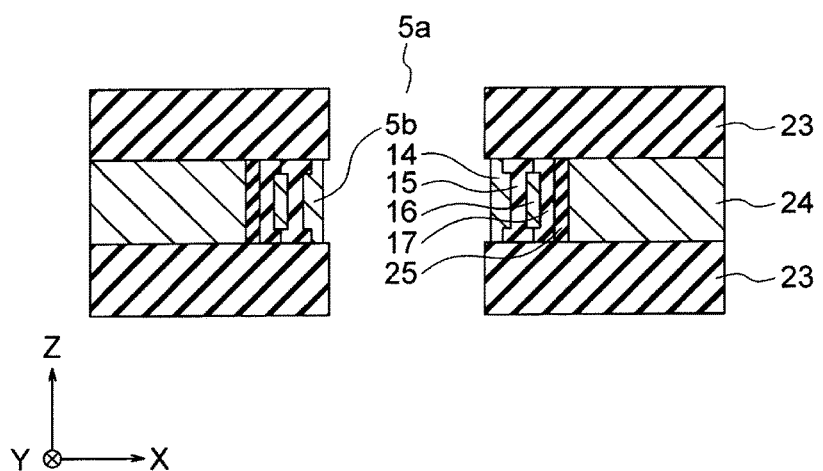

Next, the FG layer 14 is selectively etched (FIG. 8B). Consequently, the FG layer 14 remains on the side surface of the inter-gate insulating film 15 and a portion of the upper surface and the lower surface of the recess portion 5b. The FG layer 14 is etched by, for example, the TMAH treatment at room temperature.

The inter-gate insulating film 15, the first CT film 16, and the second CT film 17 are formed in the recess portion 5b without being exposed to the memory hole 5a. Thus, the tunnel insulating film 13 and the channel semiconductor layer 12 that are subsequently formed in the memory hole 5a are not in contact with the inter-gate insulating film 15, the first CT film 16, and the second CT film 17.

Figure 9A:
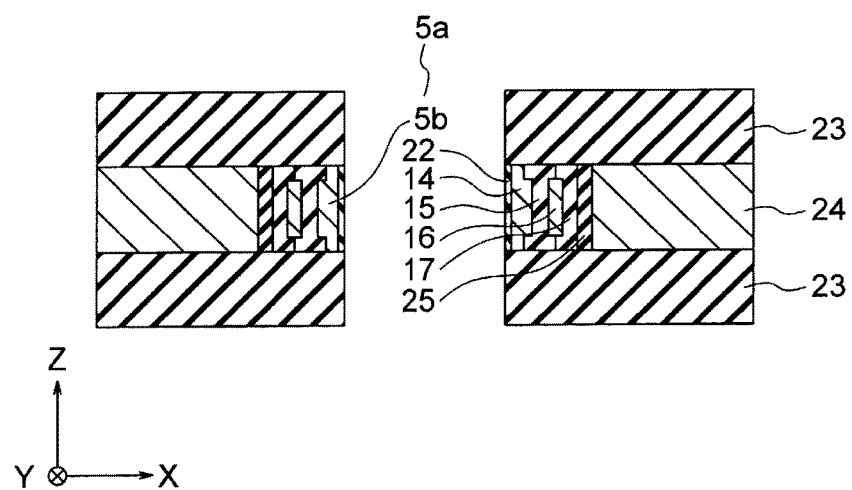
FIGS. 9A and 9B are enlarged sectional views illustrating a method for manufacturing the semiconductor device according to the first embodiment.

Next, the oxide film 22 is formed on the surface of the FG layer 14 by oxidizing the FG layer 14 (FIG. 9A). The oxide film 22 is formed by using, for example, a water vapor generator (WVG).

Figure 9B:
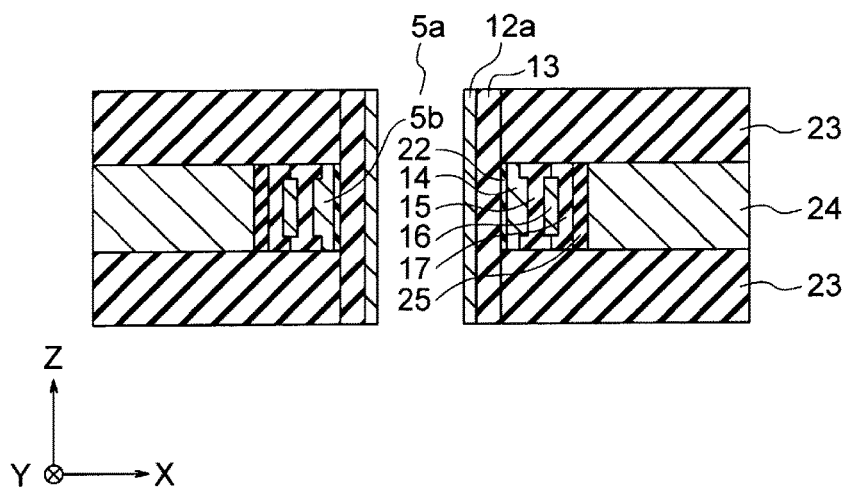

Next, the tunnel insulating film 13 is formed on the entire surface of the substrate 1 by CVD (FIG. 9B). Consequently, the tunnel insulating film 13 is formed on the side surface and the bottom surface of the memory hole 5a. Next, a first layer 12a of the channel semiconductor layer 12 is formed on the entire surface of the substrate 1 by CVD (FIG. 9B). Consequently, the first layer 12a is formed on the side surface and the bottom surface of the memory hole 5a. Examples of the first layer 12a include a polysilicon layer. Then, the tunnel insulating film 13 and the first layer 12a are removed from the bottom surface of the memory hole 5a by an etch-back process, and the substrate 1 is exposed to the bottom surface of the memory hole 5a.

Figure 10A:
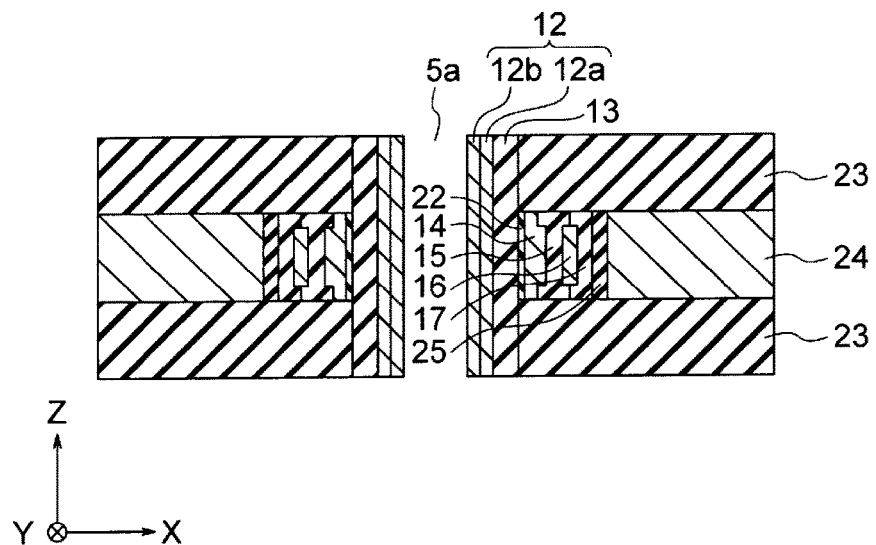
FIGS. 10A and 10B are enlarged sectional views illustrating a method for manufacturing the semiconductor device according to the first embodiment.

Next, a second layer 12b of the channel semiconductor layer 12 is formed on the entire surface of the substrate 1 by CVD (FIG. 10A). Consequently, the channel semiconductor layer 12 that includes the first layer 12a and the second layer 12b is formed on the side surface and the bottom surface of the memory hole 5a, and the channel semiconductor layer 12 is electrically connected to the substrate 1. Examples of the second layer 12b include a polysilicon layer.

Figure 10B:
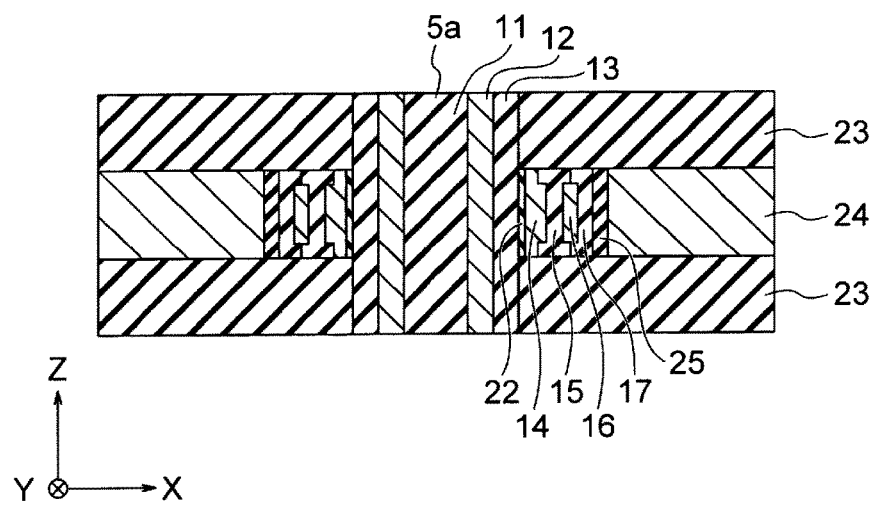

Next, the core layer 11 is formed on the entire surface of the substrate 1 by CVD (FIG. 10B). Consequently, the core layer 11 is formed in the memory hole 5a, and the memory hole 5a is completely occluded by the core layer 11. Examples of the core layer 11 include a silicon oxide film. Then, the core layer 11 and the channel semiconductor layer 12 are divided by etch-back for individual memory holes 5a, and a capping layer is embedded in the memory hole 5a.

Figure 11A:
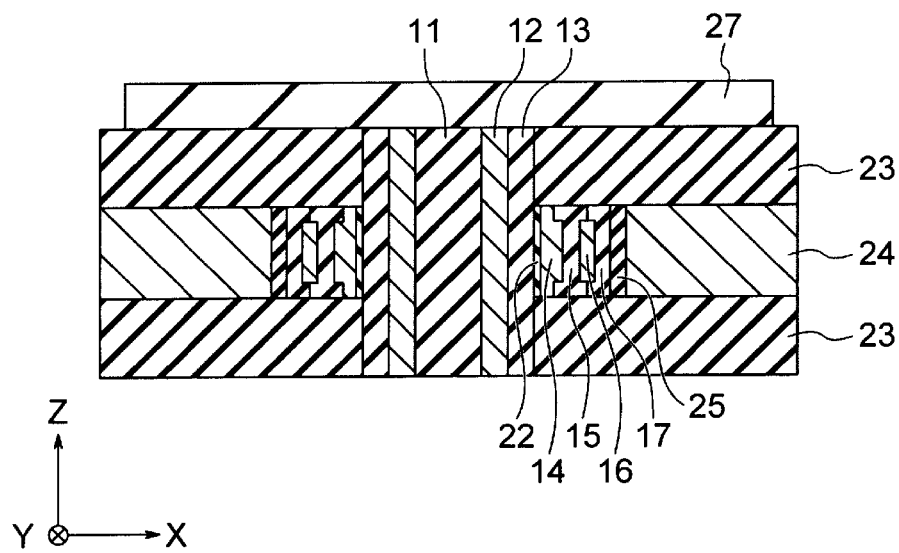
FIGS. 11A and 11B are enlarged sectional views illustrating a method for manufacturing the semiconductor device according to the first embodiment.

Next, a resist layer 27 is formed on the insulating layers 23 and the sacrificial layers 24 in order to form the slit trench portion 6 (FIG. 11A). The resist layer 27 is actually above the position illustrated in FIG. 11A but is illustrated in this position in FIG. 11A for convenience of description.

Figure 11B:
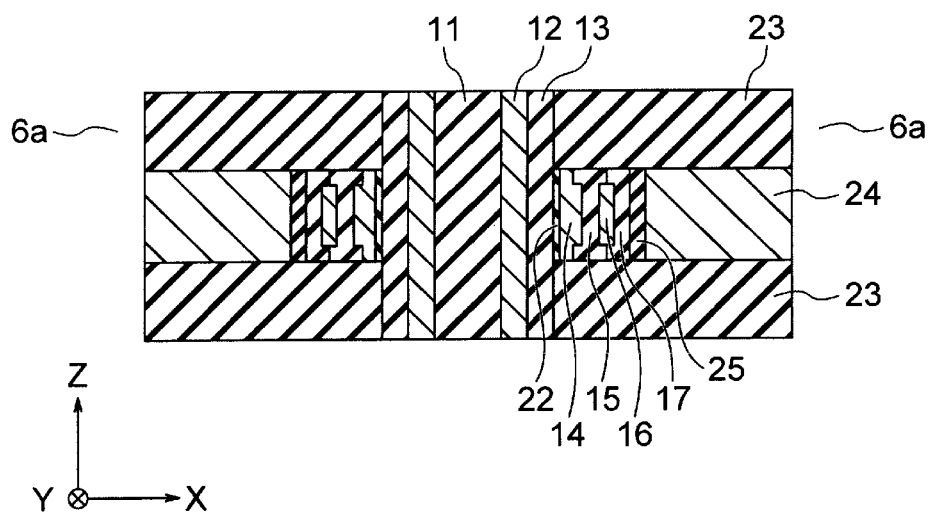

Next, a slit trench 6a that extends in the Z direction is formed in the insulating layers 23 and the sacrificial layers 24 by reactive ion etching (RIE) with the resist layer 27 used as a mask (FIG. 11B). The slit trench 6a is an example of a third recess portion.

Figure 12A:
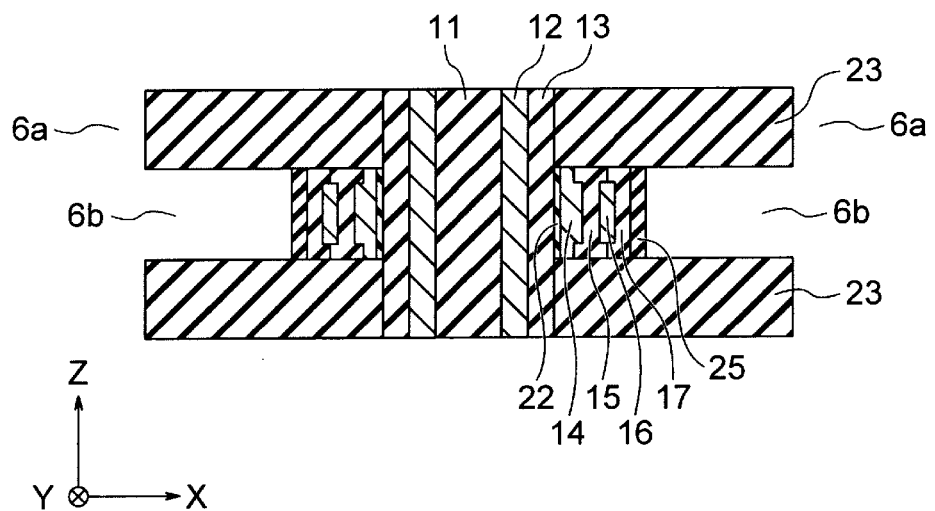
FIGS. 12A and 12B are enlarged sectional views illustrating a method for manufacturing the semiconductor device according to the first embodiment.

Next, the sacrificial layers 24 that are exposed to the slit trench 6a are selectively recessed, and a recess portion 6b is formed adjacent to the modified oxide film 25 (FIG. 12A). The sacrificial layers 24 are recessed and removed by, for example, the TMAH treatment. The recess portion 6b is an example of a fourth recess portion.

Figure 12B:
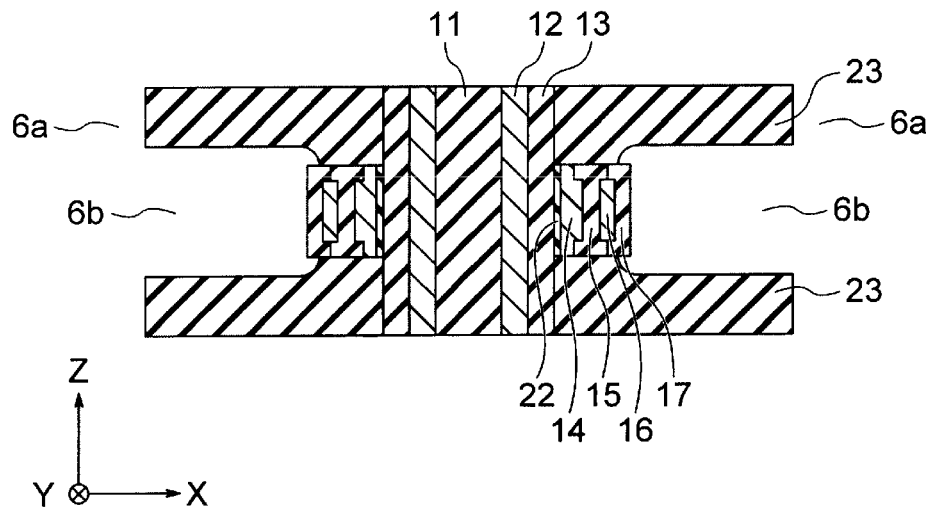

Next, the modified oxide film 25 that is exposed to the recess portion 6b is removed (FIG. 12B). Consequently, the second CT film 17 is exposed to the recess portion 6b. Furthermore, the insulating layers 23 above and below the recess portion 6b are recessed as well. The process in FIG. 12B is performed by, for example, the dilute hydrofluoric acid (DHF) treatment.

Figure 13A:
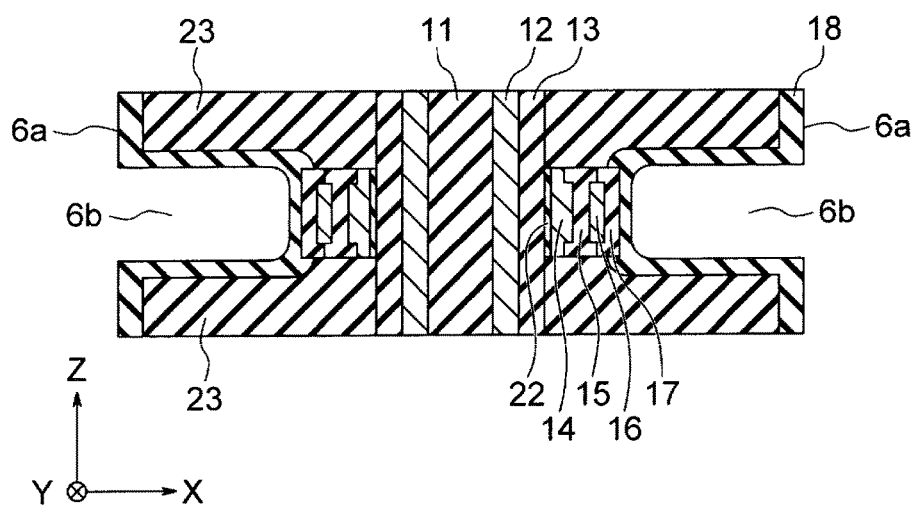
FIGS. 13A and 13B are enlarged sectional views illustrating a method for manufacturing the semiconductor device according to the first embodiment.

Next, the first block insulating film 18 is formed on the entire surface of the substrate 1 by CVD (FIG. 13A). Consequently, the first block insulating film 18 is formed on the side surface of the second CT film 17 and the upper surface and the lower surface of the recess portion 6b.

Figure 13B:
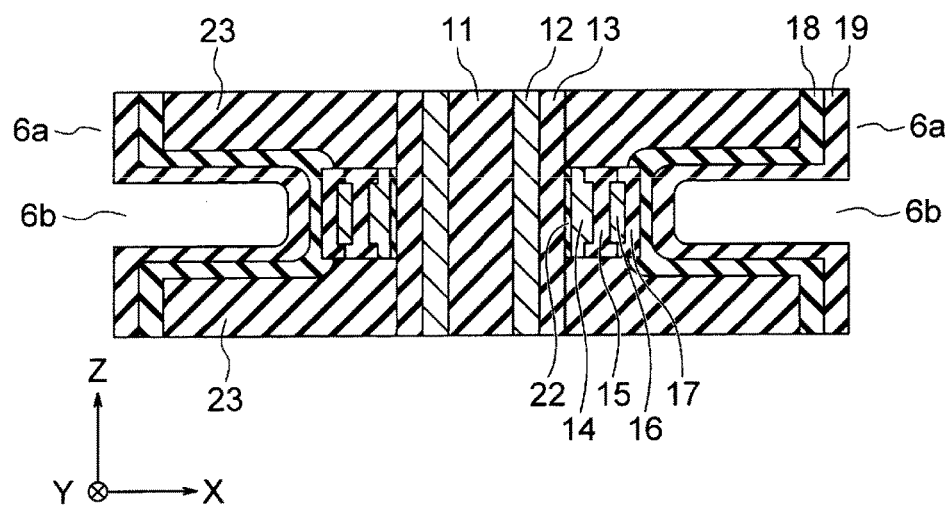

Next, the second block insulating film 19 is formed on the entire surface of the substrate 1 by CVD (FIG. 13B). Consequently, the second block insulating film 19 is formed on the side surface, the upper surface, and the lower surface of the first block insulating film 18 in the recess portion 6b.

Figure 14A:
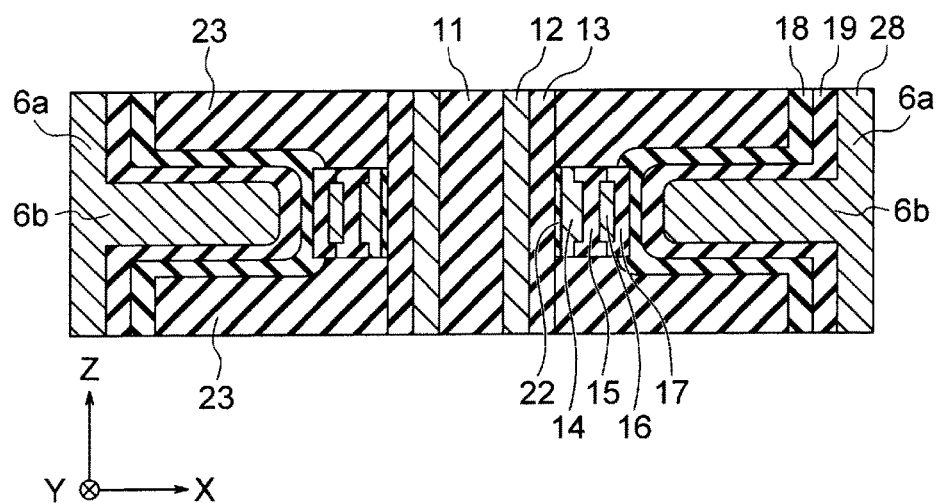
FIGS. 14A and 14B are enlarged sectional views illustrating a method for manufacturing the semiconductor device according to the first embodiment.

Next, a dummy layer 28 is formed on the entire surface of the substrate 1 by CVD (FIG. 14A). Consequently, the dummy layer 28 is formed in the recess portion 6b, and the recess portion 6b is completely occluded by the dummy layer 28. Examples of the dummy layer 28 include an amorphous silicon layer.

Figure 14B:
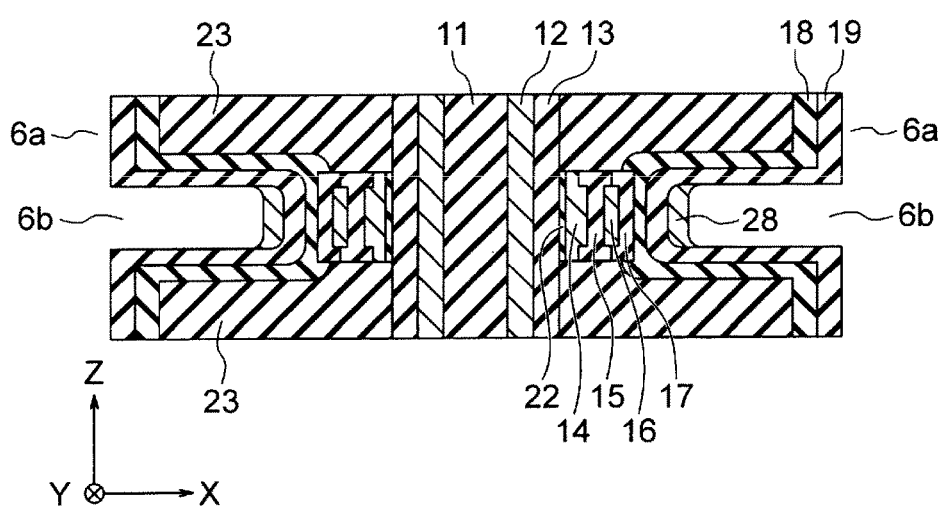

Next, the dummy layer 28 is selectively etched (FIG. 14B). Consequently, the dummy layer 28 remains on the side surface of the second block insulating film 19. The dummy layer 28 is etched by, for example, the TMAH treatment.

Figure 15A:
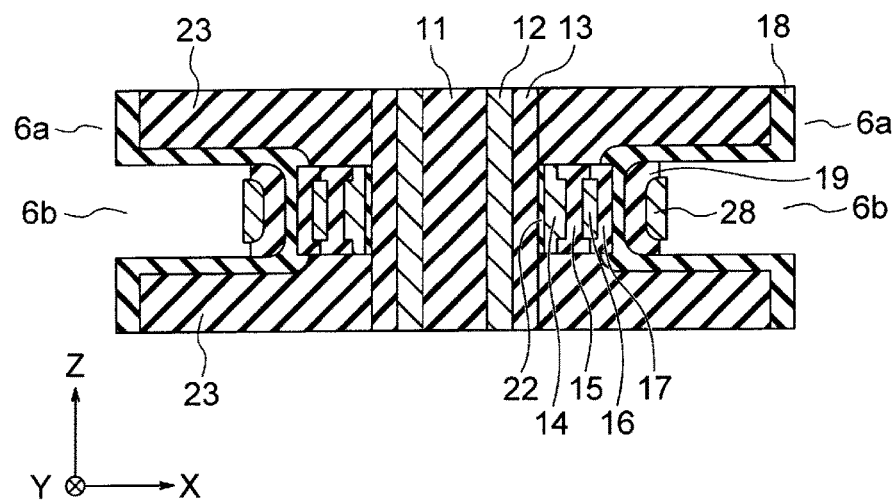
FIGS. 15A and 15B are enlarged sectional views illustrating a method for manufacturing the semiconductor device according to the first embodiment.

Next, the second block insulating film 19 is selectively removed by using the dummy layer 28 as a mask (FIG. 15A). Consequently, the second block insulating film 19 remains on the side surface of the first block insulating film 18. The second block insulating film 19 is advantageous in that the electrical resistance of the CG layer 21 can be decreased by increasing the volume of the CG layer 21. The second block insulating film 19 is removed by, for example, hot phosphoric acid treatment.

Figure 15B:
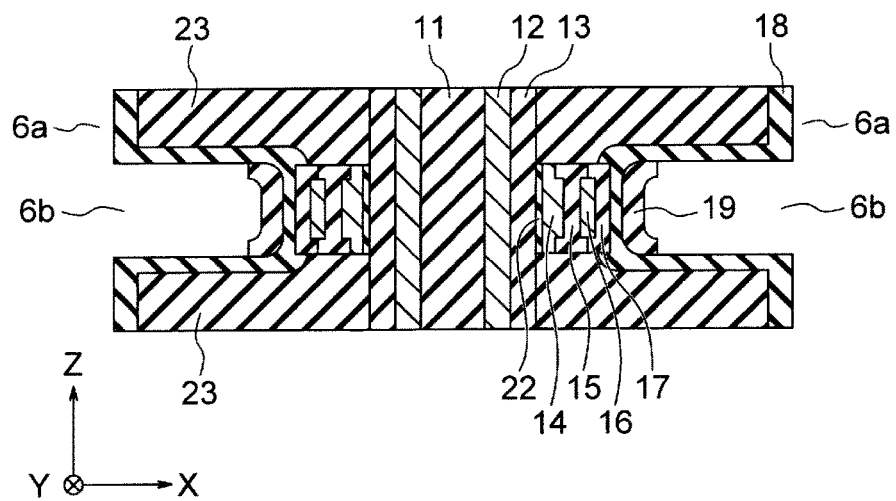

Next, the dummy layer 28 is selectively removed (FIG. 15B). The dummy layer 28 is removed by, for example, the TMAH treatment.

Figure 16A:
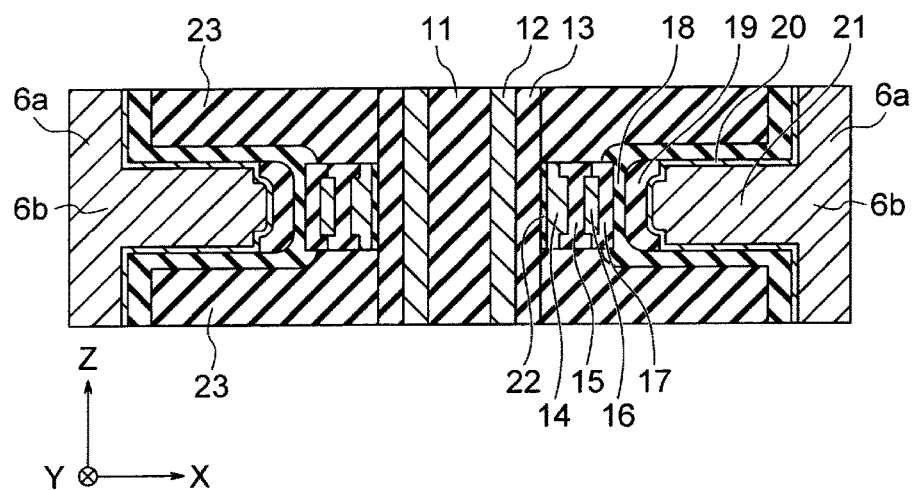
FIGS. 16A and 16B are enlarged sectional views illustrating a method for manufacturing the semiconductor device according to the first embodiment.

Next, the barrier metal layer 20 is formed on the entire surface of the substrate 1 by CVD (FIG. 16A). Consequently, the barrier metal layer 20 is formed in the recess portion 6b to be in contact with the side surface of the second block insulating film 19 and the upper surface and the lower surface of the first block insulating film 18. Next, the CG layer 21 is formed on the entire surface of the substrate 1 by CVD (FIG. 16A). Consequently, the CG layer 21 is formed in the recess portion 6b, and the recess portion 6b is completely occluded by the CG layer 21.

Figure 16B:
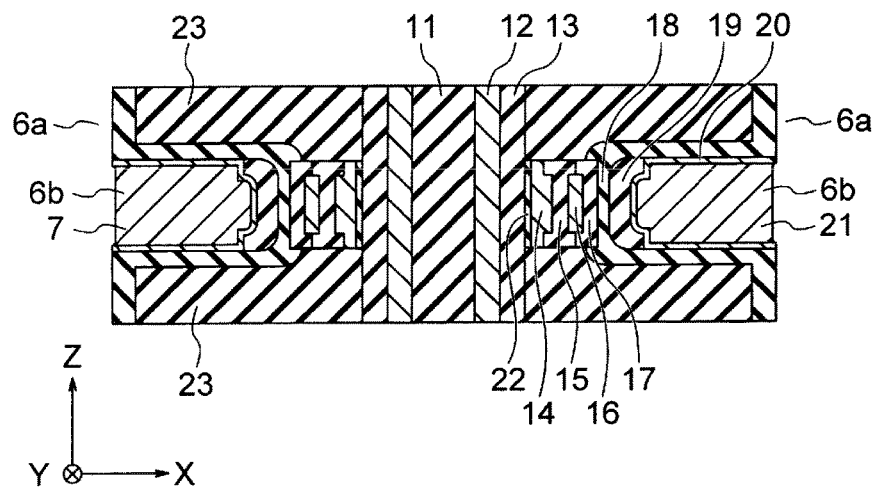

Next, the barrier metal layer 20 and the CG layer 21 are removed in such a manner that the barrier metal layer 20 and the CG layer 21 do not remain on the side surfaces of the insulating layers 23 (FIG. 16B). The barrier metal layer 20 and the CG layer 21 are removed by the isotropic etching using RIE.

The memory cell unit 7 that includes the FG layer 14, the inter-gate insulating film 15, the first CT film 16, the second CT film 17, the first block insulating film 18, the second block insulating film 19, the barrier metal layer 20, the CG layer 21, and the oxide film 22 is formed in the recess portions 5b and 6b.

Then, an insulating film is embedded in the slit trench 6a. Furthermore, various interconnect layers, plug layers, interlayer insulating films, and the like are formed on the substrate 1. The semiconductor device according to the present embodiment is manufactured.

(3) Comparative Example of First Embodiment

Figure 17:
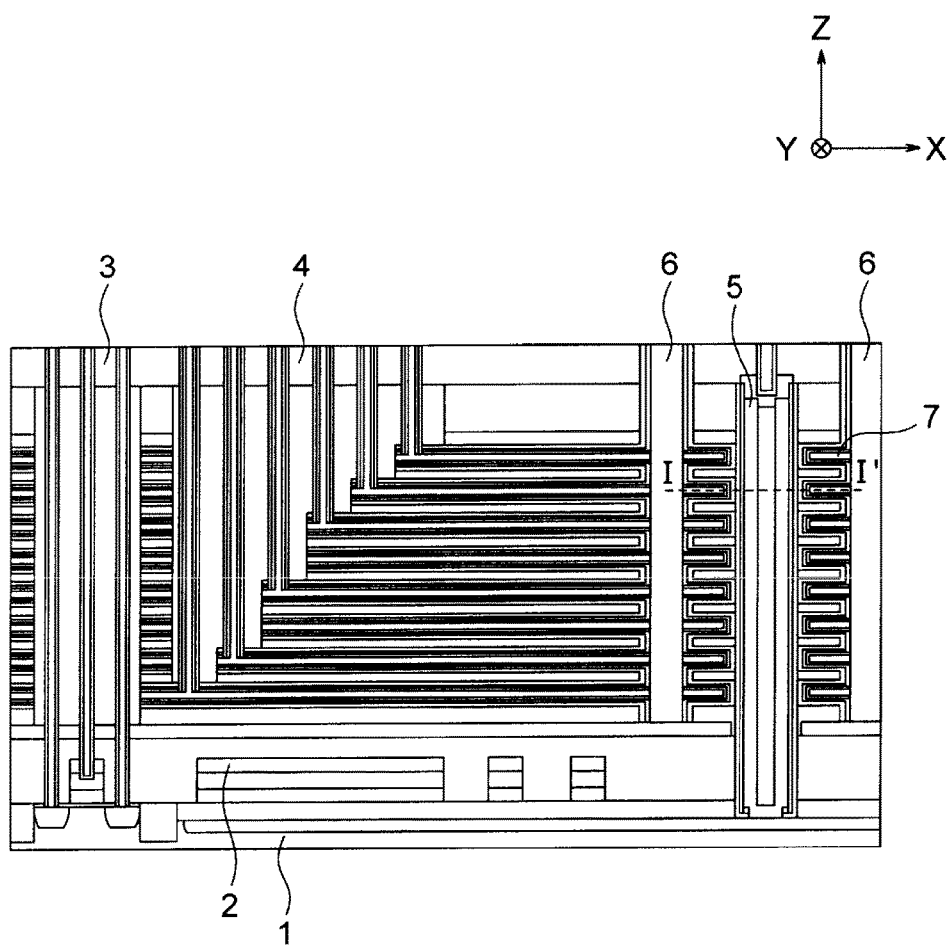
FIG. 17 is a sectional view illustrating the structure of a semiconductor device according to a first comparative example of the first embodiment.

FIG. 17 is a sectional view illustrating the structure of a semiconductor device according to a first comparative example of the first embodiment. FIGS. 18A and 18B are enlarged sectional views illustrating the structure of the semiconductor device according to the first comparative example of the first embodiment.

The semiconductor device according to the first embodiment includes, as a charge storage layer, the first CT film 16 of a semiconductor layer and the second CT film 17 of an insulating film as illustrated in FIG. 2A and FIG. 2B. Furthermore, the semiconductor device according to the first embodiment includes the FG layer 14 between the charge storage layer and the channel semiconductor layer 12.

The semiconductor device according to the first comparative example does not include the FG layer 14 as illustrated in FIG. 18A and FIG. 18B. Furthermore, the semiconductor device according to the first comparative example includes only the CT film 17 of an insulating film as a charge storage layer and does not include the CT film 16 of a semiconductor layer. The CT film 17 of the first comparative example is formed in the memory hole 5a and not in the recess portion 5b.

Figure 19:
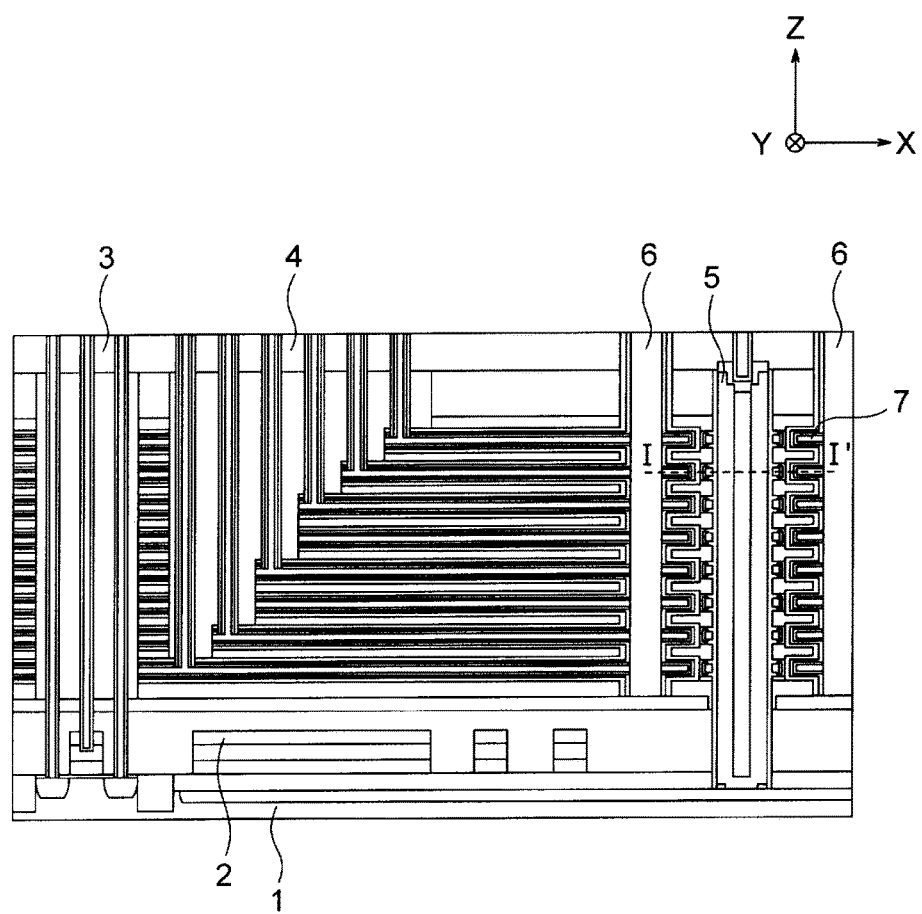
FIG. 19 is a sectional view illustrating the structure of a semiconductor device according to a second comparative example of the first embodiment.
Figure 20A:
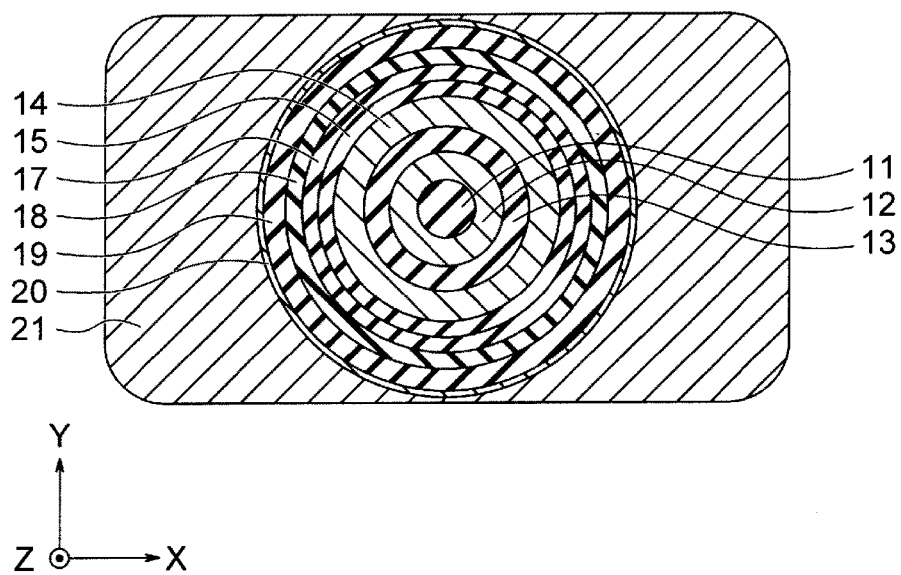
FIGS. 20A and 20B are enlarged sectional views illustrating the structure of the semiconductor device according to the second comparative example according to the first embodiment.
Figure 20B:
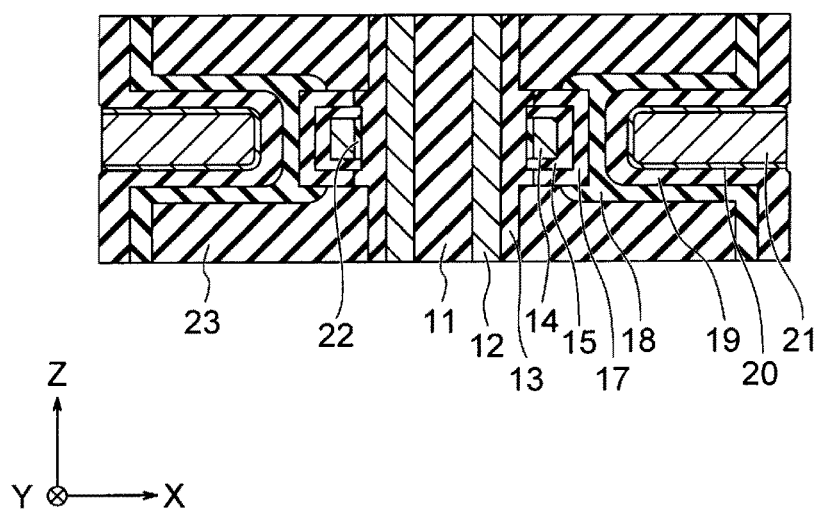

FIG. 19 is a sectional view illustrating the structure of a semiconductor device according to a second comparative example of the first embodiment. FIGS. 20A and 20B are enlarged sectional views illustrating the structure of the semiconductor device according to the second comparative example of the first embodiment.

The semiconductor device according to the second comparative example includes the FG layer 14 as illustrated in FIG. 20A and FIG. 20B. However, the semiconductor device according to the second comparative example includes only the CT film 17 of an insulating film as a charge storage layer and does not include the CT film 16 of a semiconductor layer. The inter-gate insulating film 15 and the CT film 17 of the second comparative example are in contact with the tunnel insulating film 13.

Hereinafter, the first embodiment will be compared with the first and second comparative examples with reference to FIG. 21 to FIG. 23B.

Figure 21:
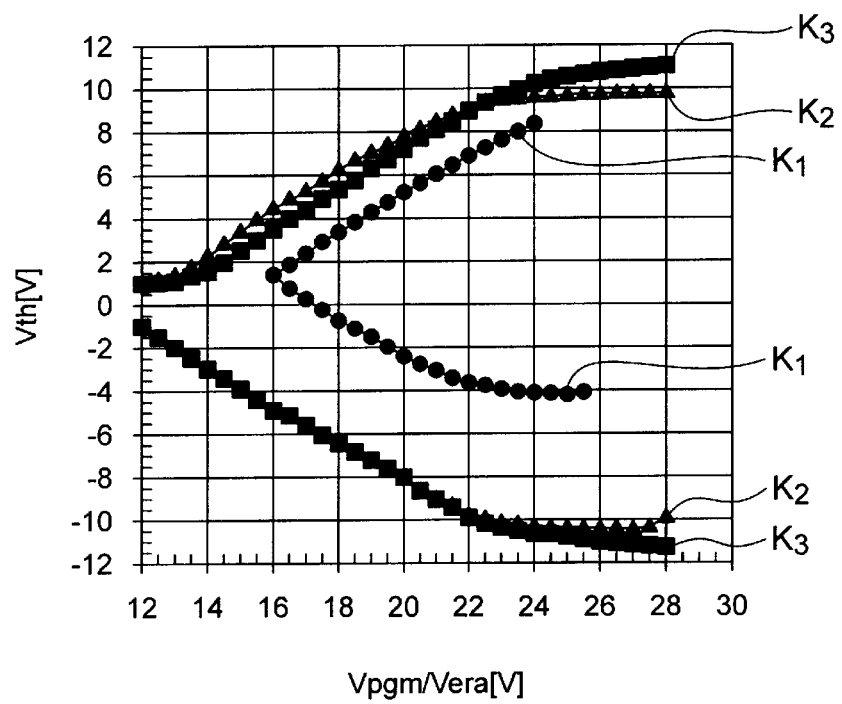
FIG. 21 is a graph illustrating a write/erase (W/E) characteristic of the semiconductor device according to the first embodiment.

FIG. 21 is a graph illustrating a write/erase (W/E) characteristic of the semiconductor device according to the first embodiment.

The horizontal axis in FIG. 21 represents a program voltage Vpgm and an erase voltage Vera, and the vertical axis in FIG. 21 represents a threshold voltage Vth. A curve $K_1$ illustrates a W/E characteristic of the first comparative example. A curve $K_2$ illustrates a W/E characteristic of the second comparative example. A curve $K_3$ illustrates a W/E characteristic of the first embodiment. Measurement for creating the present graphs is performed by setting the diameter of the memory hole 5a or the distance between the memory hole 5a and the slit trench 6a to the same values for the first comparative example, the second comparative example, and the first embodiment.

A Vth window of the first comparative example is approximately 13 V if write saturation is Vpgm=+26 V and erase saturation is Vera=−23 V. The Vth window is the sum of the threshold voltage Vth in the write saturation and the threshold voltage Vth in the erase saturation. A Vth window in the second comparative example is approximately 20 V, and a Vth window in the first embodiment is approximately 21 V. These Vth windows indicate that the Vth window can be enlarged by forming the FG layer 14 in addition to the charge storage layer as in the second comparative example and the first embodiment.

Changes in Vth with respect to Vpgm or Vera occur from approximately 16 V in the first comparative example. Changes in Vth with respect to Vpgm or Vera occur from approximately 14 V in the second comparative example and the first embodiment. These changes indicate that the efficiency of supply of electrons from the channel semiconductor layer 12 is increased and that the efficiency of injection of electrons into the charge storage layer is increased because voltages are consistently applied to the FG layer 14 and the coupling ratio is increased on both sides of the FG layer 14.

The W/E characteristic is improved by forming the FG layer 14 between the charge storage layer and the channel semiconductor layer 12. That is, the FG layer 14 can improve the charge storing ability of the charge storage layer.

Figure 22A:
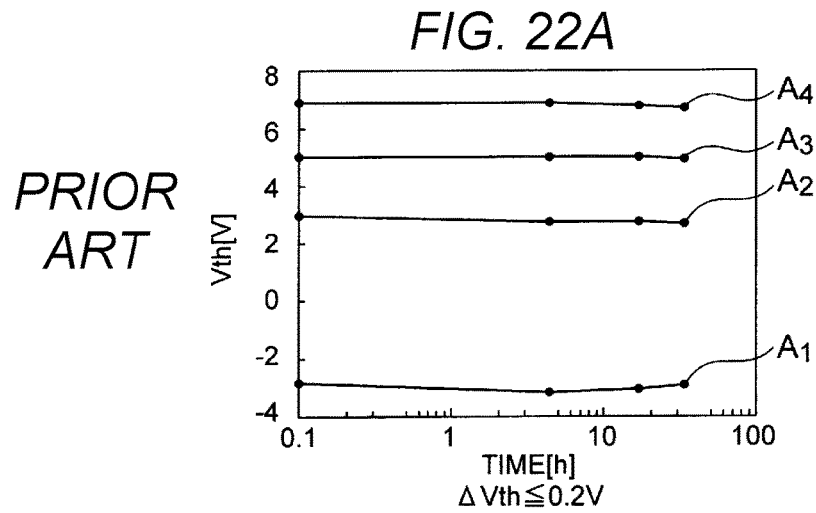
FIGS. 22A, 22B, and 22C are graphs illustrating a charge retaining characteristic of the semiconductor device according to the first embodiment.
Figure 22B:
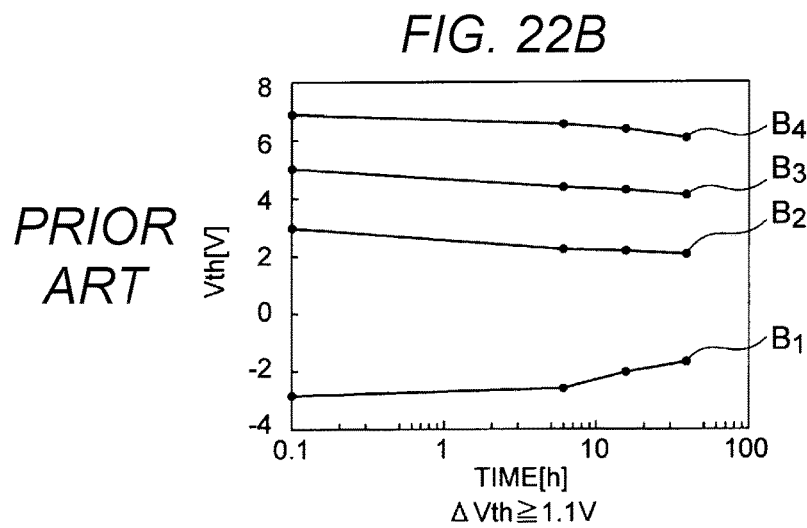
Figure 22C:
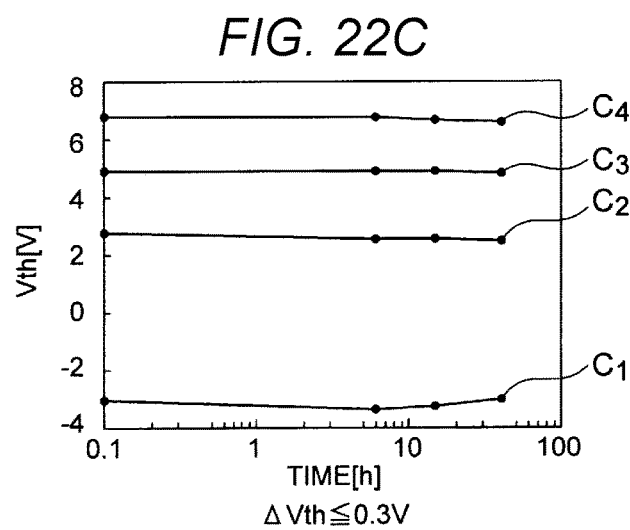

FIGS. 22A, 22B, and 22C are graphs illustrating a charge retaining characteristic of the semiconductor device according to the first embodiment.

FIG. 22A illustrates a charge retaining characteristic of the first comparative example. FIG. 22B illustrates a charge retaining characteristic of the second comparative example. FIG. 22C illustrates a charge retaining characteristic of the first embodiment. A curve $A_1$ illustrates a change ΔVth in Vth if the semiconductor device is heated after Vth is adjusted to −3 V at the time of erasing. Curves $A_2$, $A_3$, and $A_4$ illustrate the change ΔVth in Vth if the semiconductor device is heated after Vth is adjusted to +3 V, +5 V, and +7 V at the time of writing. The same applies to curves $B_1$ to $B_4$ and curves $C_1$ to $C_4$. In FIG. 22A to FIG. 22C, the vertical axis represents the threshold voltage Vth, and the horizontal axis represents time.

The change ΔVth after 50 hours is approximately 0.2 V in the first comparative example. The change ΔVth after 50 hours is approximately 1.1 V in the second comparative example. These changes indicate that the charge retaining ability in the second comparative example is lower than the charge retaining ability in the first comparative example. The change ΔVth after 50 hours is approximately 0.3 V in the first embodiment. This change indicates that the charge retaining ability in the first embodiment is approximately the same as the charge retaining ability in the first comparative example.

This result indicates that the charge retaining ability of the CT film 17 is decreased by the FG layer 14 in the second comparative example. Therefore, an experiment is performed to impose stress on the CT film 17 by applying positive and negative voltages to the CG layer 21 for 60 seconds in order to find whether charges of the CT film 17 leak to the FG layer 14 or the CG layer 21.

Consequently, ΔVth is less than or equal to 0.1 V if a stress of +7 V is imposed and Vth is adjusted to +7 V (writing or electron injection). ΔVth is greater than or equal to 1 V if a stress of +7 V is imposed and Vth is adjusted to −3 V (erasing or positive hole injection). ΔVth is greater than or equal to 1 V if a stress of −7 V is imposed and Vth is adjusted to +7 V (writing or electron injection). ΔVth is less than or equal to 0.1 V if a stress of −7 V is imposed and Vth is adjusted to −3 V (erasing or positive hole injection).

This result indicates that, from an increase in ΔVth due to a negative voltage at the time of writing, electrons stored in the CT film 17 at the time of writing leak to the FG layer 14. In addition, the result indicates that, from an increase in ΔVth due to a positive voltage at the time of erasing, positive holes stored in the CT film 17 at the time of erasing leak to the FG layer 14. Thus, it is understood that the CT film 17 of the second comparative example has a high charge storing ability but has a low charge retaining ability and that charges of the CT film 17 are likely to leak to the FG layer 14.

FIG. 22C illustrates that the first and second CT films 16 and 17 in the first embodiment have a high charge retaining ability. The first CT film 16 is configured as a semiconductor layer and the second CT film 17 as an insulating film in the first embodiment. Thus, the first CT film 16 in the first embodiment is considered to function as a storage area for charges that leak from the second CT film 17.

Figure 23A:
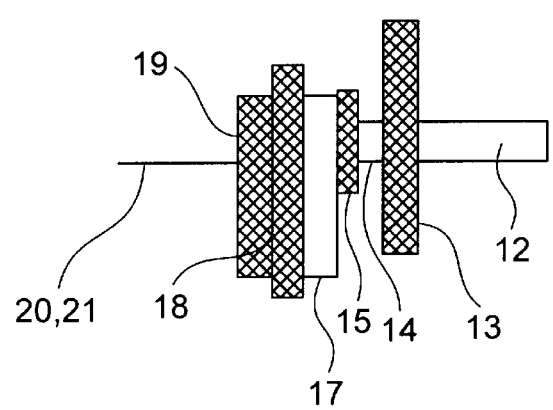
FIGS. 23A and 23B are graphs for describing the band structure of the semiconductor device according to the first embodiment.
Figure 23B:
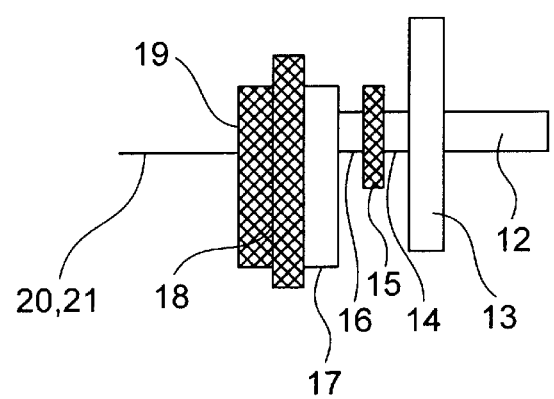

FIGS. 23A and 23B are graphs for describing the band structure of the semiconductor device according to the first embodiment.

FIG. 23A illustrates the band structure of the second comparative example. FIG. 23B illustrates the band structure of the first embodiment.

The height of the electron barrier of the inter-gate insulating film 15 (SiN) is greater than the height of the electron barrier of the CT film 17 (HfSiON) by approximately 0.5 eV in FIG. 23A. Thus, electrons and positive holes do not leak from the CT film 17 to the FG layer 14 at room temperature. However, when the interface state at the interface between the inter-gate insulating film 15 and the CT film 17 is excited by imposing heat or voltage stress on the CT film 17, there is a possibility that a very small energy causes electrons and positive holes to leak from the CT film 17 to the FG layer 14.

The height of the electron barrier of the first CT film 16 (polysilicon) is smaller than the height of the electron barrier of the second CT film 17 (HfSiON) in FIG. 23B. Thus, charges of the second CT film 17 are likely to leak to the first CT film 16. However, the height of the electron barrier of the inter-gate insulating film 15 (SiN) is greater than the height of the electron barrier of the first CT film 16 (polysilicon) by approximately 2 eV. Thus, even if heat or voltage stress is imposed on the first and second CT films 16 and 17, charges are unlikely to leak to the FG layer 14. Thus, according to the first embodiment, both the charge storing ability and the charge retaining ability of the charge storage layer can be improved.

The CT film 17 is in contact with the tunnel insulating film 13 in the second comparative example (FIG. 20A and FIG. 20B). Thus, there is a possibility that a very small energy causes charges of the CT film 17 to leak to the tunnel insulating film 13. The first and second CT films 16 and 17 are not in contact with the tunnel insulating film 13 in the first embodiment (FIG. 2A and FIG. 2B). Thus, according to the first embodiment, the possibility that a very small energy causes charges of the first and second CT films 16 and 17 to leak to the tunnel insulating film 13 can be decreased.

As described heretofore, the semiconductor device according to the present embodiment includes the first and second CT films 16 and 17 as a charge storage layer and includes the FG layer 14 between the channel semiconductor layer 12 and the CT films 16 and 17. Thus, according to the present embodiment, the charge storing ability and the charge retaining ability of a three-dimensional memory cell can be improved.

Second Embodiment

Hereinafter, a second embodiment will be described. The second embodiment will be described with focus on the differences from the first embodiment, and matters common to the first embodiment will not be described.

(1) Structure of Semiconductor Device According to Second Embodiment

Figure 24A:
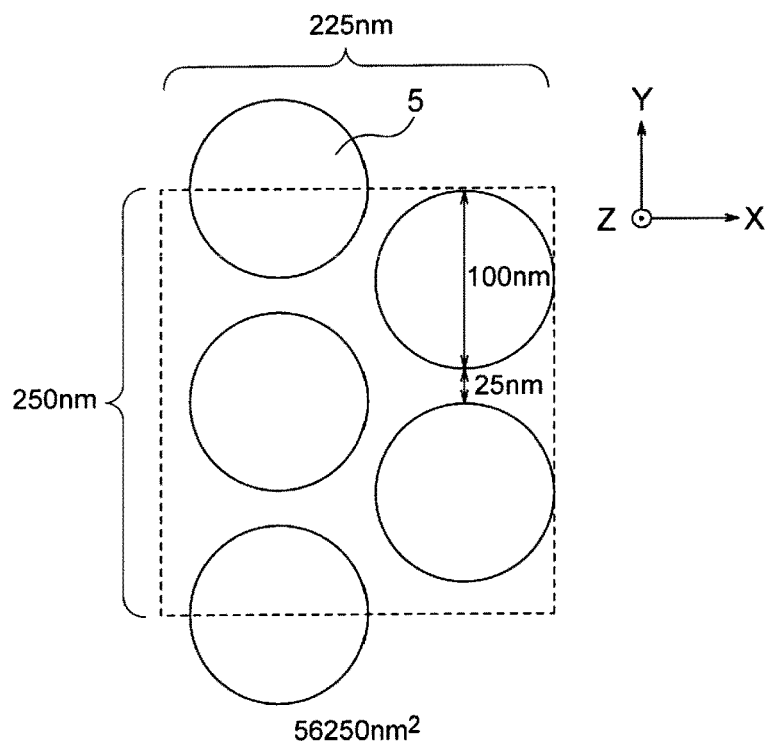
FIGS. 24A and 24B are sectional views for describing the structure of a semiconductor device according to a second embodiment.
Figure 24B:
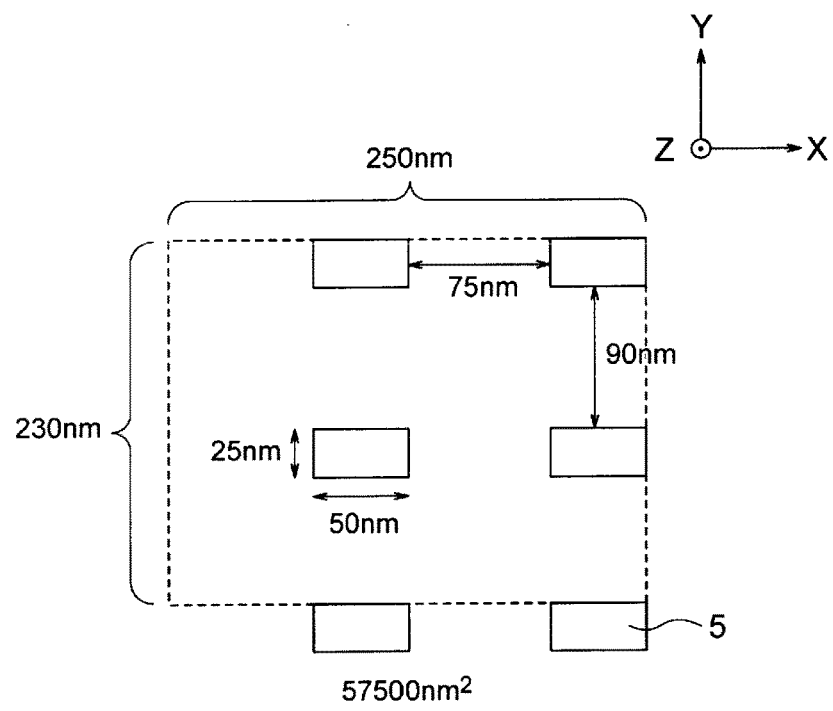

FIGS. 24A and 24B are sectional views for describing the structure of a semiconductor device according to the second embodiment.

FIG. 24A illustrates an arrangement of memory element units 5 by showing horizontal sections. Dimensions illustrated in FIG. 24A represent the dimensions in the first comparative example. FIG. 24B illustrates horizontal sections of a plurality of memory element units 5 according to the second embodiment.

The diameter of the memory element unit 5 is set as 100 nm, and the distance between the adjacent memory element units 5 is set as 25 nm in FIG. 24A. The diameter and the distance represent the diameter and the distance in the portion of the memory element units 5 formed in the memory hole 5a. The core layer 11, the channel semiconductor layer 12, the tunnel insulating film 13, and the CT film 17 are formed in the memory hole 5a in the first comparative example (FIG. 18A and FIG. 18B). Thus, the outer periphery of the memory element unit 5 in FIG. 24A corresponds to the outer periphery of the CT film 17.

Assume that, for example, the thickness of each layer of the memory cell unit 7 according to the first comparative example is set to a minimum thickness in terms of breakdown voltage. In this case, the thicknesses of the first block insulating film 18 (SiO$_2$), the second block insulating film 19 (AlO), and the barrier metal layer 20 (TiN) are, for example, 5 nm, 2 nm, and 2 nm. Thus, the total thickness is 9 nm, and a film of 9 nm (the first block insulating film 18, the second block insulating film 19, and the barrier metal layer 20) is formed on the outer periphery of each memory element unit 5. The width of an embedding space for the CG layer 21 is greater than or equal to 5 nm in order to securely embed the CG layer 21 between the memory element units 5. Consequently, the distance between the memory element units 5 of the first comparative example is greater than or equal to 25 nm (9+9+5+2 nm) considering a thickness error of approximately 10% (2 nm). The value 25 nm above is calculated in this manner.

The core layer 11, the channel semiconductor layer 12, and the tunnel insulating film 13 are formed in the memory hole 5a, and the FG layer 14, the inter-gate insulating film 15, the first CT film 16, and the second CT film 17 are formed in the recess portion 5b in the first embodiment (FIG. 2A and FIG. 2B). Thus, if FIG. 24A is used for memory elements of the first embodiment, the outer periphery of the memory element unit 5 in FIG. 24A corresponds to the outer periphery of the tunnel insulating film 13. Consequently, the distance between the memory element units 5 in the first embodiment, if arranged according to the arrangement of FIG. 24A, tends to be greater than if the memory elements of the first comparative example are used.

Assume that, for example, the thickness of each layer of the memory cell unit 7 according to the first embodiment is set to the minimum thickness. In this case, the thicknesses of the FG layer 14, the inter-gate insulating film 15, the first CT film 16, and the second CT film 17 are, for example, 5 nm, 2 nm, 5 nm, and 5 nm. Furthermore, the thicknesses of the first block insulating film 18, the second block insulating film 19, and the barrier metal layer 20 are, for example, 5 nm, 5 nm, and 2 nm. Thus, the total thickness is 29 nm, and a film of 29 nm is formed on the outer periphery of each memory element unit 5. The width of an embedding space for the CG layer 21 is greater than or equal to 5 nm in order to securely embed the CG layer 21 between the memory element units 5. Consequently, the distance between the memory element units 5 according to the first embodiment, arranged as in FIG. 24A, is greater than or equal to 70 nm (29+29+5+7 nm) considering a thickness error of approximately 10% (7 nm).

Thus, if N numbers of memory element units 5 according to the first embodiment are arranged in the same area as N numbers of memory element units 5 according to the first comparative example (N is an arbitrary integer), the diameter of the memory element unit 5 according to the first embodiment is required to be smaller than the diameter of the memory element unit 5 according to the first comparative example, if the arrangement of FIG. 24A is to be followed, since the distance between the memory element units 5 according to the first embodiment is greater than the distance between the memory element units 5 according to the first comparative example. Specifically, the diameter of the memory element unit 5 according to the first embodiment is 55 nm (100+25−70 nm), and the diameter of the memory hole 5a is 55 nm. In this case, a problem exists that the memory hole 5a is likely to be occluded by a reaction product and that ions and radicals are unlikely to reach the bottom portion of the memory hole 5a. This problem worsens as the aspect ratio of the memory hole 5a increases, and thus is not desirable for a three-dimensional memory.

Therefore, the horizontal sectional shape of the memory element unit 5 according to the second embodiment is set to have a band shape that extends in the X direction as in FIG. 24B. Accordingly, even if the area of each memory element unit 5 is decreased, the problem that a reaction product causes occlusion or that ions and radicals do not reach can be prevented. The memory element unit 5 according to the second embodiment is formed by active area (AA) cross-point processing as described later.

The X-direction length of the memory element unit 5 is set as 50 nm, and the Y-direction length of the memory element unit 5 is set as 25 nm in FIG. 24B. Furthermore, the distance between the adjacent memory element units 5 in the X direction is set as 75 nm, and the distance between the adjacent memory element units 5 in the Y direction is set as 90 nm.

FIG. 24A and FIG. 24B will be compared. Four memory element units 5 are arranged in an area of 56,250 nm$^2$ (225 nm×250 nm) in FIG. 24A. Four memory element units 5 are arranged in an area of 57,500 nm$^2$ (250 nm×230 nm) in FIG. 24B. The dimensions of the memory element unit 5 and the distance between the memory element units 5 according to the second embodiment are set as in FIG. 24B, and thus the memory element units 5 can be arranged in approximately the same area as FIG. 24A. The dimensions and the distance in FIG. 24B are merely one example, and other dimensions and distances may be employed.

The memory hole 5a that has a hole (aperture) shape is formed, and one memory element unit 5 is formed in one memory hole 5a in the first embodiment. The memory trench 5a that has a trench (groove) shape is formed, and a plurality of memory element units 5 is formed in one memory trench 5a in the second embodiment. Accordingly, the area of each memory trench 5a can be sufficiently greater than the area of each memory hole 5a, and the problem that a reaction product causes occlusion or that ions and radicals do not reach can be prevented. Details of the memory trench 5a in the second embodiment will be described later.

Figure 25:
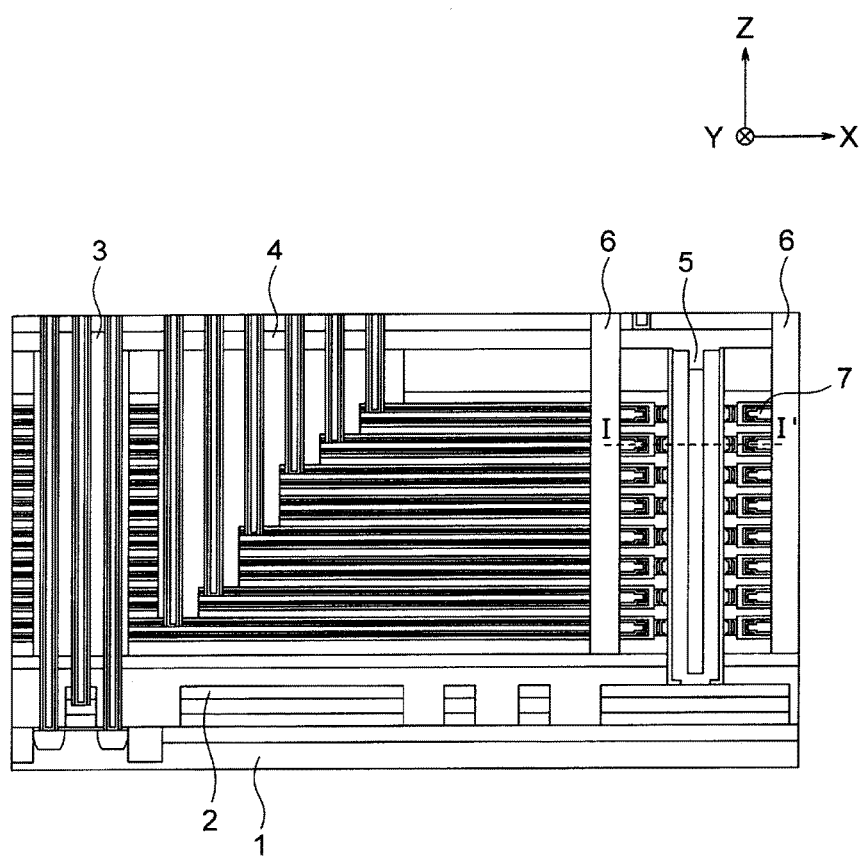
FIG. 25 is a sectional view illustrating the structure of the semiconductor device according to the second embodiment.

FIG. 25 is a sectional view illustrating the structure of the semiconductor device according to the second embodiment.

FIG. 25 illustrates the base MOSFET unit 2, the peripheral transistor unit 3, the stepped contact portion 4, the memory element unit 5, the slit trench portion 6, and the plurality of memory cell units 7 formed on the substrate 1.

The memory element unit 5 according to the first embodiment is electrically connected to a diffusion area in the substrate 1. The memory element unit 5 according to the second embodiment is electrically connected to the MOSFET of the base MOSFET unit 2. Specifically, the memory element unit 5 according to the second embodiment is electrically connected to a gate electrode of the MOSFET and functions as source lines of the memory cell units 7.

The reason why such a structure is employed in the second embodiment is as follows. If the memory hole 5a in the first embodiment is formed, the aspect ratio of the memory hole 5a is great since the diameter of the memory hole 5a is small. Thus, when the memory hole 5a is formed on the MOSFET, the memory hole 5a may pass through the MOSFET due to over etch. If the memory trench 5a in the second embodiment is formed, such a problem can be prevented since the opening area of the memory trench 5a is great. Thus, the memory element unit 5 according to the second embodiment is formed on the MOSFET.

(2) Method for Manufacturing Semiconductor Device According to Second Embodiment FIG. 26 to FIG. 73 are sectional views and enlarged sectional views illustrating a method for manufacturing the semiconductor device according to the second embodiment.

First, the base MOSFET unit 2 is formed on the substrate 1 (FIG. 26). Each MOSFET of the base MOSFET unit 2 includes a gate insulating film 31, a first gate electrode layer 32, a second gate electrode layer 33, and a third gate electrode layer 34 that are formed in order on the substrate 1. Examples of the gate insulating film 31 include a silicon oxide film. Examples of the first gate electrode layer 32 include a polysilicon layer. Examples of the second gate electrode layer 33 include a tungsten layer. Examples of the third gate electrode layer 34 include an n type polysilicon layer. The second and third gate electrode layers 33 and 34 function as source lines of the memory cell units 7 as well.

Next, a diffusion area 37 and an element isolation area 38 of the base MOSFET unit 2 are formed (FIG. 26). The diffusion area 37 is formed in the substrate 1 in such a manner that the gate electrode of each MOSFET is interposed therein. The element isolation area 38 is formed in the substrate 1 to isolate the MOSFETs. The element isolation area 38 of the present embodiment is formed by silicon trench isolation (STI) using a silicon oxide film.

Next, an interlayer insulating film 35 is formed to cover the base MOSFET unit 2 on the substrate 1. The surface of the interlayer insulating film 35 is flattened by chemical mechanical polishing (CMP), and a stopper layer 36 is formed on the interlayer insulating film 35 (FIG. 26). Examples of the interlayer insulating film 35 include a silicon oxide film. Examples of the stopper layer 36 include a polysilicon layer. The stopper layer 36 is used as an etching stopper when the memory trench 5a or the slit trench 6a is formed.

Next, the plurality of insulating layers 23 and the plurality of sacrificial layers 24 are alternately formed on the stopper layer 36, and a stopper layer 39 is formed on the insulating layers 23 and the sacrificial layers 24 (FIG. 27). The insulating layers 23 in the present embodiment are silicon oxide films. The sacrificial layers 24 in the present embodiment are silicon nitride films. Examples of the stopper layer 39 include a silicon nitride layer, and the thickness of the stopper layer 39 is set to be greater than the thickness of each sacrificial layer 24. The thickness of each insulating layer 23 is, for example, 50 nm. The thickness of each sacrificial layer 24 is, for example, 35 nm. The thickness of the stopper layer 39 is, for example, 100 nm.

Figure 28:
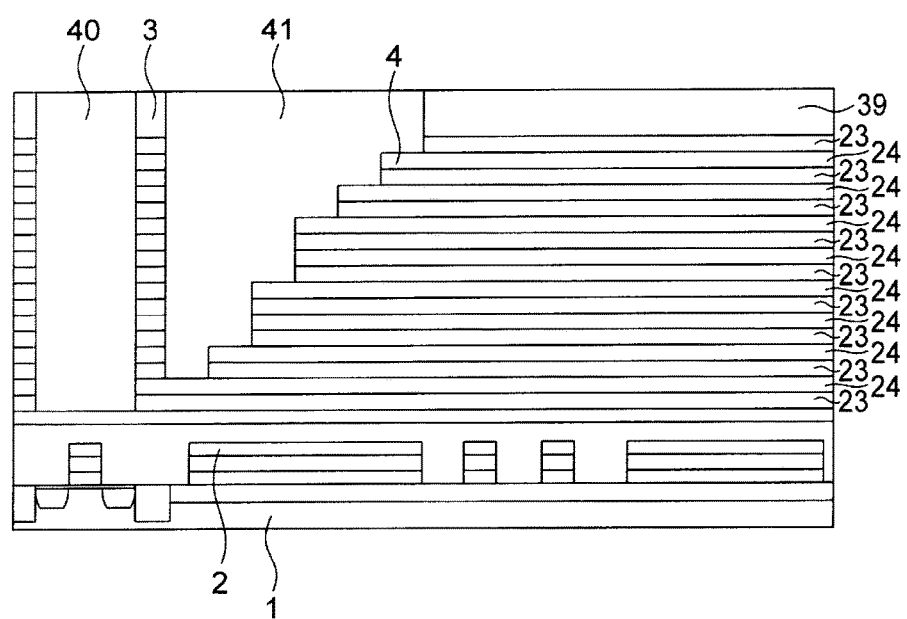
FIG. 28 is a sectional view illustrating a method for manufacturing the semiconductor device according to the second embodiment.

Next, an opening portion is formed in the area of the peripheral transistor unit 3 by using the stopper layer 36 as a stopper (FIG. 28). Next, an insulating film 40 is embedded in the opening portion, and the surface of the insulating film 40 is flattened by CMP (FIG. 28). Examples of the insulating film 40 include a tetraethyl orthosilicate (TEOS) film.

Next, a step-shaped opening portion is formed in the area of the stepped contact portion 4 by repeating a resist slimming process (FIG. 28). Next, an insulating film 41 is embedded in the opening portion, and the surface of the insulating film 41 is flattened by CMP (FIG. 28). Examples of the insulating film 41 include a TEOS film.

Figure 29:
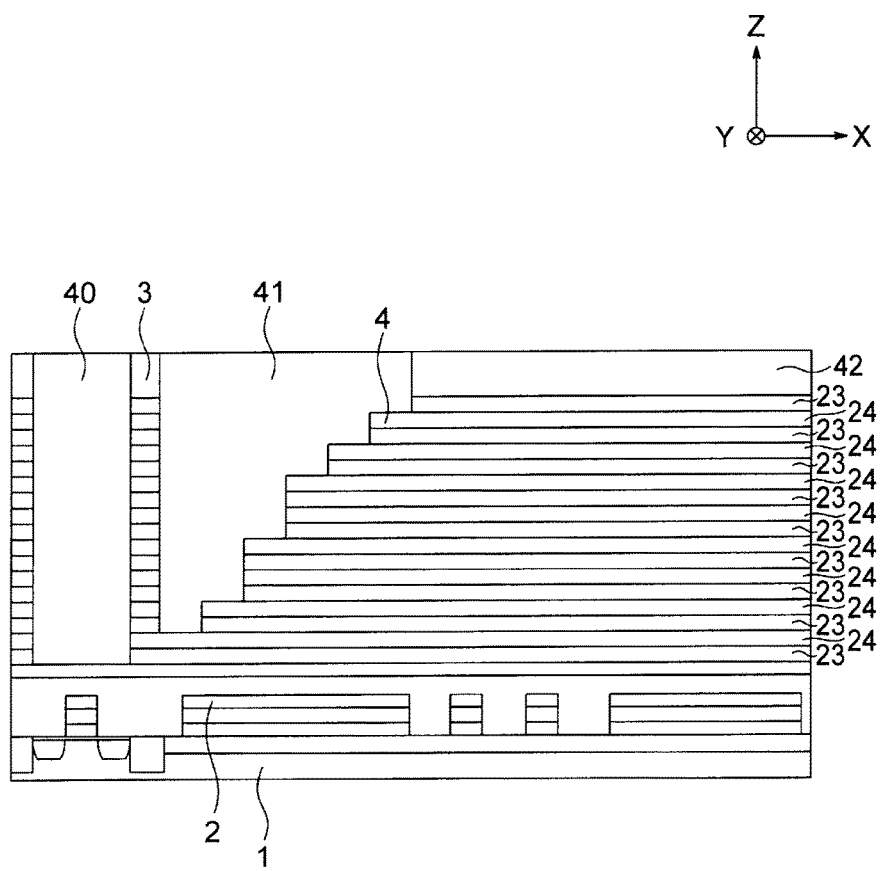
FIG. 29 is a sectional view illustrating a method for manufacturing the semiconductor device according to the second embodiment.

Next, the stopper layer 39 is removed, and a mask layer 42 is formed in the area from which the stopper layer 39 is removed (FIG. 29). The stopper layer 39 is removed by, for example, hot phosphoric acid treatment. Examples of the mask layer 42 include a TEOS film.

Figure 30:
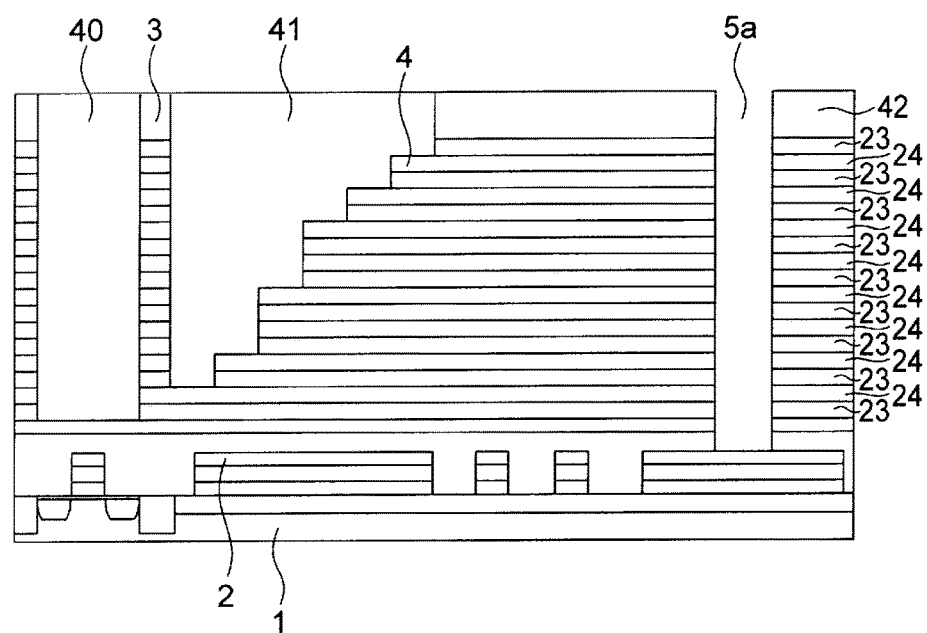
FIG. 30 is a sectional view illustrating a method for manufacturing the semiconductor device according to the second embodiment.

Next, the memory trench 5a that passes through the insulating layers 23 and the sacrificial layers 24 is formed by lithography and etching (FIG. 30). The memory trench 5a is formed by using the stopper layer 36 as a stopper, and then the stopper layer 36 and the interlayer insulating film 35 in the bottom portion of the memory trench 5a are removed in the present embodiment. Accordingly, the memory trench 5a reaches the MOSFET of the base MOSFET unit 2.

The memory trench 5a extends in the Z direction as illustrated in FIG. 30. In addition, the memory trench 5a extends in the Y direction as well and has a band-shaped planar shape. The memory trench 5a is an example of the first recess portion.

Next, the sacrificial layers 24 that are exposed to the memory trench 5a are recessed, and the recess portion 5b is formed adjacent to the sacrificial layers 24 (FIG. 31). The sacrificial layers 24 are recessed by, for example, hot phosphoric acid treatment. The amount of recess of the sacrificial layers 24 (the depth of the recess portion 5b) is, for example, 20 nm. The recess portion 5b is an example of the second recess portion.

Next, the modified oxide film 25 is formed by dry $O_2$ oxidation on the surfaces of the sacrificial layers 24 (FIG. 32).

Figure 33A:
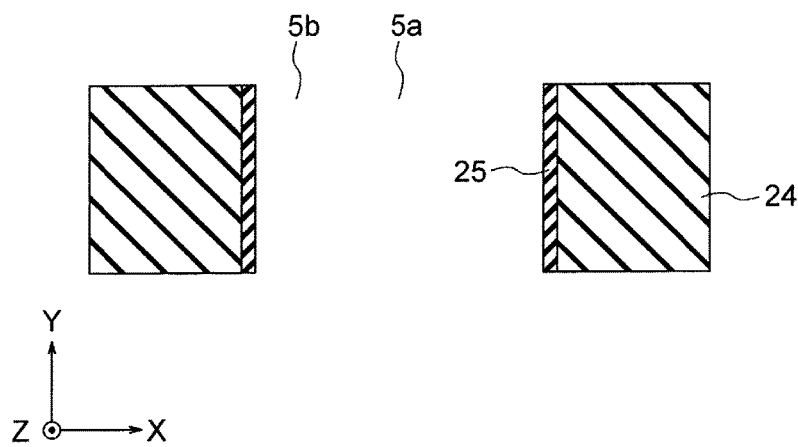
FIGS. 33A and 33B are enlarged sectional views illustrating a method for manufacturing the semiconductor device according to the second embodiment.
Figure 33B:
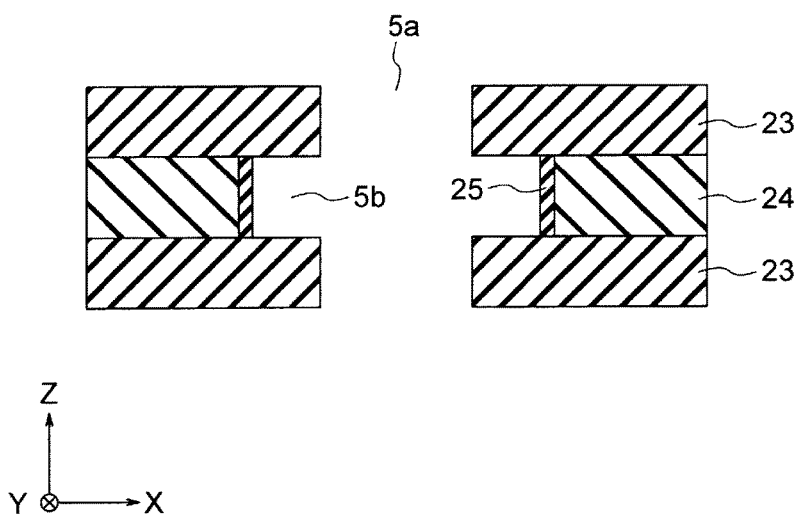

FIG. 33A and FIG. 33B are enlarged views in FIG. 32. FIG. 33A illustrates a horizontal section taken along a line I-I' in FIG. 32. FIG. 33B illustrates a vertical section near the line I-I' in FIG. 32. The memory trench 5a extends in the Y direction in FIG. 33A, and the memory trench 5a extends in the Z direction in FIG. 33B.

Figure 34A:
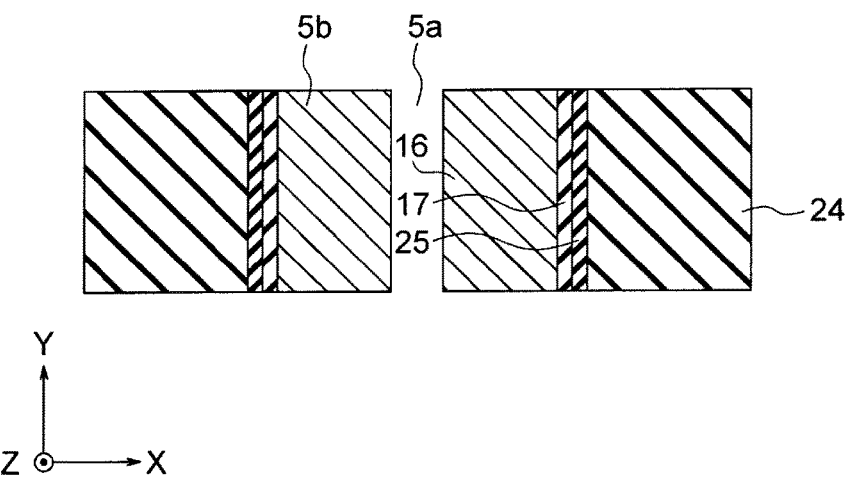
FIGS. 34A and 34B are enlarged sectional views illustrating a method for manufacturing the semiconductor device according to the second embodiment.
Figure 34B:
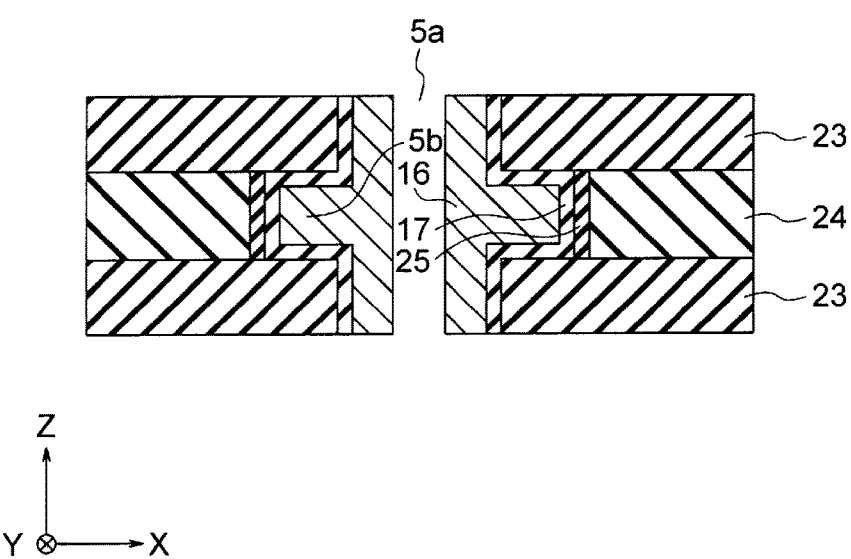

Next, the second CT film 17 is formed on the entire surface of the substrate 1, and the second CT film 17 is crystallized by RTA (FIG. 34A and FIG. 34B). Consequently, the second CT film 17 is formed on the side surface of the modified oxide film 25 and the upper surface and the lower surface of the recess portion 5b. Examples of the second CT film 17 include an HfSiON film. The thickness of the second CT film 17 is, for example, 5 nm. RTA is performed at greater than or equal to 900° C. in the present embodiment, and thus mixing between the HfSiON of the second CT film 17 and the amorphous silicon of the first CT film 16 can be prevented.

Next, the first CT film 16 is formed on the entire surface of the substrate 1 (FIG. 34A and FIG. 34B). Consequently, the first CT film 16 is formed in the recess portion 5b. Examples of the first CT film 16 include an amorphous silicon layer. When the first CT film 16 is configured as a polysilicon layer, etching of the first CT film 16 proceeds through the grain boundaries of polysilicon, and thus the etching is difficult to control. Thus, the first CT film 16 is configured as an amorphous silicon layer in the present embodiment. The amorphous silicon layer is changed to a polysilicon layer by crystallization after the etching processes in FIG. 35A and FIG. 35B.

Figure 35A:
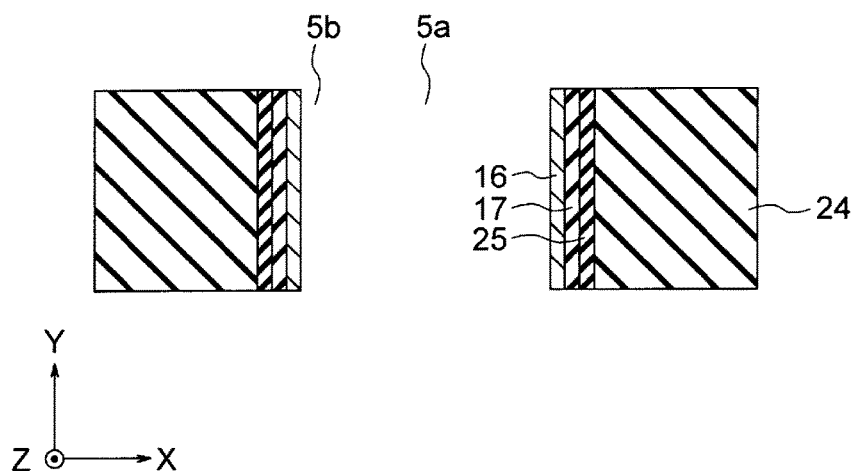
FIGS. 35A and 35B are enlarged sectional views illustrating a method for manufacturing the semiconductor device according to the second embodiment.
Figure 35B:
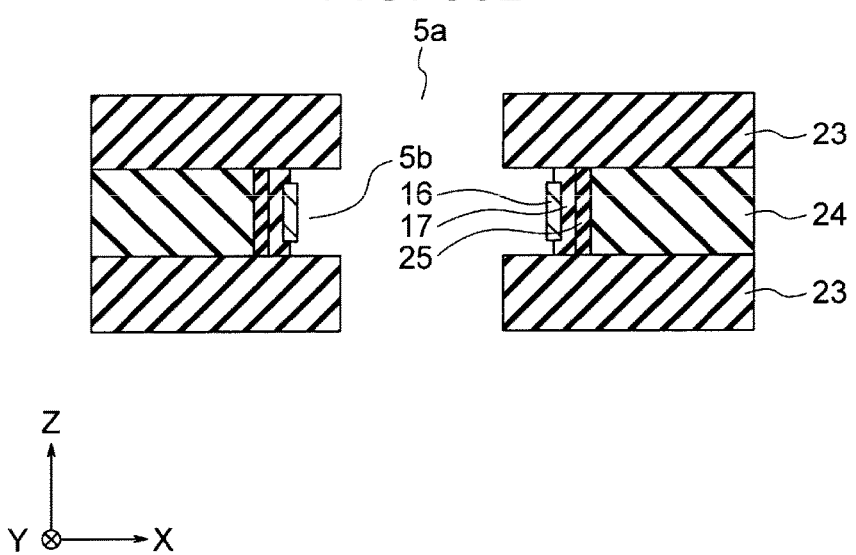

Next, the first CT film 16 is selectively etched (FIG. 35A and FIG. 35B). Consequently, the first CT film 16 having a thickness of 5 nm remains on the side surface of the second CT film 17. The first CT film 16 is etched by, for example, the TMAH treatment.

Next, the second CT film 17 is selectively removed by using the first CT film 16 as a mask (FIG. 35A and FIG. 35B). Consequently, the second CT film 17 remains on the side surface of the modified oxide film 25 and a portion of the upper surface and the lower surface of the recess portion 5b. The second CT film 17 is removed by, for example, a phosphoric acid treatment at less than or equal to a temperature of 150° C.

Figure 36A:
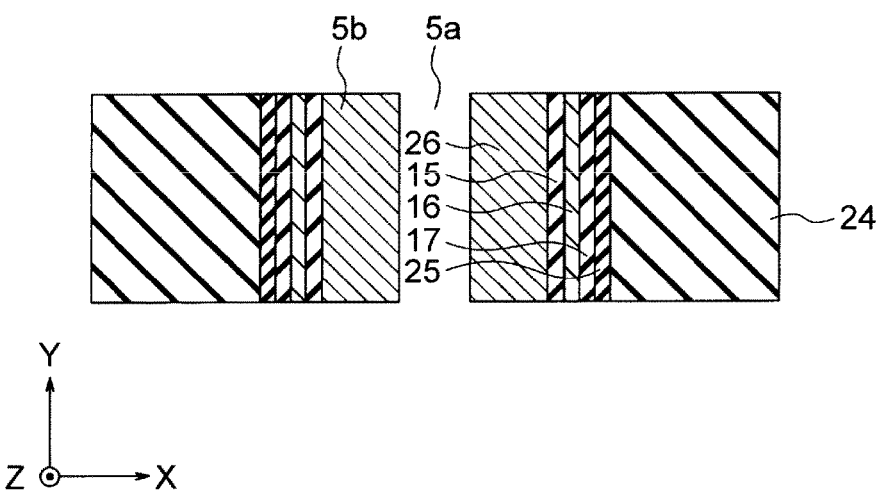
FIGS. 36A and 36B are enlarged sectional views illustrating a method for manufacturing the semiconductor device according to the second embodiment.
Figure 36B:
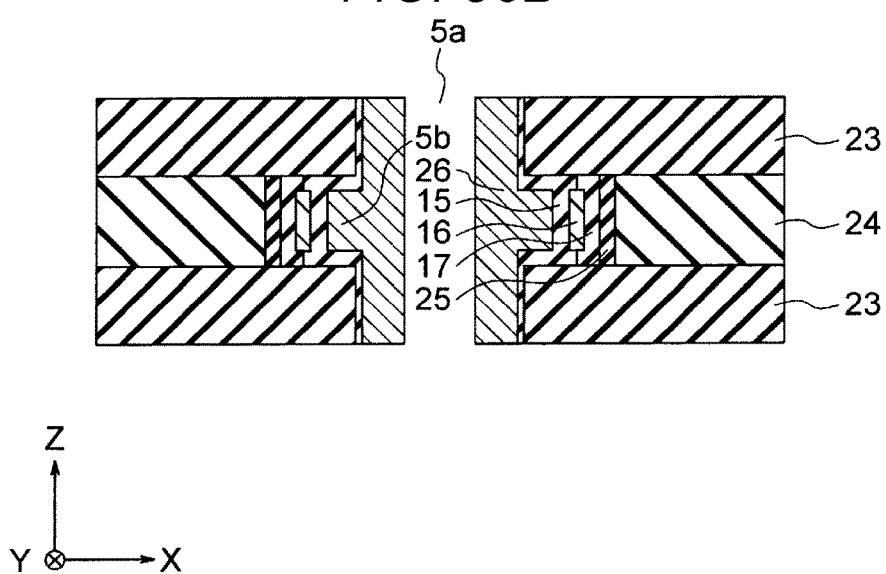

Next, the inter-gate insulating film 15 is formed on the entire surface of the substrate 1 (FIG. 36A and FIG. 36B). Consequently, the inter-gate insulating film 15 is formed on the side surfaces of the first and second CT films 16 and 17 and the upper surface and the lower surface of the recess portion 5b. Examples of the inter-gate insulating film 15 include a silicon oxynitride film. The thickness of the inter-gate insulating film 15 is, for example, 3 nm.

Next, the dummy layer 26 is formed on the entire surface of the substrate 1 (FIG. 36A and FIG. 36B). Consequently, the dummy layer 26 is formed in the recess portion 5b. Examples of the dummy layer 26 include an amorphous silicon layer.

Figure 37A:
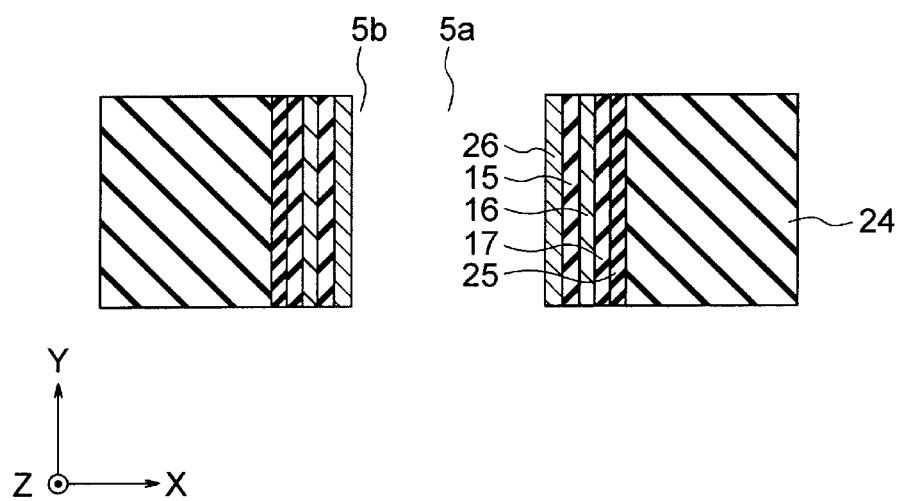
FIGS. 37A and 37B are enlarged sectional views illustrating a method for manufacturing the semiconductor device according to the second embodiment.
Figure 37B:
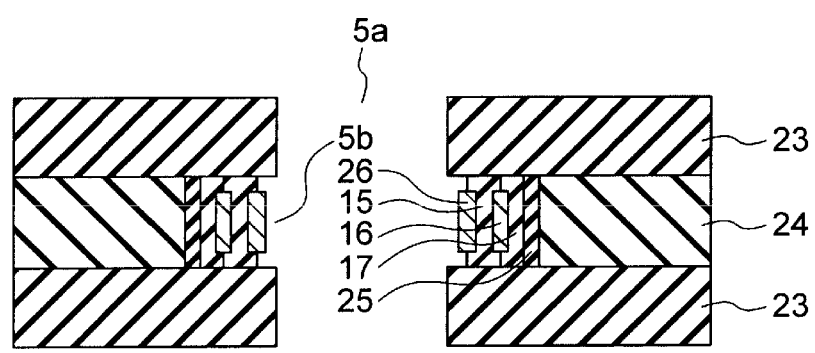

Next, the dummy layer 26 is selectively etched (FIG. 37A and FIG. 37B). Consequently, the dummy layer 26 having a thickness of 5 nm remains on the side surface of the inter-gate insulating film 15. The dummy layer 26 is etched by, for example, the TMAH treatment.

Next, the inter-gate insulating film 15 is selectively removed by using the dummy layer 26 as a mask (FIG. 37A and FIG. 37B). Consequently, the inter-gate insulating film 15 remains on the side surfaces of the first and second CT films 16 and 17 and the upper surface and the lower surface of the recess portion 5b. The inter-gate insulating film 15 is removed by, for example, the DHF treatment.

Next, the dummy layer 26 is selectively removed (FIG. 38A and FIG. 38B). The dummy layer 26 is removed by, for example, the TMAH treatment at room temperature.

Figure 39A:
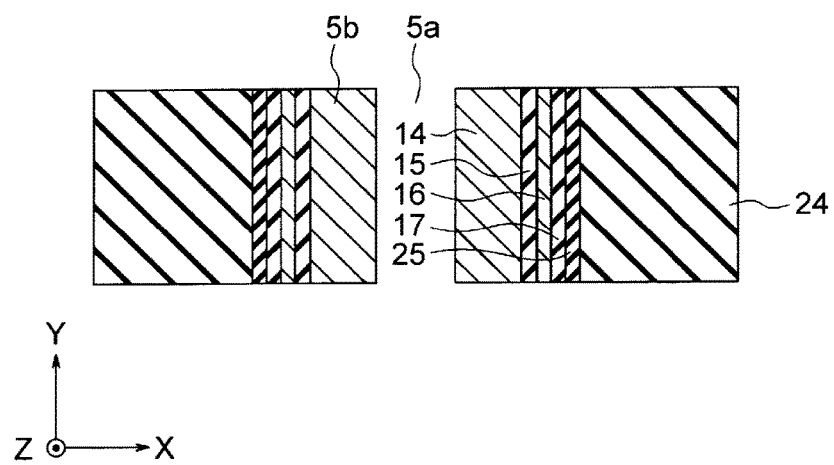
FIGS. 39A and 39B are enlarged sectional views illustrating a method for manufacturing the semiconductor device according to the second embodiment.
Figure 39B:
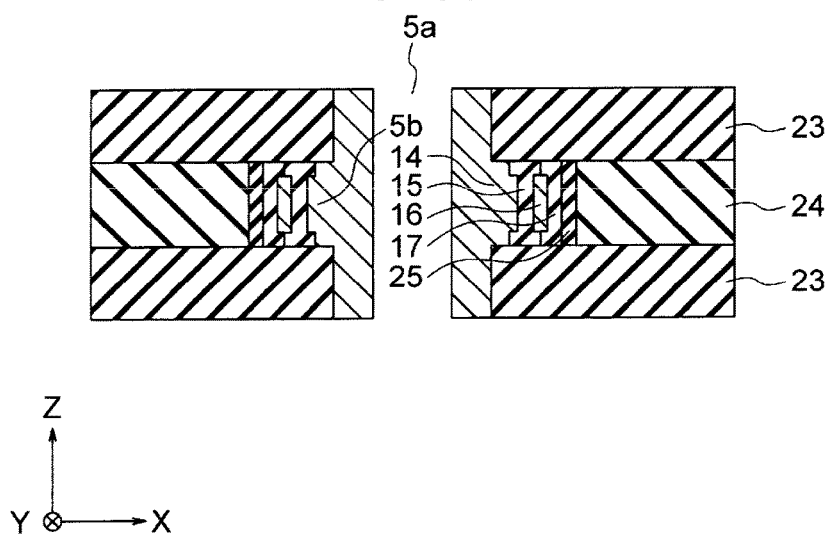

Next, the FG layer 14 is formed on the entire surface of the substrate 1 (FIG. 39A and FIG. 39B). Consequently, the FG layer 14 is formed in the recess portion 5b. Examples of the FG layer 14 include an amorphous silicon layer. The amorphous silicon layer is changed to a polysilicon layer by crystallization after the etching processes in FIG. 40A and FIG. 40B.

Figure 40A:
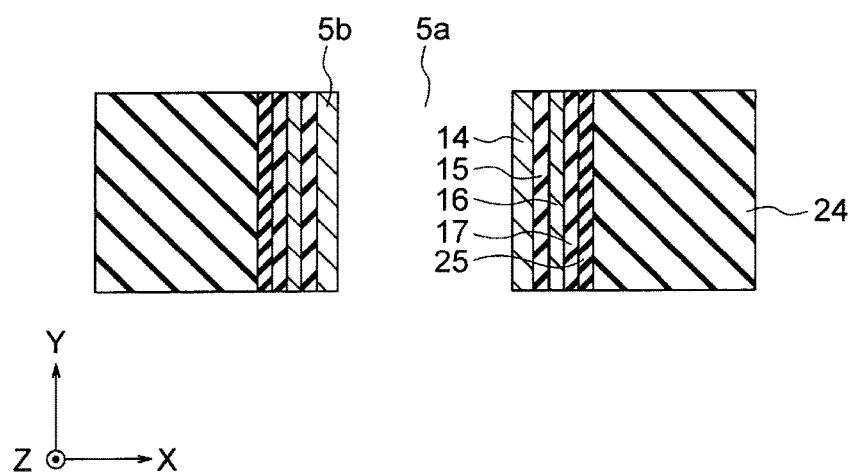
FIGS. 40A and 40B are enlarged sectional views illustrating a method for manufacturing the semiconductor device according to the second embodiment.
Figure 40B:
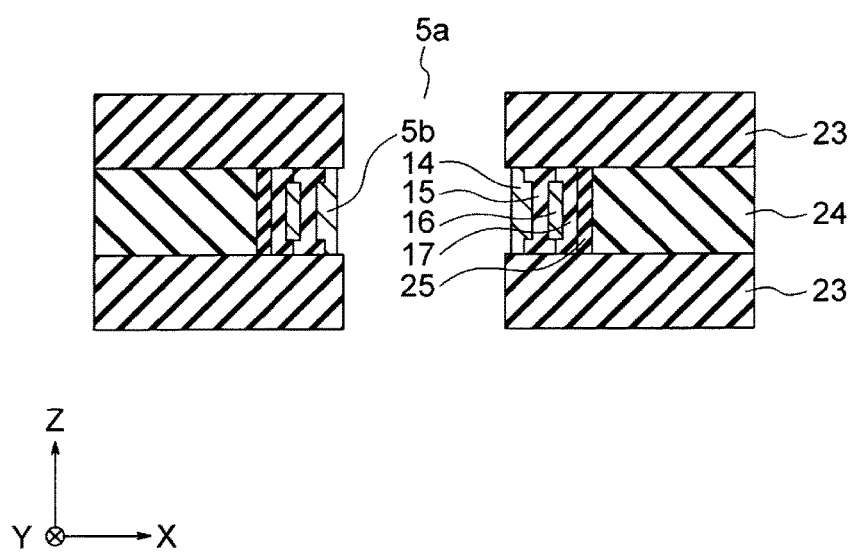

Next, the FG layer 14 is selectively etched (FIG. 40A and FIG. 40B). Consequently, the FG layer 14 having a thickness of 5 nm remains on the side surface of the inter-gate insulating film 15 and a portion of the upper surface and the lower surface of the recess portion 5b. The FG layer 14 is etched by, for example, the TMAH treatment at room temperature.

The FG layer 14, the inter-gate insulating film 15, the first CT film 16, and the second CT film 17 are formed in the recess portion 5b. The total thickness is 18 nm. The depth of the recess portion 5b is 20 nm. Thus, the inner periphery of the FG layer 14 recedes by 2 nm from the outer periphery of the memory trench 5a.

Figure 41A:
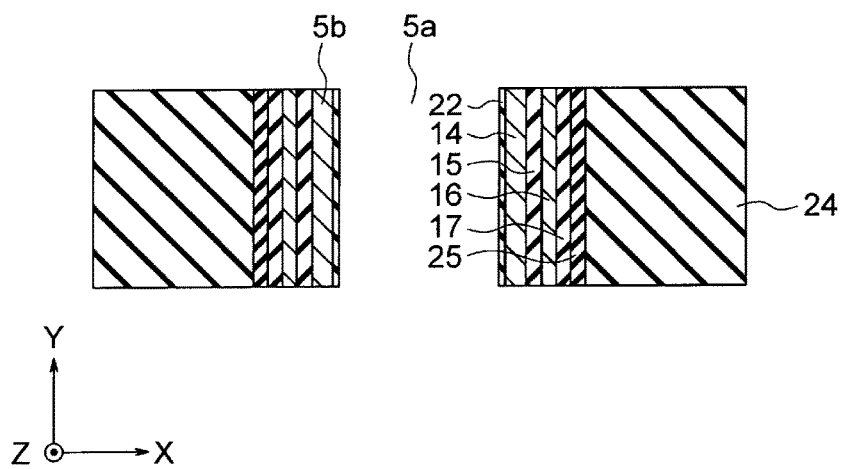
FIGS. 41A and 41B are enlarged sectional views illustrating a method for manufacturing the semiconductor device according to the second embodiment.
Figure 41B:
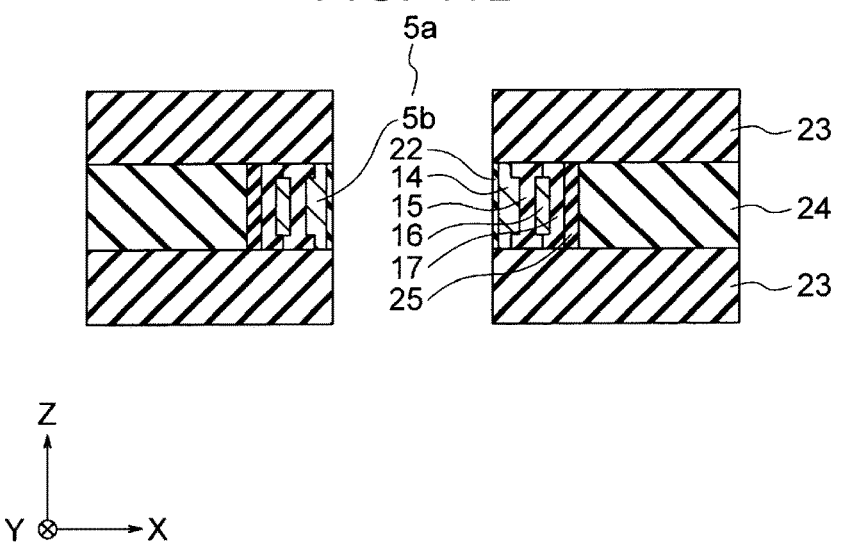

Next, the oxide film 22 is formed on the surface of the FG layer 14 by oxidizing the FG layer 14 (FIG. 41A and FIG. 41B). The thickness of the oxide film 22 is, for example, 2 nm. The oxide film 22 in the present embodiment is formed in order to easily decrease the interface state between the tunnel insulating film 13 and the FG layer 14.

FIG. 42 is a sectional view corresponding to FIG. 41A and FIG. 41B.

Next, the tunnel insulating film 13 is formed on the entire surface of the substrate 1 (FIG. 43). Consequently, the tunnel insulating film 13 is formed on the side surface and the bottom surface of the memory trench 5a. Next, the first layer 12a of the channel semiconductor layer 12 is formed on the entire surface of the substrate 1 (FIG. 43). Consequently, the first layer 12a is formed on the side surface and the bottom surface of the memory trench 5a.

Figure 44:
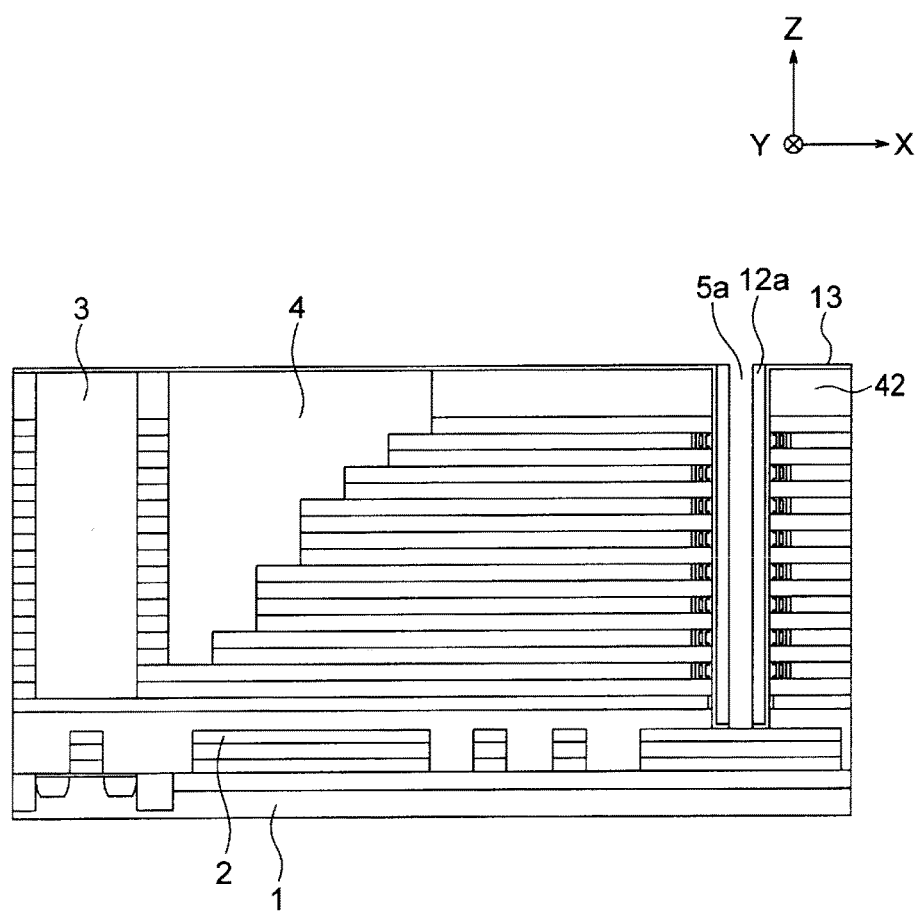
FIG. 44 is a sectional view illustrating a method for manufacturing the semiconductor device according to the second embodiment.

Next, the first layer 12a is processed by etch-back (FIG. 44). Consequently, the first layer 12a is removed from the bottom surface of the memory trench 5a. Next, the tunnel insulating film 13 is processed by using the first layer 12a as a mask (FIG. 44). Consequently, the tunnel insulating film 13 is removed from the bottom surface of the memory trench 5a, and a MOSFET is exposed to the bottom surface of the memory trench 5a.

Figure 45:
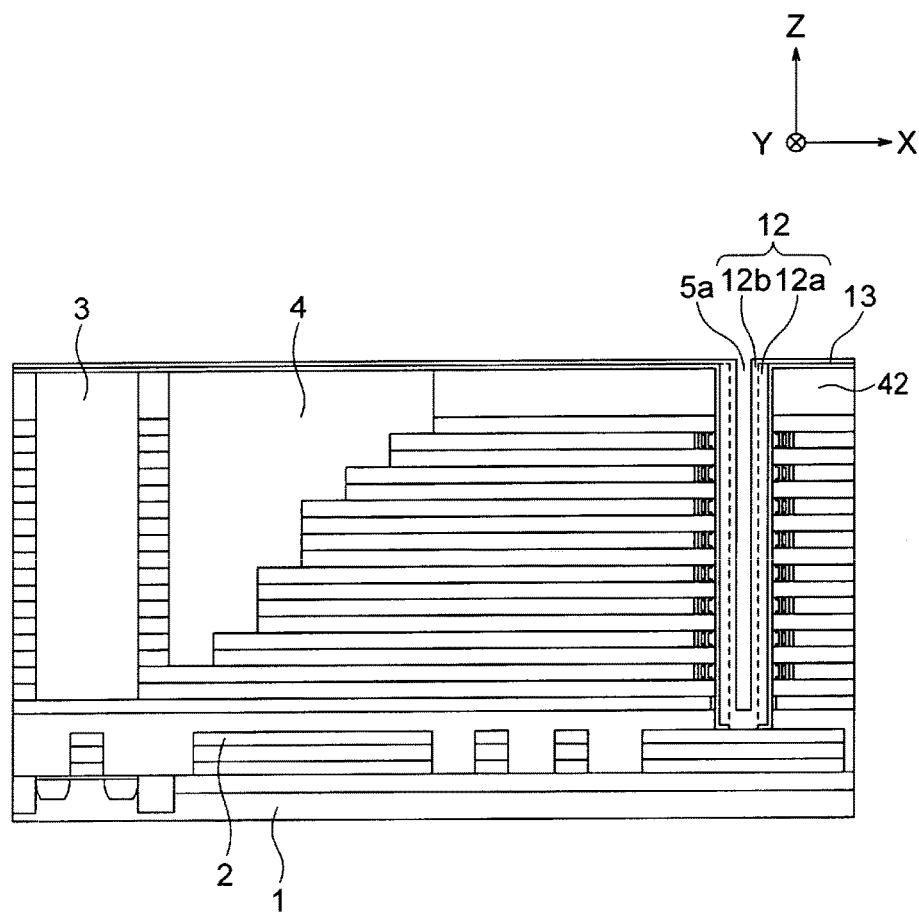
FIG. 45 is a sectional view illustrating a method for manufacturing the semiconductor device according to the second embodiment.

Next, the second layer 12b of the channel semiconductor layer 12 is formed on the entire surface of the substrate 1 (FIG. 45). Consequently, the channel semiconductor layer 12 is formed on the side surface and the bottom surface of the memory trench 5a, and the channel semiconductor layer 12 is electrically connected to the MOSFET.

Figure 46:
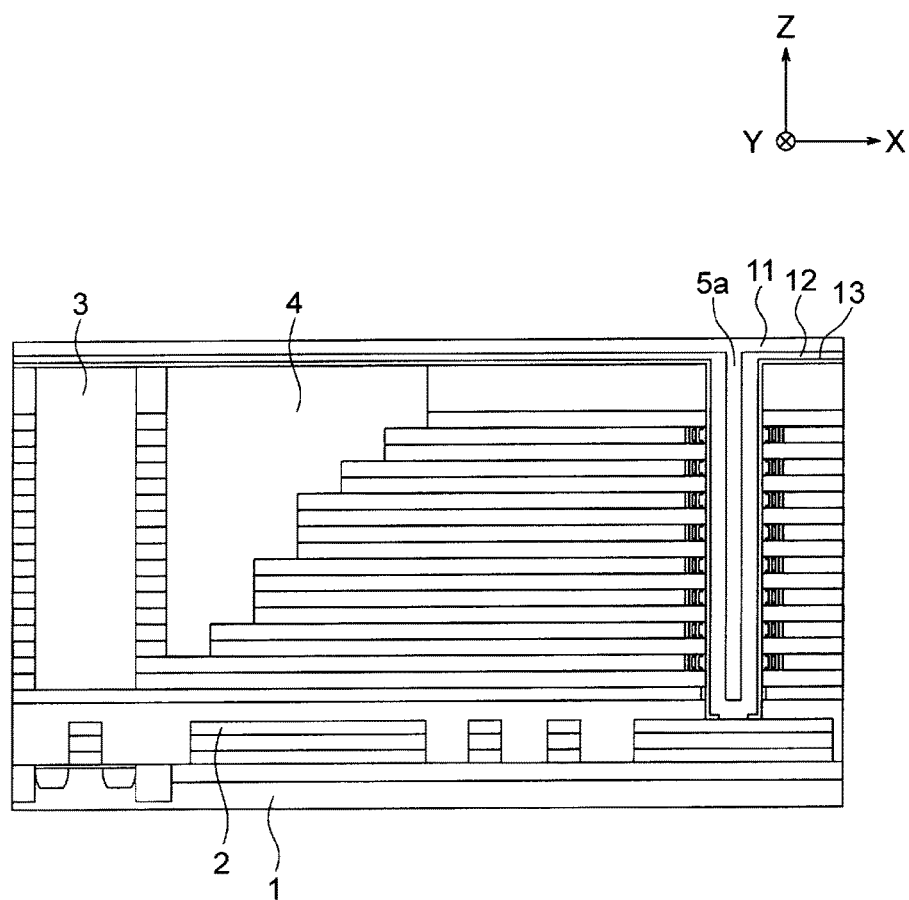
FIG. 46 is a sectional view illustrating a method for manufacturing the semiconductor device according to the second embodiment.

Next, the core layer 11 is formed on the entire surface of the substrate 1 (FIG. 46). Consequently, the core layer 11 is formed in the memory trench 5a. Examples of the core layer 11 include an insulating film such as a silicon oxide film and a semiconductor layer such as a $p^+$ type silicon layer.

Figure 47:
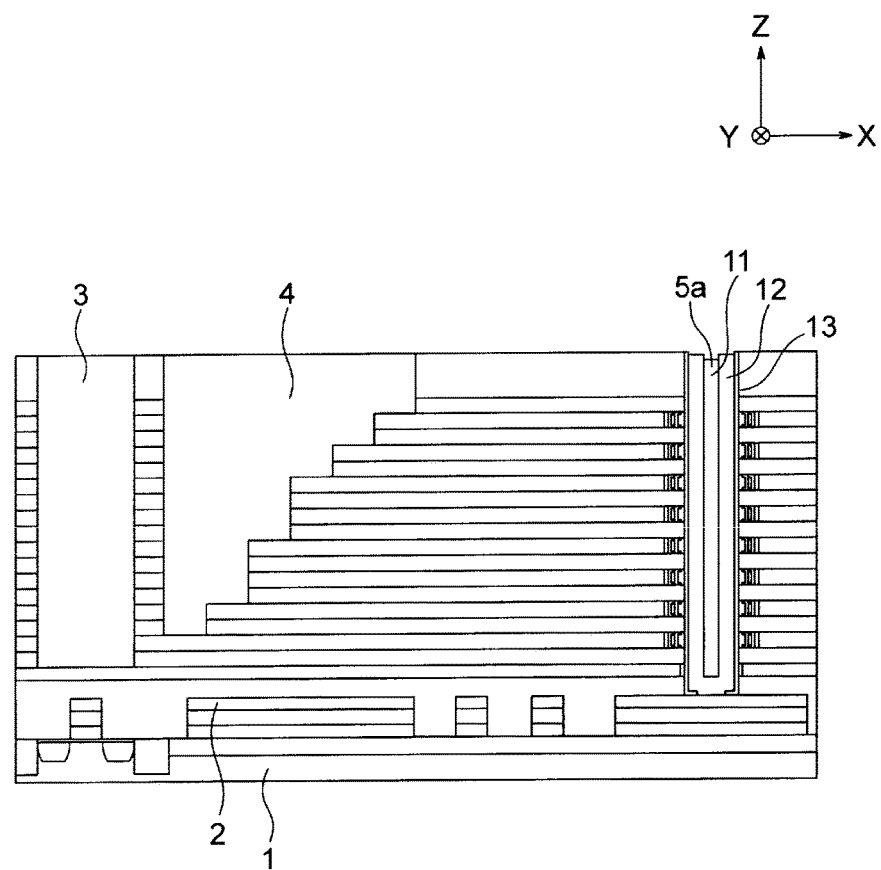
FIG. 47 is a sectional view illustrating a method for manufacturing the semiconductor device according to the second embodiment.

Next, the core layer 11 and the channel semiconductor layer 12 are divided by etch-back for individual memory trenches 5a (FIG. 47).

Figure 48:
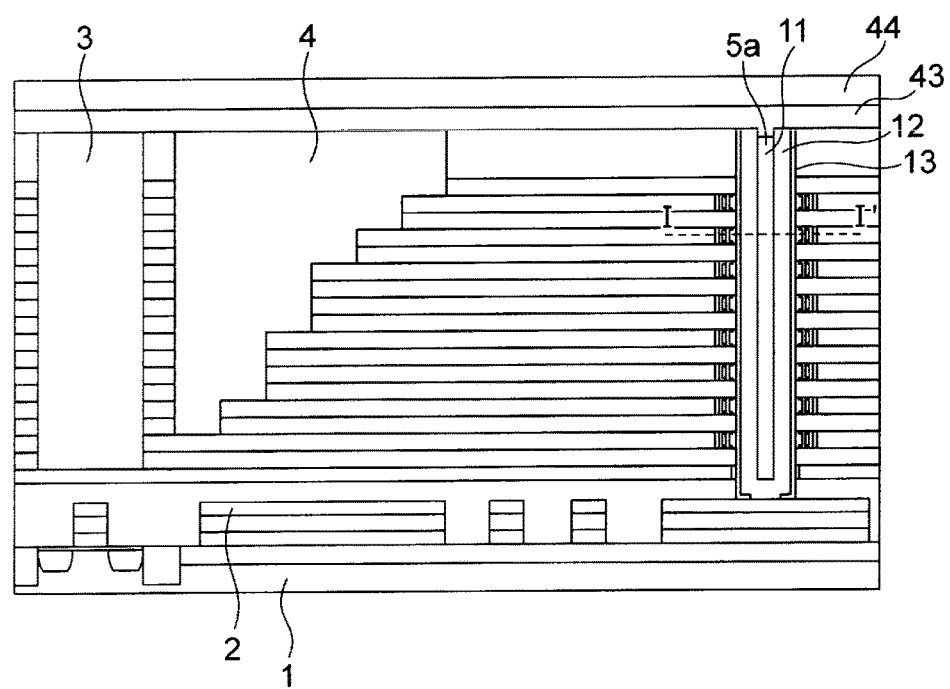
FIG. 48 is a sectional view illustrating a method for manufacturing the semiconductor device according to the second embodiment.

Next, a capping layer 43 and a mask layer 44 are formed in order on the entire surface of the substrate 1 (FIG. 48). Consequently, the capping layer 43 is embedded in the memory trench 5a. Examples of the capping layer 43 include a polysilicon layer. Examples of the mask layer 44 include a TEOS film. The mask layer 44 is used as a mask for AA processing.

Figure 49A:
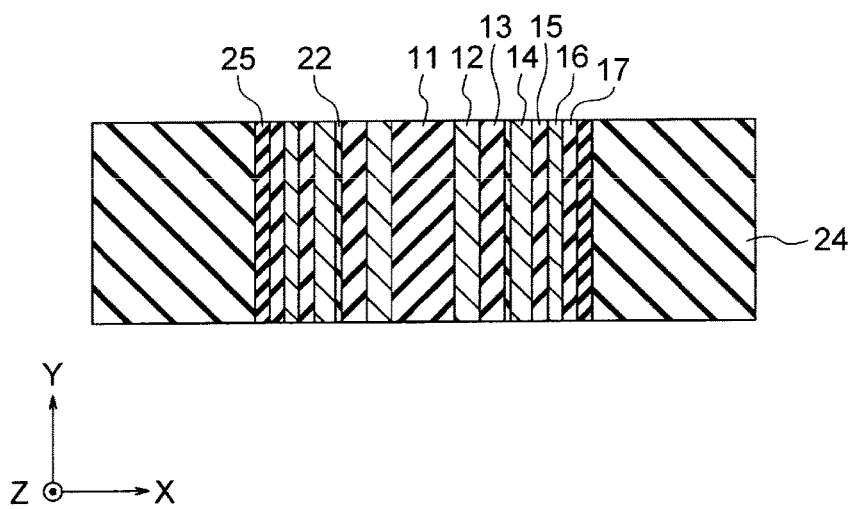
FIGS. 49A and 49B are enlarged sectional views illustrating a method for manufacturing the semiconductor device according to the second embodiment.
Figure 49B:
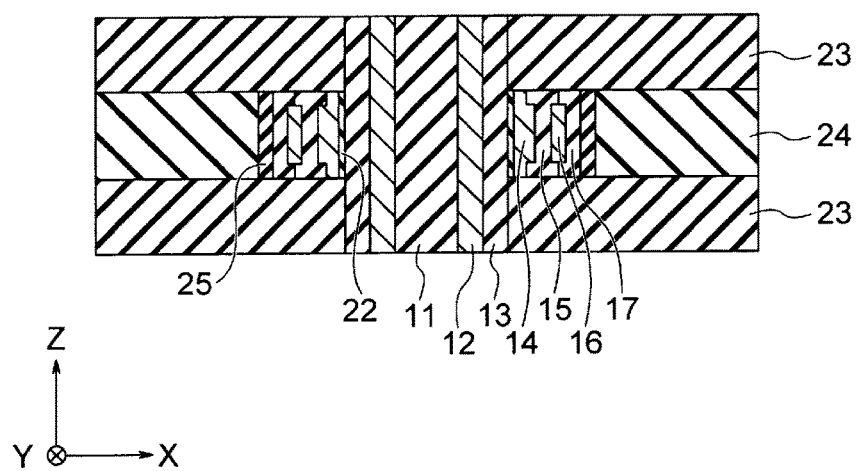

FIG. 49A and FIG. 49B are enlarged views in FIG. 48. FIG. 49A illustrates a horizontal section taken along a line I-I' in FIG. 48. FIG. 49B illustrates a vertical section near the line I-I' in FIG. 48. The core layer 11, the channel semiconductor layer 12, and the tunnel insulating film 13 extend in the Y direction in FIG. 49A. The core layer 11, the channel semiconductor layer 12, and the tunnel insulating film 13 extend in the Z direction in FIG. 49B.

Next, a resist layer 45 is formed on the mask layer 44, and an opening portion that extends in the X direction is formed in the resist layer 45 (FIG. 50A and FIG. 50B). The opening portion is then transferred to the mask layer 44 and the capping layer 43. The resist layer 45 is actually above the horizontal section in FIG. 50A but is illustrated within the section in FIG. 50A for convenience of description.

Next, the core layer 11 and the channel semiconductor layer 12 in the opening portion are selectively etched by using the mask layer 44 and the capping layer 43 as a mask (FIG. 51A and FIG. 51B). Consequently, a recess portion 5c is formed in the core layer 11 and the channel semiconductor layer 12 in the opening portion. The recess portion 5c is used in order to divide each layer in the memory trench 5a and the recess portion 5b for individual memory element units 5. The recess portion 5c of the present embodiment is formed in a vertical section different from FIG. 51B. The recess portion 5c is an example of a fifth recess portion.

Figure 52A:
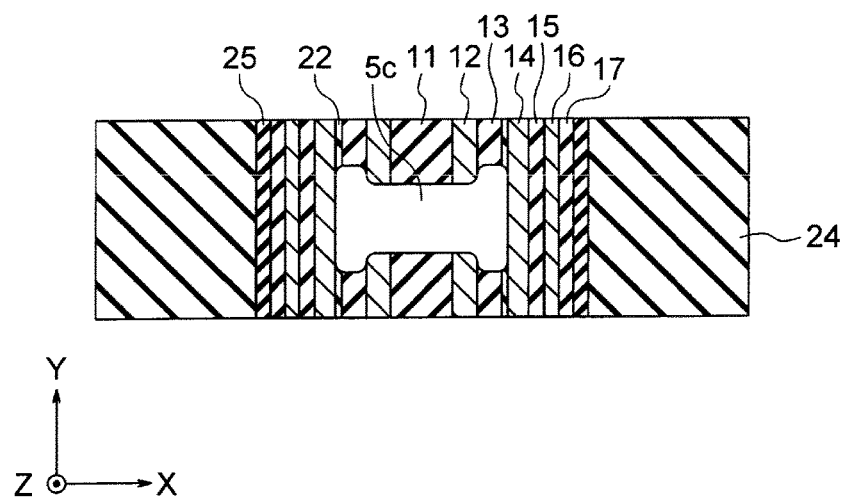
FIGS. 52A and 52B are enlarged sectional views illustrating a method for manufacturing the semiconductor device according to the second embodiment.
Figure 52B:
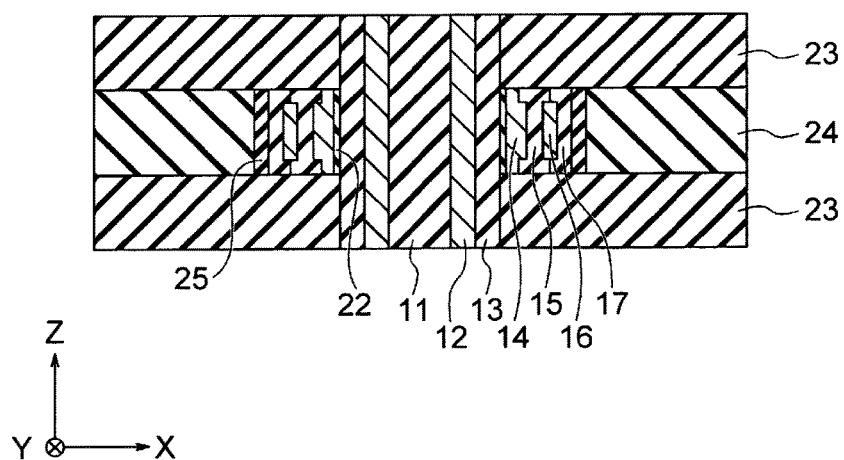

Next, the tunnel insulating film 13 that is exposed to the recess portion 5c and the oxide film 22 are processed by wet etching (FIG. 52A and FIG. 52B). Consequently, these films are recessed, and the X-direction width of the recess portion 5c is increased. The present process is performed by, for example, the DHF treatment. The thicknesses of the tunnel insulating film 13 and the oxide film 22 of the present embodiment are 4 nm and 2 nm, and each corner portion of the recess portion 5c is recessed by approximately 7 nm in the ±Y directions (6 nm+an error of 10%).

Figure 53A:
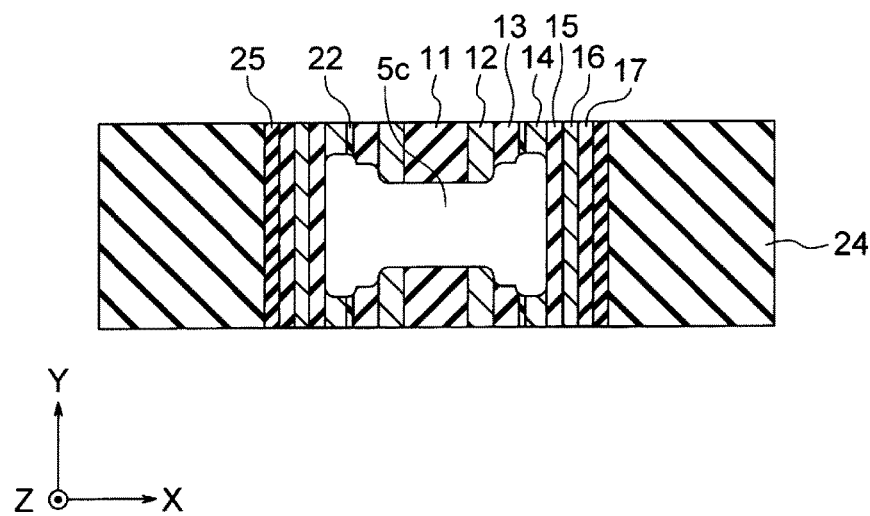
FIGS. 53A and 53B are enlarged sectional views illustrating a method for manufacturing the semiconductor device according to the second embodiment.
Figure 53B:
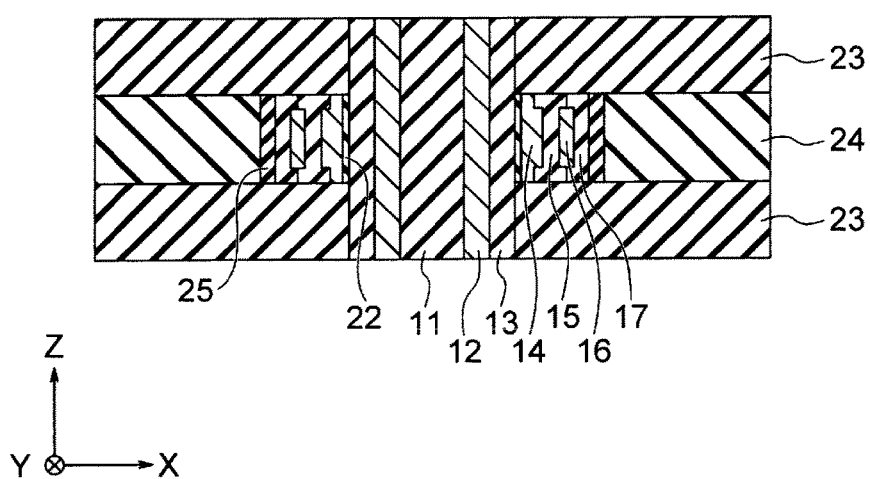

Next, the FG layer 14 that is exposed to the recess portion 5c is processed by wet etching (FIG. 53A and FIG. 53B). Consequently, the FG layer 14 is recessed, and the X-direction width of the recess portion 5c is increased. The present process is performed by, for example, the TMAH treatment at room temperature. The thickness of the FG layer 14 in the present embodiment is 5 nm, and each corner portion of the recess portion 5c is further recessed by approximately 6 nm in the +/−Y directions (5 nm+an error of 10%). Thus, the total amount of recessing of each corner portion is 13 nm. The core layer 11 and the channel semiconductor layer 12 are recessed by 6 nm as well (if the core layer 11 is a silicon layer).

Next, the inter-gate insulating film 15 that is exposed to the recess portion 5c is processed by wet etching (FIG. 54A and FIG. 54B). Consequently, the inter-gate insulating film 15 is recessed, and the X-direction width of the recess portion 5c is increased. The present process is performed by, for example, the DHF treatment. The thickness of the inter-gate insulating film 15 in the present embodiment is 3 nm, and each corner portion of the recess portion 5c is further recessed by approximately 3 nm in the +/−Y directions (3 nm+an error of 10%). Thus, the total amount of recessing of each corner portion is 16 nm. The tunnel insulating film 13 is recessed by 3 nm as well.

Next, the first CT film 16 that is exposed to the recess portion 5c is processed by wet etching (FIG. 55A and FIG. 55B). Consequently, the first CT film 16 is recessed, and the X-direction width of the recess portion 5c is increased. The present process is performed by, for example, the TMAH treatment at room temperature. The thickness of the first CT film 16 in the present embodiment is 5 nm, and each corner portion of the recess portion 5c is further recessed by approximately 6 nm in the +/−Y directions (5 nm+an error of 10%). Thus, the total amount of recessing of each corner portion is 22 nm.

Next, the second CT film 17 that is exposed to the recess portion 5c is processed by wet etching (FIG. 56A and FIG. 56B). Consequently, the second CT film 17 is recessed, and the X-direction width of the recess portion 5c is increased. The present process is performed by, for example, hot phosphoric acid treatment. The thickness of the second CT film 17 in the present embodiment is 5 nm, and each corner portion of the recess portion 5c is further recessed by approximately 6 nm in the +/−Y directions (5 nm+an error of 10%). Thus, the total amount of recessing of each corner portion is 28 nm.

Accordingly, the total amount of recessing of each recess portion 5c is 56 nm in the +/−Y directions. If the initial Y-direction width of the recess portion 5c (the width in FIG. 51A) is 25 nm, the Y-direction distance between the corner portions in each recess portion 5c is increased from 25 nm to 81 nm (25+56 nm) by recessing. The Y-direction distance between the memory element units 5 illustrated in FIG. 24B is 90 nm. This distance indicates that the recess portion 5c in FIG. 56A is included in this distance. Thus, the channel semiconductor layer 12, the FG layer 14, the first CT film 16, the second CT film 17, and the like in the memory trench 5a and the recess portion 5b are divided into a plurality of sets by one or more recess portions 5c in the present embodiment, and thus the plurality of memory element units 5 illustrated in FIG. 24B can be formed. In this case, one set of the channel semiconductor layer 12, the FG layer 14, the first CT film 16, the second CT film 17, and the like configures one memory element unit 5.

Figure 57A:
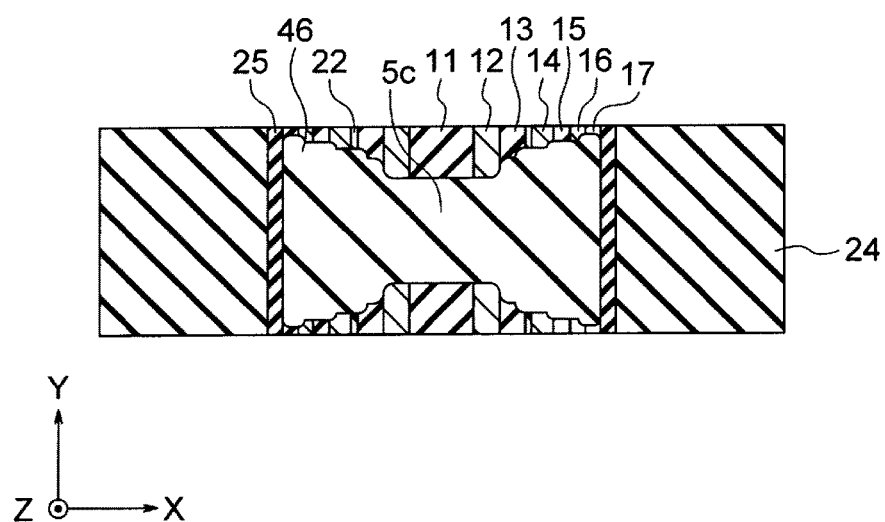
FIGS. 57A and 57B are enlarged sectional views illustrating a method for manufacturing the semiconductor device according to the second embodiment.
Figure 57B:
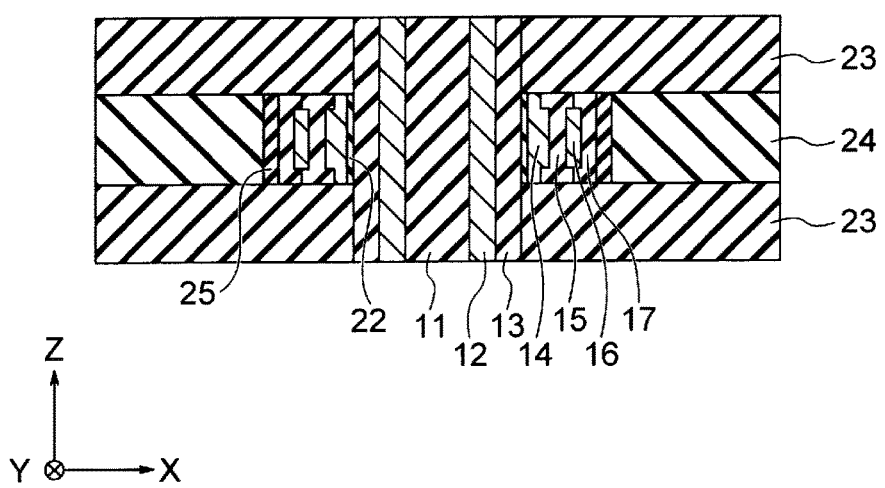
Figure 58:
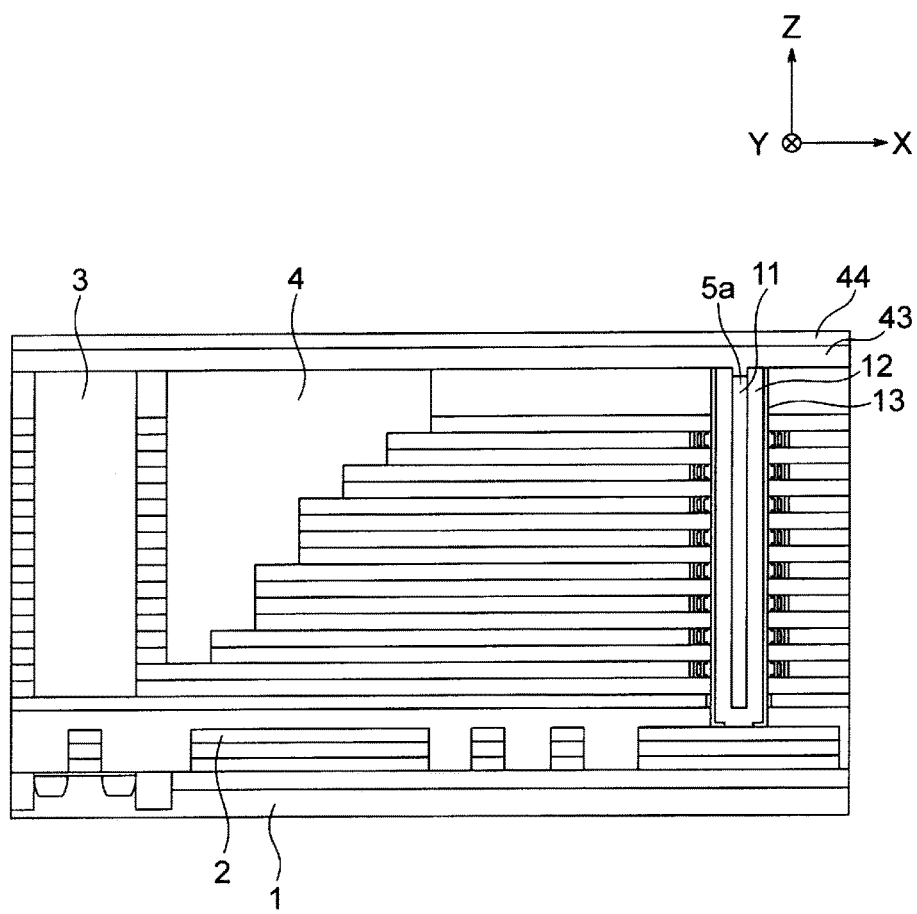
FIG. 58 is a sectional view illustrating a method for manufacturing the semiconductor device according to the second embodiment.

Next, an insulating film 46 is embedded in the recess portion 5c, and the surface of the insulating film 46 is flattened (FIG. 57A and FIG. 57B). Consequently, the insulating film 46 divides the memory element units 5. Examples of the insulating film 46 include a stacked film that includes a low temperature oxide (LTO) film and a polysilazane (PSZ) film. FIG. 58 is a sectional view corresponding to FIG. 57A and FIG. 57B.

Figure 59A:
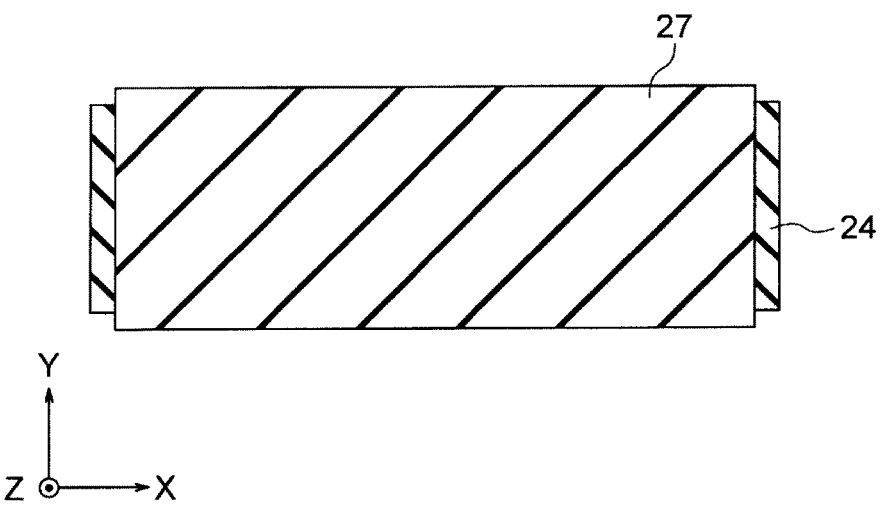
FIGS. 59A and 59B are enlarged sectional views illustrating a method for manufacturing the semiconductor device according to the second embodiment.
Figure 59B:
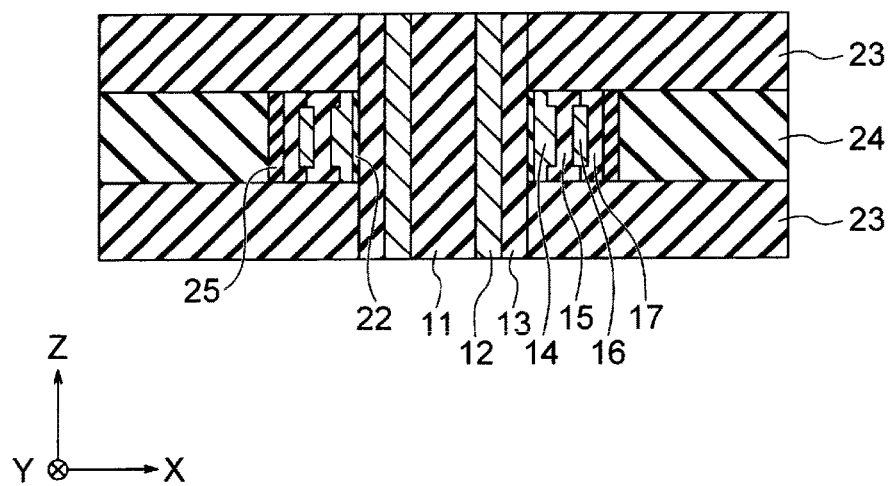

Next, the resist layer 27 is formed on the insulating layers 23 and the sacrificial layers 24 in order to form the slit trench portion 6 (FIG. 59A and FIG. 59B). The resist layer 27 is actually above the horizontal section in FIG. 59A but is illustrated within the section in FIG. 59A for convenience of description.

Figure 60A:
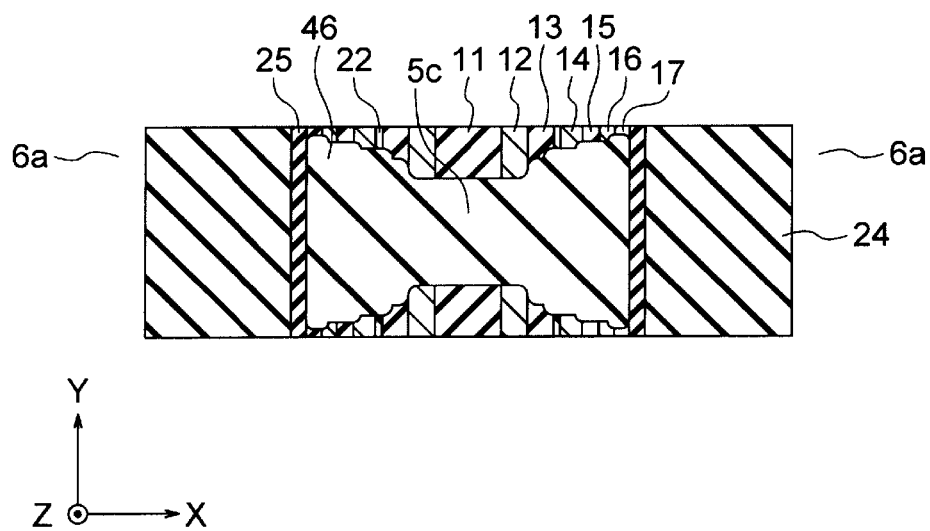
FIGS. 60A and 60B are enlarged sectional views illustrating a method for manufacturing the semiconductor device according to the second embodiment.
Figure 60B:
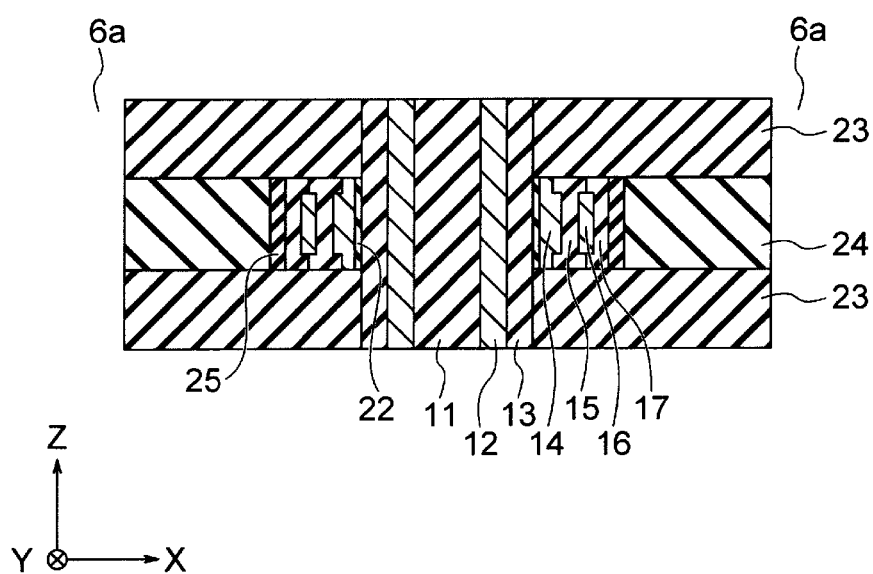
Figure 61:
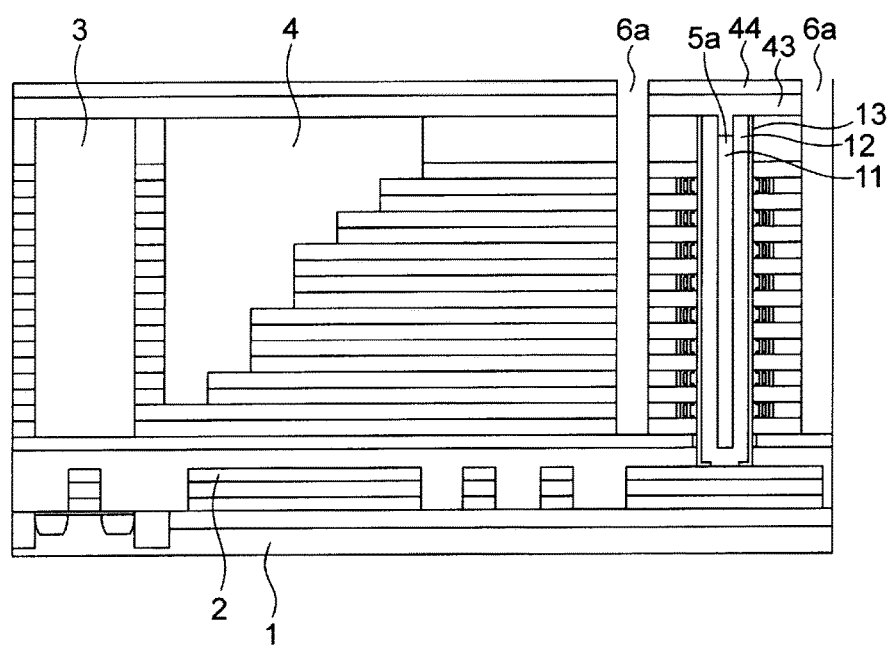
FIG. 61 is a sectional view illustrating a method for manufacturing the semiconductor device according to the second embodiment.

Next, the slit trench 6a that extends in the Y direction and the Z direction is formed in the insulating layers 23 and the sacrificial layers 24 by RIE using the resist layer 27 as a mask (FIG. 60A and FIG. 60B). The distance between the memory trench 5a and the slit trench 6a is, for example, 50 nm. The slit trench 6a is formed by using the stopper layer 36 as an etch stopper. The slit trench 6a is an example of the third recess portion. FIG. 61 is a sectional view corresponding to FIG. 60A and FIG. 60B.

Next, the sacrificial layers 24 that are exposed to the slit trench 6a are selectively recessed, and the recess portion 6b is formed adjacent to the modified oxide film 25 (FIG. 62A and FIG. 62B). The sacrificial layers 24 are recessed and removed by, for example, hot phosphoric acid treatment. The recess portion 6b is an example of the fourth recess portion.

Next, the modified oxide film 25 that is exposed to the recess portion 6b is removed (FIG. 63A and FIG. 63B). Consequently, the second CT film 17 is exposed to the recess portion 6b. Furthermore, the insulating layers 23 above and below the recess portion 6b are recessed as well. The modified oxide film 25 having a thickness of 3 nm is removed in the present embodiment, and thus the Z-direction width of the recess portion 6b is increased from 35 nm to 41 nm.

Figure 64A:
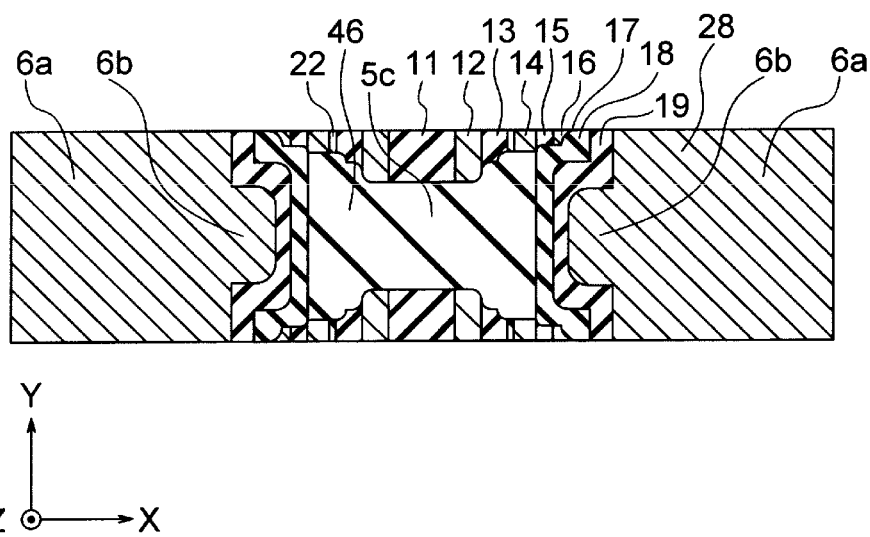
FIGS. 64A and 64B are enlarged sectional views illustrating a method for manufacturing the semiconductor device according to the second embodiment.
Figure 64B:
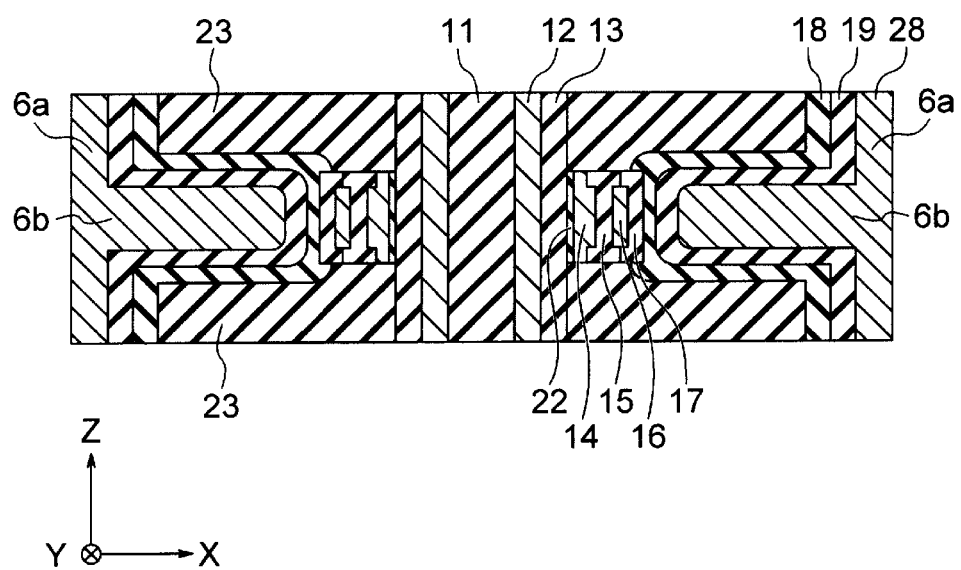

Next, the first block insulating film 18, the second block insulating film 19, and the dummy layer 28 are formed in order on the entire surface of the substrate 1 (FIG. 64A and FIG. 64B). Consequently, the first and second block insulating films 18 and 19 are formed on the side surface of the second CT film 17 and the upper surface and the lower surface of the recess portion 6b, and the dummy layer 28 is formed in the recess portion 6b. The thickness of the first block insulating film 18 is, for example, 6 nm. The thickness of the second block insulating film 19 is, for example, 5 nm. The second block insulating film 19 in the present embodiment is an HfSiON film of which the nitrogen composition ratio is greater than or equal to 10% (or greater than or equal to 10% and less than or equal to 40%), and is crystallized by RTA at a temperature greater than or equal to 900° C.

Next, the dummy layer 28 is selectively etched (FIG. 65A and FIG. 65B). Consequently, the dummy layer 28 remains on the side surface of the second block insulating film 19. The amount of time of etching in the present process is controlled in such a manner that the thickness of the dummy layer 28 becomes 5 nm.

Next, the second block insulating film 19 is selectively removed by using the dummy layer 28 as a mask (FIG. 65A and FIG. 65B). Consequently, the second block insulating film 19 remains on the side surface of the first block insulating film 18. The second block insulating film 19 is removed by, for example, hot phosphoric acid treatment at a low temperature. The nitrogen composition ratio of the second block insulating film 19 is set to be greater than or equal to 10% in the present embodiment, and thus the second block insulating film 19 is selectively etched easily.

Next, the dummy layer 28 is selectively removed (FIG. 66A and FIG. 66B).

Next, the barrier metal layer 20 and the CG layer 21 are formed in order on the entire surface of the substrate 1 (FIG. 67A and FIG. 67B). Consequently, the barrier metal layer 20 is formed on the side surface of the second block insulating film 19 and the upper surface and the lower surface of the first block insulating film 18, and the CG layer 21 is formed in the recess portion 6b. The thickness of the barrier metal layer 20 is, for example, 2 nm.

Figure 69:
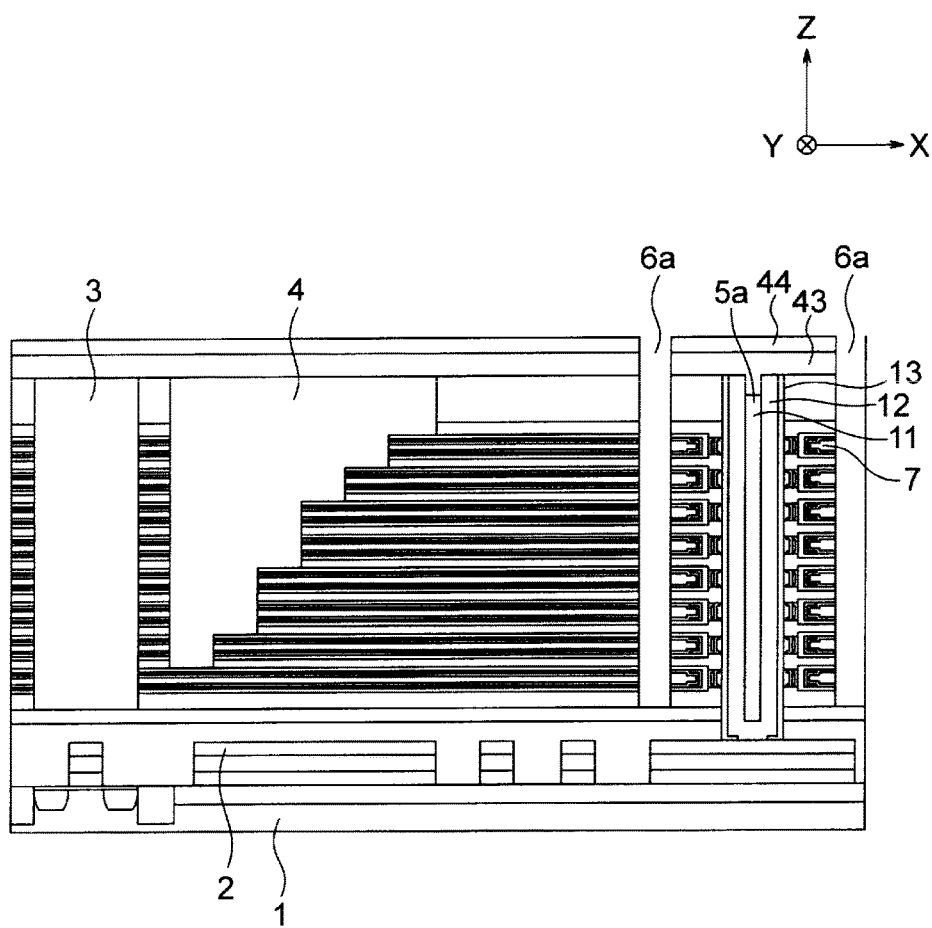
FIG. 69 is a sectional view illustrating a method for manufacturing the semiconductor device according to the second embodiment.

Next, the barrier metal layer 20 and the CG layer 21 are removed in such a manner that the barrier metal layer 20 and the CG layer 21 do not remain on the side surfaces of the insulating layers 23 (FIG. 68A and FIG. 68B). FIG. 69 is a sectional view corresponding to FIG. 68A and FIG. 68B.

The memory cell unit 7 that includes the FG layer 14, the inter-gate insulating film 15, the first CT film 16, the second CT film 17, the first block insulating film 18, the second block insulating film 19, the barrier metal layer 20, the CG layer 21, and the oxide film 22 is formed in the recess portions 5b and 6b.

Figure 70:
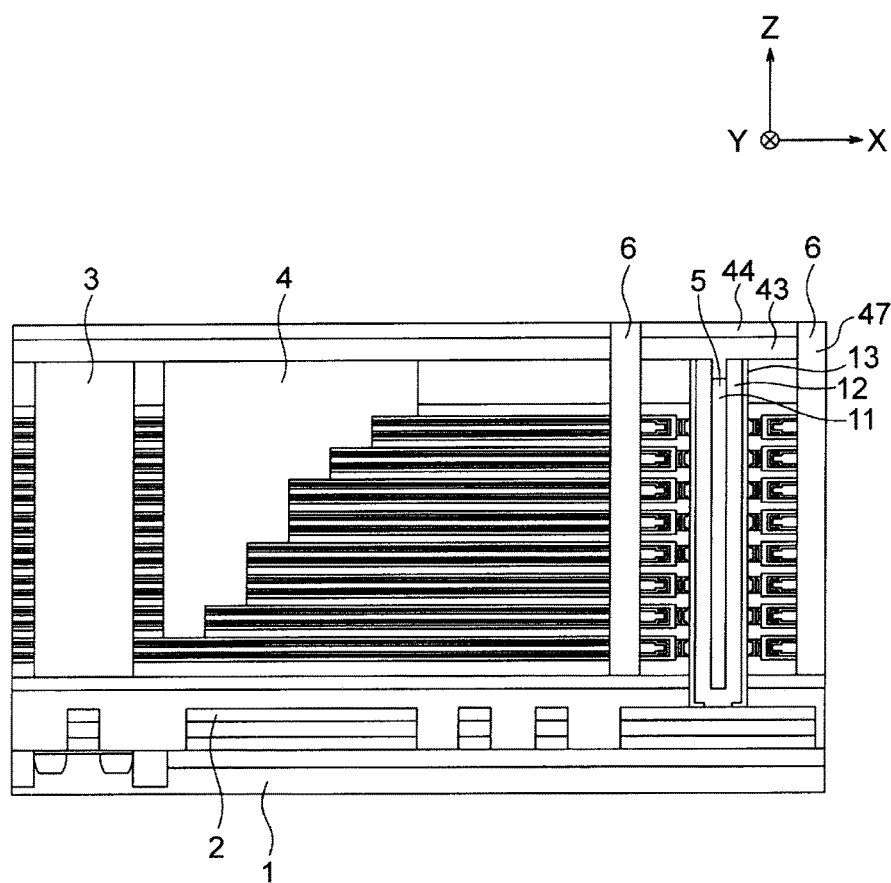
FIG. 70 is a sectional view illustrating a method for manufacturing the semiconductor device according to the second embodiment.

Next, an insulating film 47 is embedded in the slit trench 6a, and the surface of the insulating film 47 is flattened (FIG. 70). Consequently, the insulating film 47 divides the memory element units 5. Examples of the insulating film 47 include a stacked film that includes an LTO film and a PSZ film.

Figure 71:
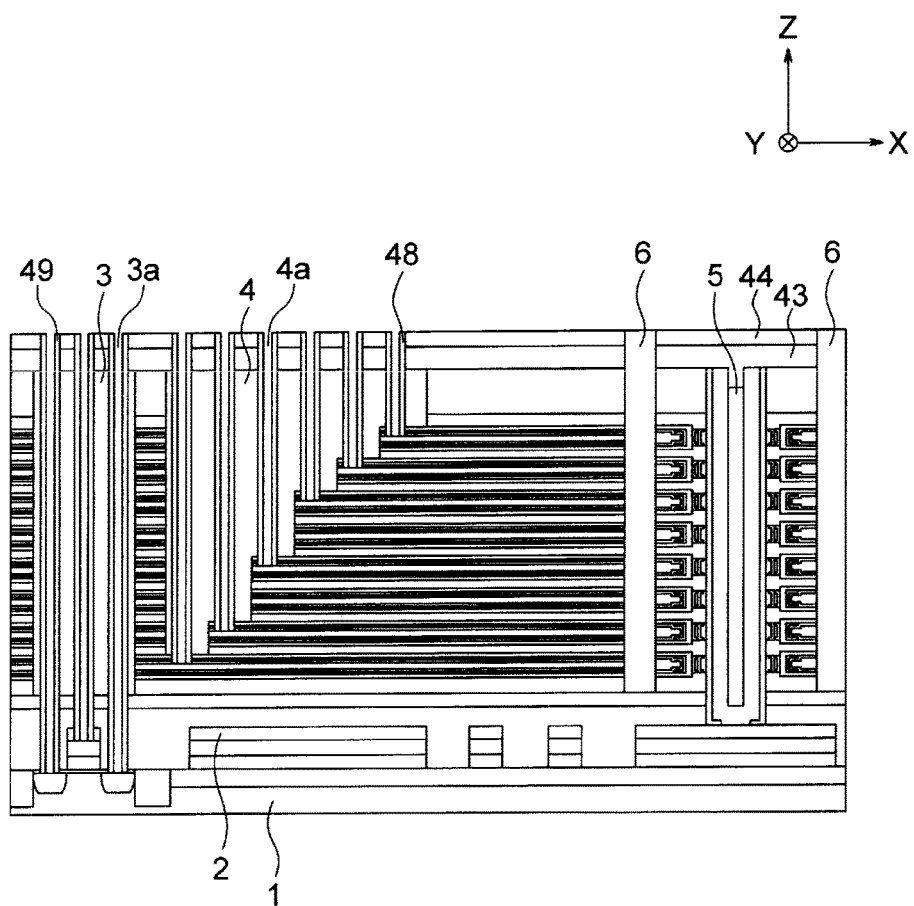
FIG. 71 is a sectional view illustrating a method for manufacturing the semiconductor device according to the second embodiment.

Next, contact holes 4a are formed in each step portion of the stepped contact portion 4 by lithography and RIE, and a spacer insulating film 48 is formed on the side surfaces of the contact holes 4a (FIG. 71). Since the plurality of contact holes 4a is formed at the same time in the present process, the diameter of the contact hole 4a is likely to be increased. The spacer insulating film 48 in the present embodiment is formed in order to decrease the diameter of the contact hole 4a and to increase insulation between the contact plugs. Examples of the spacer insulating film 48 include a silicon oxide film.

Next, a contact hole 3a of the peripheral transistor unit 3 is formed by lithography and RIE, and a spacer insulating film 49 is formed on the side surface of the contact hole 3a (FIG. 71). The spacer insulating film 49 in the present embodiment is formed in order to increase insulation between the contact plugs. Examples of the spacer insulating film 49 include a silicon oxide film.

Figure 72:
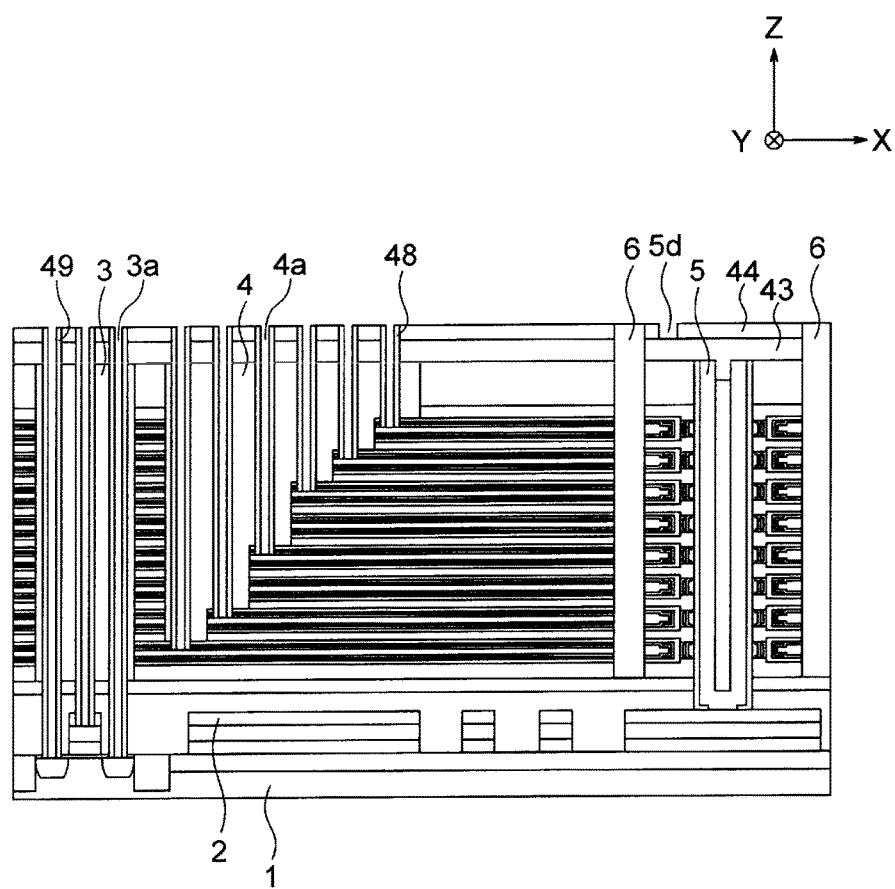
FIG. 72 is a sectional view illustrating a method for manufacturing the semiconductor device according to the second embodiment.

Next, contact holes 5d of the memory element units 5 are formed by the lithography and RIE (FIG. 72). The contact holes 5d are formed to pass through the mask layer 44 and reach the capping layer 43. The plurality of contact holes 5d is formed in a staggered disposition in the present embodiment.

Figure 73:
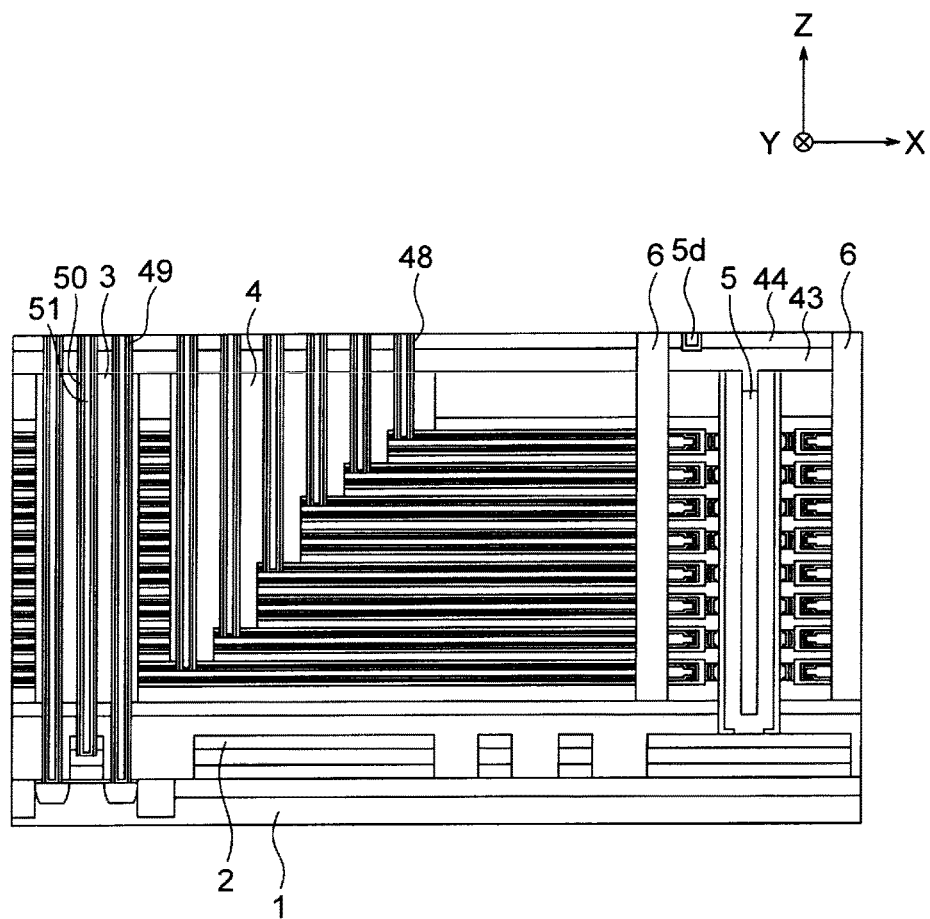
FIG. 73 is a sectional view illustrating a method for manufacturing the semiconductor device according to the second embodiment.

Next, a barrier metal layer 50 and a plug material layer 51 are formed in order in the contact holes 3a, 4a, and 5d by CVD (FIG. 73). Examples of the barrier metal layer 50 include a titanium nitride layer. Examples of the plug material layer 51 include a tungsten layer. Next, the surfaces of the barrier metal layer 50 and the plug material layer 51 are flattened by CMP (FIG. 73). Consequently, a contact plug that includes the barrier metal layer 50 and the plug material layer 51 is formed in the contact holes 3a, 4a, and 5d.

Then, various interconnect layers, plug layers, interlayer insulating films, and the like are formed on the substrate 1. The semiconductor device according to the present embodiment is manufactured.

Figure 74A:
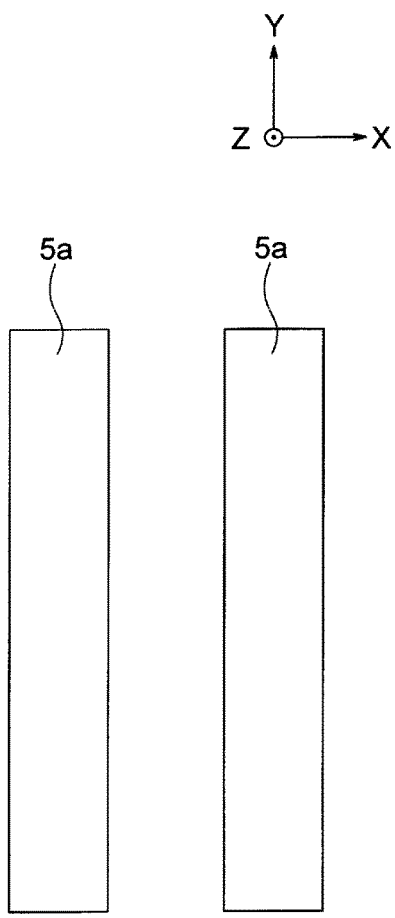
FIGS. 74A and 74B are plan views for describing a method for manufacturing the semiconductor device according to the second embodiment.
Figure 74B:
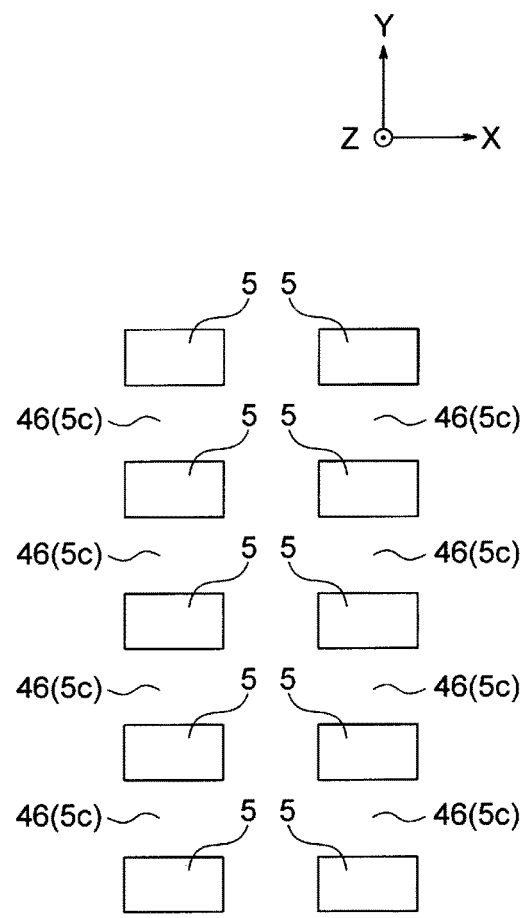

FIGS. 74A and 74B are plan views for describing a method for manufacturing the semiconductor device according to the second embodiment.

FIG. 74A illustrates two memory trenches 5a. FIG. 74B illustrates five memory element units 5 that are formed from one memory trench 5a, and five memory element units 5 that are formed from the other memory trench 5a.

One or more recess portions 5c are formed in the area of each memory trench 5a after the channel semiconductor layer 12, the FG layer 14, the first CT film 16, the second CT film 17, and the like are formed in the memory trench 5a and the recess portion 5b, and the insulating film 46 is embedded in the recess portions 5c in the present embodiment. Accordingly, the plurality of memory element units 5 is formed from each memory trench 5a.

As described heretofore, the memory trench 5a instead of the memory hole 5a is used as an opening portion for forming the memory element unit 5 in the present embodiment. Thus, according to the present embodiment, a reaction product occluding the opening portion or ions and radicals not reaching the bottom portion of the opening portion can be prevented. Thus, according to the present embodiment, the memory element unit 5 can be formed to have the same or smaller area than the area of the memory element unit 5 of the first embodiment.

Third Embodiment

Hereinafter, a third embodiment will be described. The third embodiment will be described with focus on the differences from the first and second embodiments, and matters common to the first and second embodiments will not be described.

(1) Method for Manufacturing Semiconductor Device According to Third Embodiment

FIG. 75A to FIG. 105 are sectional views and enlarged sectional views illustrating a method for manufacturing a semiconductor device according to the third embodiment. The CT film 16 of a metal silicide layer is formed as a charge storage layer in the present embodiment.

Figure 75A:
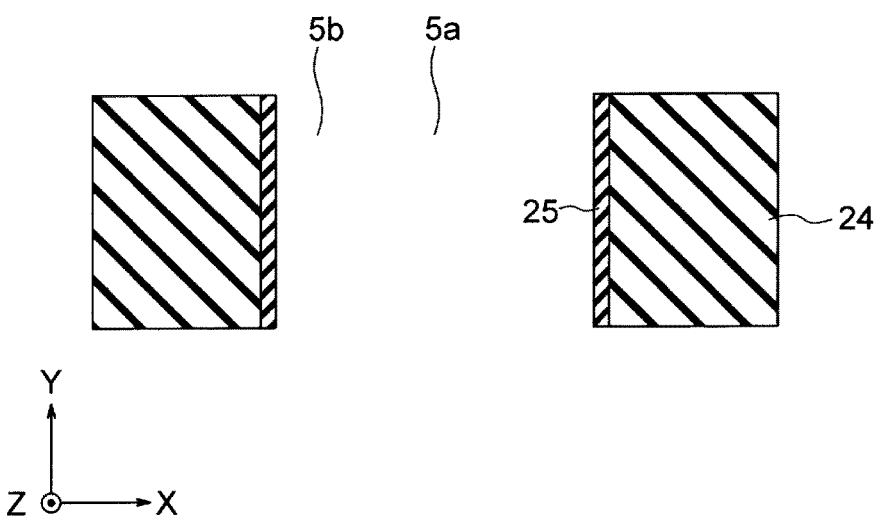
FIGS. 75A and 75B are enlarged sectional views illustrating a method for manufacturing a semiconductor device according to a third embodiment.
Figure 75B:
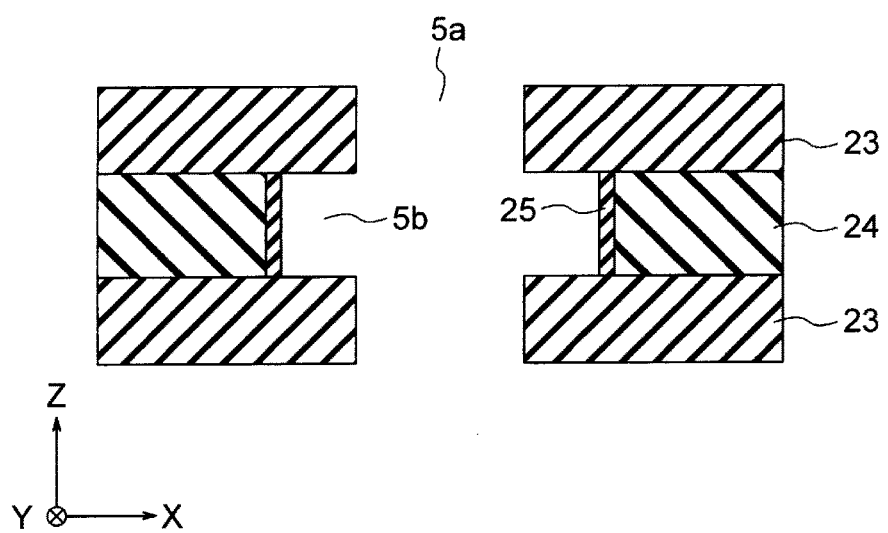

First, the plurality of insulating layers 23 and the plurality of sacrificial layers 24 are alternately formed on the substrate 1, and the memory trench 5a is formed in the insulating layers 23 and the sacrificial layers 24 (FIG. 75A and FIG. 75B). The insulating layers 23 are, for example, silicon oxide films. The sacrificial layers 24 are, for example, silicon nitride films.

Next, the sacrificial layers 24 that are exposed to the memory trench 5a are recessed, and the recess portion 5b is formed adjacent to the sacrificial layers 24 (FIG. 75A and FIG. 75B). The amount of recess of the sacrificial layers 24 is, for example, 15 nm. Next, the modified oxide film 25 is formed on the surfaces of the sacrificial layers 24 (FIG. 75A and FIG. 75B).

Next, a CT film material 16a is formed on the entire surface of the substrate 1 (FIG. 76A and FIG. 76B). Consequently, the CT film material 16a having a thickness of 5 nm is formed on the side surface of the modified oxide film 25 and the upper surface and the lower surface of the recess portion 5b. The CT film material 16a is a material for forming the CT film 16 as a metal silicide layer. Examples of the CT film material 16a include an amorphous silicon layer.

Next, a first dummy layer 61 and a second dummy layer 62 are formed in order on the entire surface of the substrate 1 (FIG. 76A and FIG. 76B). Consequently, the first and second dummy layers 61 and 62 are formed in the recess portion 5b. Examples of the first dummy layer 61 include a silicon nitride film. Examples of the second dummy layer 62 include an amorphous silicon layer.

Figure 77A:
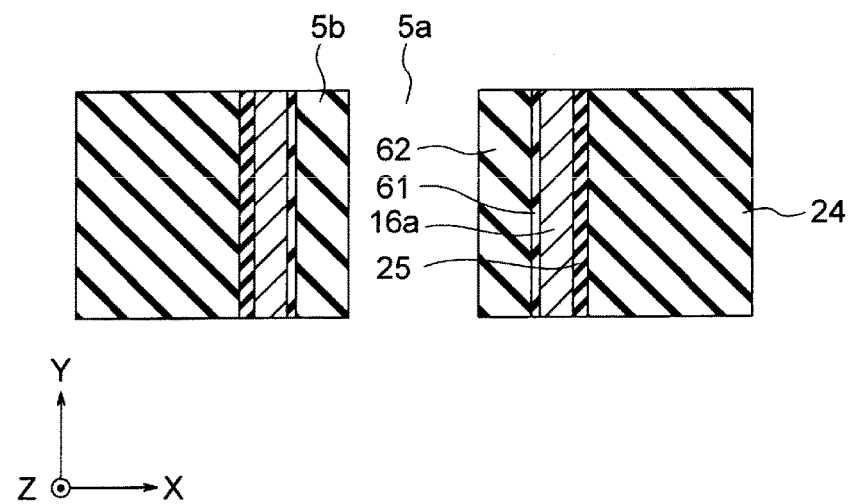
FIGS. 77A and 77B are enlarged sectional views illustrating a method for manufacturing the semiconductor device according to the third embodiment.
Figure 77B:
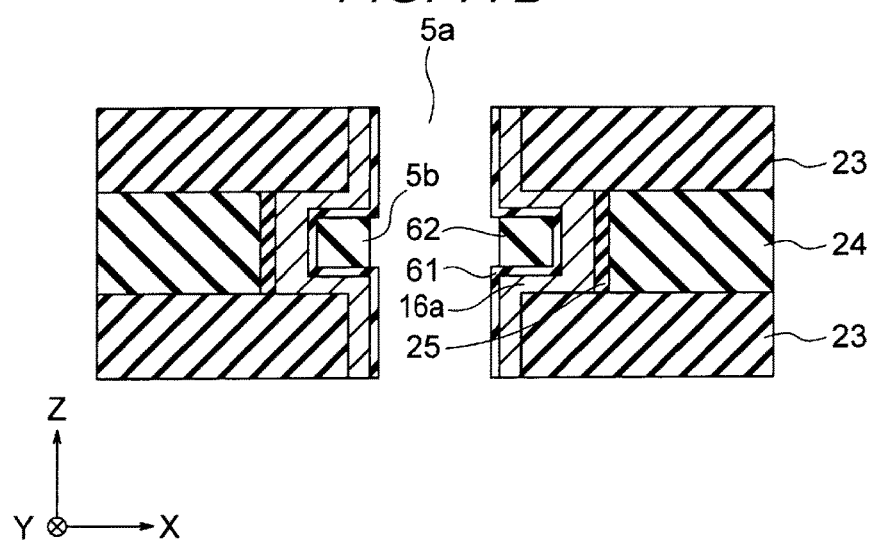

Next, the second dummy layer 62 is selectively etched (FIG. 77A and FIG. 77B). Consequently, the second dummy layer 62 remains on the side surface of the first dummy layer 61. The second dummy layer 62 is etched by, for example, the TMAH treatment at room temperature.

Figure 78A:
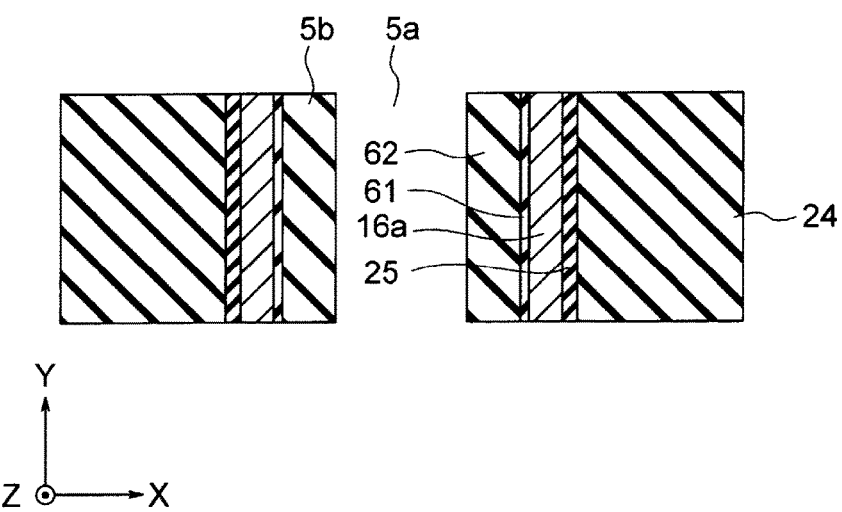
FIGS. 78A and 78B are enlarged sectional views illustrating a method for manufacturing the semiconductor device according to the third embodiment.
Figure 78B:
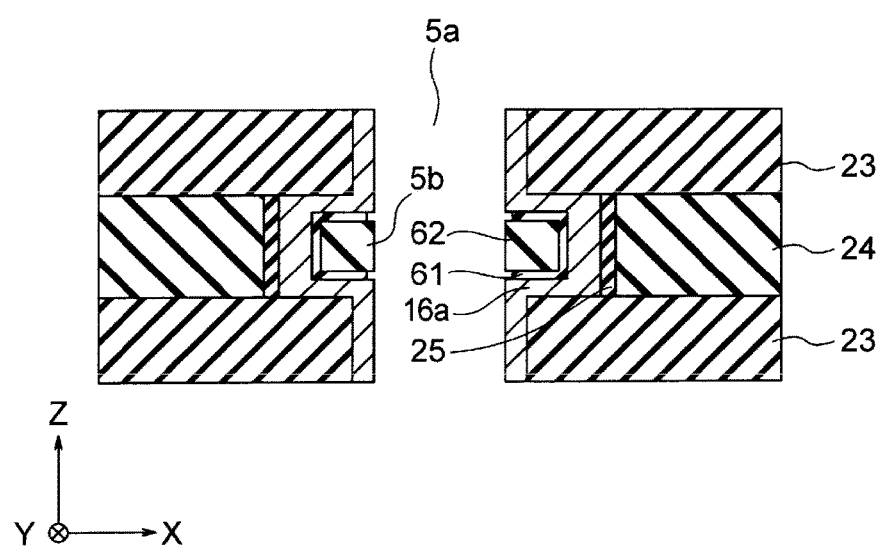

Next, the first dummy layer 61 is selectively removed by using the second dummy layer 62 as a mask (FIG. 78A and FIG. 78B). Consequently, the first dummy layer 61 remains on the side surface of the CT film material 16a and a portion of the upper surface and the lower surface of the CT film material 16a. The first dummy layer 61 is removed by, for example, hot phosphoric acid treatment.

Figure 79A:
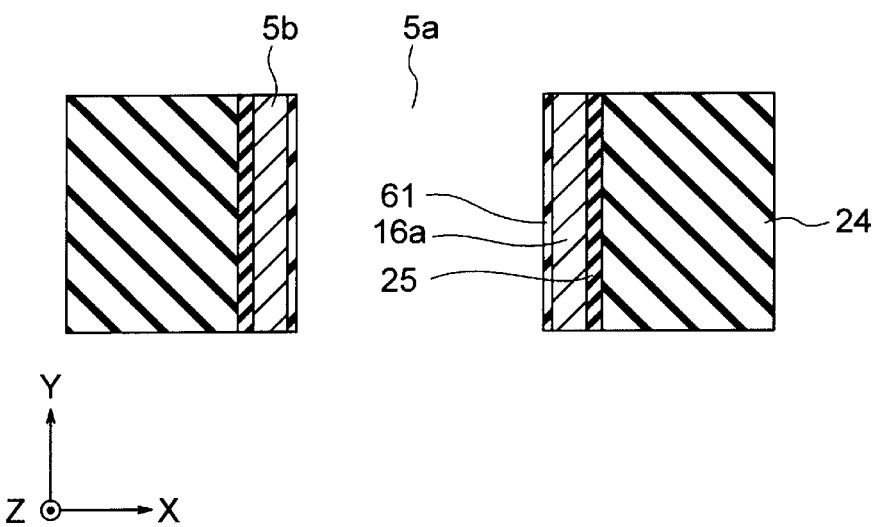
FIGS. 79A and 79B are enlarged sectional views illustrating a method for manufacturing the semiconductor device according to the third embodiment.
Figure 79B:
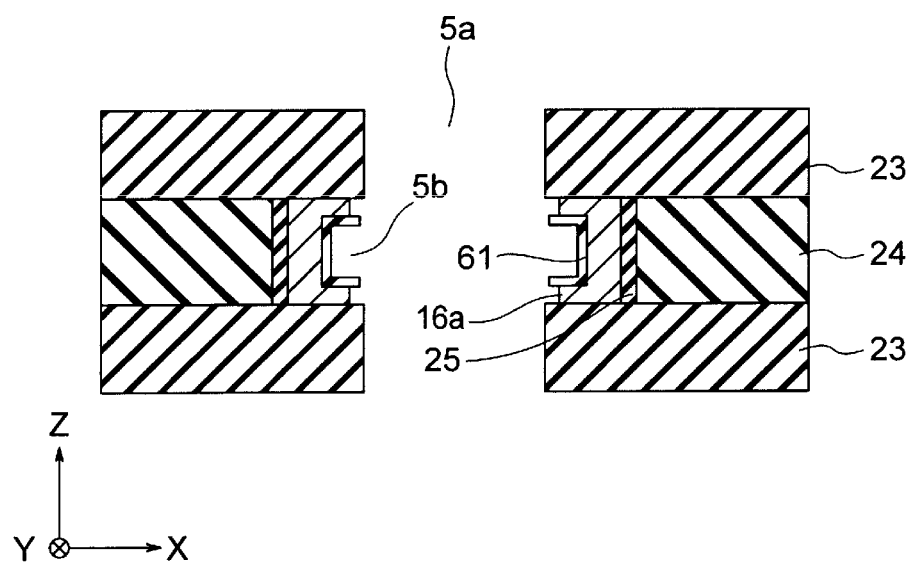

Next, the CT film material 16a is selectively removed by using the first and second dummy layers 61 and 62 as a mask (FIG. 79A and FIG. 79B). Consequently, the CT film material 16a remains on the side surface of the modified oxide film 25 and a portion of the upper surface and the lower surface of the recess portion 5b. The CT film material 16a is removed by using, for example, the TMAH at room temperature. The CT film material 16a of the present embodiment is removed in such a manner that the end portion of the CT film material 16a recedes from the end portion of the first dummy layer 61. The second dummy layer 62 in the present embodiment is completely removed during this process.

Figure 80A:
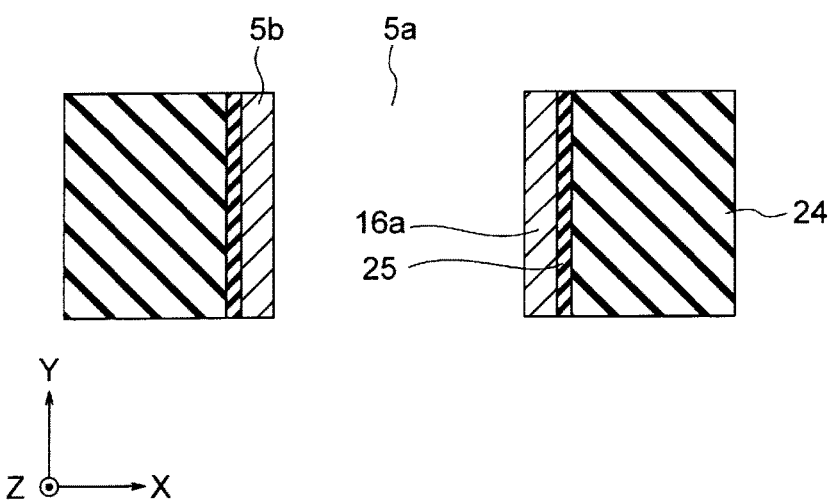
FIGS. 80A and 80B are enlarged sectional views illustrating a method for manufacturing the semiconductor device according to the third embodiment.
Figure 80B:
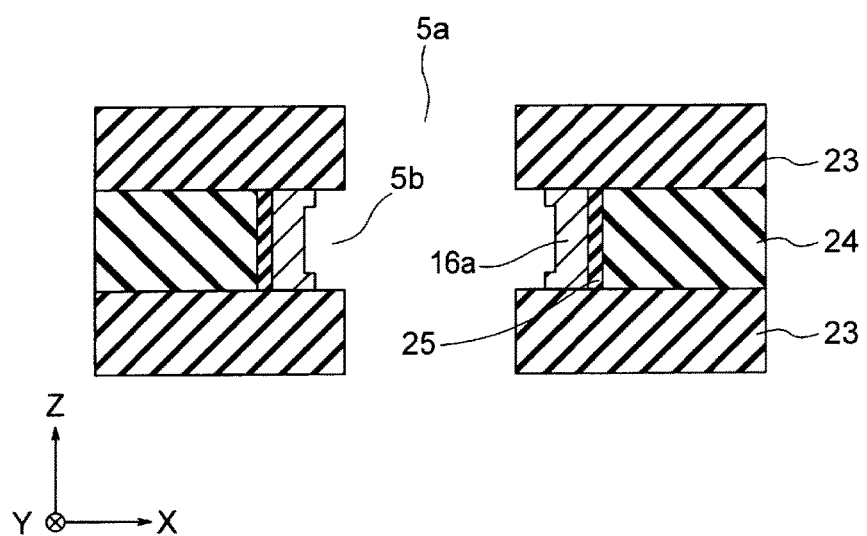

Next, the first dummy layer 61 is selectively removed (FIG. 80A and FIG. 80B). The first dummy layer 61 is removed by, for example, hot phosphoric acid treatment.

Next, the inter-gate insulating film 15 is formed on the entire surface of the substrate 1 (FIG. 81A and FIG. 81B). Consequently, the inter-gate insulating film 15 having a thickness of 3 nm is formed on the side surface of the CT film material 16a and the upper surface and the lower surface of the recess portion 5b. Examples of the inter-gate insulating film 15 include a silicon nitride film.

Figure 82A:
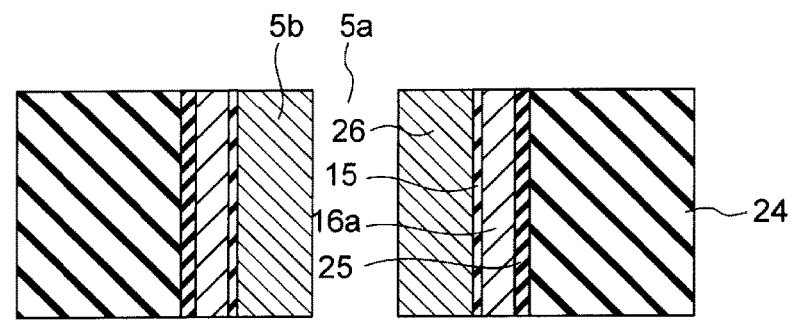
FIGS. 82A and 82B are enlarged sectional views illustrating a method for manufacturing the semiconductor device according to the third embodiment.
Figure 82B:
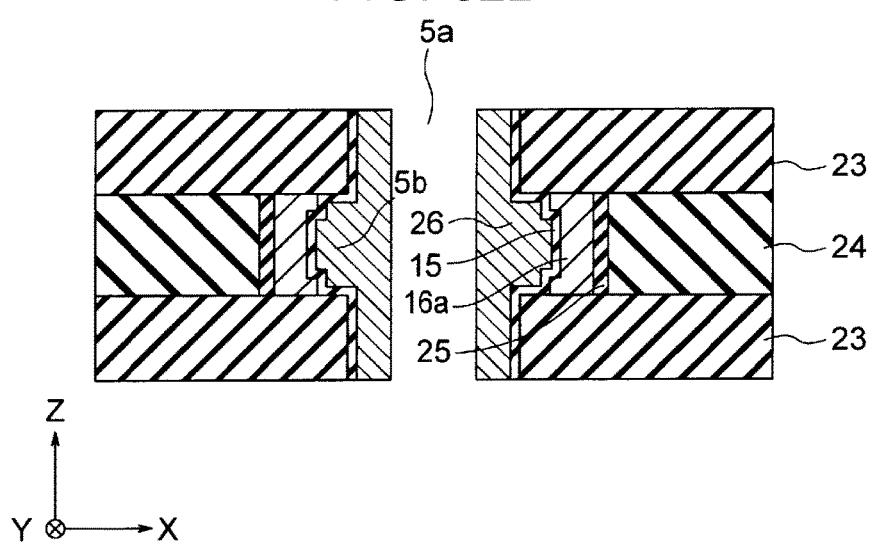

Next, the dummy layer 26 is formed on the entire surface of the substrate 1 (FIG. 82A and FIG. 82B). Consequently, the dummy layer 26 is formed in the recess portion 5b. Examples of the dummy layer 26 include an amorphous silicon layer.

Figure 83A:
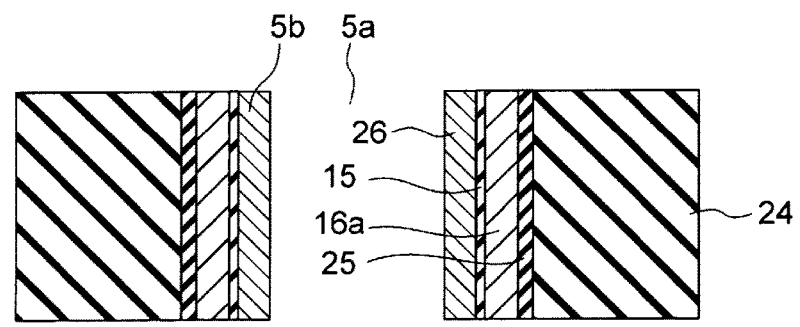
FIGS. 83A and 83B are enlarged sectional views illustrating a method for manufacturing the semiconductor device according to the third embodiment.
Figure 83B:
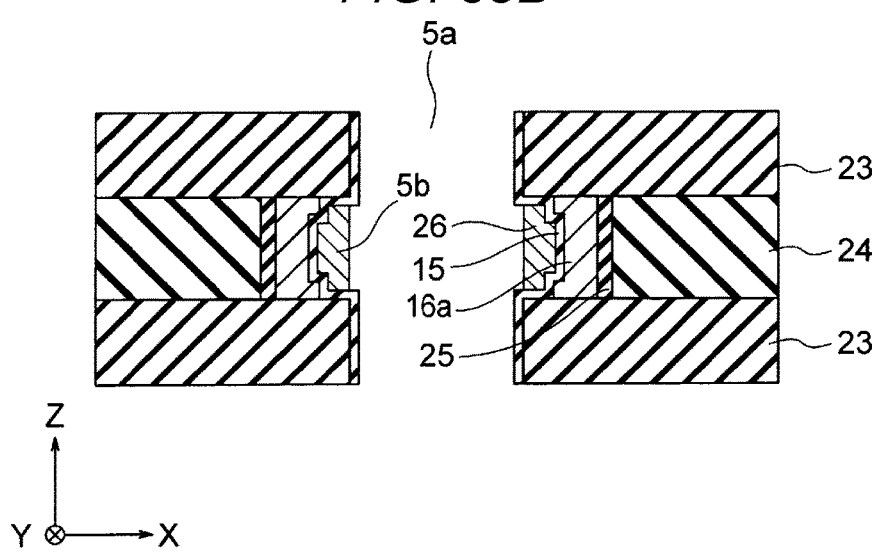

Next, the dummy layer 26 is selectively etched (FIG. 83A and FIG. 83B). Consequently, the dummy layer 26 remains on the side surface of the inter-gate insulating film 15. The dummy layer 26 is etched by, for example, the TMAH treatment at room temperature.

Figure 84A:
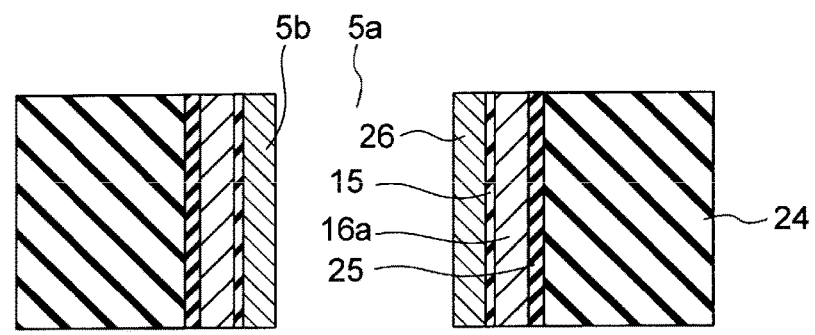
FIGS. 84A and 84B are enlarged sectional views illustrating a method for manufacturing the semiconductor device according to the third embodiment.
Figure 84B:
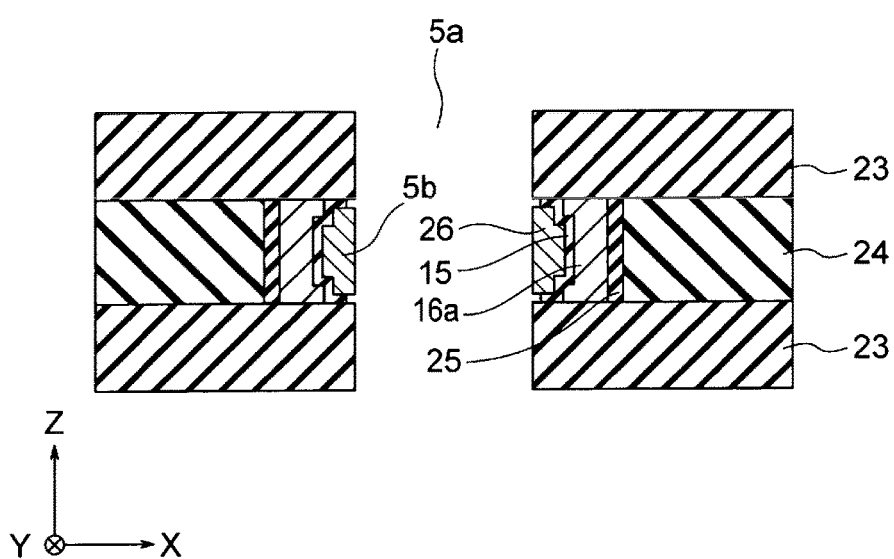

Next, the inter-gate insulating film 15 is selectively removed by using the dummy layer 26 as a mask (FIG. 84A and FIG. 84B). Consequently, the inter-gate insulating film 15 remains on the side surface of the CT film material 16a and a portion of the upper surface and the lower surface of the recess portion 5b. The inter-gate insulating film 15 is removed by, for example, hot phosphoric acid treatment.

Figure 85A:
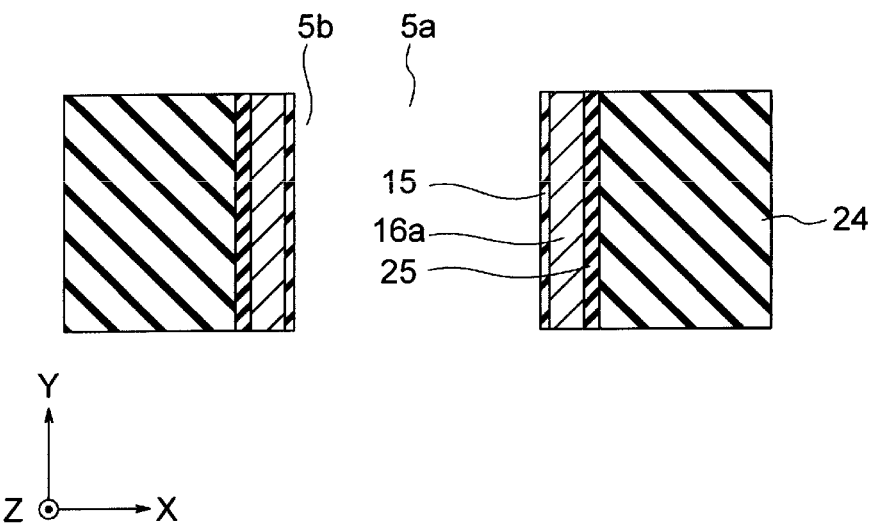
FIGS. 85A and 85B are enlarged sectional views illustrating a method for manufacturing the semiconductor device according to the third embodiment.
Figure 85B:
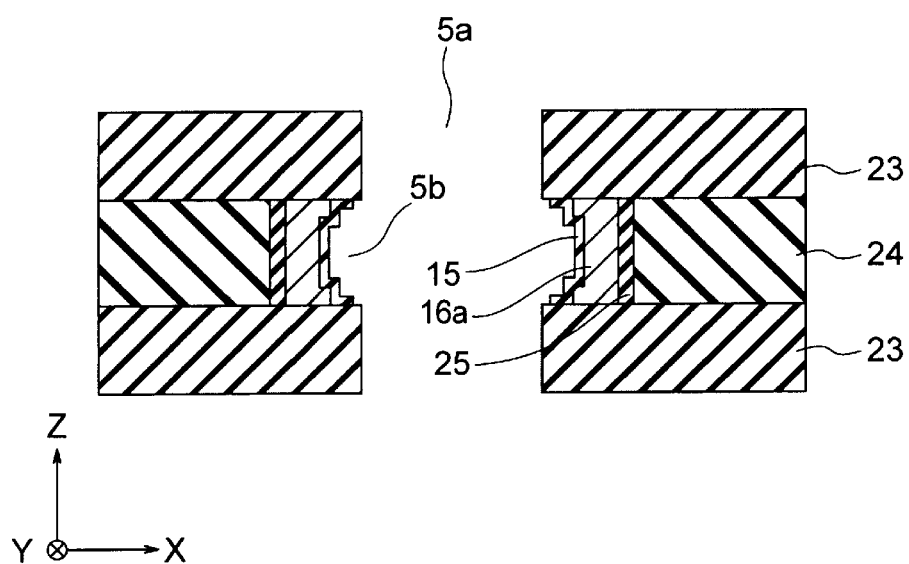

Next, the dummy layer 26 is selectively removed (FIG. 85A and FIG. 85B). The dummy layer 26 is removed by, for example, the TMAH treatment at room temperature.

Next, the FG layer 14 is formed on the entire surface of the substrate 1, and the FG layer 14 is selectively etched (FIG. 86A and FIG. 86B). Consequently, the FG layer 14 having a thickness of 5 nm is formed on the side surface of the inter-gate insulating film 15 and a portion of the upper surface and the lower surface of the recess portion 5b. The FG layer 14 is, for example, an amorphous silicon layer and is etched by the TMAH treatment at room temperature. The amorphous silicon layer is changed to a polysilicon layer by crystallization in a subsequent process.

The FG layer 14, the inter-gate insulating film 15, and the CT film material 16a are formed in the recess portion 5b. The total thickness is 13 nm. The depth of the recess portion 5b is 15 nm. Thus, the inner periphery of the FG layer 14 recedes by 2 nm from the outer periphery of the memory trench 5a.

Next, the oxide film 22 is formed on the surface of the FG layer 14 by oxidizing the FG layer 14 (FIG. 86A and FIG. 86B). The thickness of the oxide film 22 is, for example, 2 nm. Next, the tunnel insulating film 13, the channel semiconductor layer 12, and the core layer 11 are formed in order in the memory trench 5a in the same manner as the second embodiment (FIG. 86A and FIG. 86B). Examples of the core layer 11 include an insulating film such as a silicon oxide film and a semiconductor layer such as a $p^+$ type silicon layer.

Figure 87:
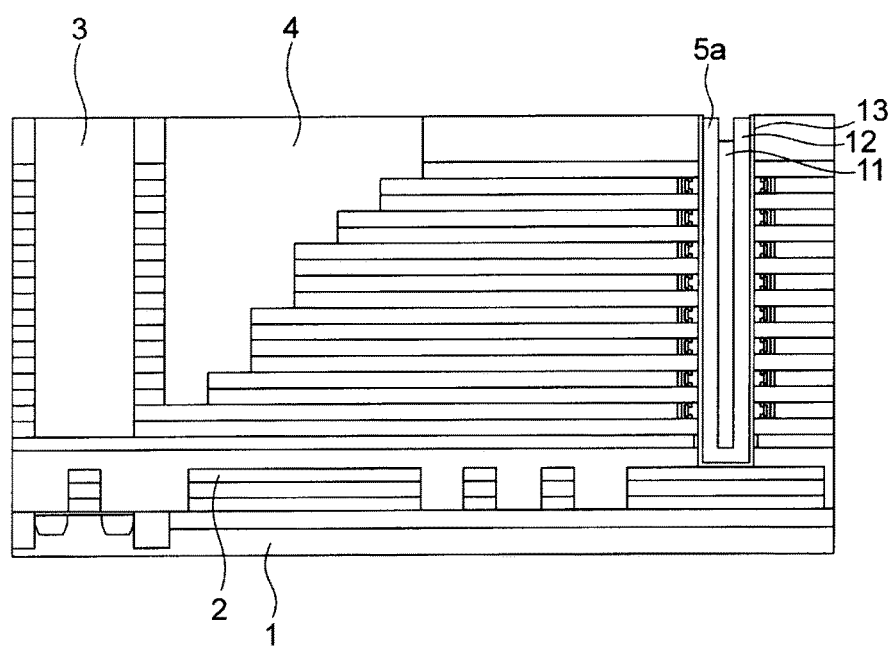
FIG. 87 is a sectional view illustrating a method for manufacturing the semiconductor device according to the third embodiment.

Next, the core layer 11 and the channel semiconductor layer 12 are divided by etch-back for individual memory trenches 5a (FIG. 87).

Figure 88:
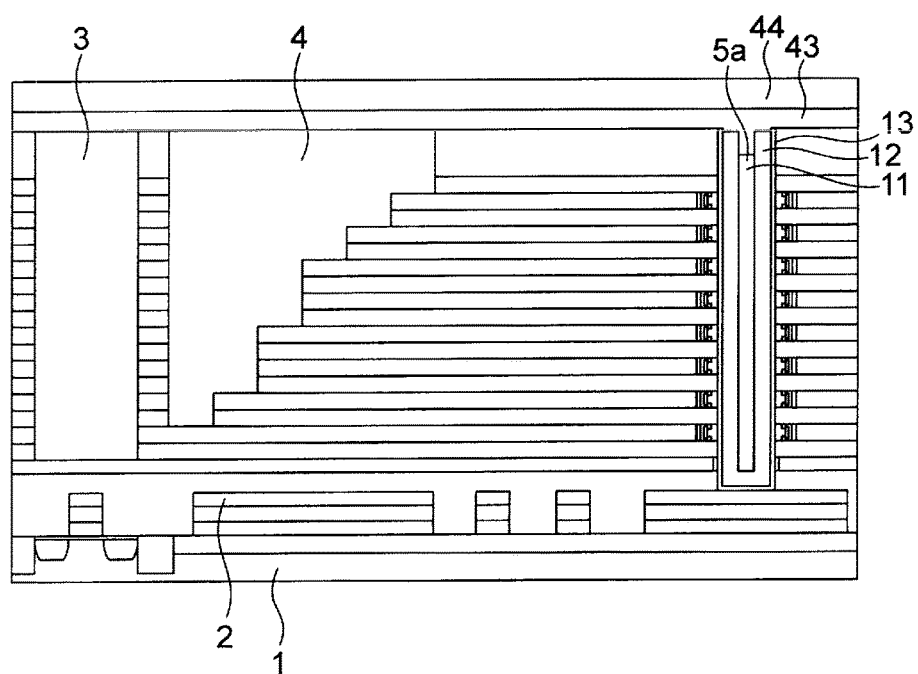
FIG. 88 is a sectional view illustrating a method for manufacturing the semiconductor device according to the third embodiment.

Next, the capping layer 43 and the mask layer 44 are formed in order on the entire surface of the substrate 1 (FIG. 88). Consequently, the capping layer 43 is embedded in the memory trench 5a.

Figure 89A:
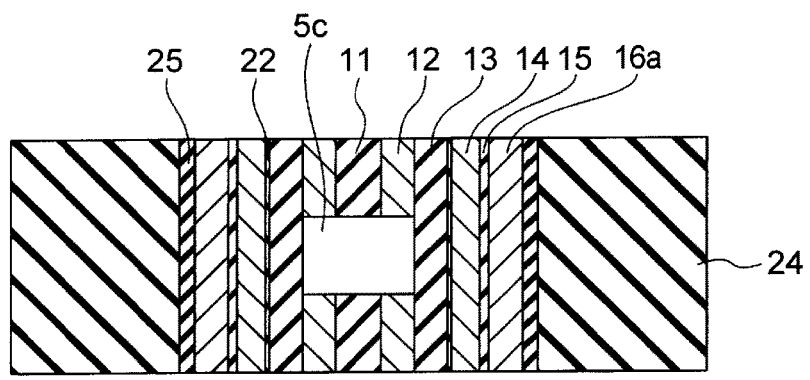
FIGS. 89A and 89B are enlarged sectional views illustrating a method for manufacturing the semiconductor device according to the third embodiment.
Figure 89B:
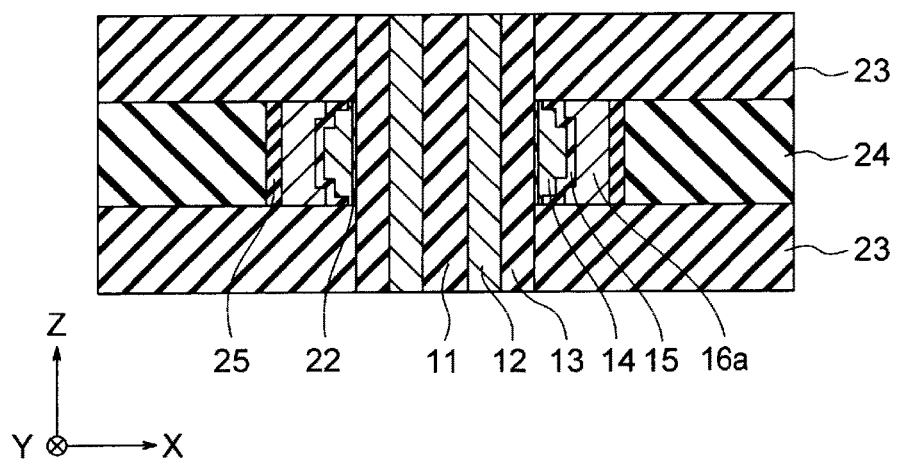

Next, the recess portion 5c is formed in the core layer 11 and the channel semiconductor layer 12 in the same manner as the second embodiment (FIG. 89A and FIG. 89B).

Figure 90A:
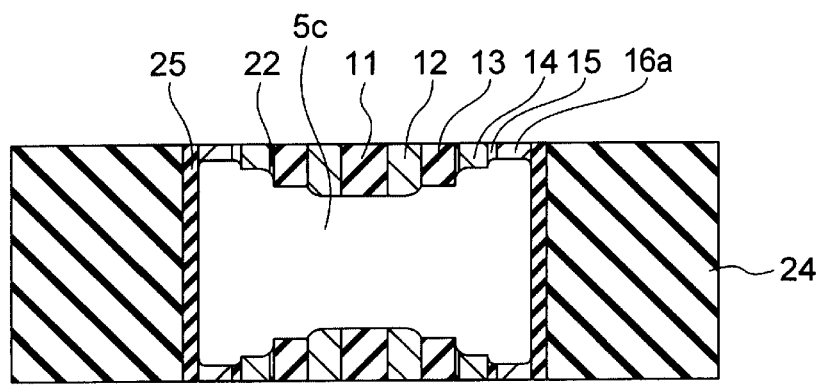
FIGS. 90A and 90B are enlarged sectional views illustrating a method for manufacturing the semiconductor device according to the third embodiment.
Figure 90B:
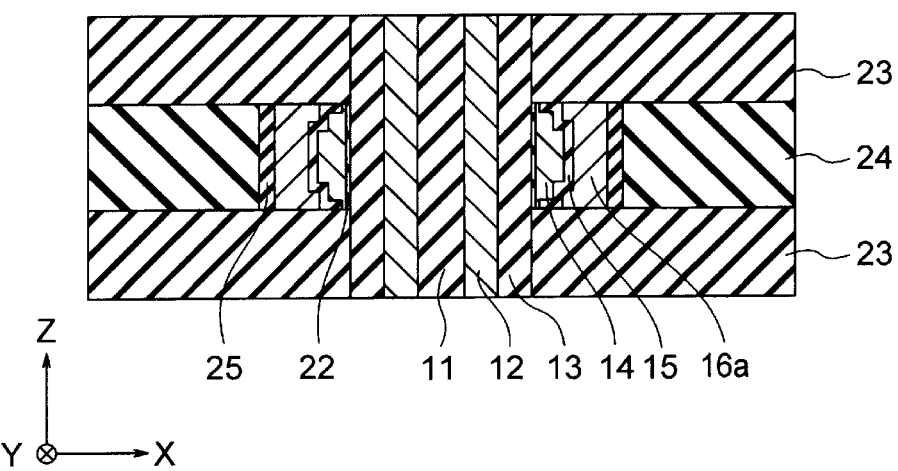

Next, the tunnel insulating film 13 that is exposed to the recess portion 5c and the oxide film 22 are processed by the DHF treatment (FIG. 90A and FIG. 90B). Consequently, these films are recessed, and the X-direction width of the recess portion 5c is increased. The thicknesses of the tunnel insulating film 13 and the oxide film 22 of the present embodiment are 4 nm and 2 nm, and each corner portion of the recess portion 5c is recessed by approximately 7 nm in the +/−Y directions.

Next, the FG layer 14 that is exposed to the recess portion 5c is processed by the TMAH treatment at room temperature (FIG. 90A and FIG. 90B). The thickness of the FG layer 14 of the present embodiment is 5 nm, and each corner portion of the recess portion 5c is further recessed by approximately 6 nm in the ±Y directions. Thus, the total amount of recess of each corner portion is 13 nm.

Next, the inter-gate insulating film 15 that is exposed to the recess portion 5c is processed by hot phosphoric acid treatment (FIG. 90A and FIG. 90B). The thickness of the inter-gate insulating film 15 of the present embodiment is 3 nm, and each corner portion of the recess portion 5c is further recessed by approximately 3 nm in the +/−Y directions. Thus, the total amount of recess of each corner portion is 16 nm.

Next, the CT film material 16a that is exposed to the recess portion 5c is processed by the TMAH treatment at room temperature (FIG. 90A and FIG. 90B). The thickness of the CT film material 16a of the present embodiment is 5 nm, and each corner portion of the recess portion 5c is further recessed by approximately 6 nm in the +/−Y directions. Thus, the total amount of recess of each corner portion is 22 nm.

Accordingly, the total amount of recessing of each recess portion 5c is 44 nm in the +/−Y directions. If the initial Y-direction width of the recess portion 5c (the width in FIG. 89A) is 25 nm, the Y-direction distance between the corner portions in each recess portion 5c is increased from 25 nm to 69 nm (25+44 nm) by recessing. The Y-direction distance between the memory element units 5 illustrated in FIG. 24B is 90 nm. This distance indicates that the recess portion 5c in FIG. 90A is included in this distance.

Figure 91A:
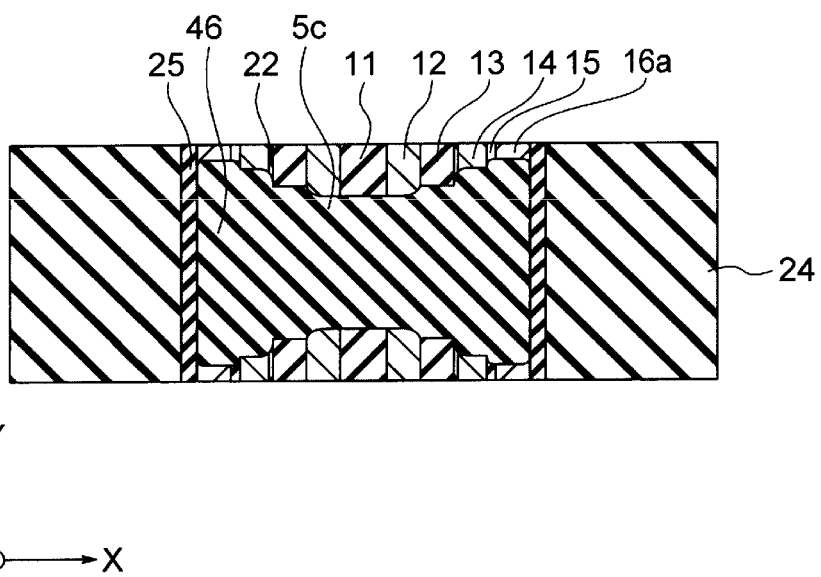
FIGS. 91A and 91B are enlarged sectional views illustrating a method for manufacturing the semiconductor device according to the third embodiment.
Figure 91B:
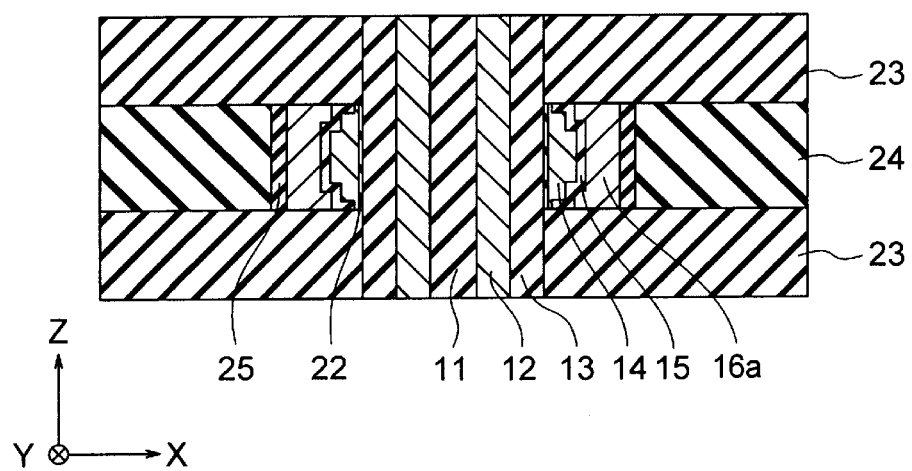

Next, the insulating film 46 is embedded in the recess portion 5c, and the surface of the insulating film 46 is flattened (FIG. 91A and FIG. 91B). FIG. 92 is a sectional view corresponding to FIG. 91A and FIG. 91B.

Figure 93:
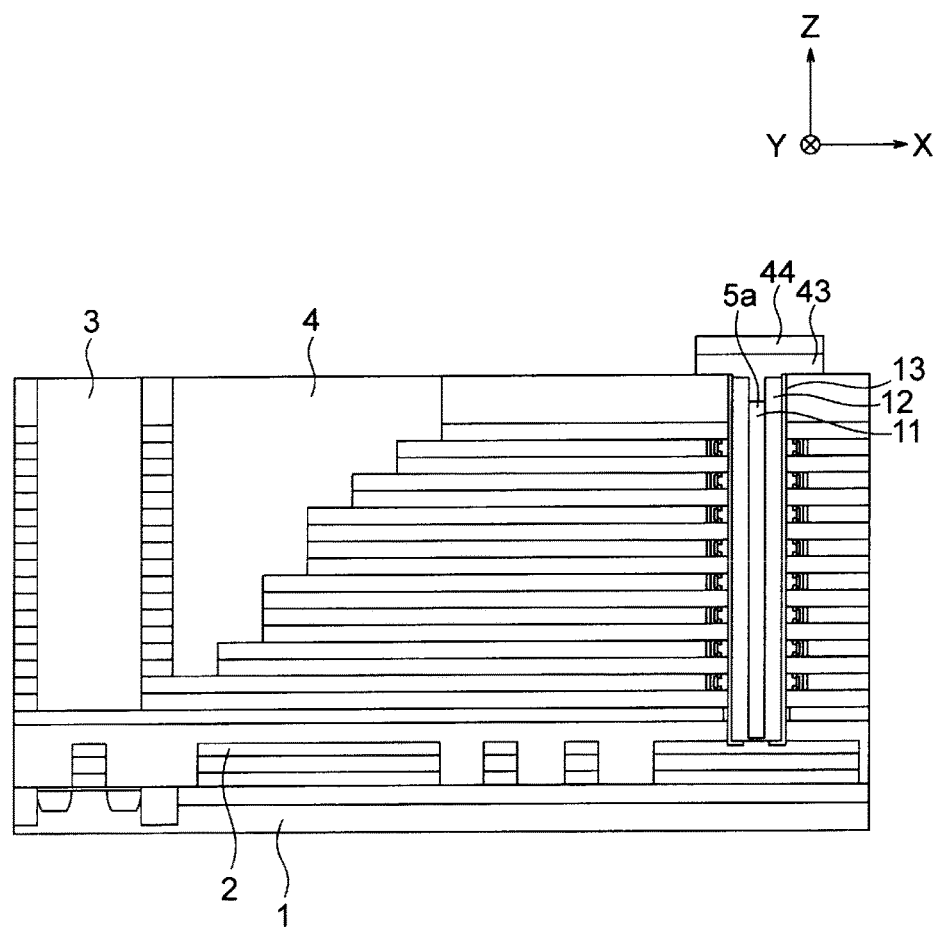
FIG. 93 is a sectional view illustrating a method for manufacturing the semiconductor device according to the third embodiment.

Next, the capping layer 43 and the mask layer 44 are processed by lithography and RIE in such a manner that the capping layer 43 and the mask layer 44 remain on the memory trench 5a (FIG. 93). The present process is a measure for the silicide treatment described later.

Figure 94:
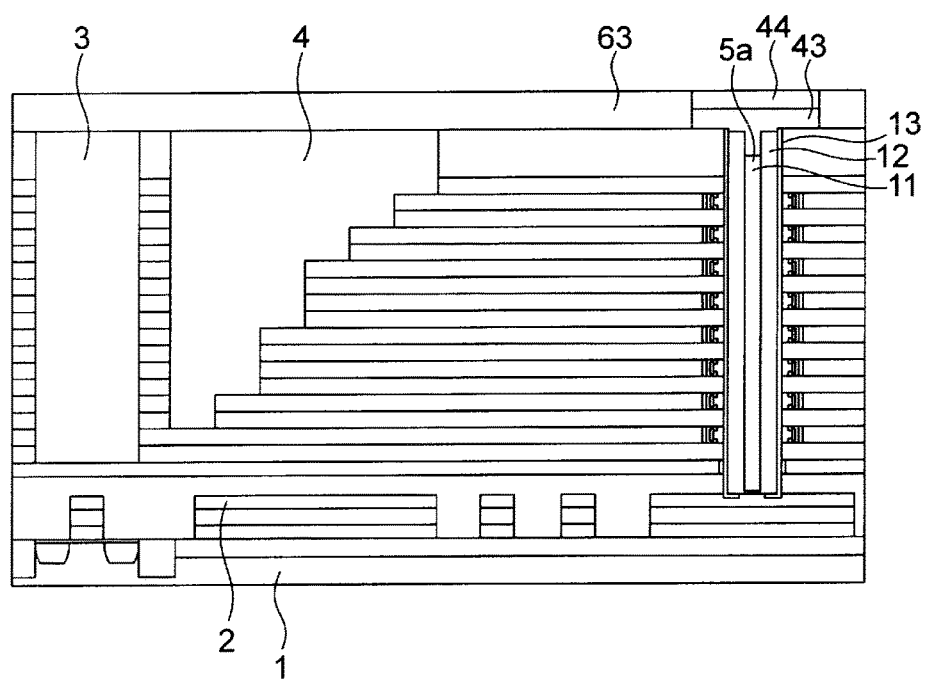
FIG. 94 is a sectional view illustrating a method for manufacturing the semiconductor device according to the third embodiment.

Next, a mask layer 63 is formed on the entire surface of the substrate 1, and the surface of the mask layer 63 is flattened by CMP (FIG. 94). Examples of the mask layer 63 include a TEOS film.

Figure 95:
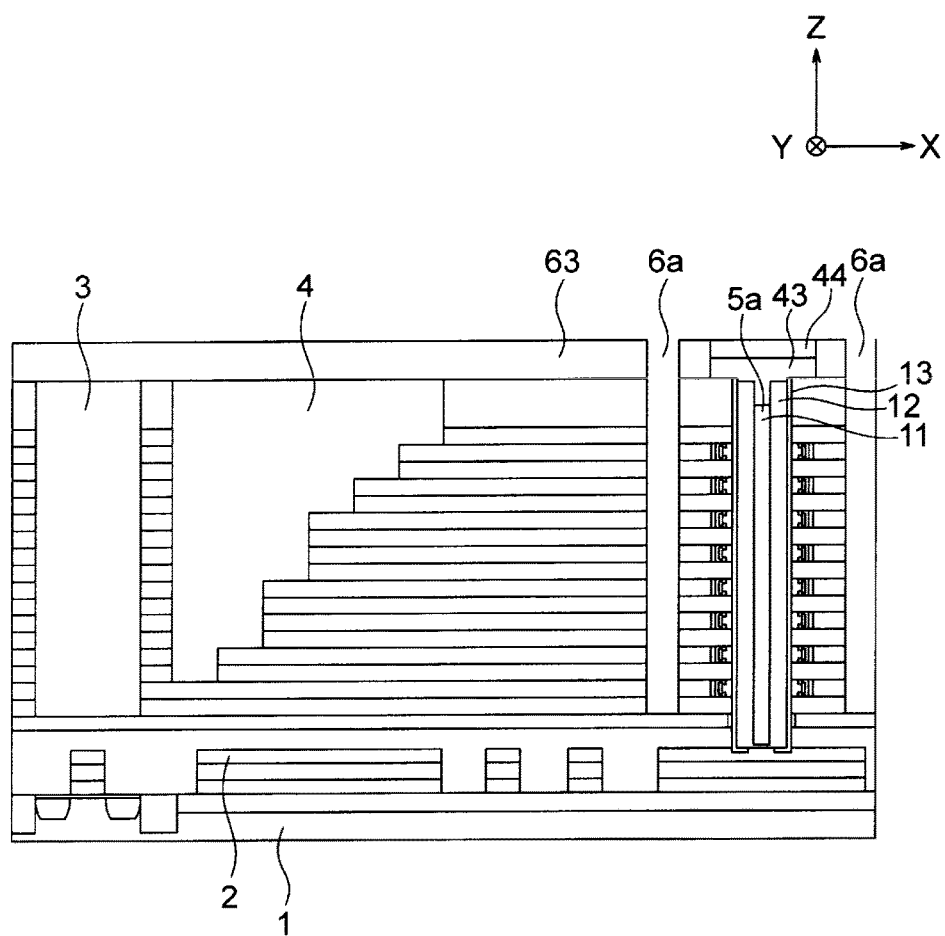
FIG. 95 is a sectional view illustrating a method for manufacturing the semiconductor device according to the third embodiment.

Next, the slit trench 6a is formed in the insulating layers 23 and the sacrificial layers 24 in the same manner as the second embodiment (FIG. 95).

Figure 96A:
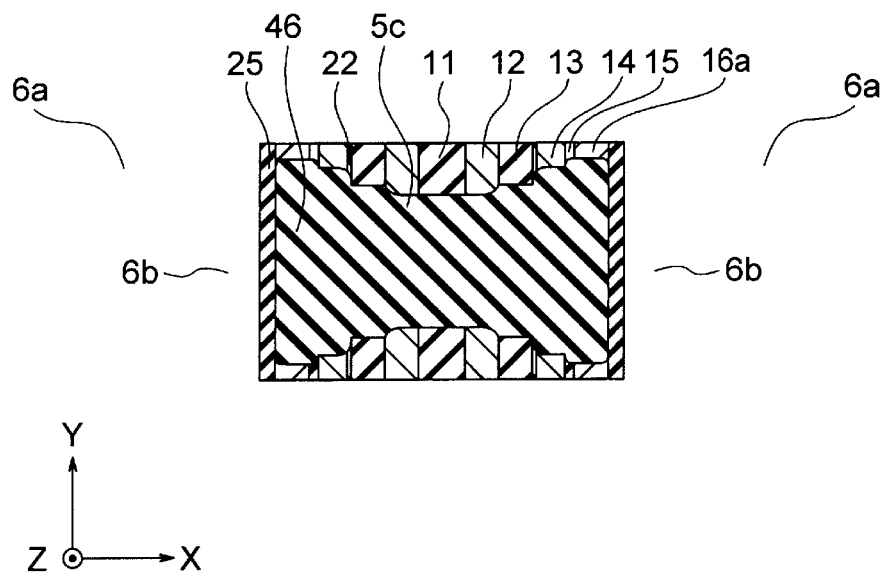
FIGS. 96A and 96B are enlarged sectional views illustrating a method for manufacturing the semiconductor device according to the third embodiment.
Figure 96B:
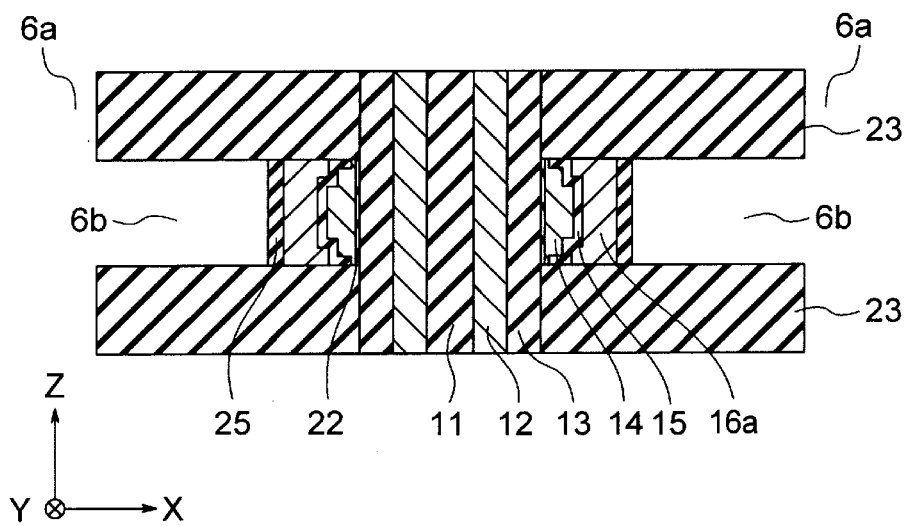

Next, the sacrificial layers 24 that are exposed to the slit trench 6a are selectively recessed, and the recess portion 6b is formed adjacent to the modified oxide film 25 (FIG. 96A and FIG. 96B).

Figure 97A:
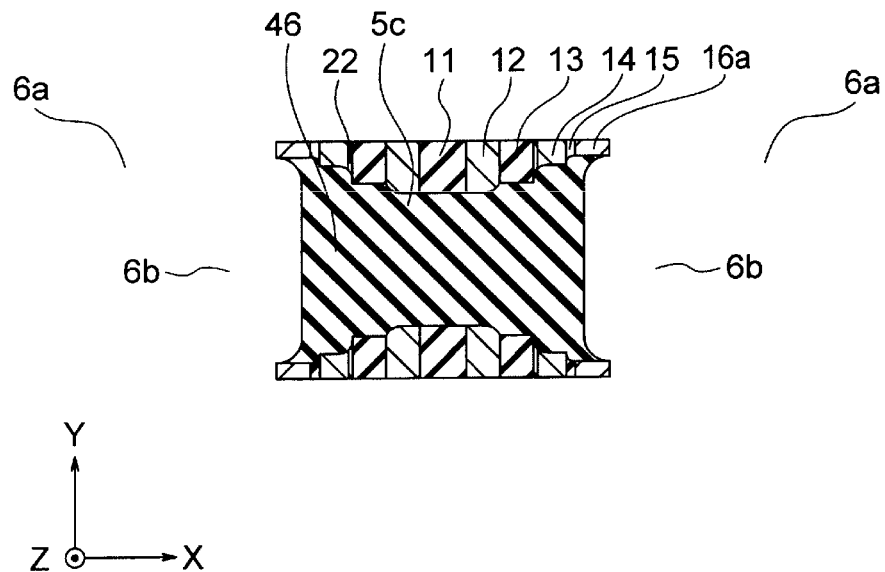
FIGS. 97A and 97B are enlarged sectional views illustrating a method for manufacturing the semiconductor device according to the third embodiment.
Figure 97B:
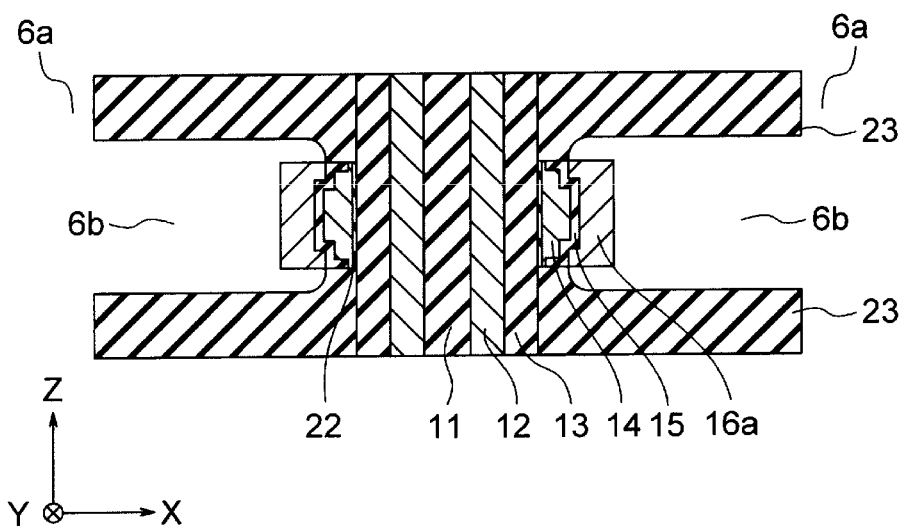

Next, the modified oxide film 25 that is exposed to the recess portion 6b is removed (FIG. 97A and FIG. 97B). Consequently, the CT film material 16a is exposed to the recess portion 6b. Furthermore, the insulating layers 23 above and below the recess portion 6b are recessed as well. The modified oxide film 25 having a thickness of 3 nm is removed in the present embodiment, and thus the Z-direction width of the recess portion 6b is increased from 35 nm to 41 nm.

Figure 98A:
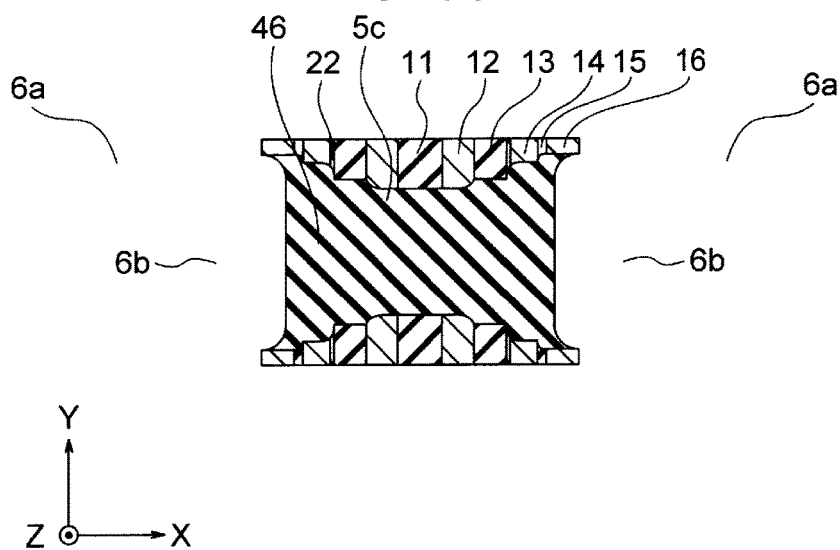
FIGS. 98A and 98B are enlarged sectional views illustrating a method for manufacturing the semiconductor device according to the third embodiment.
Figure 98B:
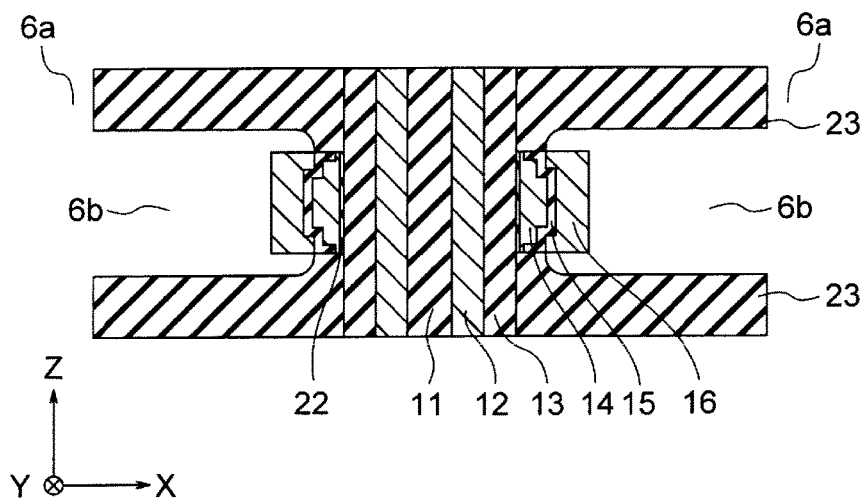

Next, the CT film material 16a is selectively reacted with gas that includes a metal element (FIG. 98A and FIG. 98B). Consequently, the CT film material 16a of an amorphous silicon layer is changed to the CT film 16 of a metal silicide layer by silicide reaction. Examples of the gas include titanium tetrachloride ($TiCl_4$) gas. In this case, the metal silicide layer turns into a titanium silicide ($TiSi_2$) layer. The present process is performed by, for example, high temperature CVD at 650° C. The CT film 16 in the present embodiment corresponds to a metal salicide layer. Then, a reaction product of the $TiCl_4$ gas is removed by using a mixed solution that includes, for example, sulfuric acid and hydrogen peroxide.

Figure 99A:
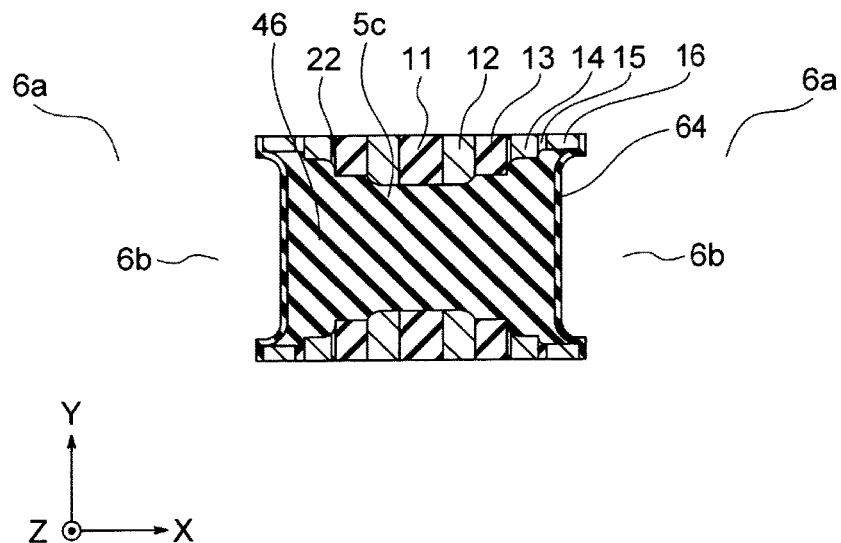
FIGS. 99A and 99B are enlarged sectional views illustrating a method for manufacturing the semiconductor device according to the third embodiment.
Figure 99B:
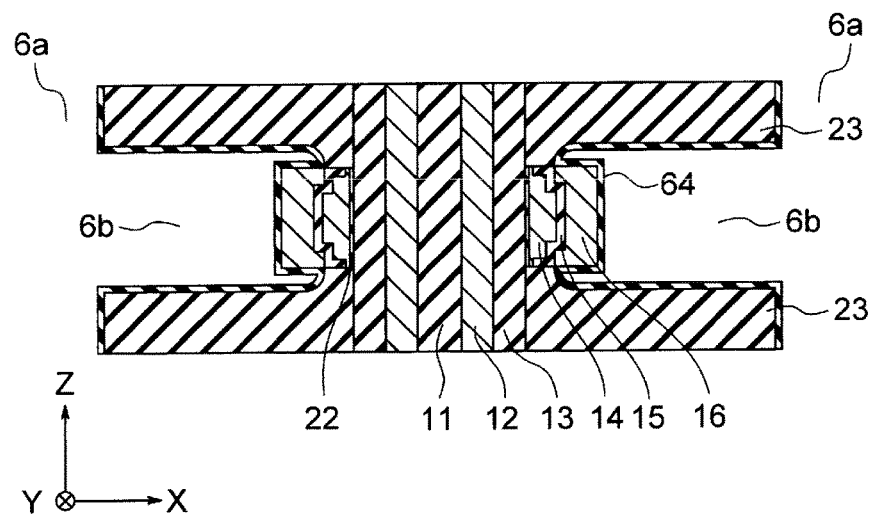

Next, a capping layer 64 is formed on the entire surface of the substrate 1 by CVD (FIG. 99A and FIG. 99B). Consequently, the capping layer 64 is formed on the side surface of the CT film 16 and the upper surface and the lower surface of the recess portion 6b. The capping layer 64 is formed in order to prevent oxidation of the CT film 16. Examples of the capping layer 64 include an insulating film such as a silicon nitride film. The thickness of the capping layer 64 is, for example, 3 nm.

Figure 100A:
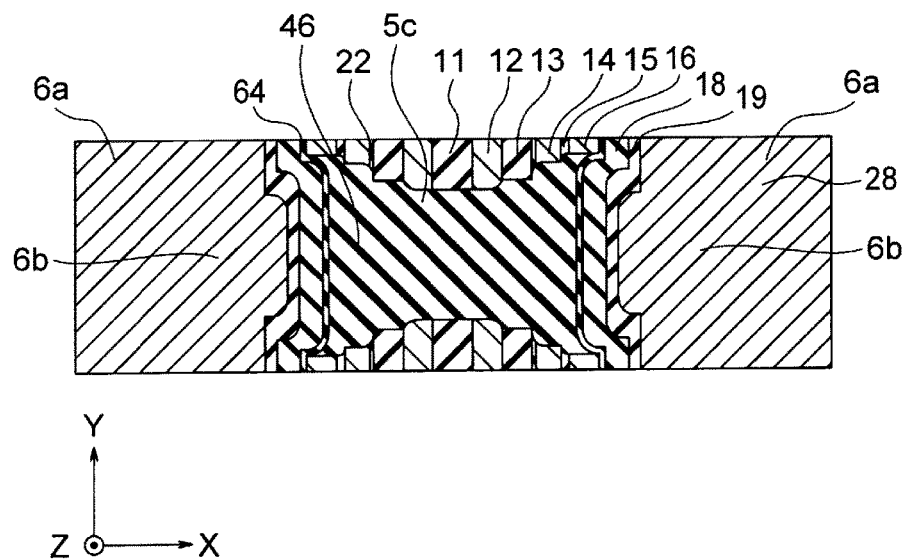
FIGS. 100A and 100B are enlarged sectional views illustrating a method for manufacturing the semiconductor device according to the third embodiment.
Figure 100B:
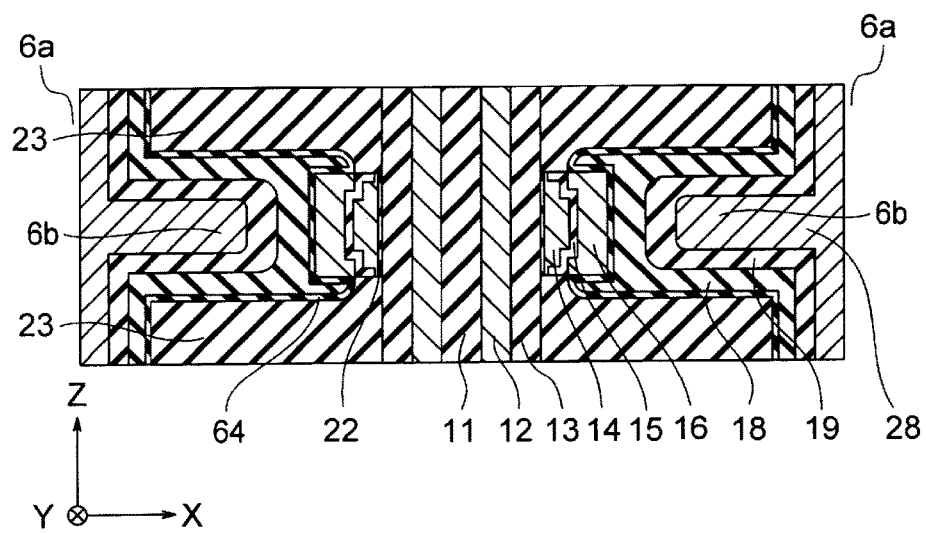

Next, the first block insulating film 18, the second block insulating film 19, and the dummy layer 28 are formed in order on the entire surface of the substrate 1 (FIG. 100A and FIG. 100B). Consequently, the first and second block insulating films 18 and 19 are formed on the side surface, the upper surface, and the lower surface of the capping layer 64, and the dummy layer 28 is formed in the recess portion 6b. The thickness of the first block insulating film 18 is, for example, 6 nm. The thickness of the second block insulating film 19 is, for example, 5 nm.

Figure 101A:
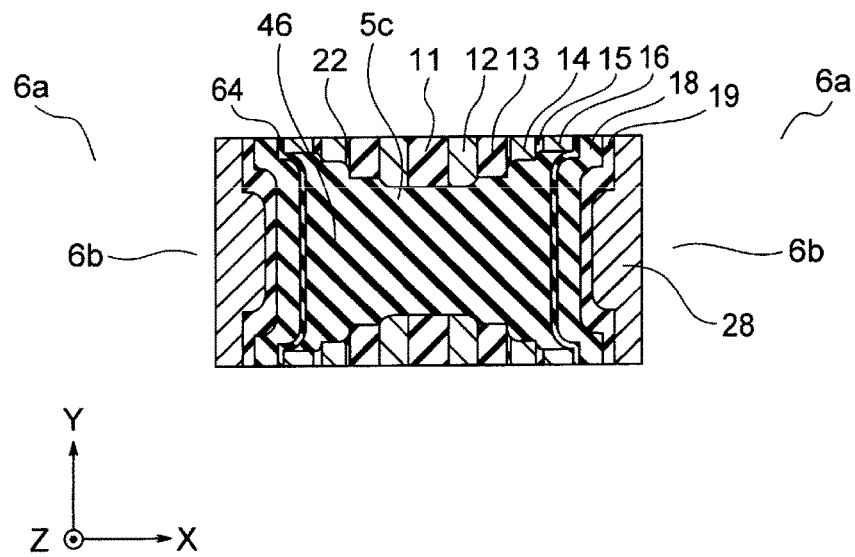
FIGS. 101A and 101B are enlarged sectional views illustrating a method for manufacturing the semiconductor device according to the third embodiment.
Figure 101B:
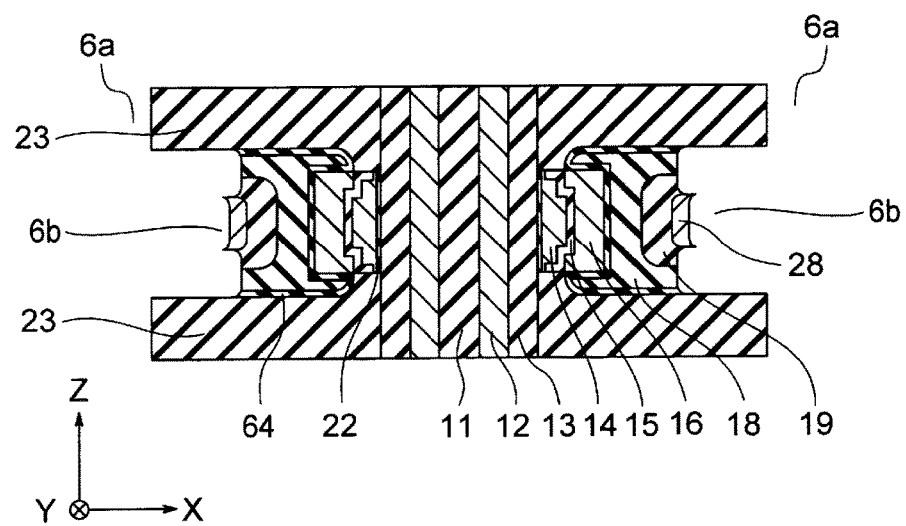

Next, the dummy layer 28 is selectively etched (FIG. 101A and FIG. 101B). Consequently, the dummy layer 28 having a thickness of 5 nm remains on the side surface of the second block insulating film 19.

Next, the second block insulating film 19 is selectively removed by using the dummy layer 28 as a mask (FIG. 101A and FIG. 101B). Consequently, the second block insulating film 19 remains on the side surface of the first block insulating film 18.

Next, the first block insulating film 18 is selectively removed by using the dummy layer 28 and the second block insulating film 19 as a mask (FIG. 101A and FIG. 101B). Consequently, the first block insulating film 18 remains on the side surface of the capping layer 64. The first block insulating film 18 is removed by, for example, the DHF treatment.

Next, the capping layer 64 is selectively removed by using the dummy layer 28, the second block insulating film 19, and the first block insulating film 18 as a mask (FIG. 101A and FIG. 101B). Consequently, the capping layer 64 remains on the side surface of the CT film 16 and a portion of the upper surface and the lower surface of the recess portion 6b. The capping layer 64 is removed by, for example, hot phosphoric acid treatment. While the second block insulating film 19 is etched as well in the present process, the etch rate of the second block insulating film 19 is significantly lower than the etch rate of the capping layer 64.

Such a structure of the second block insulating film 19, the first block insulating film 18, and the capping layer 64 is advantageous in that the electrical resistance of the CG layer 21 can be further decreased by increasing the volume of the CG layer 21 to be greater than the volume of the CG layer 21 in the first and second embodiments.

Figure 102A:
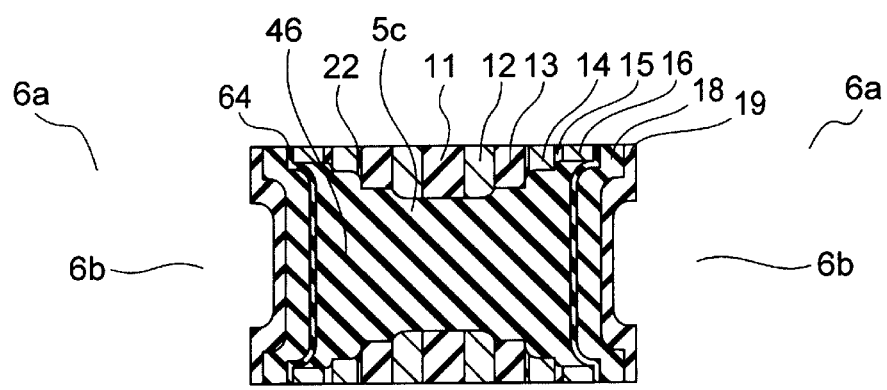
FIGS. 102A and 102B are enlarged sectional views illustrating a method for manufacturing the semiconductor device according to the third embodiment.
Figure 102B:
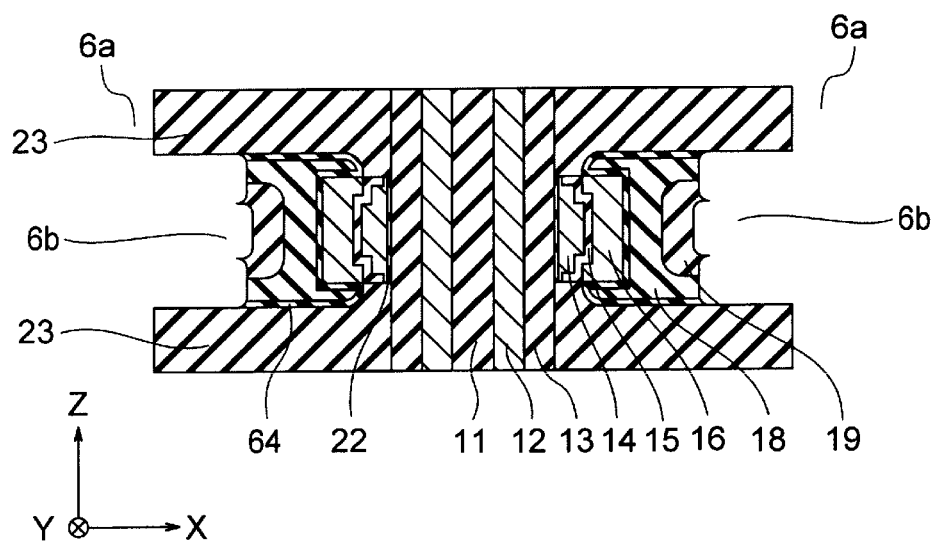

Next, the dummy layer 28 is selectively removed (FIG. 102A and FIG. 102B).

Figure 103A:
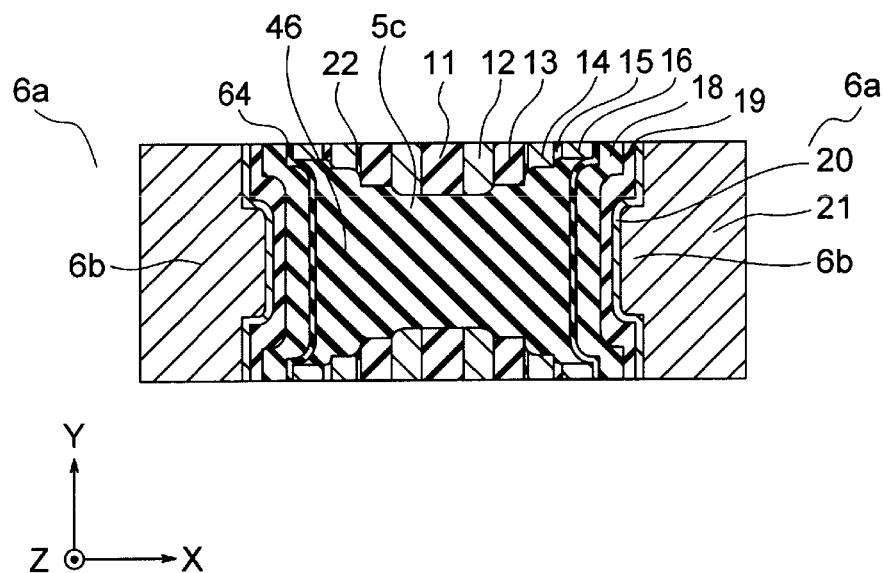
FIGS. 103A and 103B are enlarged sectional views illustrating a method for manufacturing the semiconductor device according to the third embodiment.
Figure 103B:
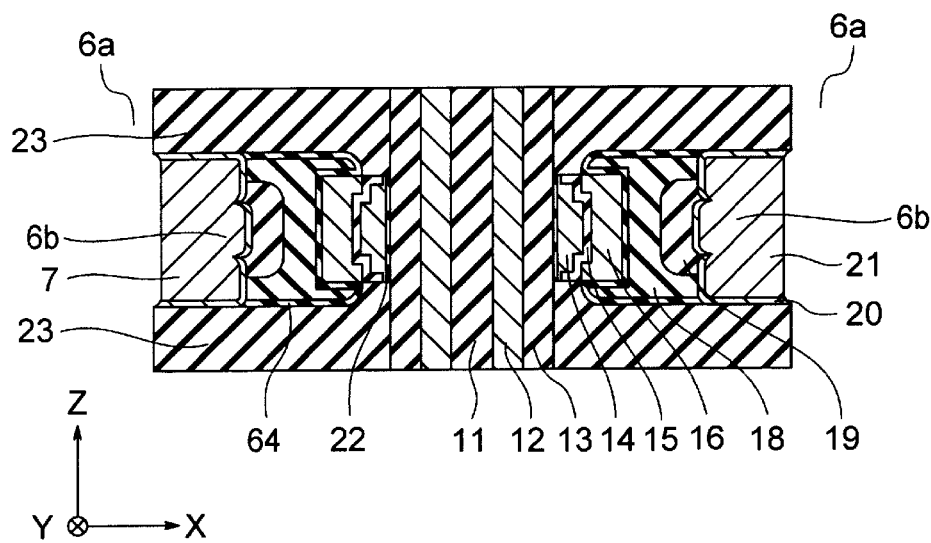

Next, the barrier metal layer 20 is formed on the entire surface of the substrate 1 (FIG. 103A and FIG. 103B). Consequently, the barrier metal layer 20 is formed in the recess portion 6b to be in contact with the side surfaces of the second block insulating film 19, the first block insulating film 18, and the capping layer 64 and the upper surface and the lower surface of the recess portion 6b. The thickness of the barrier metal layer 20 is, for example, 2 nm.

Next, the CG layer 21 is formed on the entire surface of the substrate 1 (FIG. 103A and FIG. 103B). Consequently, the CG layer 21 is formed in the recess portion 6b.

Figure 104:
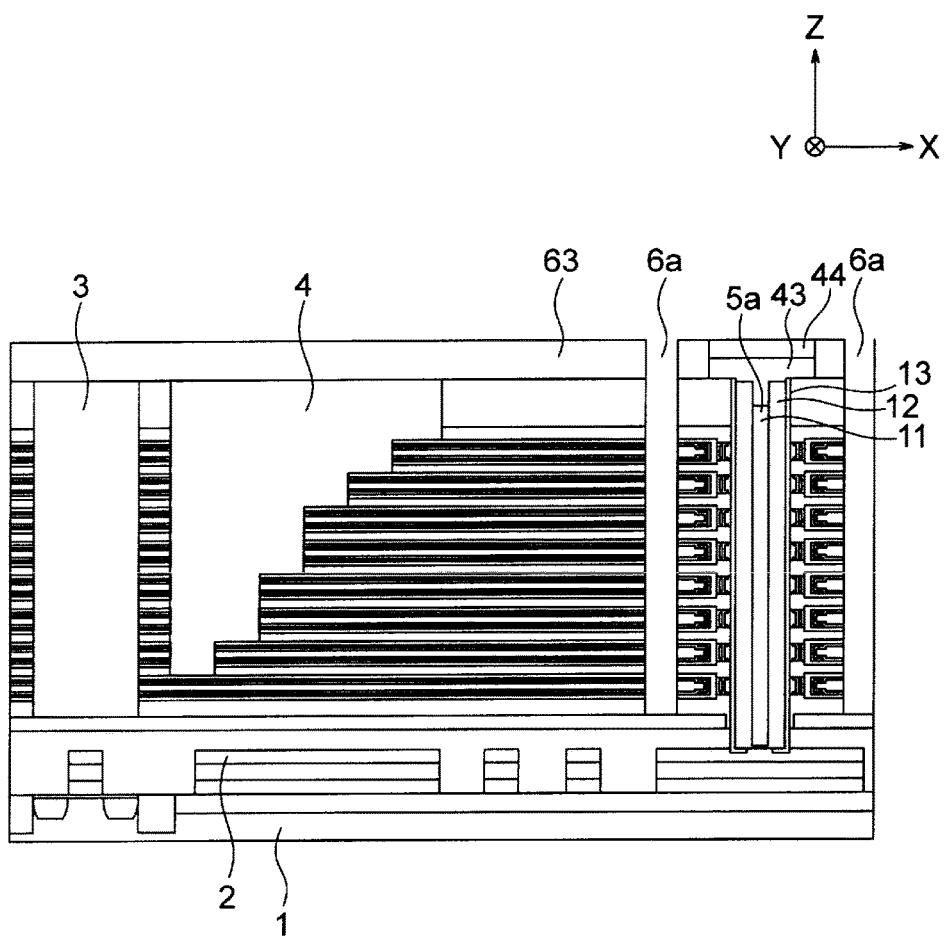
FIG. 104 is a sectional view illustrating a method for manufacturing the semiconductor device according to the third embodiment.

Next, the barrier metal layer 20 and the CG layer 21 are removed in such a manner that the barrier metal layer 20 and the CG layer 21 do not remain on the side surfaces of the insulating layers 23 (FIG. 103A and FIG. 103B). FIG. 104 is a sectional view corresponding to FIG. 103A and FIG. 103B.

The memory cell unit 7 that includes the FG layer 14, the inter-gate insulating film 15, the CT film 16, the capping layer 64, the first block insulating film 18, the second block insulating film 19, the barrier metal layer 20, the CG layer 21, and the oxide film 22 is formed in the recess portions 5b and 6b.

Figure 105:
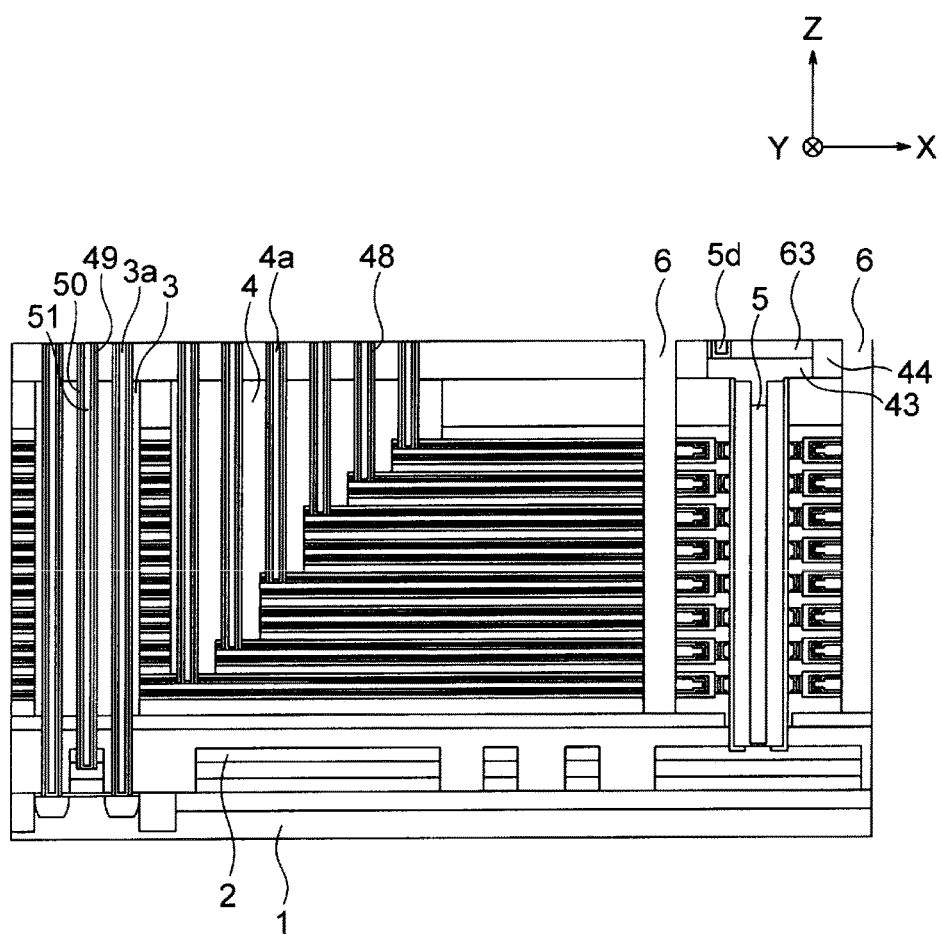
FIG. 105 is a sectional view illustrating a method for manufacturing the semiconductor device according to the third embodiment.

Next, the insulating film 47 is embedded in the slit trench 6a, and the surface of the insulating film 47 is flattened (FIG. 105). Next, the contact holes 3a, 4a, and 5d are formed, and contact plugs are formed in the contact holes 3a, 4a, and 5d in the same manner as the second embodiment (FIG. 105).

Then, various interconnect layers, plug layers, interlayer insulating films, and the like are formed on the substrate 1. The semiconductor device according to the present embodiment is manufactured.

(2) Structure of Semiconductor Device According to Third Embodiment

Figure 106A:
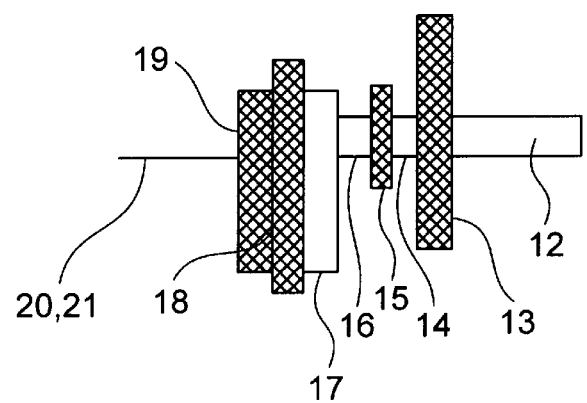
FIGS. 106A and 106B are graphs for describing the band structure of the semiconductor device according to the third embodiment.
Figure 106B:
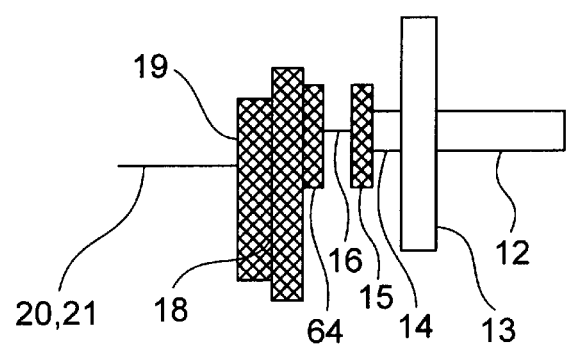

FIGS. 106A and 106B are graphs for describing the band structure of the semiconductor device according to the third embodiment.

FIG. 106A illustrates the band structure in the first embodiment. FIG. 106B illustrates the band structure in the third embodiment.

The height of the electron barrier of the first CT film 16 is smaller than the height of the electron barrier of the second CT film 17 in FIG. 106A. Thus, charges of the second CT film 17 are likely to leak to the first CT film 16. However, the height of the electron barrier of the inter-gate insulating film 15 is greater than the height of the electron barrier of the first CT film 16 by approximately 2 eV. Thus, even if heat or voltage stress is imposed on the first and second CT films 16 and 17, charges are unlikely to leak to the FG layer 14. Thus, according to the first embodiment, both the charge storing ability and the charge retaining ability of the charge storage layer can be improved.

Charges are stored in the single CT film 16 in the same manner as the CT film 17 of the second comparative example in FIG. 106B. The difference in the height of the electron barrier is small between the inter-gate insulating film 15 (SiN) and the CT film 17 (HfSiON) in the second comparative example (refer to FIG. 23A). Thus, charges are likely to leak from the CT film 17 to the FG layer 14 in the second comparative example. The difference in the height of the electron barrier is great between the inter-gate insulating film 15 (SiN) and the CT film 16 (TiSi$_2$) in the third embodiment (refer to FIG. 106B). Thus, charges are unlikely to leak from the CT film 16 to the FG layer 14 in the third embodiment. Thus, according to the third embodiment, both the charge storing ability and the charge retaining ability of the charge storage layer can be improved in the same manner as the first embodiment.

As described heretofore, the semiconductor device according to the present embodiment includes the CT film 16 of a metal silicide layer as a charge storage layer and includes the FG layer 14 between the channel semiconductor layer 12 and the CT film 16. Thus, according to the present embodiment, the charge storing ability and the charge retaining ability of a three-dimensional memory cell can be improved.

Fourth Embodiment

Hereinafter, a fourth embodiment will be described. The fourth embodiment will be described with focus on the differences from the first to third embodiments, and matters common to the first to third embodiments will not be described.

(1) Structure of Semiconductor Device According to Fourth Embodiment

Figure 107A:
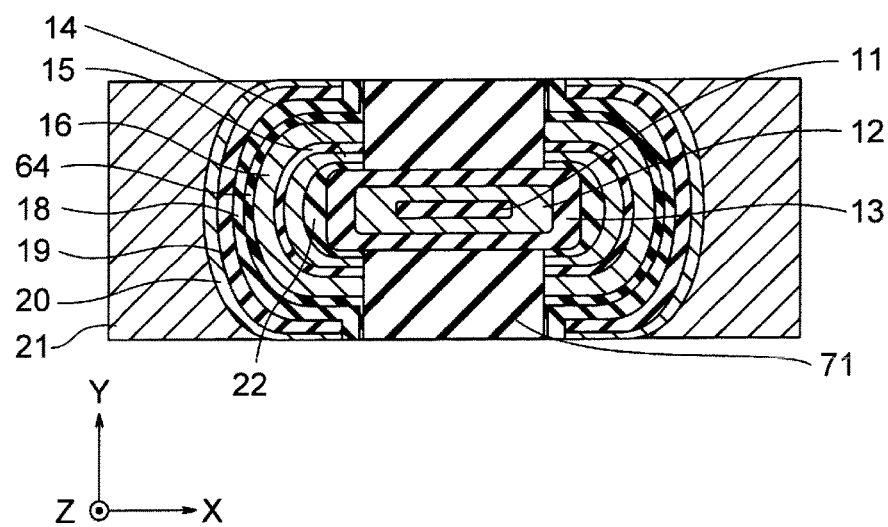
FIGS. 107A and 107B are enlarged sectional views illustrating the structure of a semiconductor device according to a fourth embodiment.
Figure 107B:
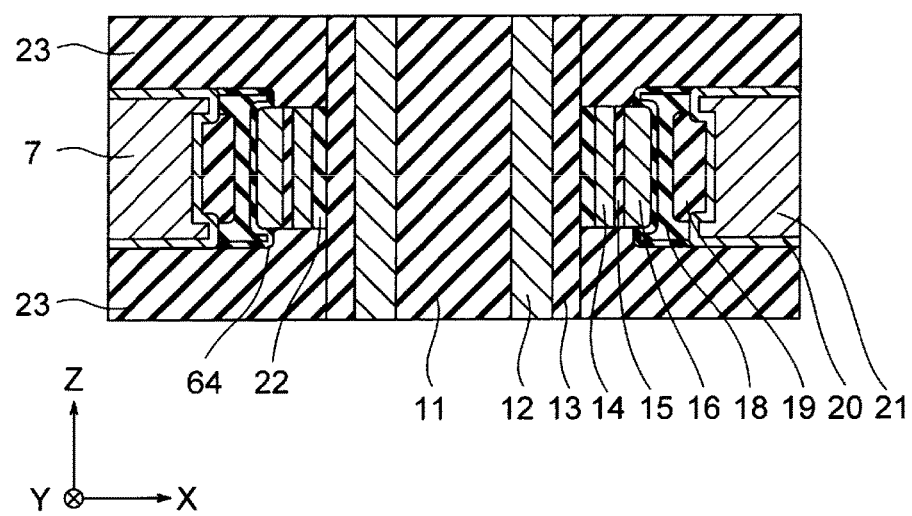

FIGS. 107A and 107B are enlarged sectional views illustrating the structure of a semiconductor device according to the fourth embodiment.

FIG. 107A and FIG. 107B illustrate one set of the core layer 11, the channel semiconductor layer 12, and the tunnel insulating film 13. Furthermore, FIG. 107A and FIG. 107B illustrate two sets of the FG layer 14, the inter-gate insulating film 15, the CT film 16, the first block insulating film 18, the second block insulating film 19, the barrier metal layer 20, the CG layer 21, the oxide film 22, and the capping layer 64. The CT film 16 in the present embodiment is a metal silicide layer such as a titanium silicide layer, and the capping layer 64 in the present embodiment is an insulating film such as a silicon nitride film. Furthermore, FIG. 107A and FIG. 107B illustrate the plurality of insulating layers 23 and an insulating film 71. Examples of the insulating film 71 include a PSZ film.

A first set of the FG layer 14, the CT film 16, the CG layer 21, and the like is formed on the right side surface (+X-direction side surface) of the channel semiconductor layer 12 in the present embodiment. Hereinafter, these layers will be referred to as a first set layer. Furthermore, a second set of the FG layer 14, the CT film 16, the CG layer 21, and the like is formed on the left side surface (−X-direction side surface) of the channel semiconductor layer 12 in the present embodiment. Hereinafter, these layers will be referred to as a second set layer. The right side surface is an example of a first side surface, and the left side surface is an example of a second side surface.

The first set layer configures one memory cell unit 7. Similarly, the second set layer configures one memory cell unit 7. The first set layer and the second set layer face each other with the core layer 11, the channel semiconductor layer 12, and the tunnel insulating film 13 interposed therebetween. The first set layer and the second set layer are not in contact with each other and are separated from each other by the insulating film 71.

FIG. 2A and FIG. 107A will be compared. The FG layer 14, the CT films 16 and 17, the CG layer 21, and the like in FIG. 2A configure one memory cell unit 7 and can retain one bit of data. The FG layer 14, the CT film 16, the CG layer 21, and the like in FIG. 107A configure two memory cell units 7 and can retain two bits of data. According to the present embodiment, the degree of integration of a three-dimensional memory can be improved.

(2) Method for Manufacturing Semiconductor Device According to Fourth Embodiment FIG. 108 to FIG. 135 are sectional views and enlarged sectional views illustrating a method for manufacturing the semiconductor device according to the fourth embodiment.

Figure 108:
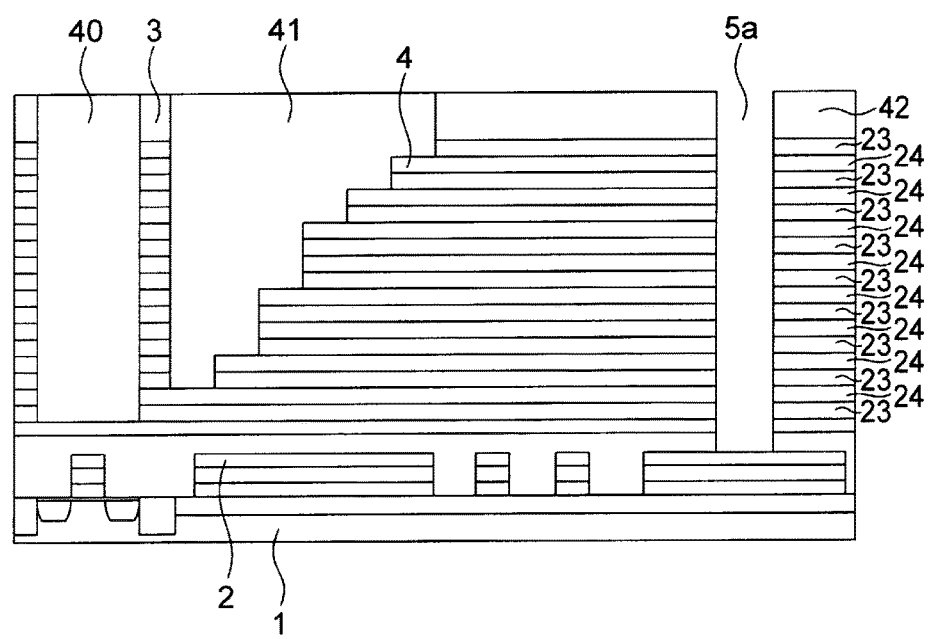
FIG. 108 is a sectional view illustrating a method for manufacturing the semiconductor device according to the fourth embodiment.

First, the plurality of insulating layers 23 and the plurality of sacrificial layers 24 are alternately formed on the substrate 1, and the memory trench 5a is formed in the insulating layers 23 and the sacrificial layers 24 (FIG. 108). The insulating layers 23 are, for example, silicon oxide films. The sacrificial layers 24 are, for example, silicon nitride films.

Figure 109:
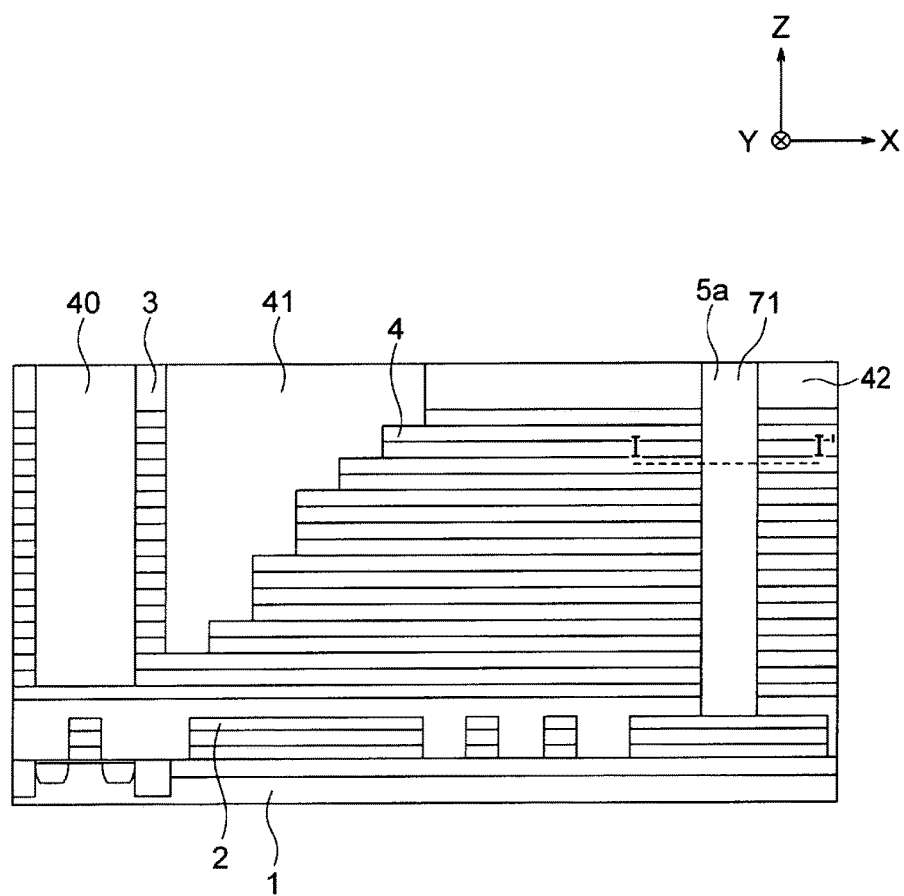
FIG. 109 is a sectional view illustrating a method for manufacturing the semiconductor device according to the fourth embodiment.

Next, the insulating film 71 is embedded in the memory trench 5a, and the surface of the insulating film 71 is flattened by CMP (FIG. 109). The insulating film 71 is, for example, a PSZ film.

Figure 110A:
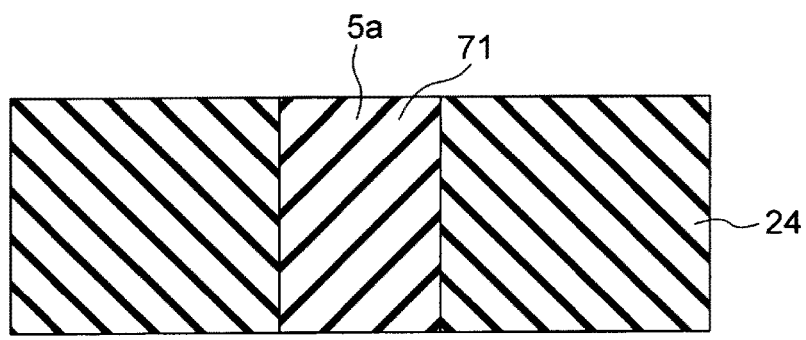
FIGS. 110A and 110B are enlarged sectional views illustrating a method for manufacturing the semiconductor device according to the fourth embodiment.
Figure 110B:
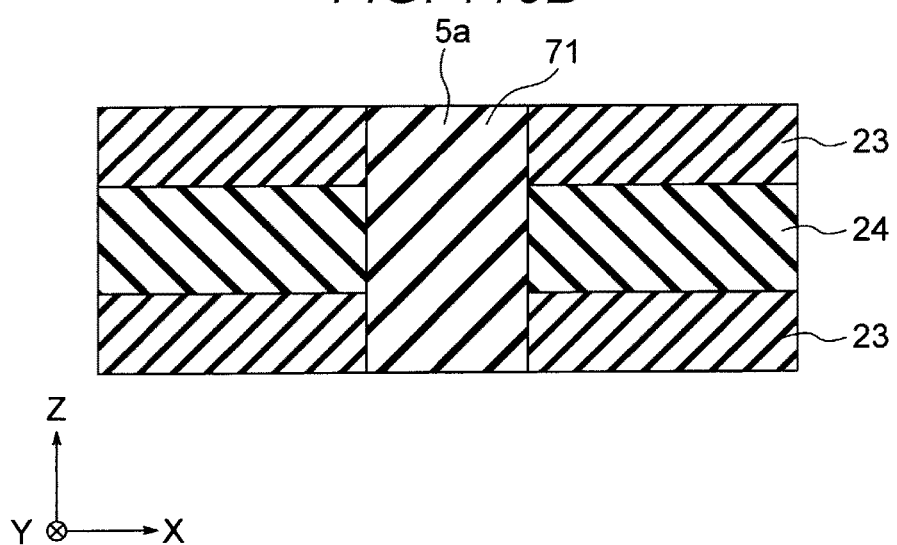

FIG. 110A and FIG. 110B are enlarged views in FIG. 109. FIG. 110A illustrates a horizontal section taken along a line I-I' in FIG. 109. FIG. 110B illustrates a vertical section near the line I-I' in FIG. 109.

Figure 111A:
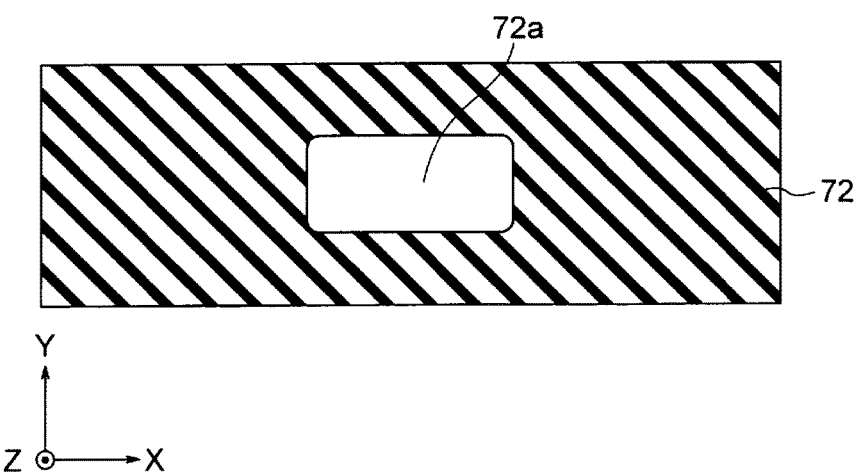
FIGS. 111A and 111B are enlarged sectional views illustrating a method for manufacturing the semiconductor device according to the fourth embodiment.
Figure 111B:
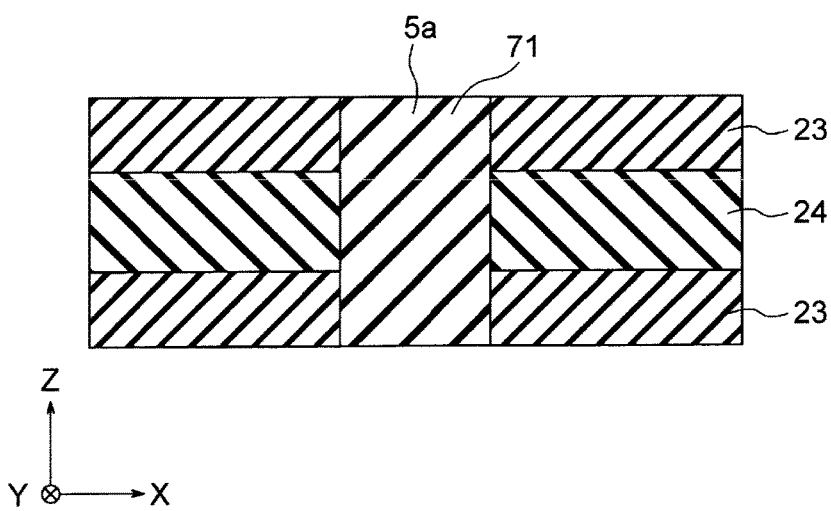

Next, a resist layer 72 is formed on the insulating layers 23 and the sacrificial layers 24, and an opening portion 72a is formed in the resist layer 72 (FIG. 111A and FIG. 111B). The resist layer 72 is actually above the horizontal section in FIG. 111A but is illustrated within the section in FIG. 111A for convenience of description.

Next, the insulating layers 23, the sacrificial layers 24, and the insulating film 71 in the opening portion 72a are etched by using the resist layer 72 as a mask (FIG. 112A and FIG. 112B). Consequently, a memory hole 5e that extends in the Z direction is formed in the insulating layers 23, the sacrificial layers 24, and the insulating film 71 in the opening portion 72a. The memory hole 5e is formed by using the stopper layer 36 as a stopper, and then the stopper layer 36 and the interlayer insulating film 35 in the bottom portion of the memory hole 5e are removed in the present embodiment. Accordingly, the memory hole 5e reaches the MOSFET of the base MOSFET unit 2. The memory hole 5e is an example of the first recess portion.

Figure 113A:
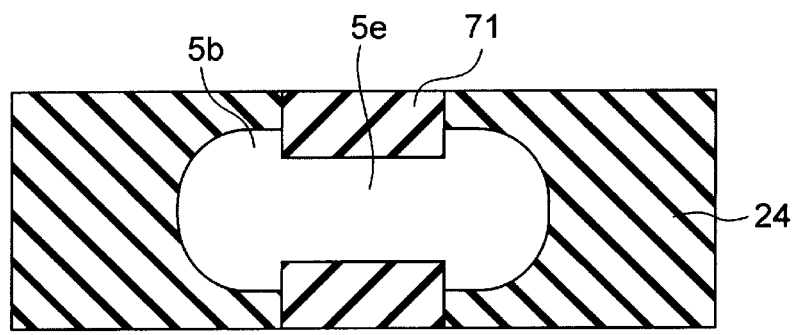
FIGS. 113A and 113B are enlarged sectional views illustrating a method for manufacturing the semiconductor device according to the fourth embodiment.
Figure 113B:
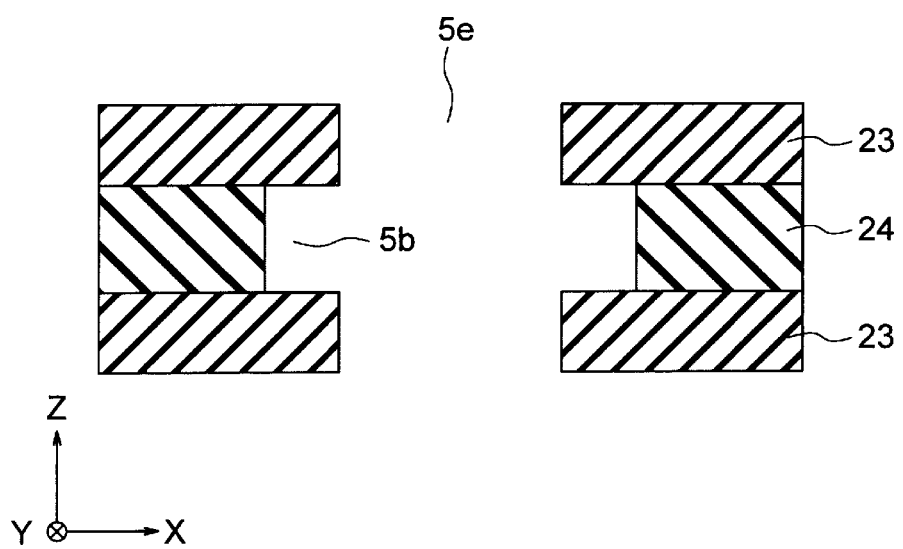

Next, the sacrificial layers 24 that are exposed to the memory hole 5e are recessed, and the recess portion 5b is formed adjacent to the sacrificial layers 24 (FIG. 113A and FIG. 113B). The amount of recessing of the sacrificial layers 24 is, for example, 25 nm. The sacrificial layers 24 are isotropically recessed by, for example, hot phosphoric acid treatment. The planar shape of the recess portion 5b is a semicircular shape. The recess portion 5b is an example of the second recess portion.

Figure 114A:
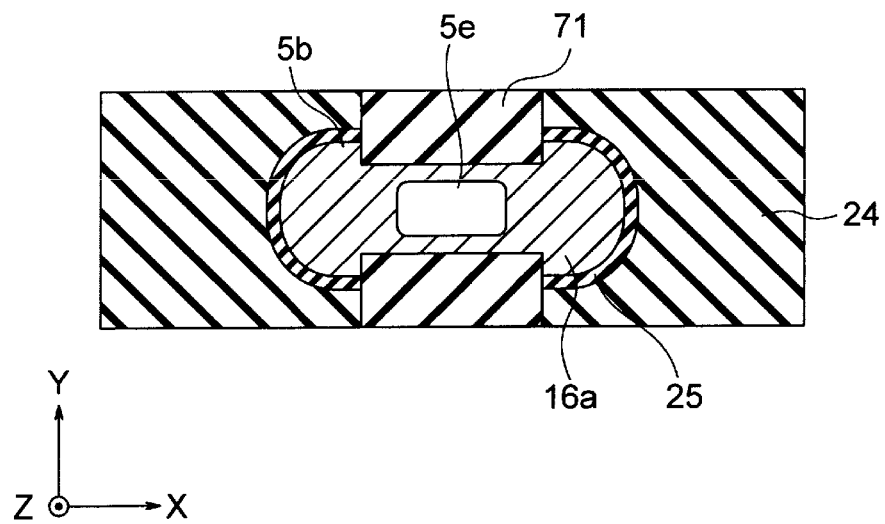
FIGS. 114A and 114B are enlarged sectional views illustrating a method for manufacturing the semiconductor device according to the fourth embodiment.
Figure 114B:
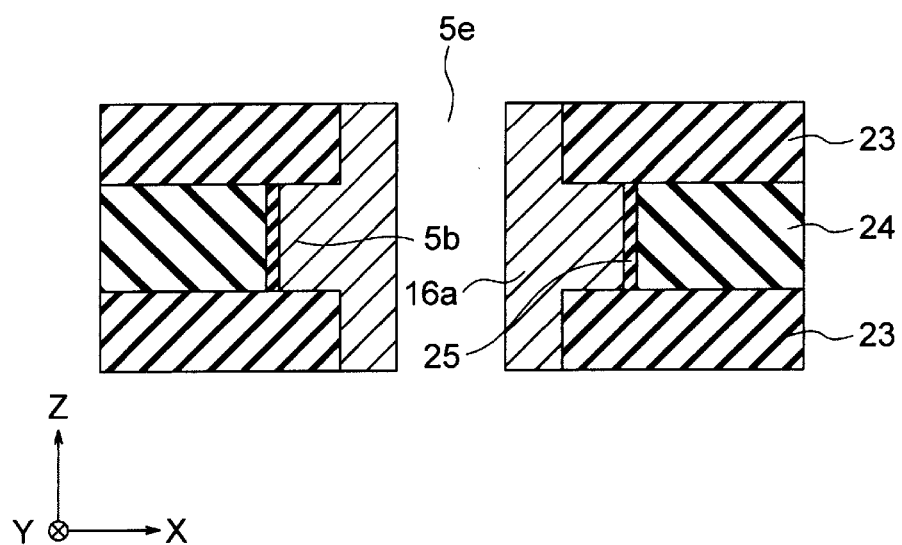

Next, the modified oxide film 25 is formed on the surfaces of the sacrificial layers 24 (FIG. 114A and FIG. 114B). The modified oxide film 25 is formed by, for example, a radical oxidation process. The thickness of the modified oxide film 25 is, for example, 5 nm.

Next, the CT film material 16a is formed on the entire surface of the substrate 1 (FIG. 114A and FIG. 114B). Consequently, the CT film material 16a is formed in the recess portion 5b. Examples of the CT film material 16a include an amorphous silicon layer. The thickness of the CT film material 16a is, for example, 30 nm.

Figure 115A:
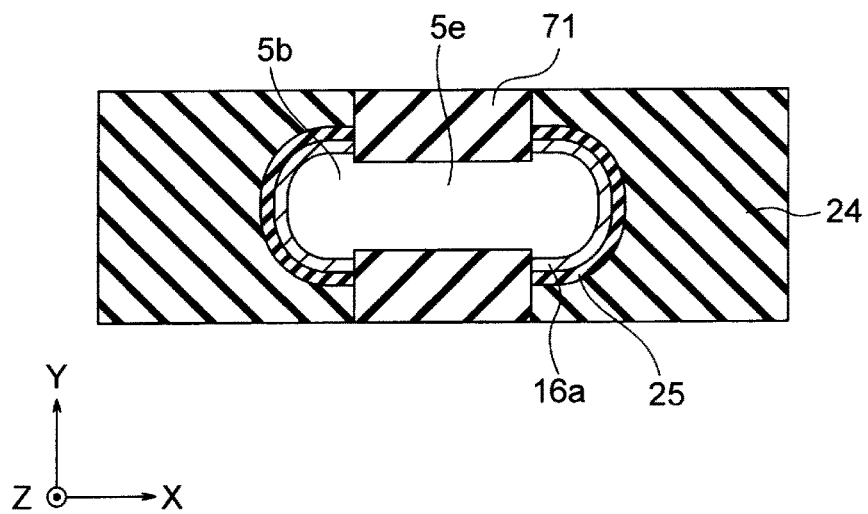
FIGS. 115A and 115B are enlarged sectional views illustrating a method for manufacturing the semiconductor device according to the fourth embodiment.
Figure 115B:
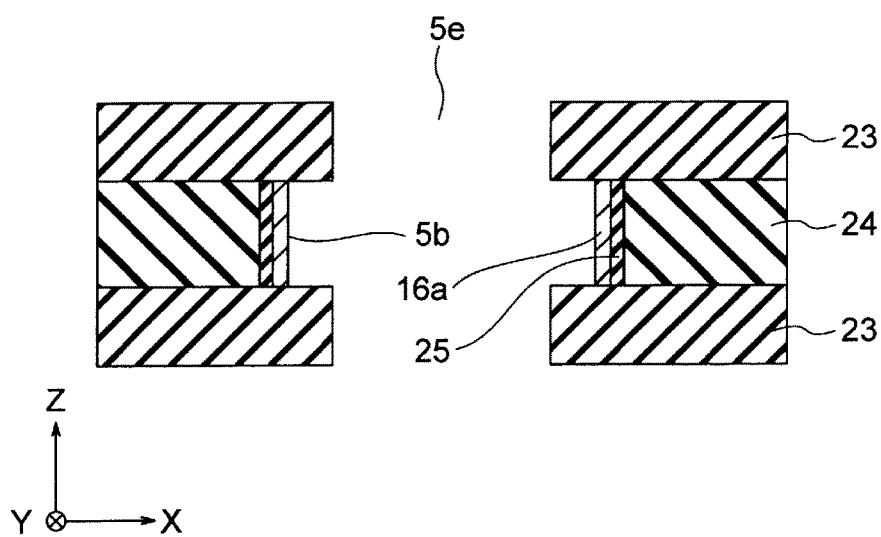

Next, the CT film material 16a is selectively removed (FIG. 115A and FIG. 115B). Consequently, the CT film material 16a having a thickness of 10 nm remains on the side surface of the modified oxide film 25. The CT film material 16a is removed by, for example, the trimethyl-2-hydroxyethyl ammonium hydroxide (TM-Y) treatment at room temperature.

Figure 116A:
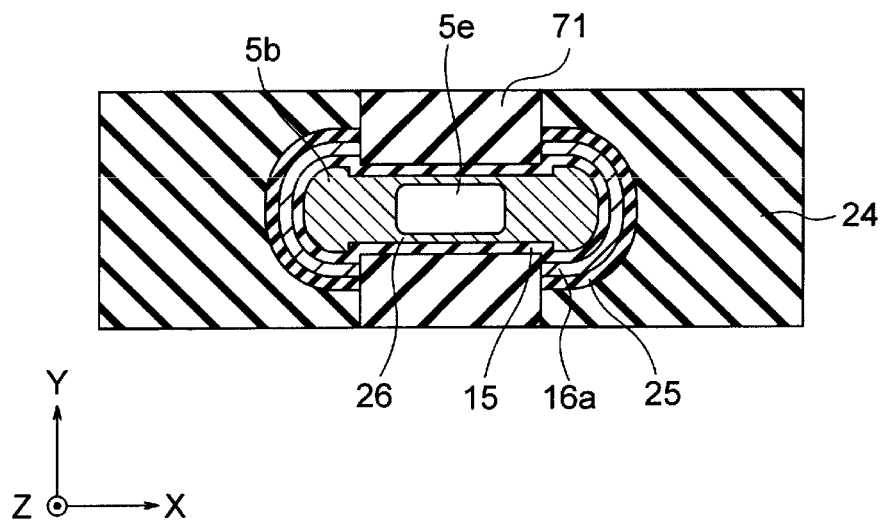
FIGS. 116A and 116B are enlarged sectional views illustrating a method for manufacturing the semiconductor device according to the fourth embodiment.
Figure 116B:
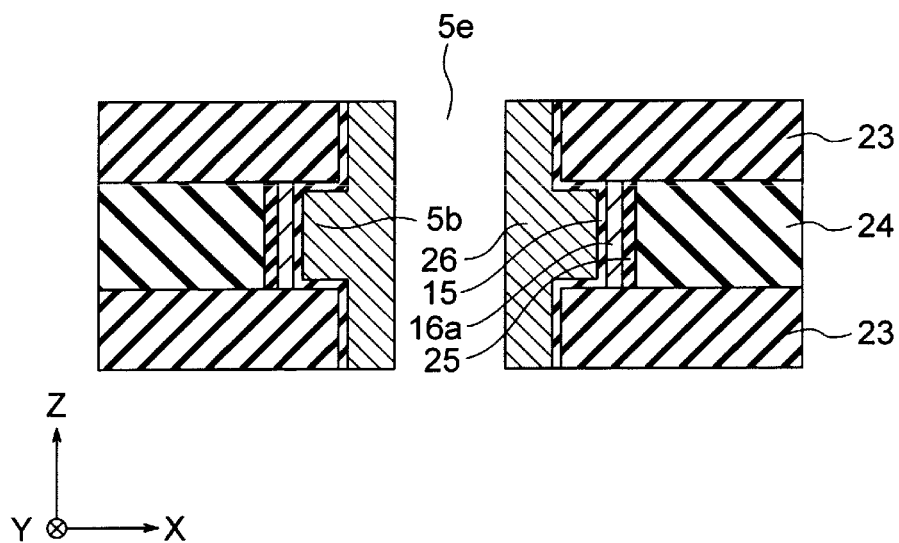

Next, the inter-gate insulating film 15 is formed on the entire surface of the substrate 1 (FIG. 116A and FIG. 116B). Consequently, the inter-gate insulating film 15 having a thickness of 2 nm is formed on the side surface of the CT film material 16a and the upper surface and the lower surface of the recess portion 5b. Examples of the inter-gate insulating film 15 include a silicon nitride film.

Next, the dummy layer 26 is formed on the entire surface of the substrate 1 (FIG. 116A and FIG. 116B). Consequently, the dummy layer 26 is formed in the recess portion 5b. Examples of the dummy layer 26 include an amorphous silicon layer. The thickness of the dummy layer 26 is, for example, 20 nm.

Figure 117A:
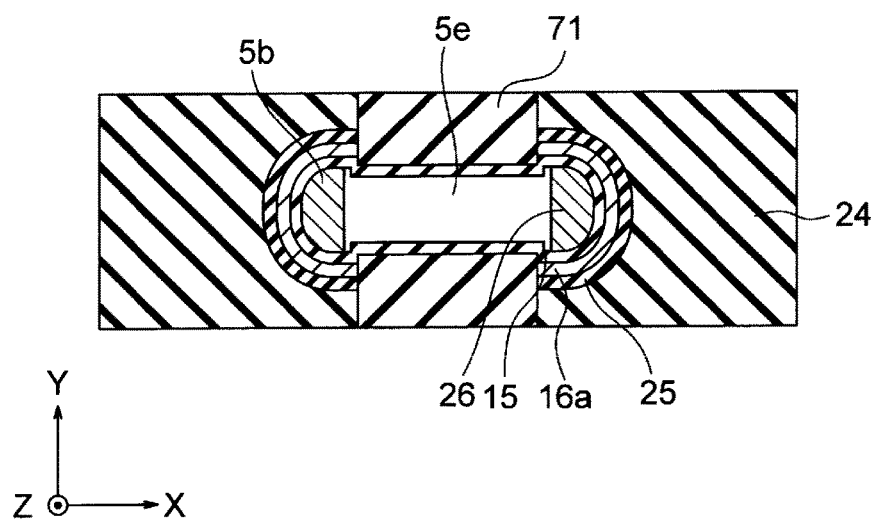
FIGS. 117A and 117B are enlarged sectional views illustrating a method for manufacturing the semiconductor device according to the fourth embodiment.
Figure 117B:
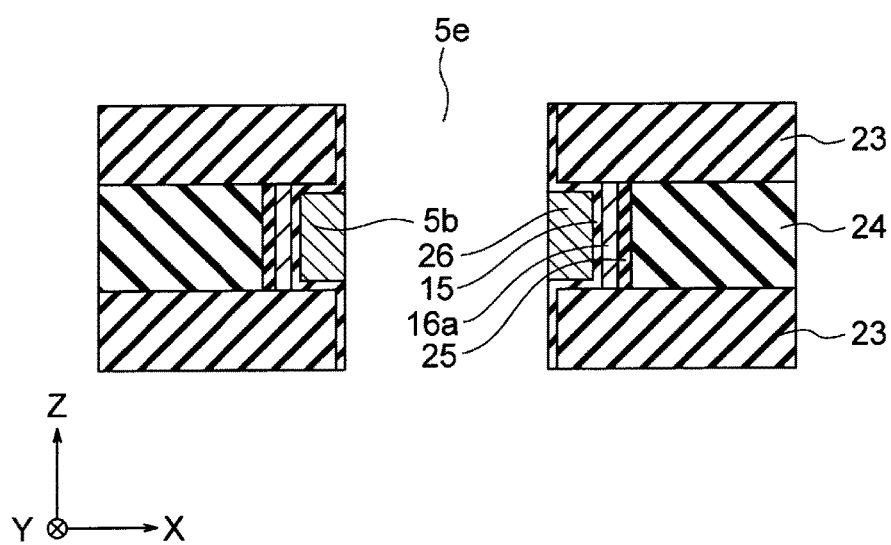

Next, the dummy layer 26 is selectively etched (FIG. 117A and FIG. 117B). Consequently, the dummy layer 26 remains on the side surface of the inter-gate insulating film 15. The dummy layer 26 is etched by, for example, the TM-Y treatment at room temperature.

Figure 118A:
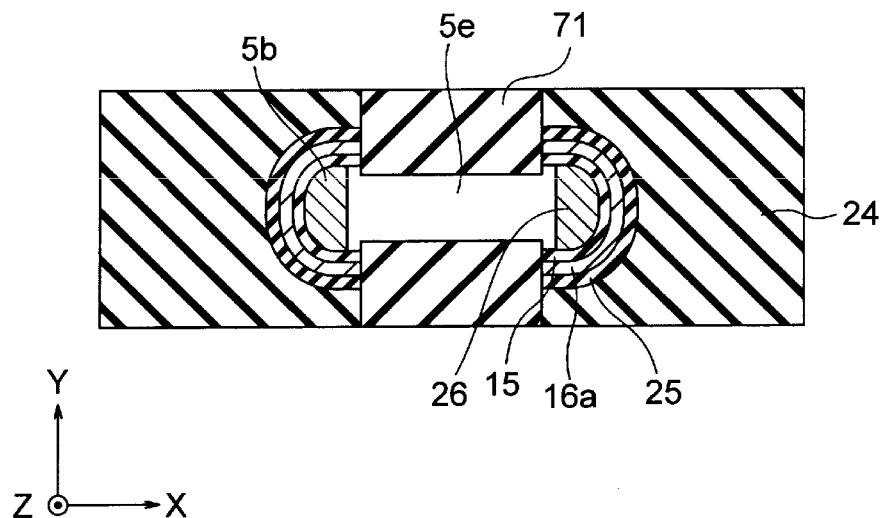
FIGS. 118A and 118B are enlarged sectional views illustrating a method for manufacturing the semiconductor device according to the fourth embodiment.
Figure 118B:
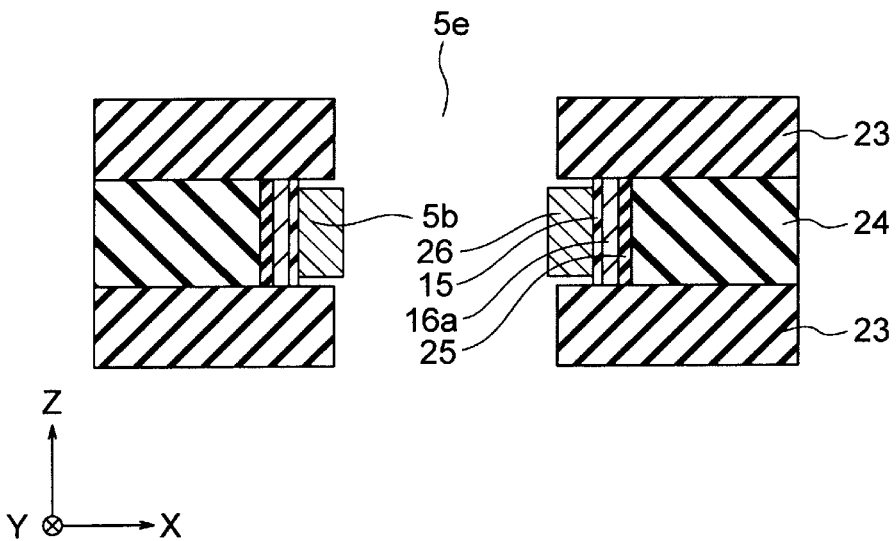

Next, the inter-gate insulating film 15 is selectively removed by using the dummy layer 26 as a mask (FIG. 118A and FIG. 118B). Consequently, the inter-gate insulating film 15 remains on the side surface of the CT film material 16a. The inter-gate insulating film 15 is removed by, for example, hot phosphoric acid treatment.

Figure 119A:
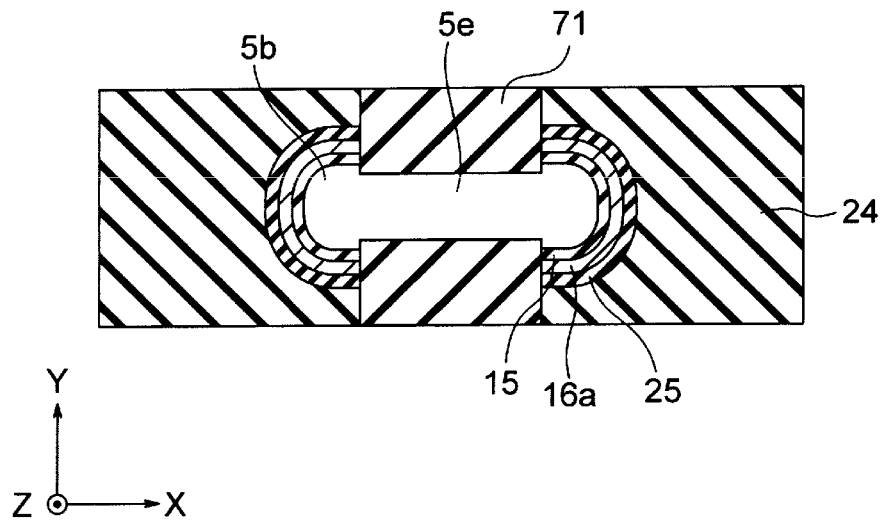
FIGS. 119A and 119B are enlarged sectional views illustrating a method for manufacturing the semiconductor device according to the fourth embodiment.
Figure 119B:
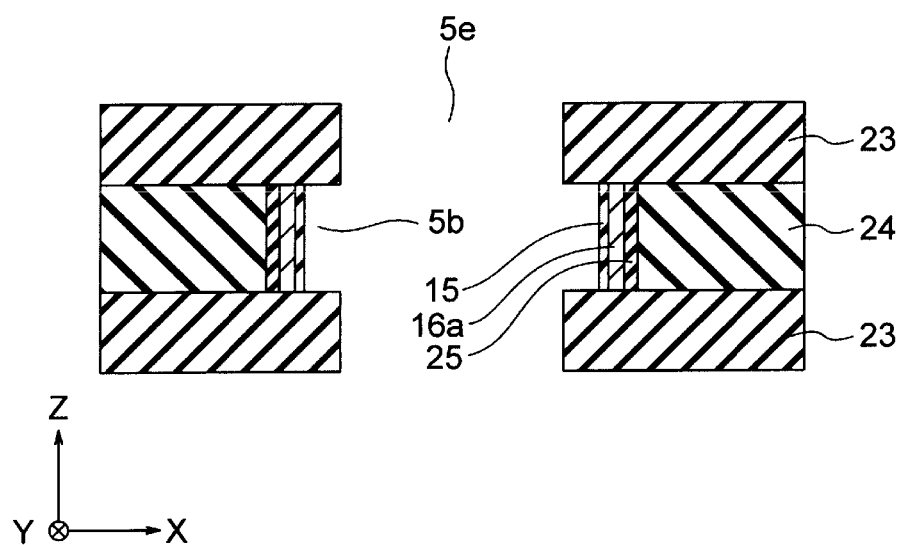

Next, the dummy layer 26 is selectively removed (FIG. 119A and FIG. 119B). The dummy layer 26 is removed by, for example, the TM-Y treatment at room temperature.

Figure 120A:
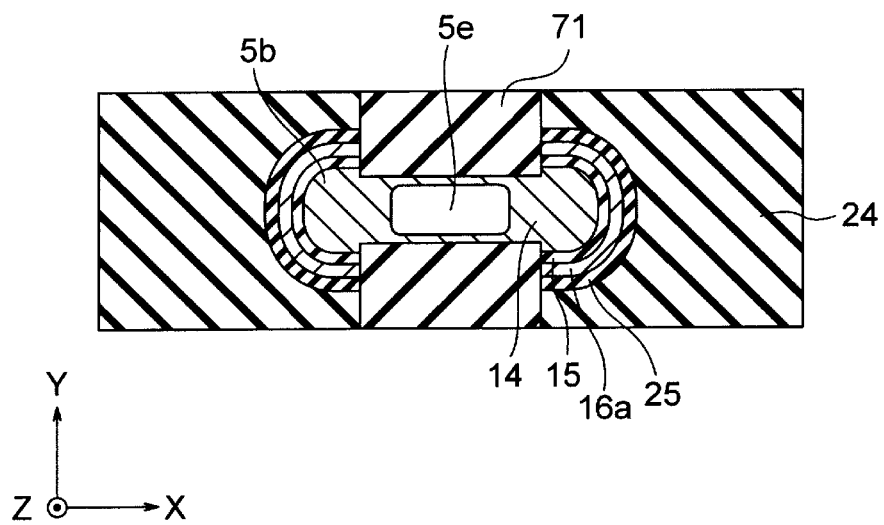
Figure 120B:
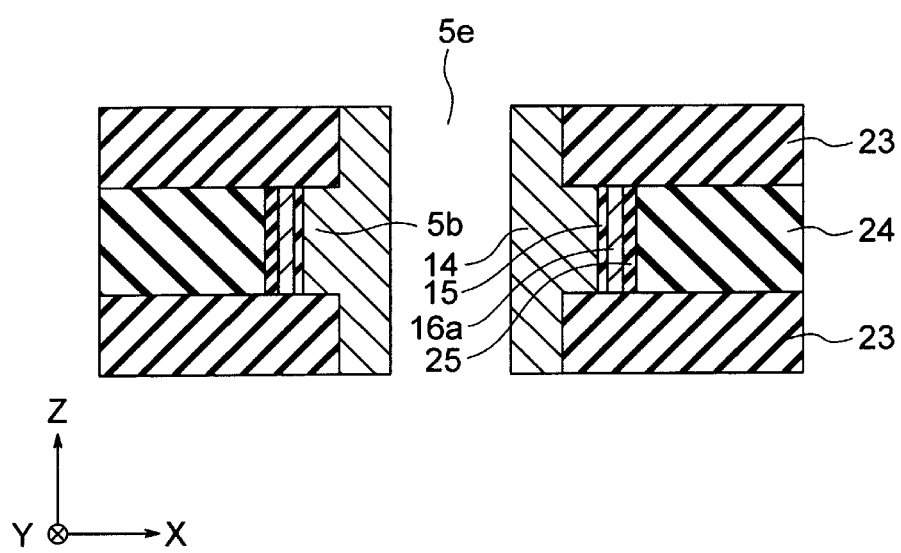

Next, the FG layer 14 is formed on the entire surface of the substrate 1 (FIG. 120A and FIG. 120B). Consequently, the FG layer 14 is formed in the recess portion 5b. Examples of the FG layer 14 include an amorphous silicon layer. The amorphous silicon layer is changed to a polysilicon layer by crystallization in a subsequent process. The thickness of the FG layer 14 is, for example, 30 nm.

Figure 121A:
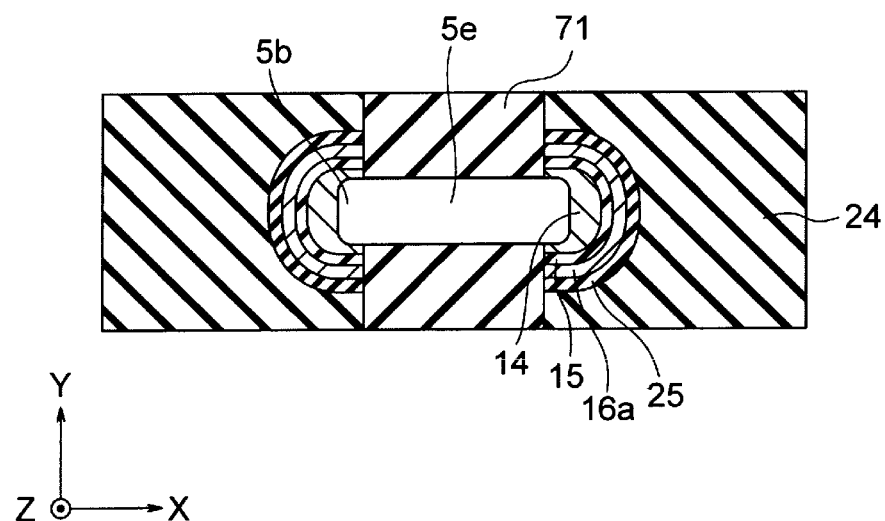
Figure 121B:
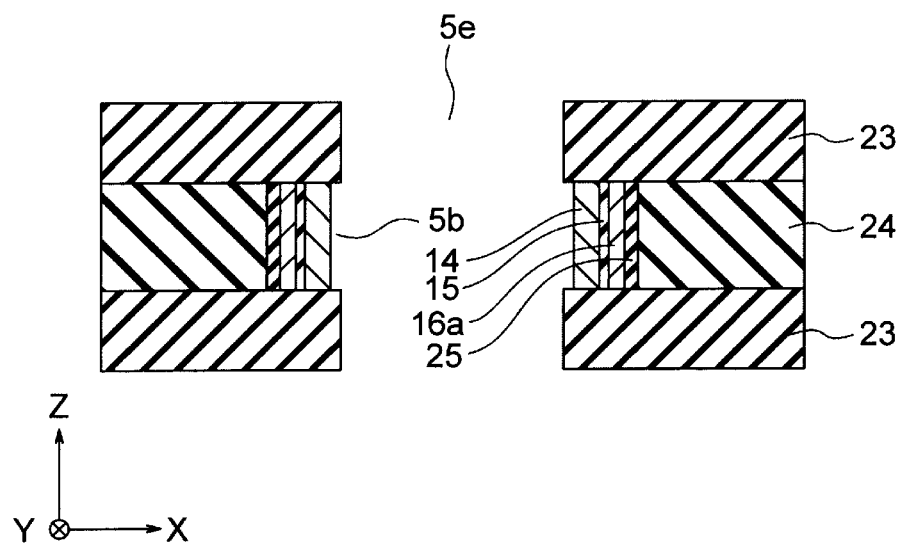

Next, the FG layer 14 is selectively etched (FIG. 121A and FIG. 121B). Consequently, the FG layer 14 having a thickness of 10 nm is formed on the side surface of the inter-gate insulating film 15. The FG layer 14 is etched by, for example, the TM-Y treatment at room temperature.

Two sets of the FG layer 14, the inter-gate insulating film 15, and the CT film material 16a are formed in the recess portion 5b. These two sets face each other with the memory hole 5e interposed therebetween. The total thickness of the FG layer 14, the inter-gate insulating film 15, and the CT film material 16a is 22 nm.

Figure 122A:
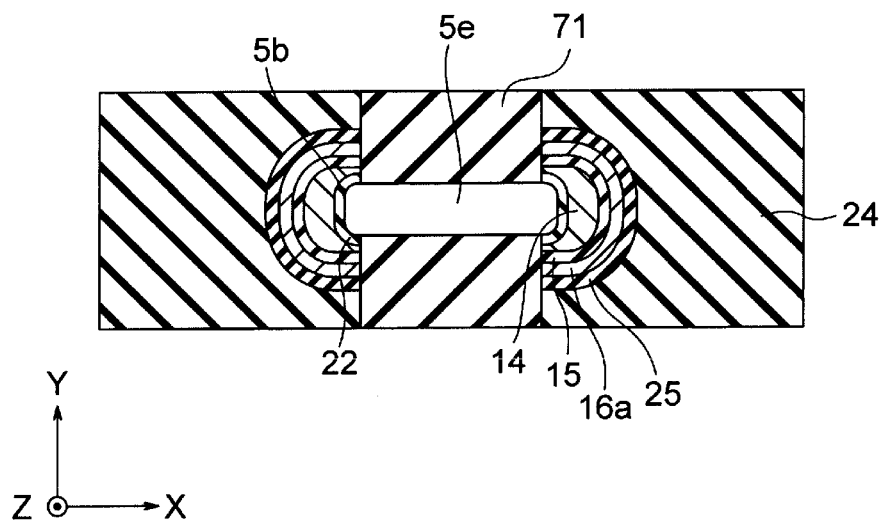
Figure 122B:
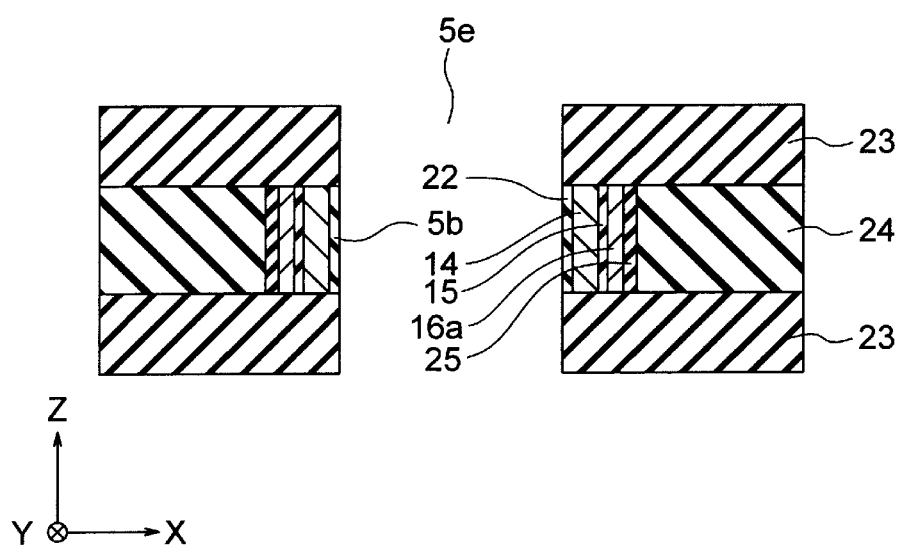

Next, the oxide film 22 is formed on the surface of the FG layer 14 by oxidizing the FG layer 14 (FIG. 122A and FIG. 122B). The thickness of the oxide film 22 is, for example, 2 nm.

Figure 123A:
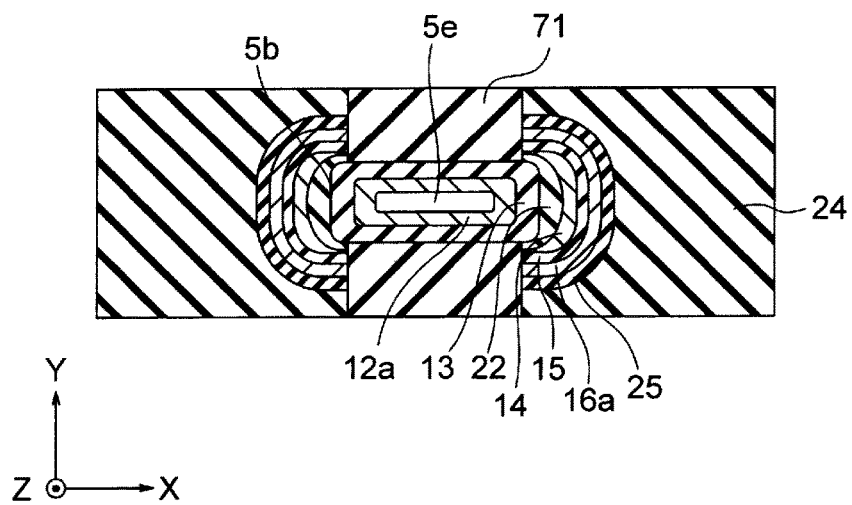
Figure 123B:
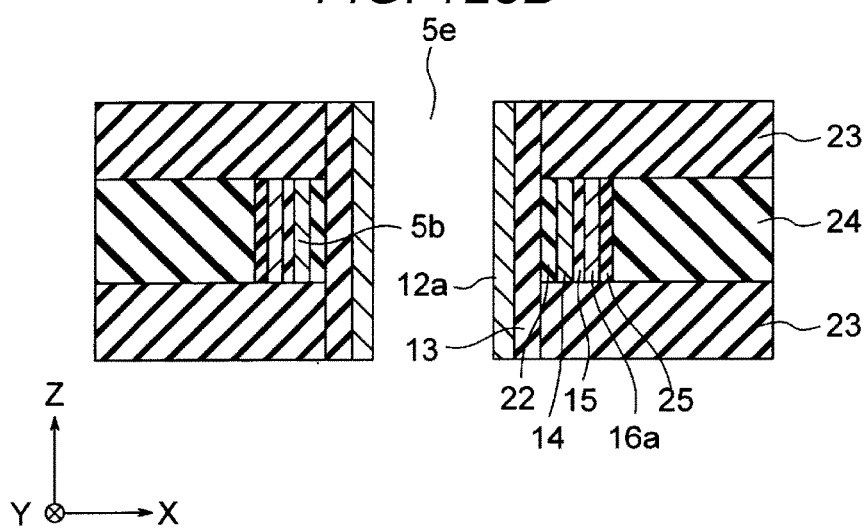

Next, the tunnel insulating film 13 and the first layer 12a of the channel semiconductor layer 12 are formed in order on the entire surface of the substrate 1 (FIG. 123A and FIG. 123B). Consequently, the tunnel insulating film 13 and the first layer 12a are formed on the side surface and the bottom surface of the memory hole 5e. Then, the tunnel insulating film 13 and the first layer 12a are removed from the bottom surface of the memory hole 5e by etch-back, and a MOSFET is exposed to the bottom surface of the memory hole 5e.

Figure 124A:
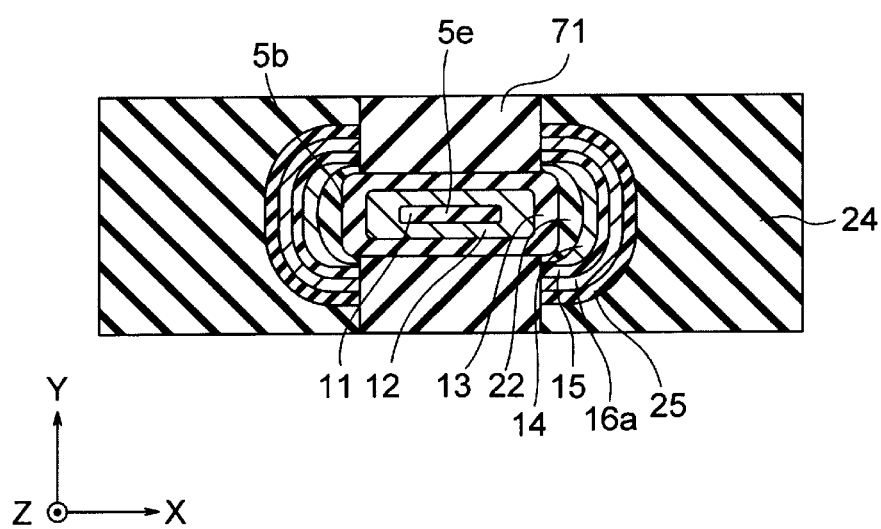
Figure 124B:
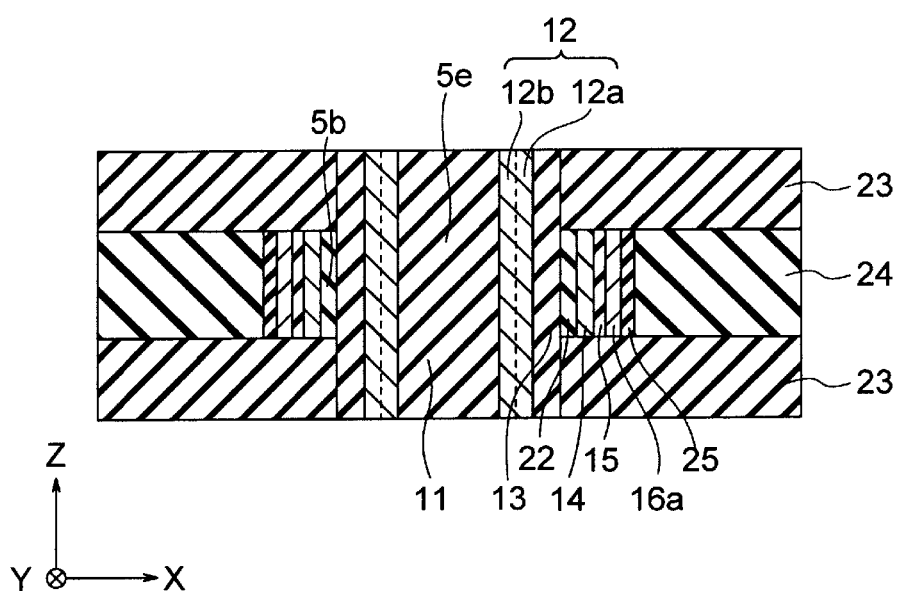

Next, the second layer 12b of the channel semiconductor layer 12 and the core layer 11 are formed in order on the entire surface of the substrate 1 (FIG. 124A and FIG. 124B). Consequently, the second layer 12b and the core layer 11 are formed in the memory hole 5e. Examples of the core layer 11 include an insulating film such as a silicon oxide film and a semiconductor layer such as a $p^+$ type silicon layer.

Figure 125:
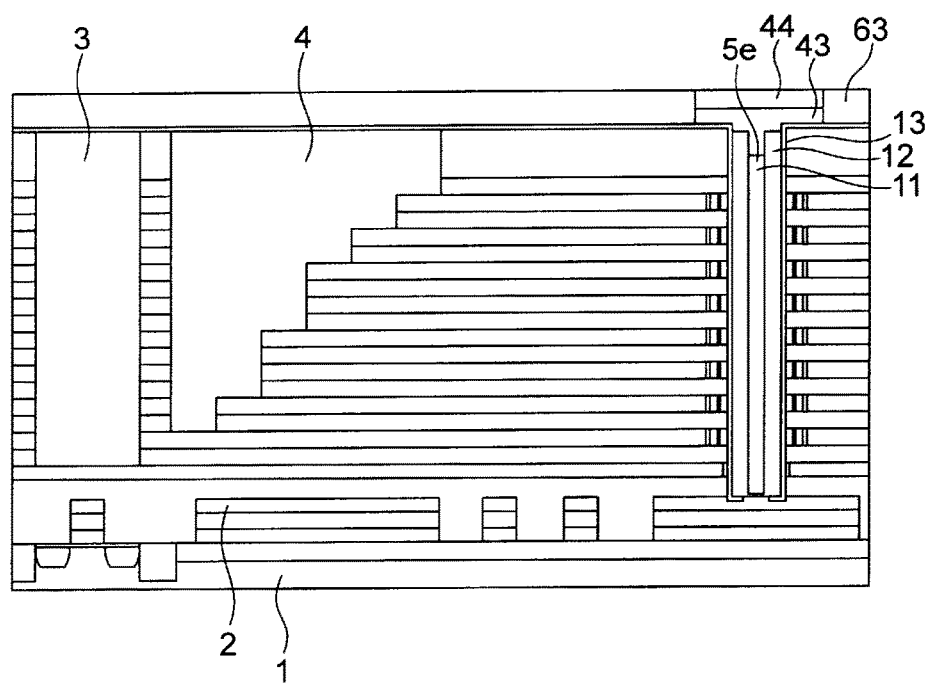

Next, the core layer 11 and the channel semiconductor layer 12 are divided by etch-back for individual memory holes 5e (FIG. 125). Next, the capping layer 43 and the mask layer 44 are formed in order on the entire surface of the substrate 1 (FIG. 125). Consequently, the capping layer 43 is embedded in the memory hole 5e. Next, the capping layer 43 and the mask layer 44 are processed in such a manner that the capping layer 43 and the mask layer 44 remain on the memory hole 5e (FIG. 125). Next, the mask layer 63 is formed on the entire surface of the substrate 1, and the surface of the mask layer 63 is flattened (FIG. 125).

One set of the core layer 11, the channel semiconductor layer 12, and the tunnel insulating film 13 is formed between two sets of the FG layer 14, the inter-gate insulating film 15, and the CT film material 16a.

Figure 126:
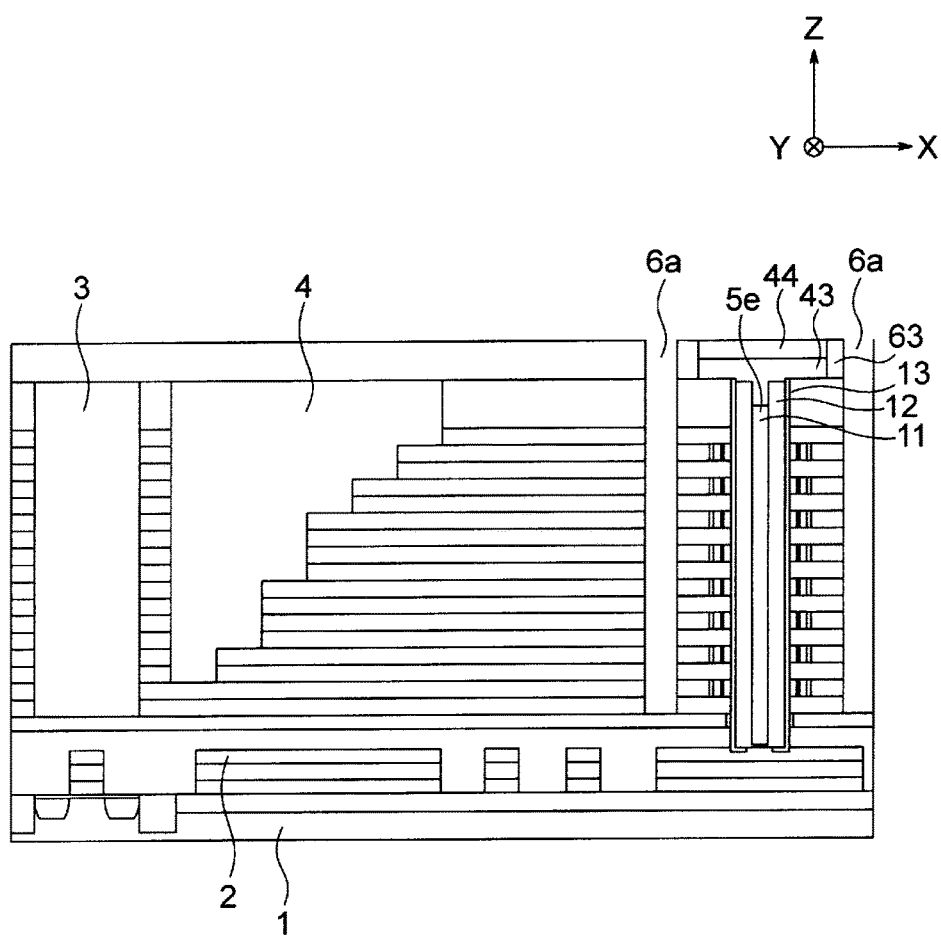

Next, the slit trench 6a is formed in the insulating layers 23 and the sacrificial layers 24 in the same manner as the second and third embodiments (FIG. 126). The distance between the memory trench 5a and the slit trench 6a is, for example, 80 nm.

Figure 127A:
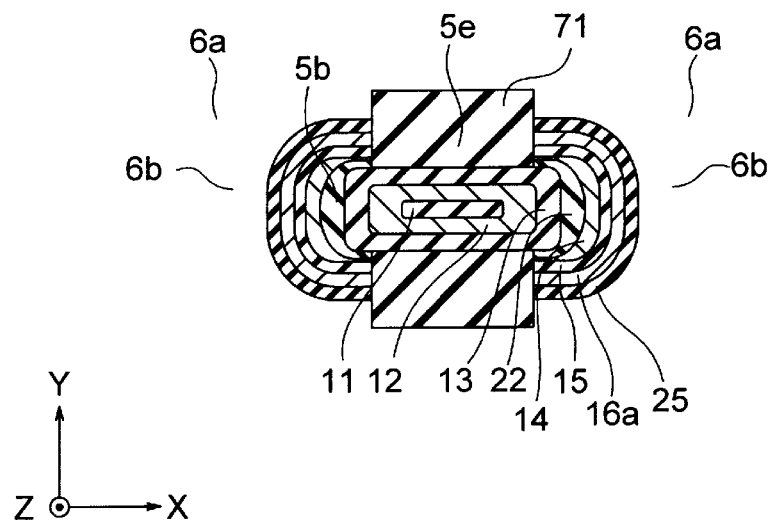
Figure 127B:
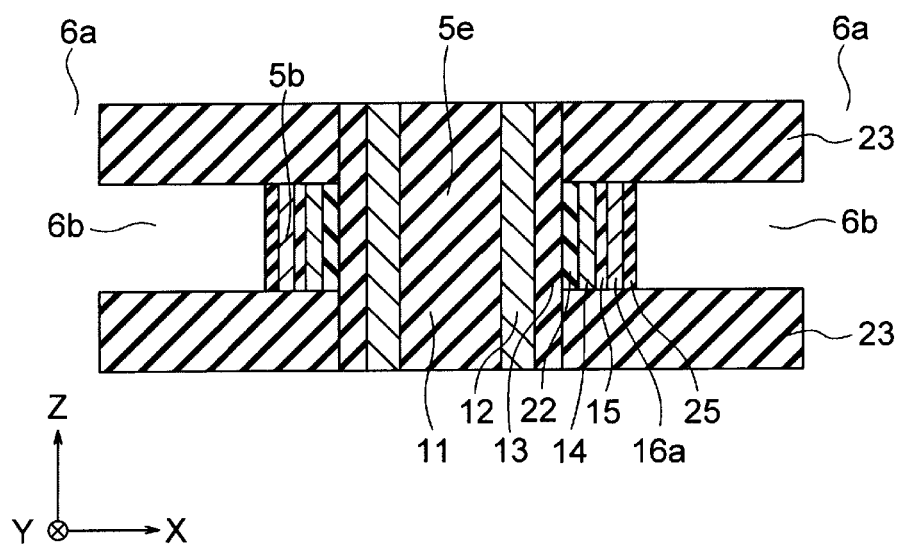

Next, the sacrificial layers 24 that are exposed to the slit trench 6a are selectively recessed, and the recess portion 6b is formed adjacent to the modified oxide film 25 (FIG. 127A and FIG. 127B).

Figure 128A:
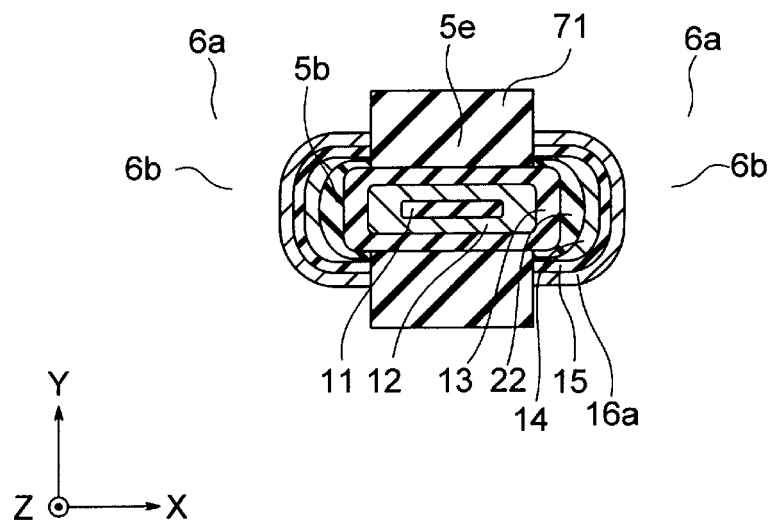
Figure 128B:
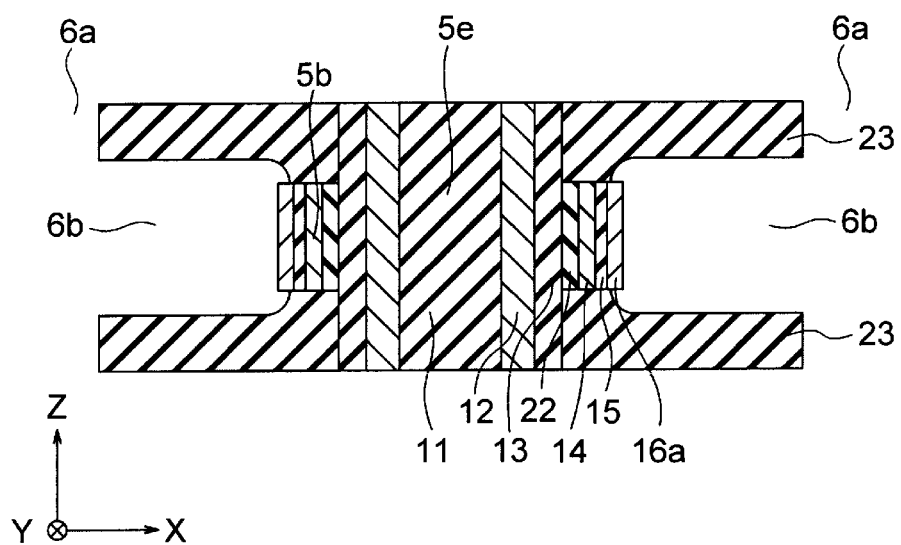

Next, the modified oxide film 25 that is exposed to the recess portion 6b is removed (FIG. 128A and FIG. 128B). Consequently, the CT film material 16a is exposed to the recess portion 6b. Furthermore, the insulating layers 23 above and below the recess portion 6b are recessed as well. The modified oxide film 25 having a thickness of 5 nm is removed in the present embodiment, and thus the Z-direction width of the recess portion 6b is increased from 30 nm to 40 nm.

Figure 129A:
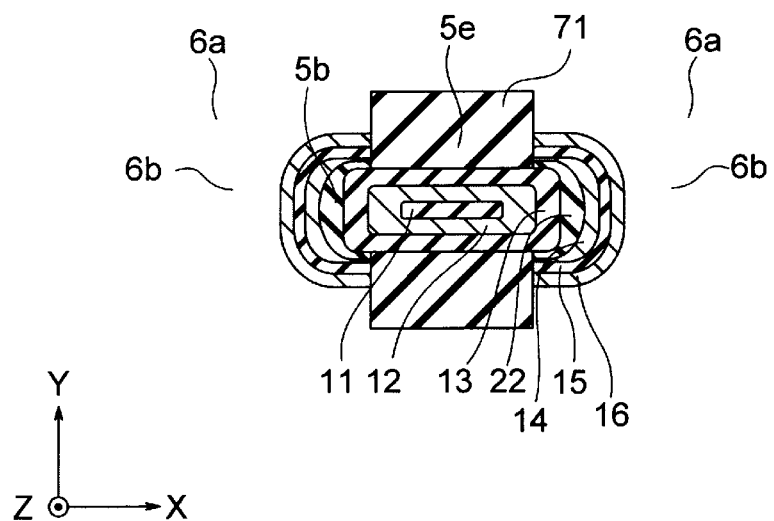
Figure 129B:
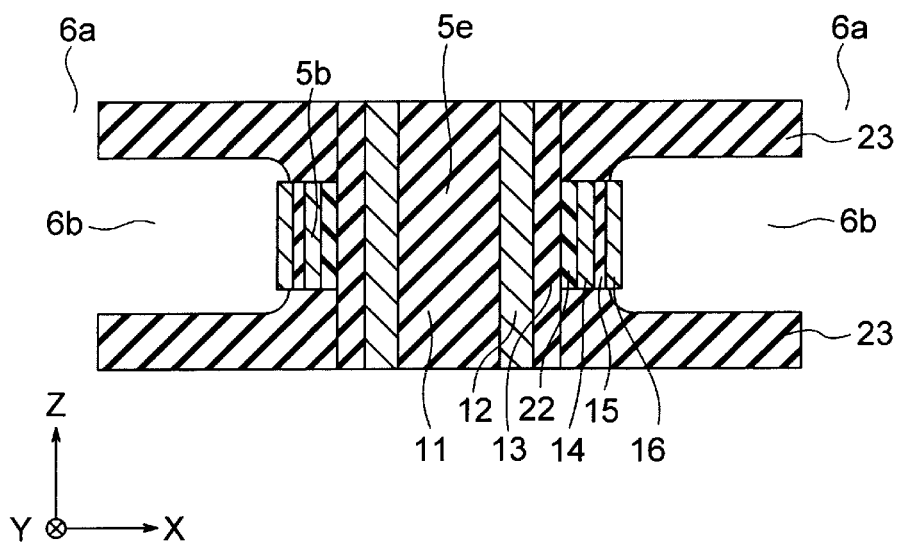

Next, the CT film material 16a is selectively reacted with gas that includes a metal element (FIG. 129A and FIG. 129B). Consequently, the CT film material 16a of an amorphous silicon layer is changed to the CT film 16 of a metal silicide layer by silicide reaction. Examples of the gas include titanium tetrachloride ($TiCl_4$) gas. In this case, the metal silicide layer turns into a titanium silicide ($TiSi_2$) layer. The present process is performed by, for example, the high temperature CVD at 600° C. to 650° C. The CT film 16 in the present embodiment corresponds to a metal salicide layer. Then, a reaction product of the $TiCl_4$ gas and excessive Ti are removed by using a mixed solution that includes, for example, sulfuric acid and hydrogen peroxide. Furthermore, excessive Cl in the CT film 16 is caused to leak by RTA at temperature greater than or equal to 700° C.

Figure 130A:
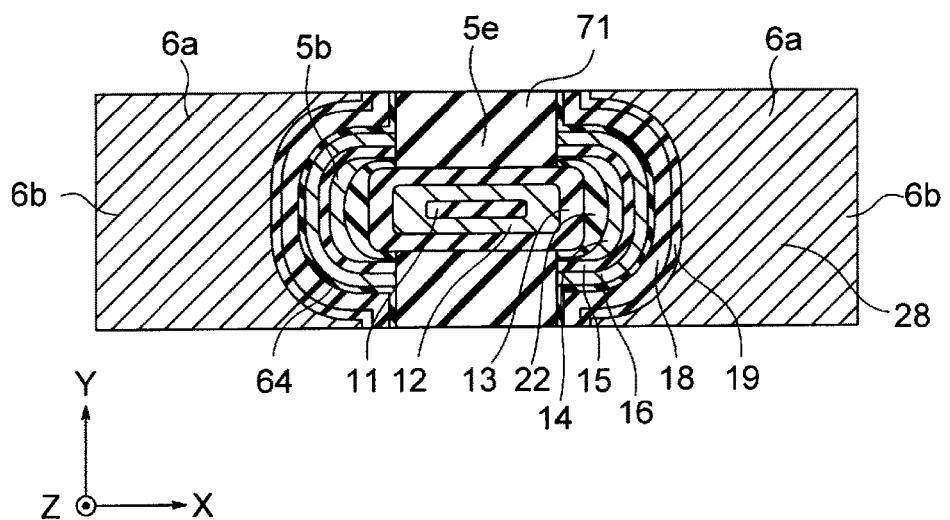
Figure 130B:
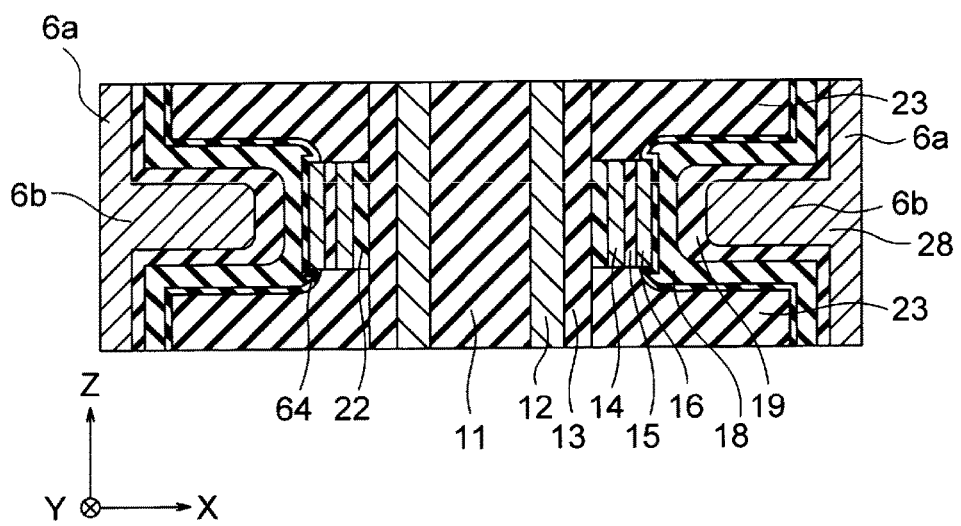

Next, the capping layer 64 is formed on the entire surface of the substrate 1 (FIG. 130A and FIG. 130B). Consequently, the capping layer 64 is formed on the side surface of the CT film 16 and the upper surface and the lower surface of the recess portion 6b. Examples of the capping layer 64 include an insulating film such as a silicon nitride film. The thickness of the capping layer 64 is, for example, 3 nm.

Next, the first block insulating film 18, the second block insulating film 19, and the dummy layer 28 are formed in order on the entire surface of the substrate 1 (FIG. 130A and FIG. 130B). Consequently, the first and second block insulating films 18 and 19 are formed on the side surface, the upper surface, and the lower surface of the capping layer 64, and the dummy layer 28 is formed in the recess portion 6b. The thickness of the first block insulating film 18 is, for example, 6 nm. The thickness of the second block insulating film 19 is, for example, 5 nm. The thickness of the dummy layer 28 is, for example, 30 nm.

Figure 131A:
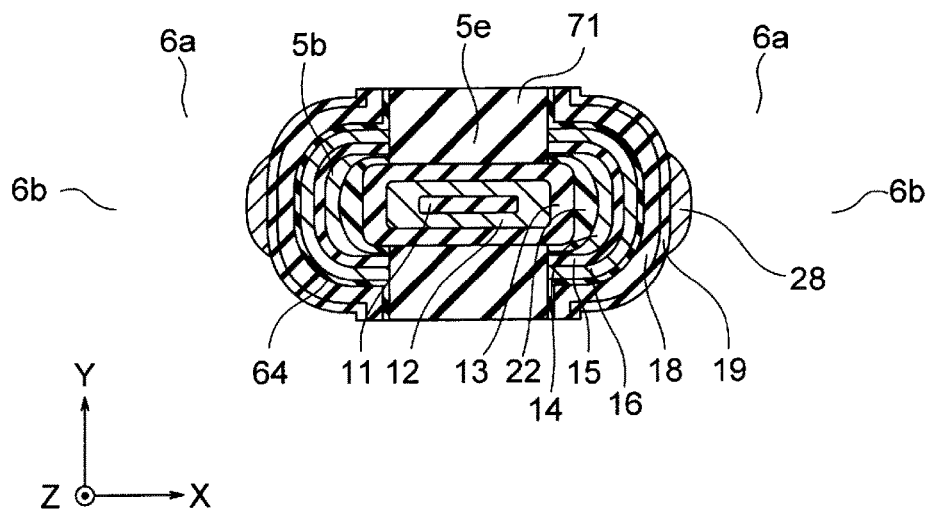
Figure 131B:
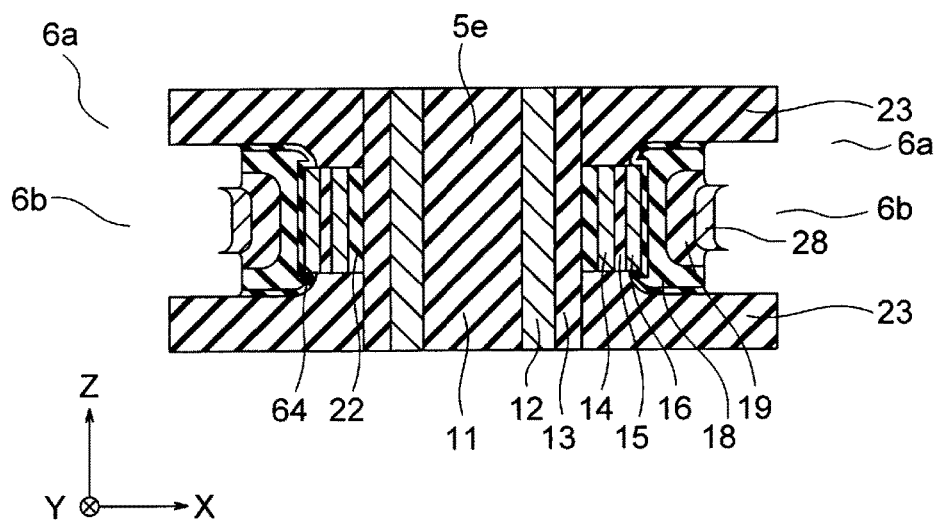

Next, the dummy layer 28 is selectively etched (FIG. 131A and FIG. 131B). Consequently, the dummy layer 28 having a thickness of 5 nm remains on the side surface of the second block insulating film 19.

Next, the second block insulating film 19 is selectively removed by using the dummy layer 28 as a mask (FIG. 131A and FIG. 131B). Consequently, the second block insulating film 19 remains on the side surface of the first block insulating film 18.

Next, the first block insulating film 18 is selectively removed by using the dummy layer 28 and the second block insulating film 19 as a mask (FIG. 131A and FIG. 131B). Consequently, the first block insulating film 18 remains on the side surface of the capping layer 64.

Next, the capping layer 64 is selectively removed by using the dummy layer 28, the second block insulating film 19, and the first block insulating film 18 as a mask (FIG. 131A and FIG. 131B). Consequently, the capping layer 64 remains on the side surface of the CT film 16 and a portion of the upper surface and the lower surface of the recess portion 6b.

Next, the dummy layer 28 is selectively removed (FIG. 132A and FIG. 132B).

Next, the barrier metal layer 20 is formed on the entire surface of the substrate 1 (FIG. 133A and FIG. 133B). Consequently, the barrier metal layer 20 is formed in the recess portion 6b to be in contact with the side surfaces of the second block insulating film 19, the first block insulating film 18, and the capping layer 64 and the upper surface and the lower surface of the recess portion 6b. The thickness of the barrier metal layer 20 is, for example, 2 nm.

Next, the CG layer 21 is formed on the entire surface of the substrate 1 (FIG. 133A and FIG. 133B). Consequently, the CG layer 21 is formed in the recess portion 6b.

Next, the barrier metal layer 20 and the CG layer 21 are removed in such a manner that the barrier metal layer 20 and the CG layer 21 do not remain on the side surfaces of the insulating layers 23 (FIG. 133A and FIG. 133B). FIG. 134 is a sectional view corresponding to FIG. 133A and FIG. 133B.

The memory cell unit 7 that includes the FG layer 14, the inter-gate insulating film 15, the CT film 16, the capping layer 64, the first block insulating film 18, the second block insulating film 19, the barrier metal layer 20, the CG layer 21, and the oxide film 22 is formed in the recess portions 5b and 6b.

Next, the insulating film 47 is embedded in the slit trench 6a, and the surface of the insulating film 47 is flattened (FIG. 135). Next, the contact holes 3a, 4a, and 5d are formed, and contact plugs are formed in the contact holes 3a, 4a, and 5d in the same manner as the second embodiment (FIG. 135).

Then, various interconnect layers, plug layers, interlayer insulating films, and the like are formed on the substrate 1. The semiconductor device according to the present embodiment is manufactured.

As described heretofore, the semiconductor device according to the present embodiment includes one set of the channel semiconductor layer 12, the tunnel insulating film 13, and the like between two sets of the FG layer 14, the inter-gate insulating film 15, the CT film 16, the CG layer 21, and the like. Thus, according to the present embodiment, the degree of integration of a three-dimensional memory can be improved.

The first to fourth embodiments may be applied in combination with one another. For example, the structures of the first and second block insulating films 18 and 19 in the first and second embodiments may be applied to the third and fourth embodiments. In addition, the structures of the first and second block insulating films 18 and 19 in the third and fourth embodiments may be applied to the first and second embodiments. In addition, the structure of the memory element unit 5 or the memory cell unit 7 in the fourth embodiment may be applied to the first to third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate;
a semiconductor layer that extends in a direction perpendicular to a major surface of the substrate;
a core layer disposed within the semiconductor layer;
a first insulating film disposed on the semiconductor layer;
an oxide film disposed on the first insulating film;
a first electrode layer disposed on the oxide film;
a second insulating film layer disposed on the first electrode layer;
a first charge trapping layer comprising a semiconductor material disposed on the second insulating film layer;
a second charge trapping layer comprising an insulating film, wherein the second charge trapping layer and the second insulating film layer surround the first charge trapping layer; and
a second electrode layer disposed on the second charge trapping layer.

2. The semiconductor device according to claim 1,
wherein the second charge trapping layer includes hafnium, silicon, oxygen, and nitrogen, and
a nitrogen composition ratio of the second charge trapping layer is greater than or equal to 10%.

3. The semiconductor device according to claim 2,
wherein the second insulating film is separated from the first insulating film by the first electrode layer.

4. The semiconductor device according to claim 3,
wherein the first charge trapping layer is separated from the first insulating film by the oxide film, the first electrode layer and the second insulating film.

5. The semiconductor device according to claim 1,
wherein the semiconductor layer further extends in a direction parallel to the major surface of the substrate.

6. The semiconductor device according to claim 1, further comprising a first set and a second set;
wherein the first set comprises a first part of the first electrode layer, a first part of the first charge trapping layer, a first part of the second charge trapping layer, and a first part of the second electrode layer, wherein the first set is disposed on a first side surface of the semiconductor layer, and
wherein the second set comprises a second part of the first electrode layer, a second part of the first charge trapping layer, a second part of the second charge trapping layer, and a second part of the second electrode layer, wherein the second set is disposed on a second side surface of the semiconductor layer opposite the first side surface of the semiconductor layer, and the first set and the second set face each other.

7. The semiconductor device according to claim 1,
wherein the first charge trapping layer is separated from the first insulating film by the oxide film, the first electrode layer and the second insulating film.

8. The semiconductor device according to claim 1,
wherein the semiconductor layer further extends in a direction parallel to the major surface of the substrate.

9. The semiconductor device according to claim 1, further comprising a first set and a second set;
wherein the first set comprises a first part of the first electrode layer, a first part of the first charge trapping layer, a first part of the second charge trapping layer, and a first part of the second electrode layer, wherein the first set is disposed on a first side surface of the semiconductor layer, and
wherein the second set comprises a second part of the first electrode layer, a second part of the first charge trapping layer, a second part of the second charge trapping layer, and a second part of the second electrode layer, wherein the second set is disposed on a second side surface of the semiconductor layer opposite the first side surface of the semiconductor layer, and the first set and the second set face each other.

10. The semiconductor device according to claim 1, further comprising:
a first block insulating layer disposed on the second charge trapping layer; and
a second block insulating layer disposed on the first block insulating layer.

11. The semiconductor device according to claim 10, wherein the second electrode layer is in contact with a side surface of the first block insulating layer perpendicular to the major surface of the substrate and a side surface of the second block insulating layer perpendicular to the major surface of the substrate.

12. The semiconductor device according to claim 10, wherein the second electrode layer is in contact with an upper surface of the first block insulating layer parallel to the major surface of the substrate, a lower surface parallel to the major surface of the substrate of the first block insulating layer and a side surface perpendicular to the major surface of the substrate of the second block insulating layer.

13. The semiconductor device according to claim 10, wherein the second electrode layer is in contact with an upper surface of the first block insulating layer parallel to the major surface of the substrate a lower surface of the first block insulating layer parallel to the major surface of the substrate, and a side surface of the second block insulating layer perpendicular to the major surface of the substrate.

* * * * *